US012133460B2

(12) United States Patent
Shin et al.

(10) Patent No.: US 12,133,460 B2
(45) Date of Patent: Oct. 29, 2024

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Chang Ju Shin, Suwon-si (KR); Hyung Sun Kim, Suwon-si (KR); Jihun Shin, Suwon-si (KR); Eunhye An, Suwon-si (KR); Jongwoo Won, Suwon-si (KR); Dongkyu Ryu, Suwon-si (KR); Seungjae Lee, Suwon-si (KR); Hanill Lee, Suwon-si (KR); Sung-Hyun Jung, Suwon-si (KR); Ho Kuk Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 940 days.

(21) Appl. No.: 17/077,113

(22) Filed: Oct. 22, 2020

(65) Prior Publication Data

US 2021/0126204 A1 Apr. 29, 2021

(30) Foreign Application Priority Data

Oct. 23, 2019 (KR) ........................ 10-2019-0132450

(51) Int. Cl.
*H01L 51/00* (2006.01)
*H10K 85/60* (2023.01)
(Continued)

(52) U.S. Cl.
CPC ....... *H10K 85/6572* (2023.02); *H10K 85/631* (2023.02); *H10K 85/654* (2023.02);
(Continued)

(58) Field of Classification Search
CPC . H10K 85/6572; H10K 85/631; H10K 85/654
See application file for complete search history.

(56) References Cited

U.S. PATENT DOCUMENTS 5,061,569 A 10/1991 Vanslyke et al.
2015/0008423 A1 * 1/2015 Inoue .................. C07D 403/14 546/276.7

FOREIGN PATENT DOCUMENTS

CN 104837834 A 8/2015
CN 105102408 A 11/2015
(Continued)

OTHER PUBLICATIONS

Espacenet translation of JP2009170815A (Year: 2023).*
(Continued)

*Primary Examiner* — Michael M Dollinger
(74) *Attorney, Agent, or Firm* — Lee IP Law, P.C.

(57) ABSTRACT

A compound for an organic optoelectronic device, an organic optoelectronic device including the same, and a
(Continued)

100 display device, the compound being represented by Chemical Formula 1:

[Chemical Formula 1]

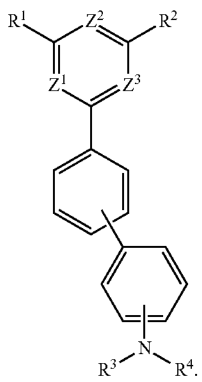

15 Claims, 1 Drawing Sheet

(51) Int. Cl.

| | |
|---|---|
| *H10K 50/11* | (2023.01) |
| *H10K 101/00* | (2023.01) |
| *H10K 101/10* | (2023.01) |

(52) U.S. Cl.

CPC ......... *H10K 85/6574* (2023.02); *H10K 50/11* (2023.02); *H10K 2101/10* (2023.02); *H10K 2101/90* (2023.02)

(56) References Cited

FOREIGN PATENT DOCUMENTS

| | | | |
|---|---|---|---|
| CN | 110818642 | A | 2/2020 |
| JP | 1993-009471 | A | 1/1993 |
| JP | 1995-126615 | A | 5/1995 |
| JP | 1998-095973 | A | 4/1998 |
| JP | 2009-170815 | A | 7/2009 |
| JP | 4408367 | B2 | 2/2010 |
| KR | 10-2011-0105285 | A | 9/2011 |
| KR | 10-2012-0038032 | A | 4/2012 |
| KR | 10-2016-0039492 | A | 4/2016 |
| KR | 10-2016-0107975 | A | 9/2016 |
| KR | 10-2017-0005853 | A | 1/2017 |
| KR | 10-2017-0086211 | A | 7/2017 |
| KR | 10-2017-0086277 | A | 7/2017 |
| KR | 10-2017-0086329 | A | 7/2017 |
| KR | 10-1803599 | B1 | 11/2017 |
| WO | WO 1995-009147 | A1 | 4/1995 |

OTHER PUBLICATIONS

Google Translation of KR20110105285A (Year: 2023).*

J. Org. Chem., 84, 8870-8885, Perez-Caaveiro, et al., Synthesis of D-A-A and D-A-D Pyrimidine π Systems Using Triorganoindium Reagents: Optical, Vibrational, and Electrochemical Studies (2019).

Chinese Office Action and Search Report dated Mar. 6, 2023 for the corresponding Chinese Patent Application No. 202011141347.X.

* cited by examiner

COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

Korean Patent Application No. 10-2019-0132450, filed on Oct. 23, 2019, in the Korean Intellectual Property Office, and entitled: "Compound for Organic Optoelectronic Device, Composition for Organic Optoelectronic Device, Organic Optoelectronic Device and Display Device," is incorporated by reference herein in its entirety.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (e.g., organic optoelectronic diode) is a device that converts electrical energy into photoenergy, and vice versa.

An organic optoelectronic device may be classified as follows in accordance with its driving principles. One is a photoelectric device where excitons generated by photoenergy are separated into electrons and holes and the electrons and holes are transferred to different electrodes respectively and electrical energy is generated, and the other is a light emitting device to generate photoenergy from electrical energy by supplying a voltage or a current to electrodes.

Examples of the organic optoelectronic device include an organic photoelectric device, an organic light emitting diode, an organic solar cell, and an organic photo conductor drum.

Of these, an organic light emitting diode (OLED) has recently drawn attention due to an increase in demand for flat panel displays. The organic light emitting diode converts electrical energy into light by applying current to an organic light emitting material and performance of an organic light emitting diode may be affected by organic materials disposed between electrodes.

SUMMARY

The embodiments may be realized by providing a compound for an organic optoelectronic device, the compound being represented by Chemical Formula 1:

[Chemical Formula 1]

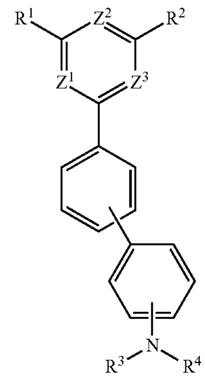

wherein, in Chemical Formula 1, $Z^1$ to $Z^3$ are independently N or $CR^a$, at least two of $Z^1$ to $Z^3$ being N, $R^1$ is a substituted or unsubstituted carbazolyl group, $R^2$ to $R^4$ are independently a substituted or unsubstituted C6 to C20 aryl group, and $R^a$ is hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

The compound represented by Chemical Formula 1 may be represented by Chemical Formula 1A or Chemical Formula 1B:

[Chemical Formula 1A]

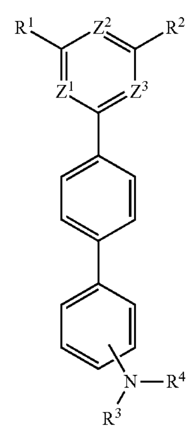

[Chemical Formula 1B]

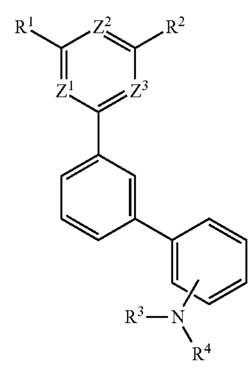

wherein, in Chemical Formula 1A and Chemical Formula 1B, $Z^1$ to $Z^3$ and $R^1$ to $R^4$ may be defined the same as those of Chemical Formula 1.

The compound represented by Chemical Formula 1 may be represented by Chemical Formula 1A, the compound represented by Chemical Formula 1A may be represented by Chemical Formula 1A-1 or Chemical Formula 1A-2:

[Chemical Formula 1A-1]

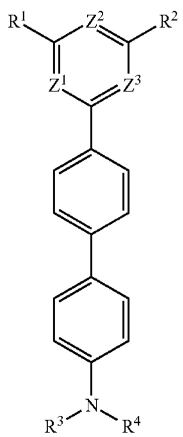

[Chemical Formula 1A-2]

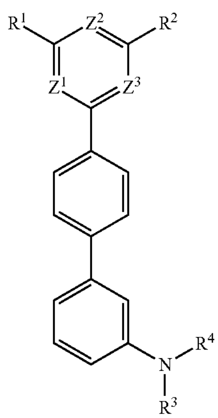

in Chemical Formula 1A-1 and Chemical Formula 1A-2, $Z^1$ to $Z^3$ and $R^1$ to $R^4$ may be defined the same as those of Chemical Formula 1.

The compound represented by Chemical Formula 1 may be represented by Chemical Formula 1D or Chemical Formula 1E:

[Chemical Formula 1D]

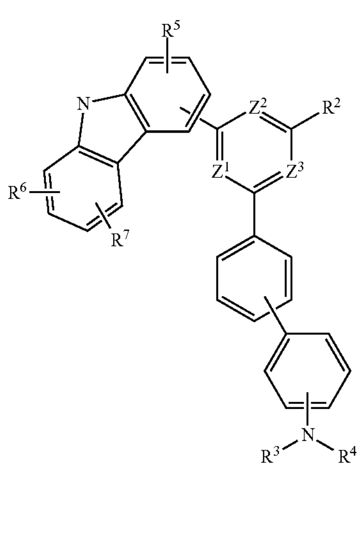

-continued

[Chemical Formula 1E]

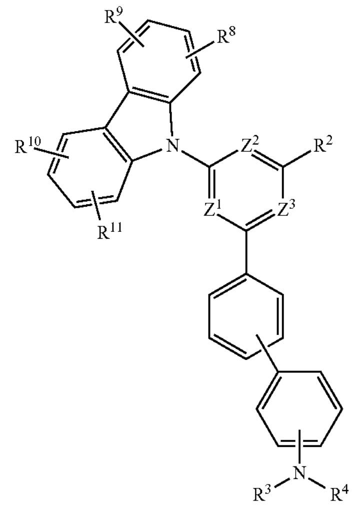

in Chemical Formula 1D and Chemical Formula 1E, $Z^1$ to $Z^3$ and $R^2$ to $R^4$ may be defined the same as those of Chemical Formula 1, and $R^5$ to $R^{11}$ may be independently hydrogen, deuterium, a C1 to C10 alkyl group, a C6 to C20 aryl group, or a combination thereof.

The compound represented by Chemical Formula 1 may be represented by Chemical Formula 1E, the compound represented by Chemical Formula 1E may be represented by Chemical Formula 1E-A-1 or Chemical Formula 1E-A-2:

[Chemical Formula 1E-A-1]

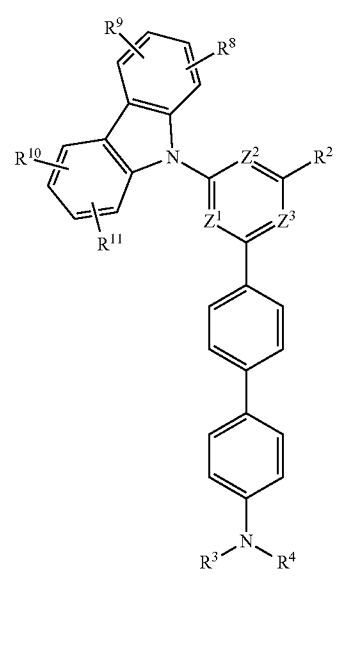

-continued

[Chemical Formula 1E-A-2]

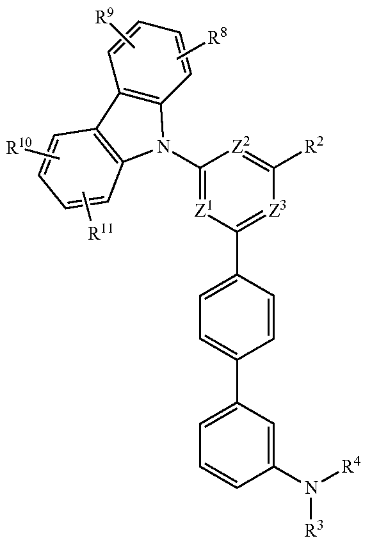

in Chemical Formula 1E-A-1 and Chemical Formula 1E-A-2, $Z^1$ to $Z^3$, $R^2$ to $R^4$, and $R^1$ to $R^{11}$ may be defined the same as those of Chemical Formula 1E.

$R^2$ may be a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, or a combination thereof, and $R^3$ and $R^4$ may be independently a substituted or unsubstituted phenyl group or a substituted or unsubstituted biphenyl group.

The compound may be a compound of Group 1:

[Group 1]

[1]

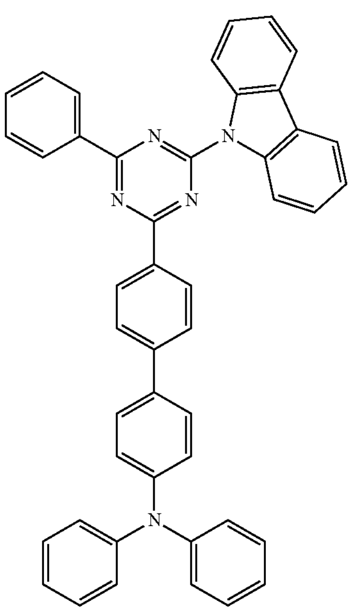

-continued

[2]

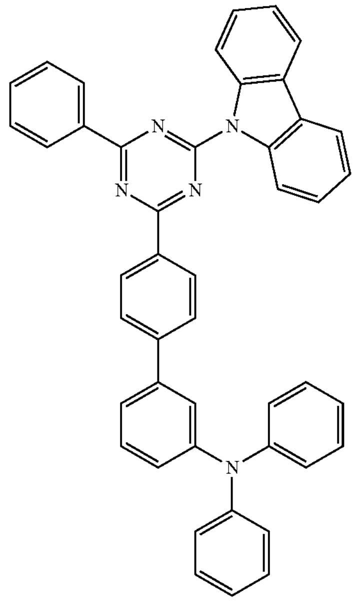

[3]

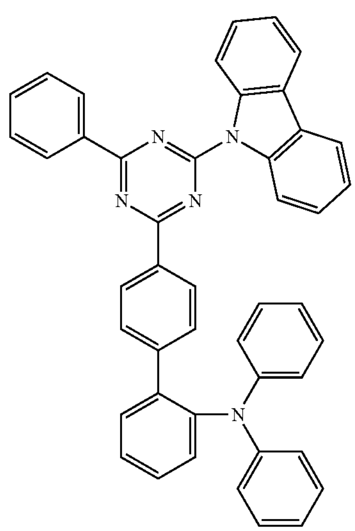

-continued
[4]
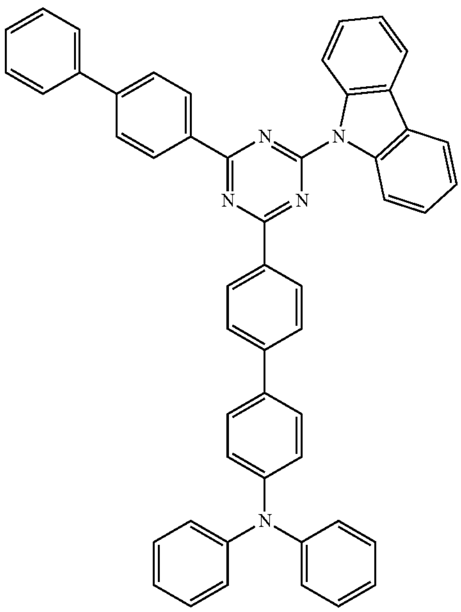
[5]
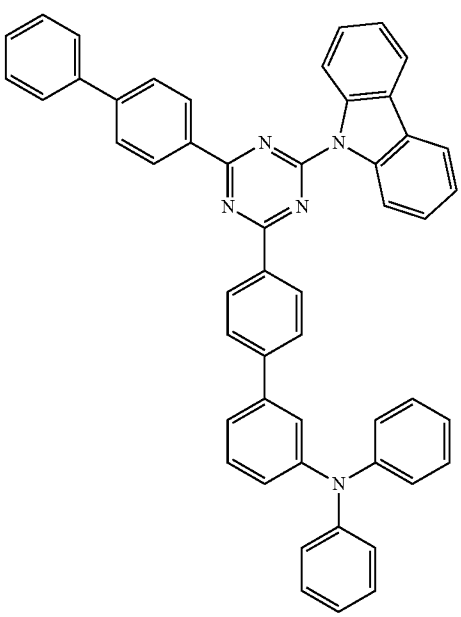
-continued
[6]
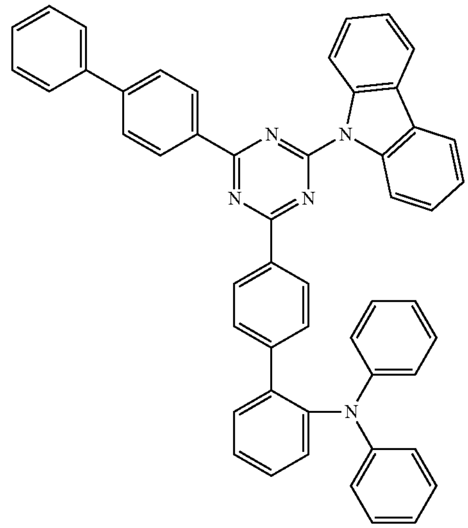
[7]
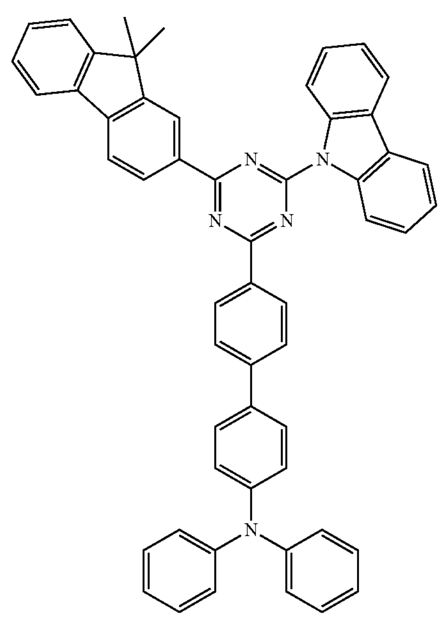

-continued
[8]
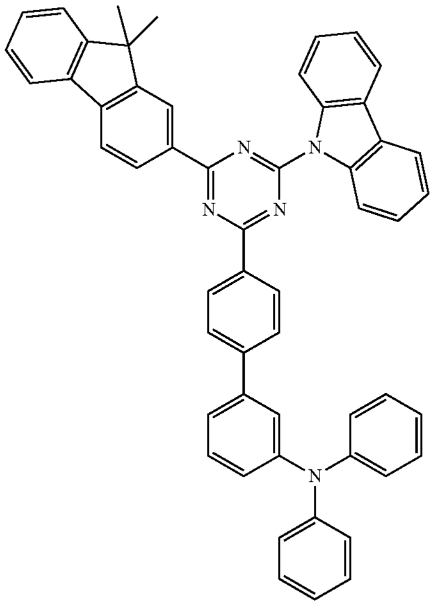
[9]
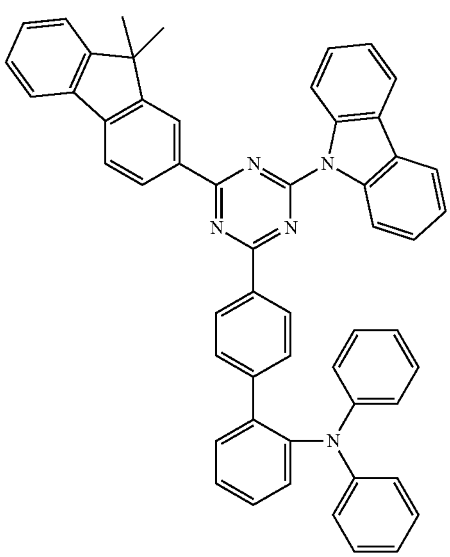
-continued
[10]
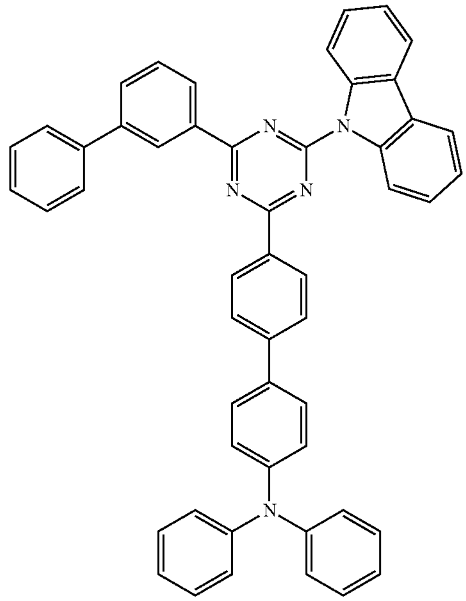
[11]
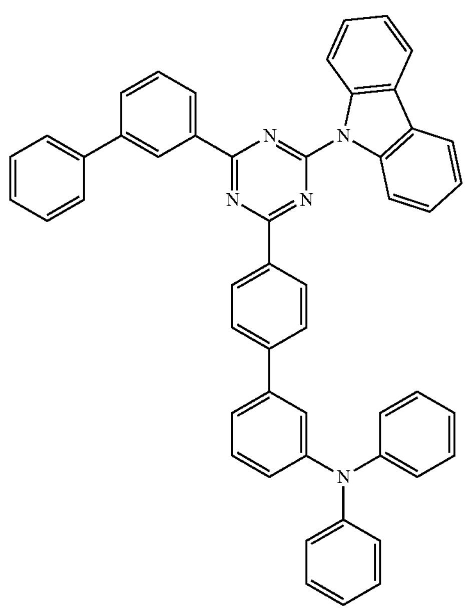

-continued
[12]
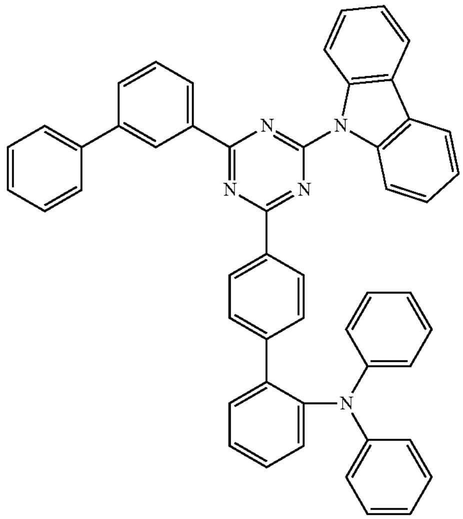
[13]
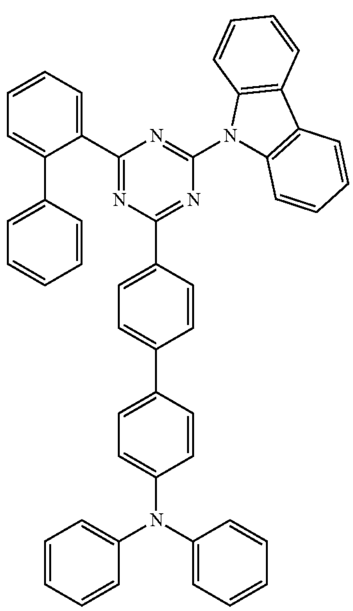
-continued
[14]
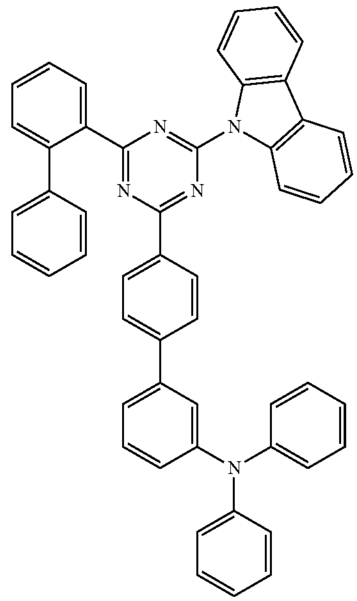
[15]
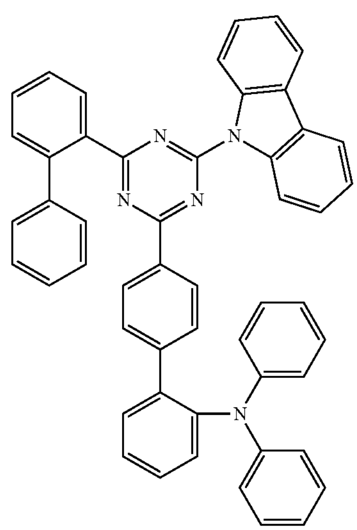

[16]
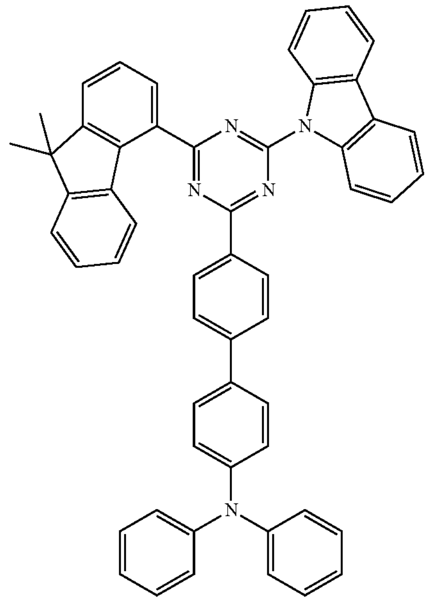
[17]
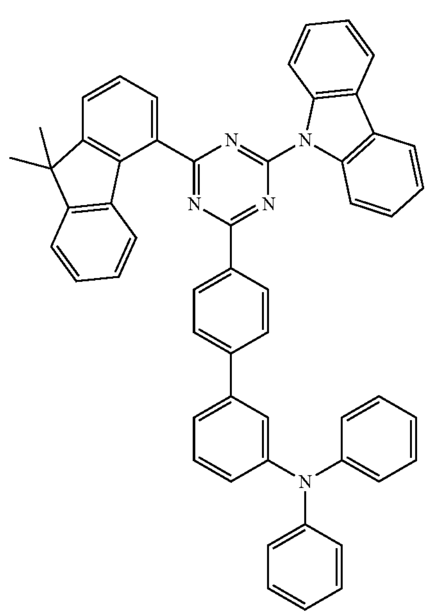
[18]
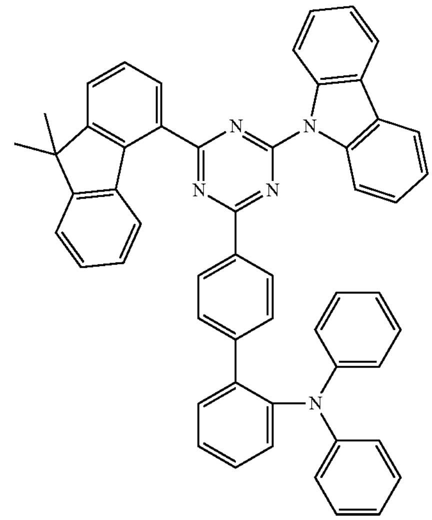
[19]
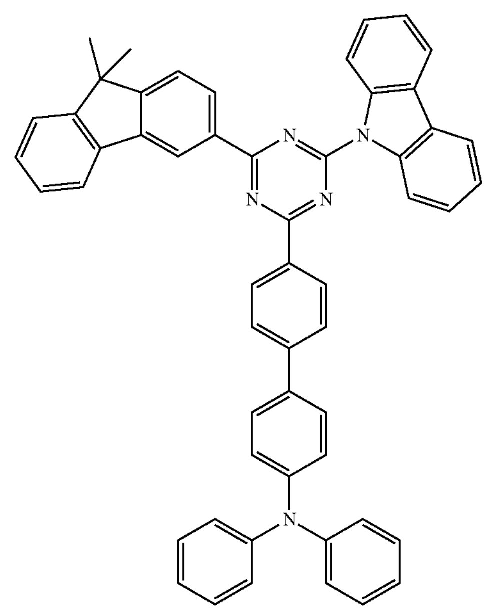

-continued
[20]
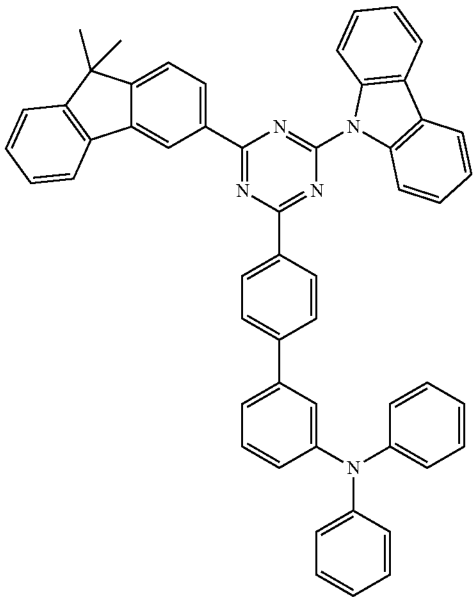
[21]
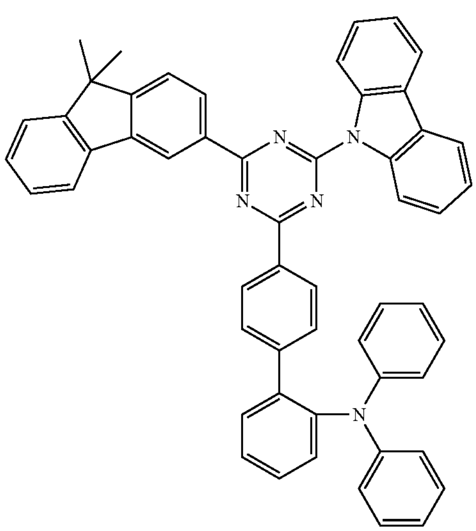
-continued
[22]
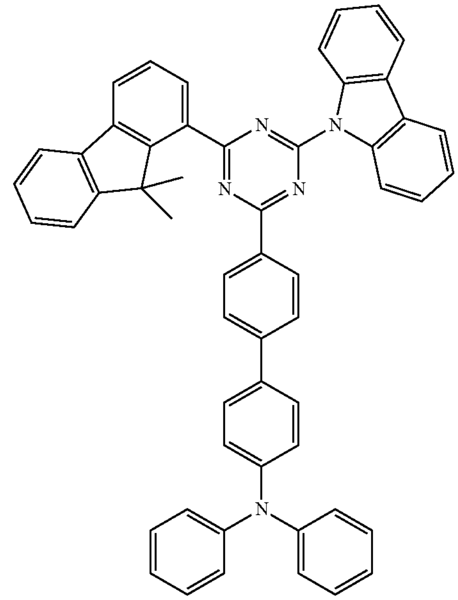
[23]
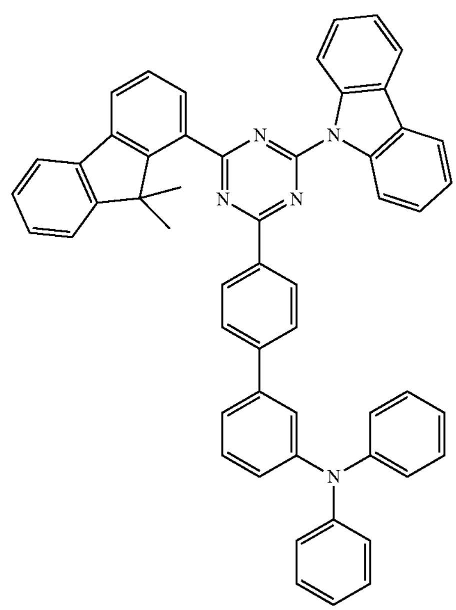

-continued
[24]
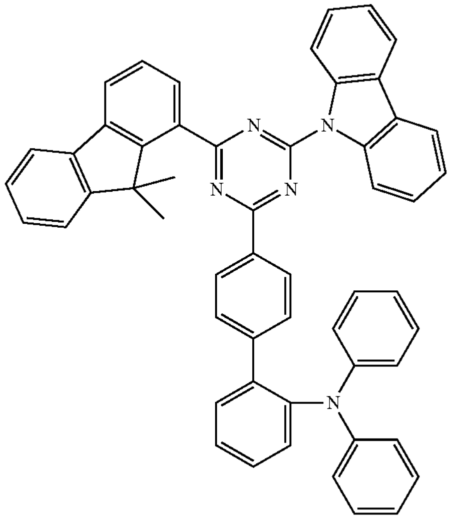
[25]
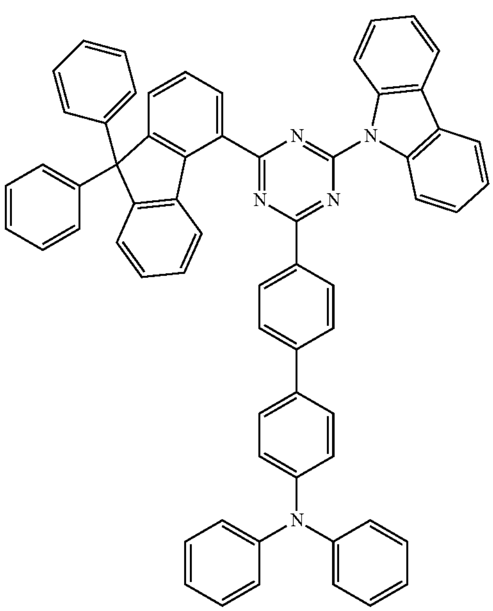
-continued
[26]
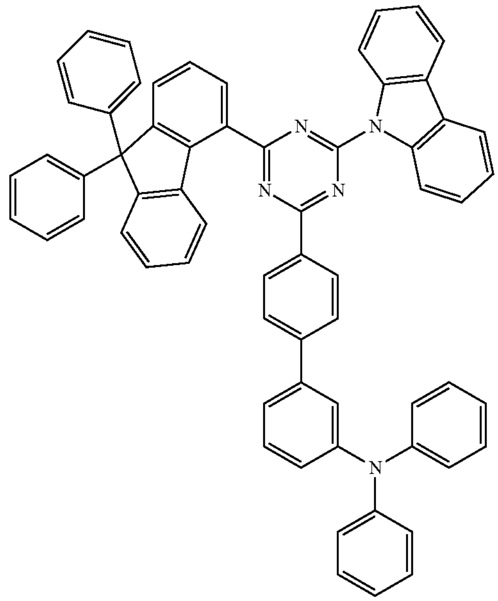
[27]
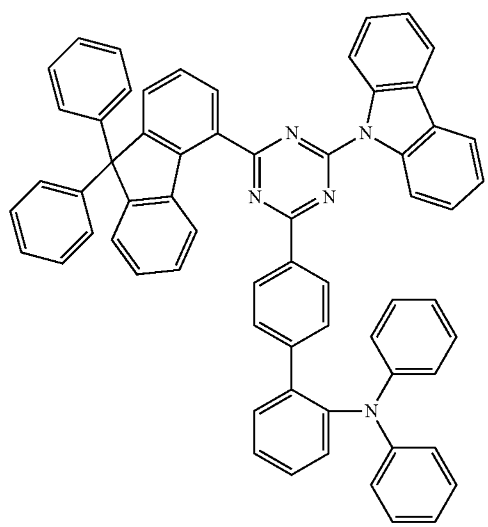

[28]
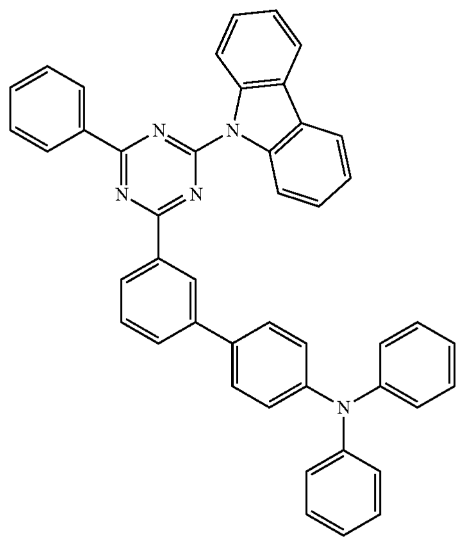
[29]
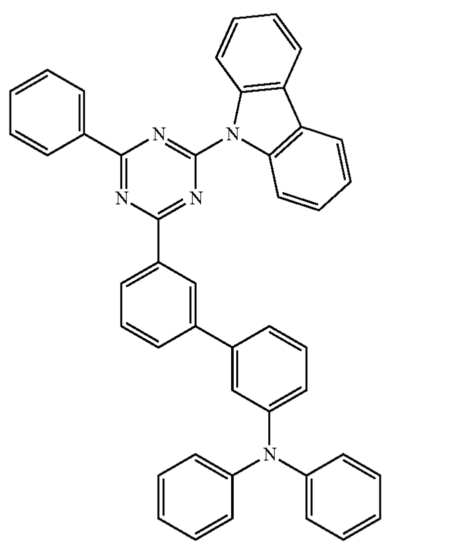
[30]
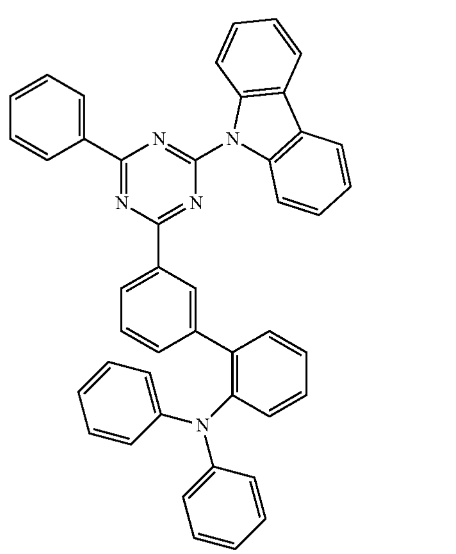
[31]
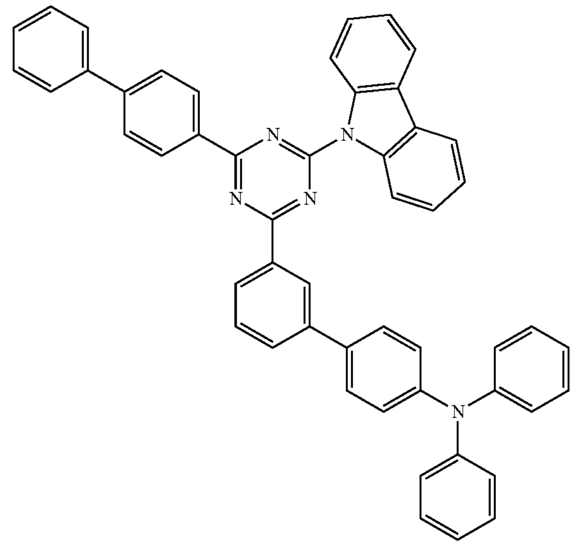
[32]
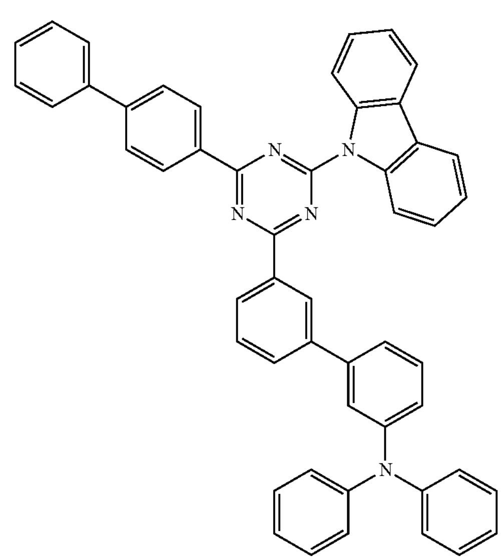

-continued
[33]
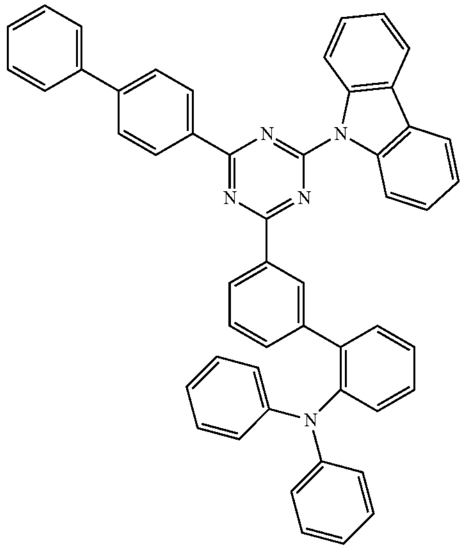
[34]
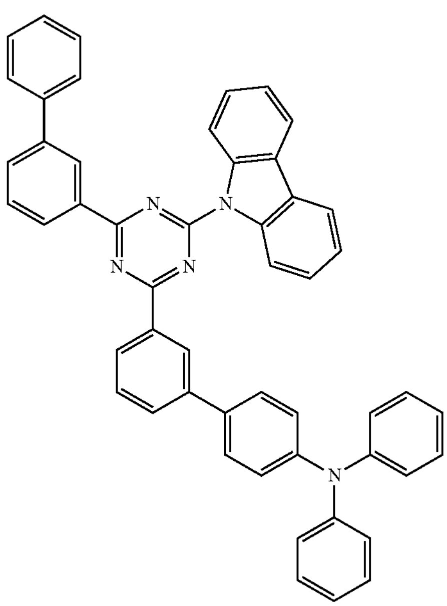
-continued
[35]
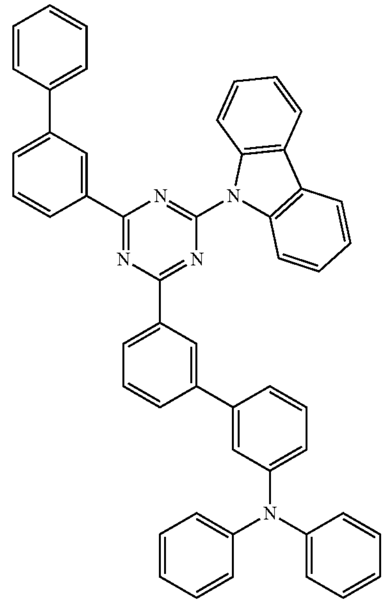
[36]
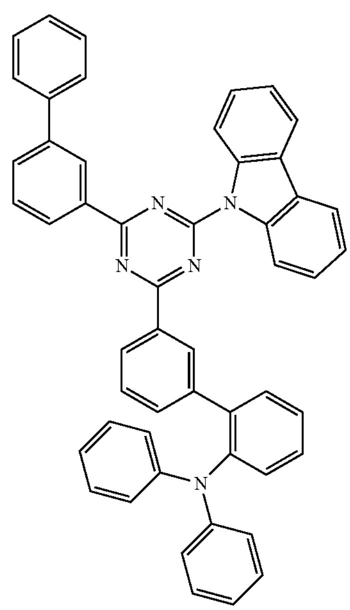

-continued
[37]
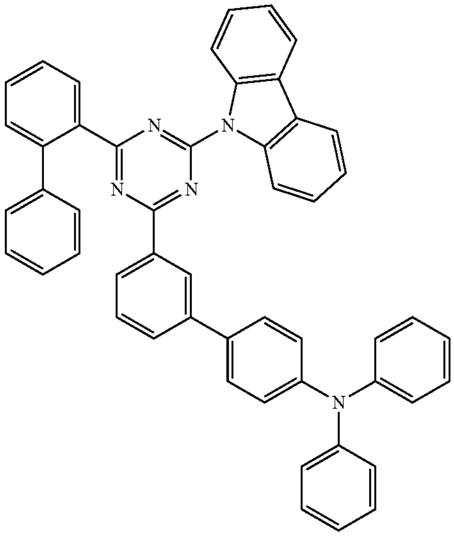
[38]
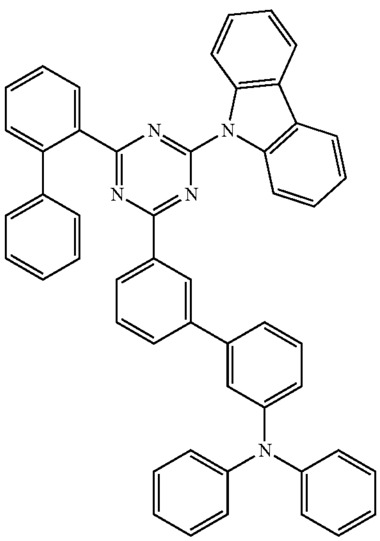
[39]
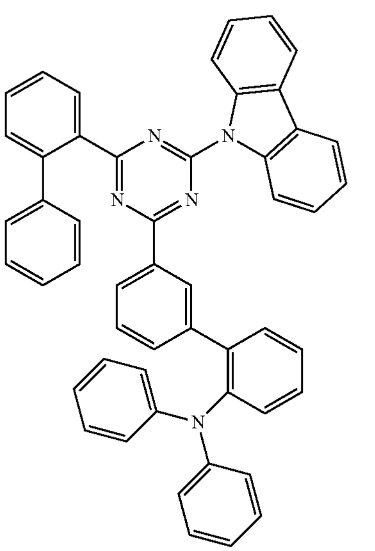
-continued
[40]
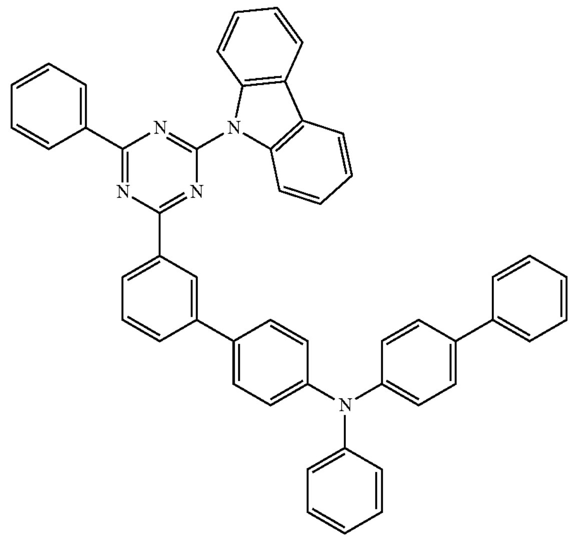
[41]
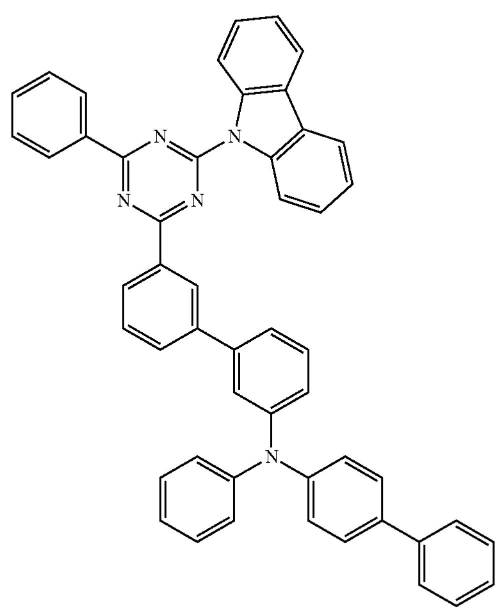

-continued
[42]
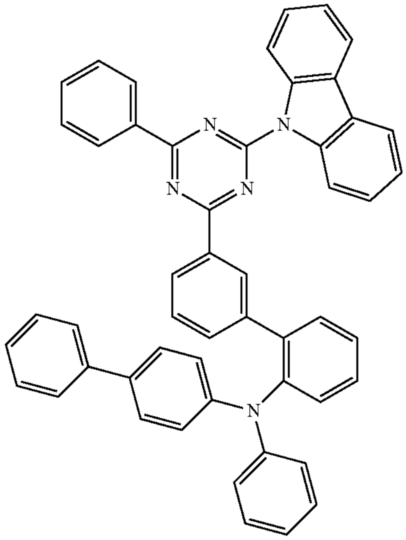
[43]
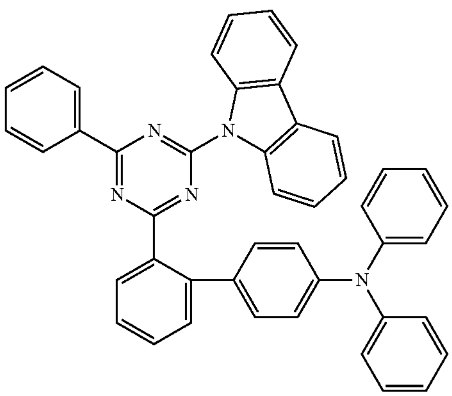
[44]
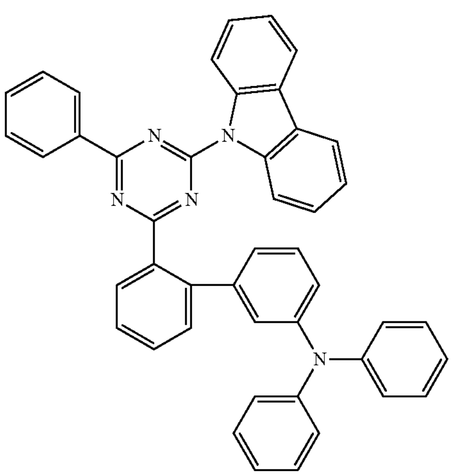
-continued
[45]
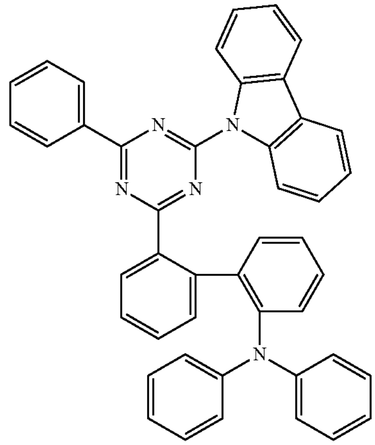
[46]
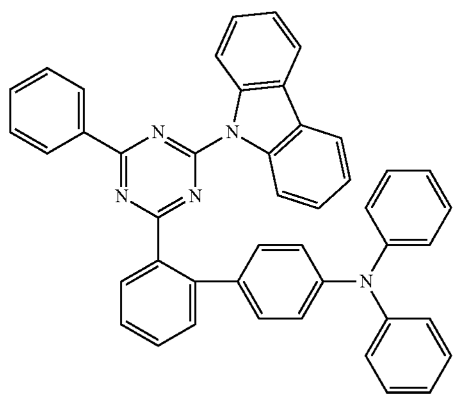
[47]
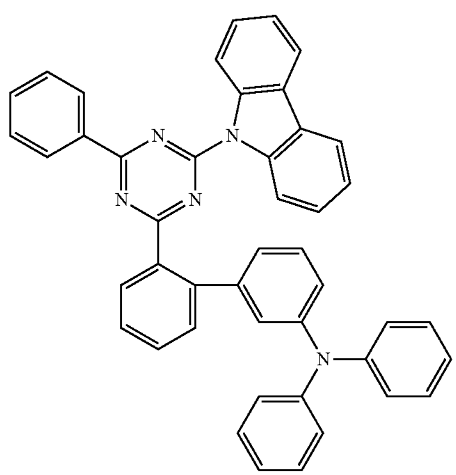

-continued
[48]
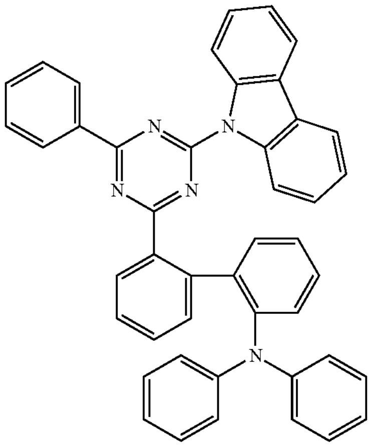
[49]
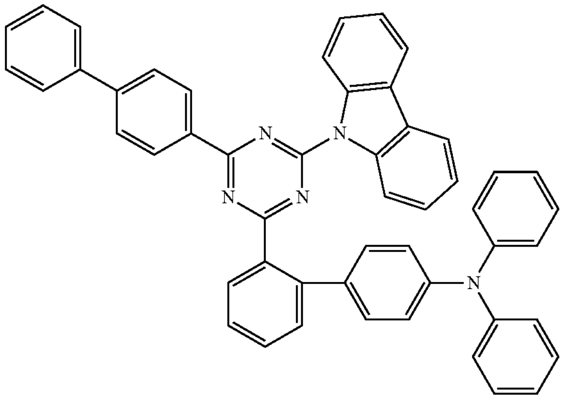
[50]
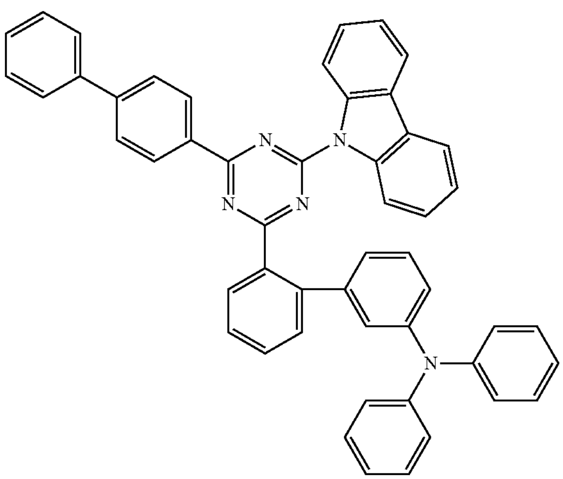
-continued
[51]
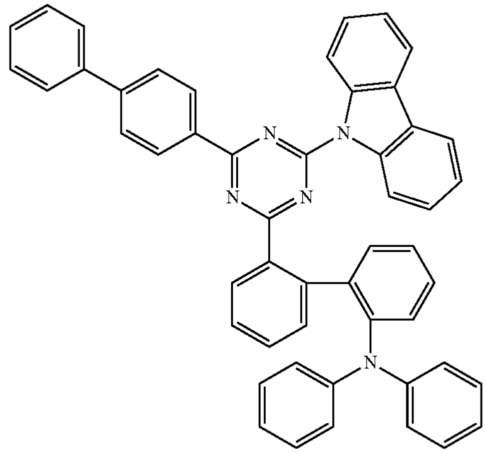
[52]
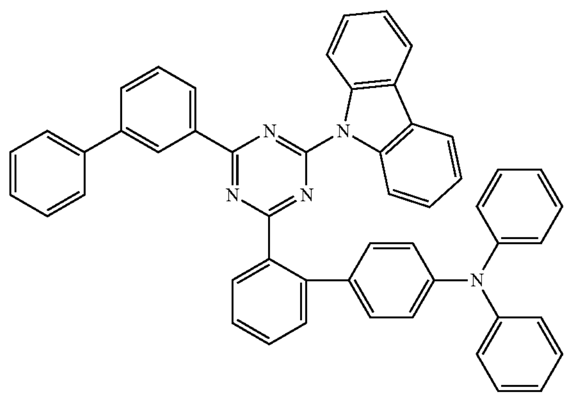
[53]
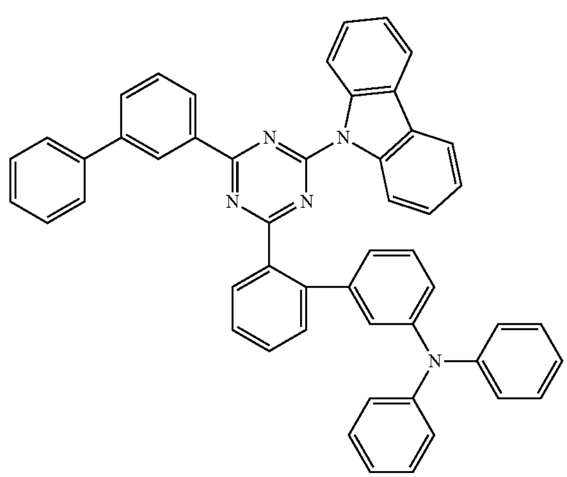

-continued
[54]
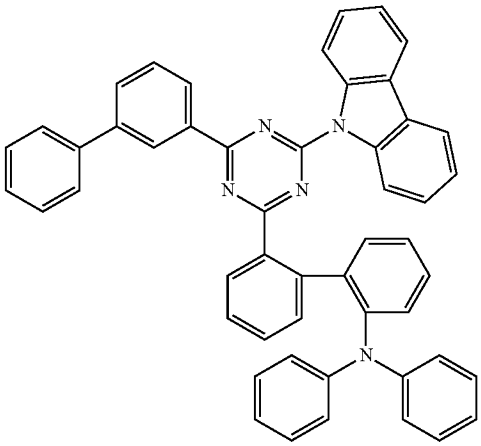
[55]
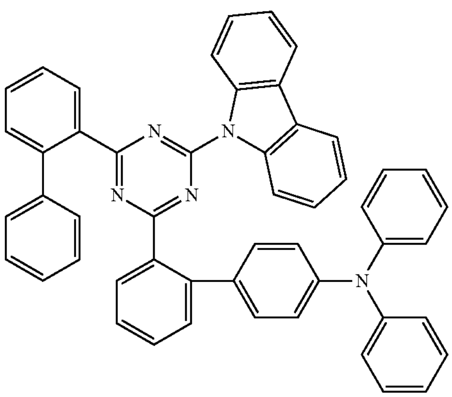
[56]
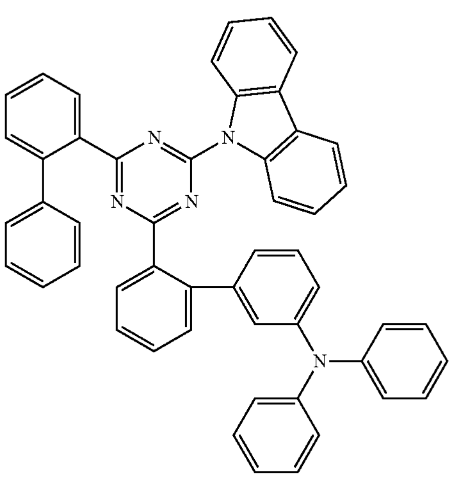
-continued
[57]
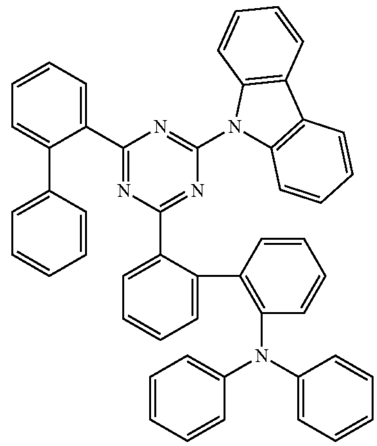
[58]
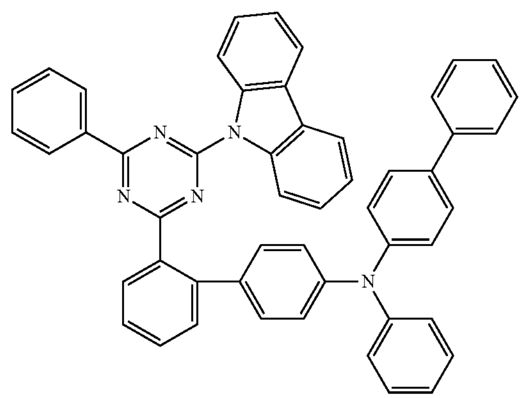
[59]
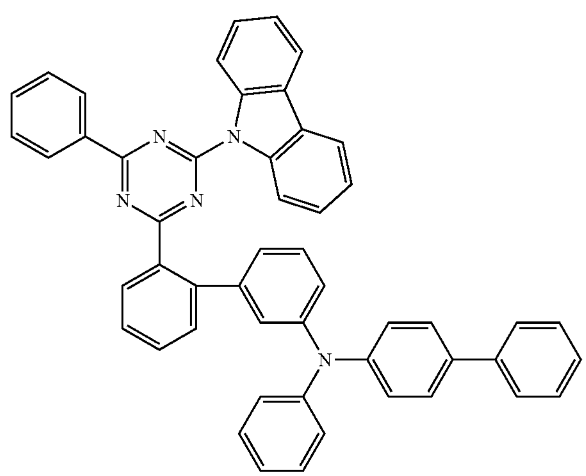

-continued
[60]
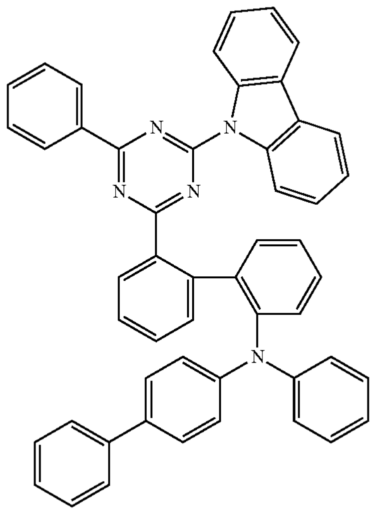
[61]
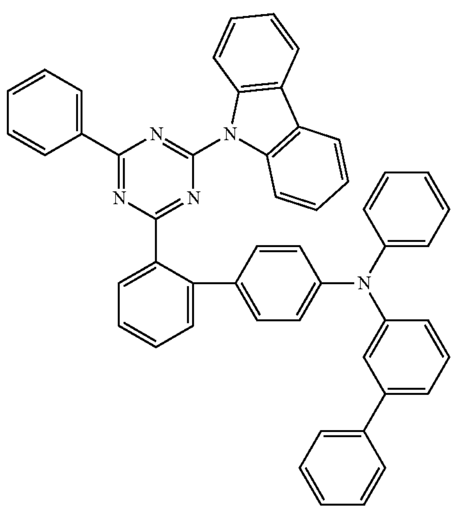
[62]
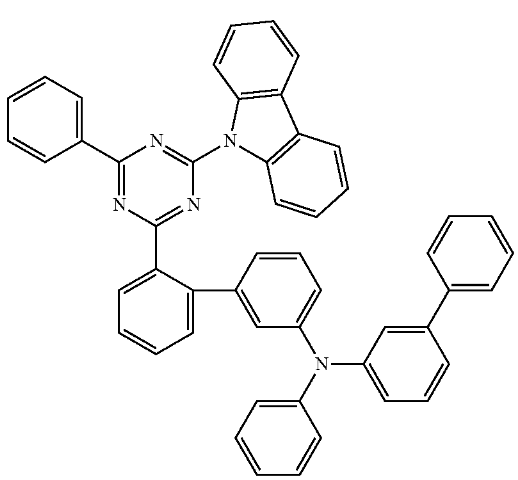
-continued
[63]
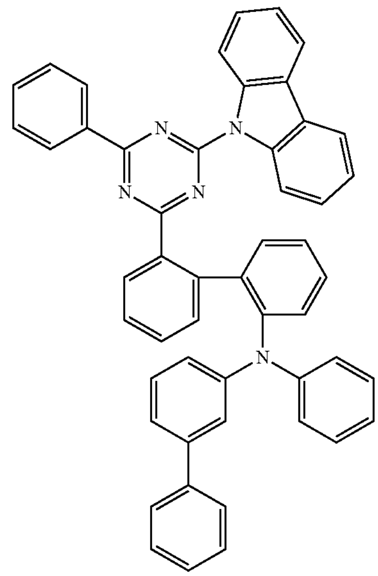
[64]
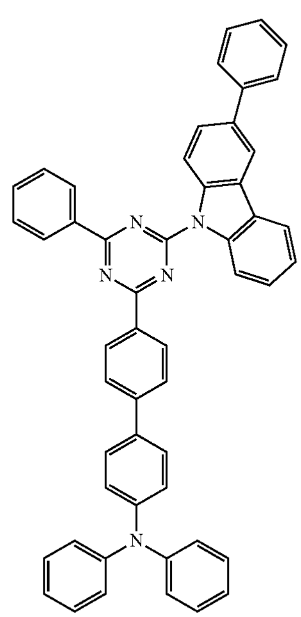

-continued
[65]
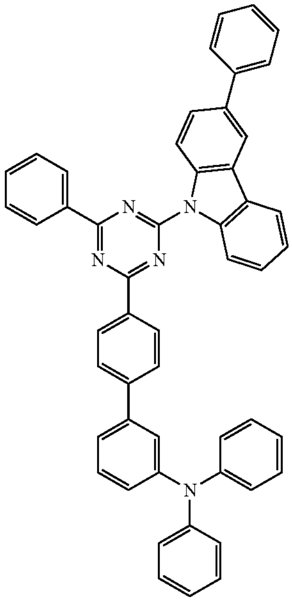
[66]
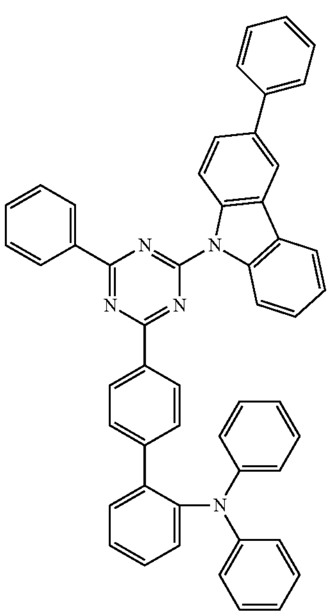
-continued
[67]
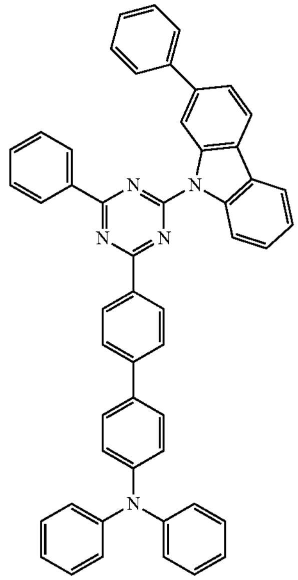
[68]
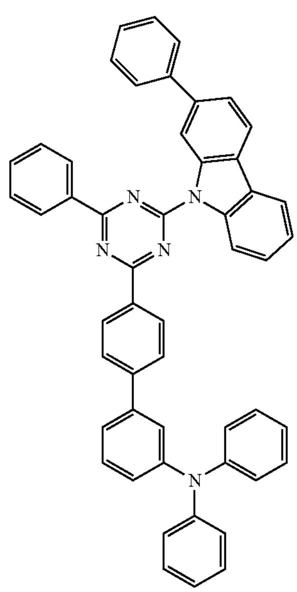

-continued
[69]
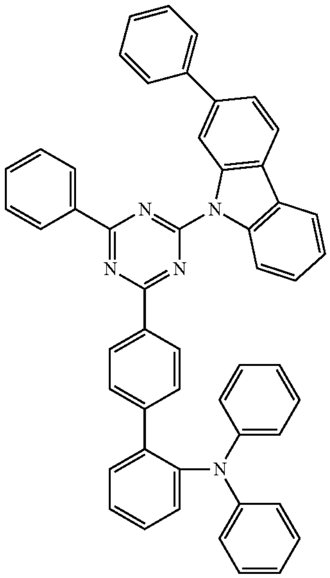
[70]
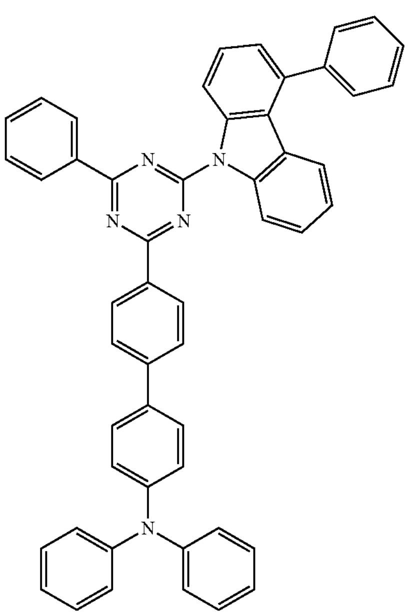
-continued
[71]
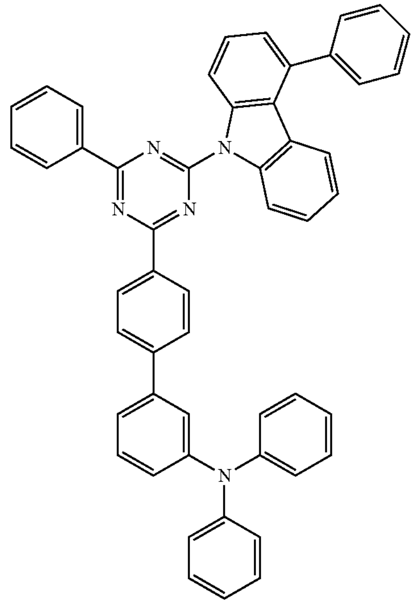
[72]
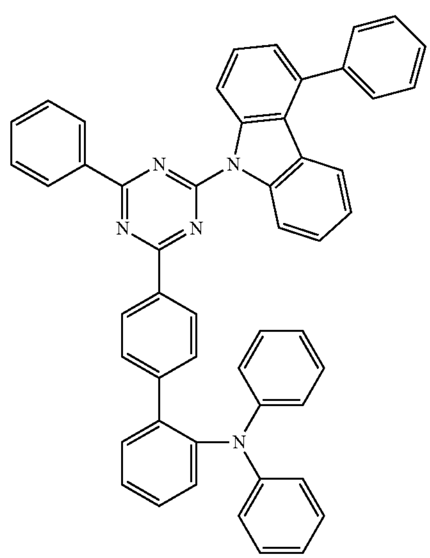

[73]
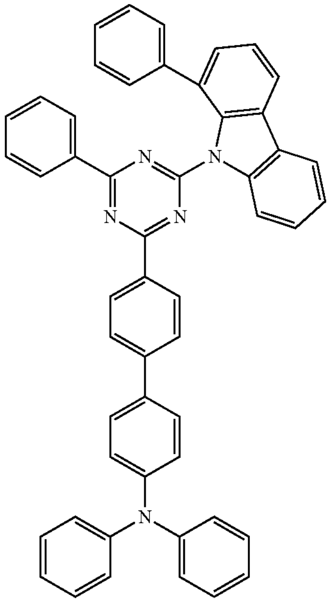
[74]
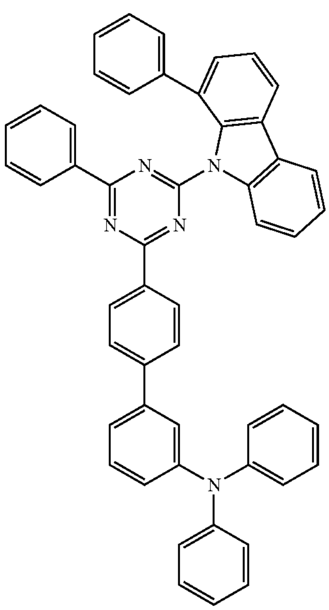
[75]
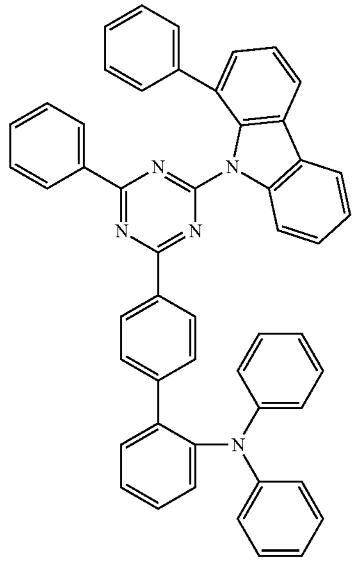
[76]
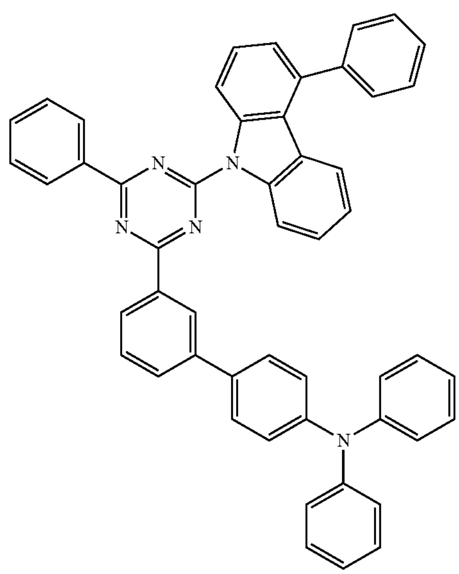

-continued
[77]
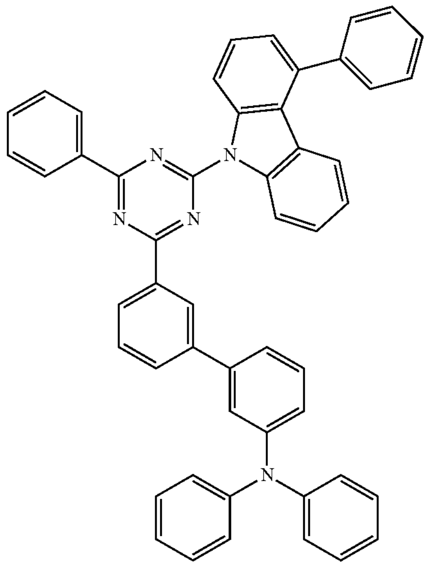
[78]
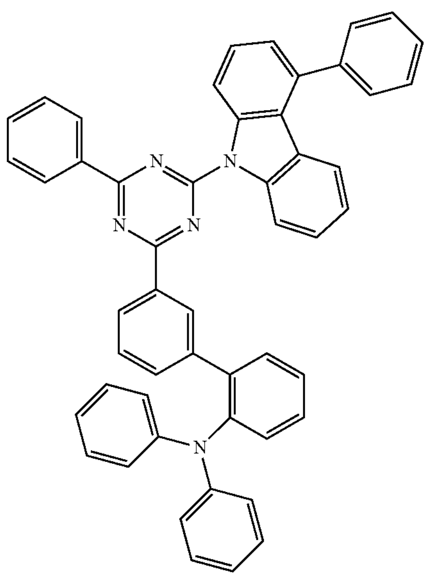
[79]
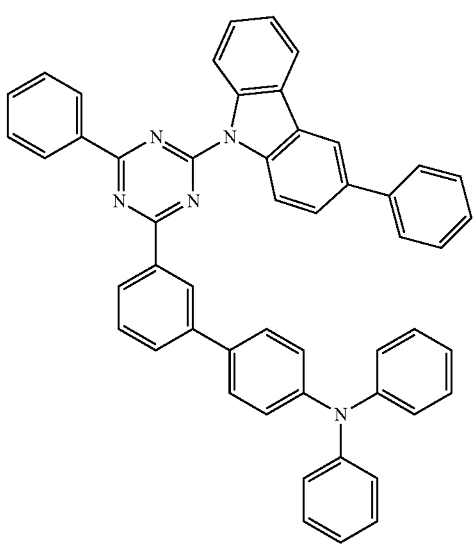
-continued
[80]
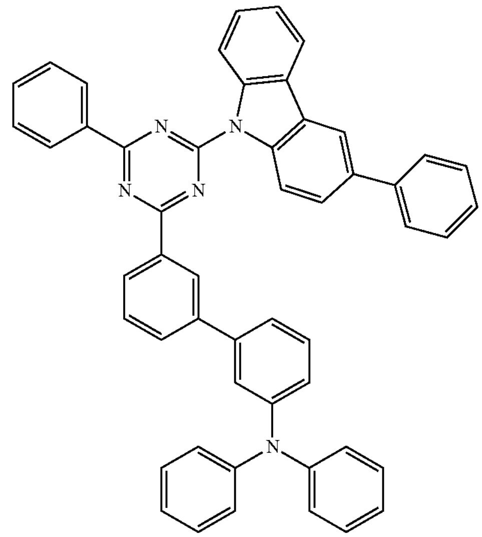
[81]
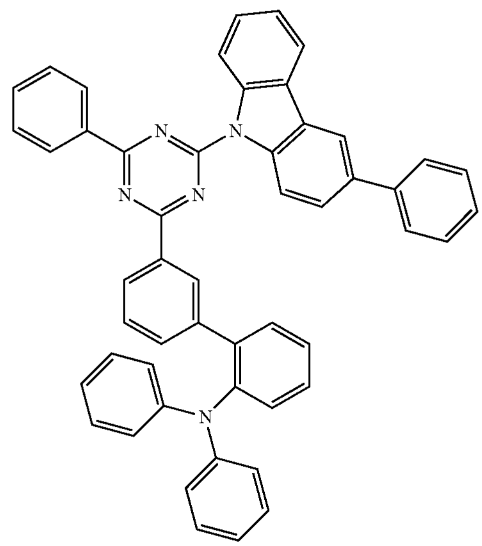
[82]
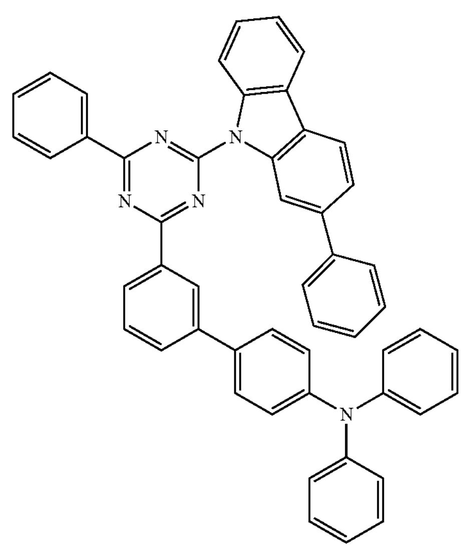

-continued
[83]
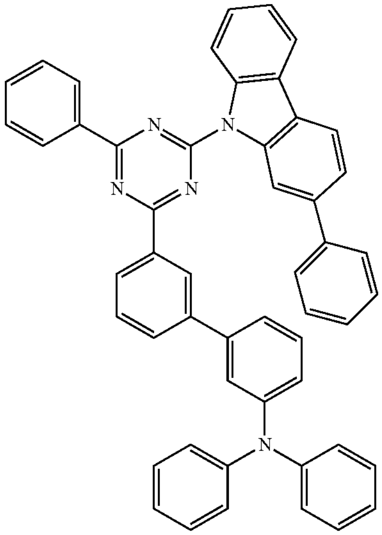
[84]
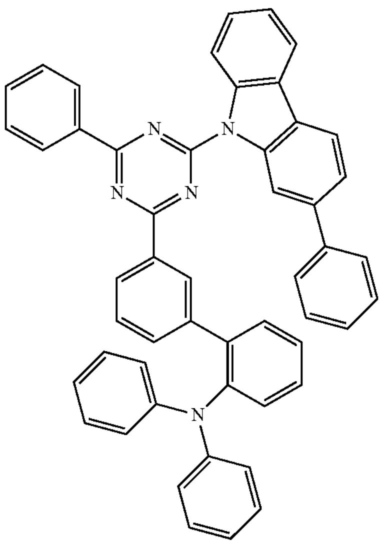
[85]
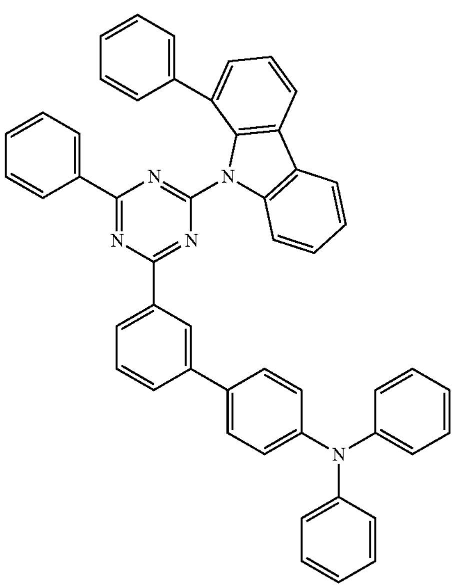
-continued
[86]
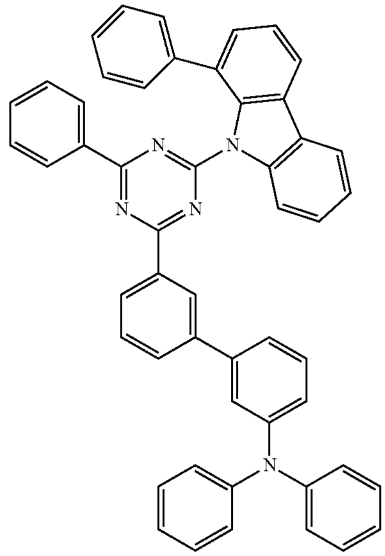
[87]
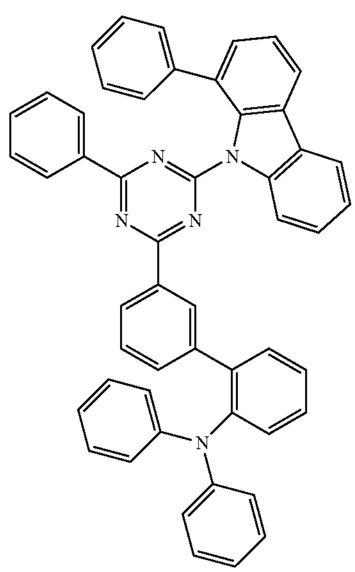

-continued
[88]
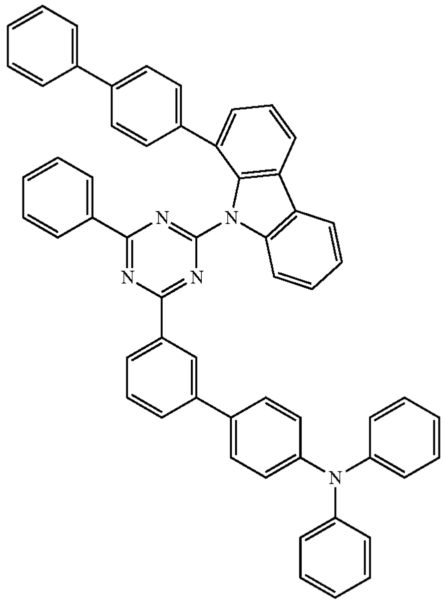
[89]
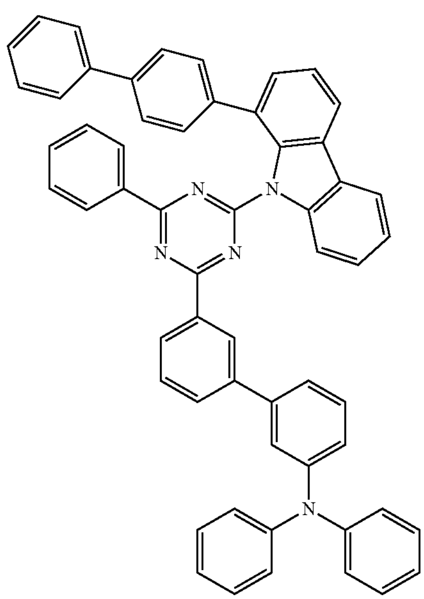
-continued
[90]
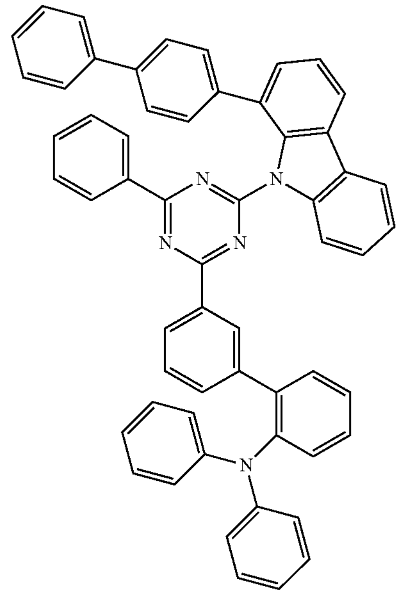
[91]
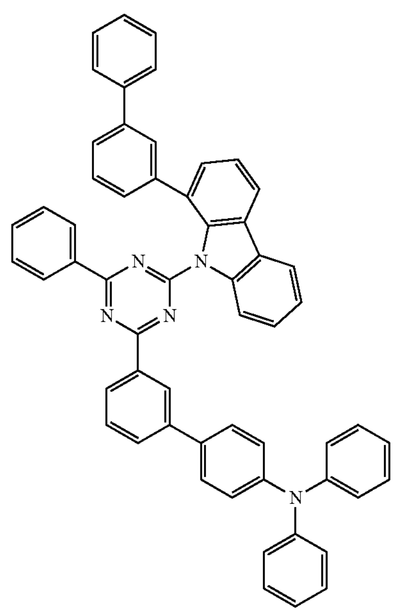

[92]
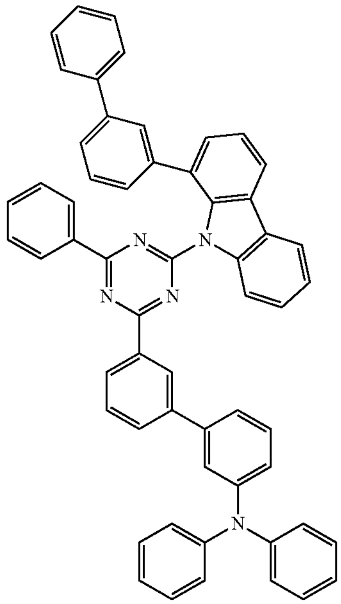
[93]
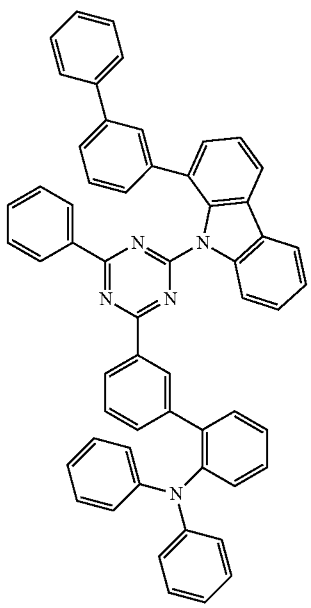
[94]
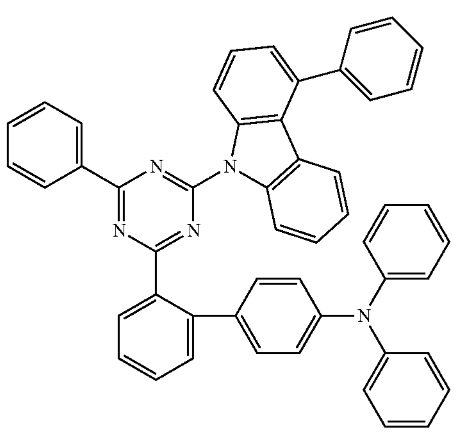
[95]
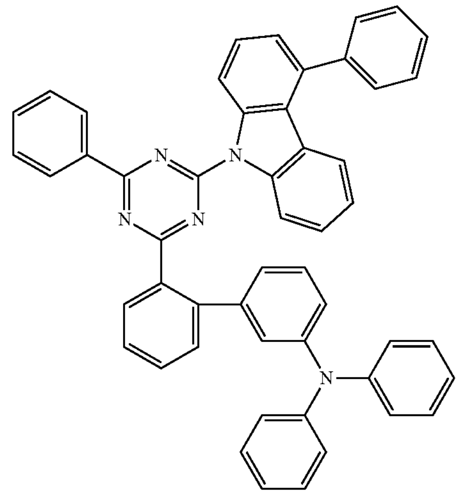
[96]
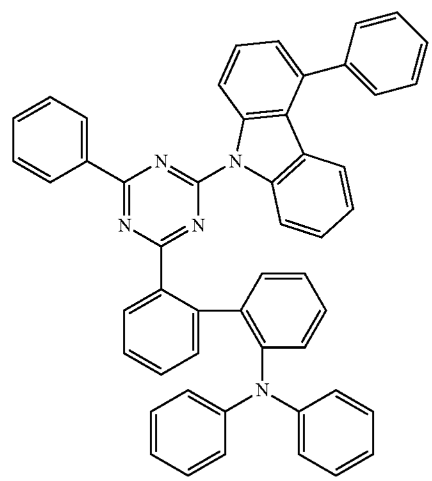
[97]
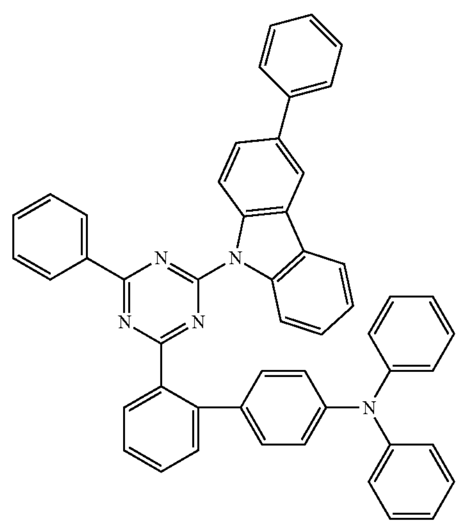

-continued
[98]
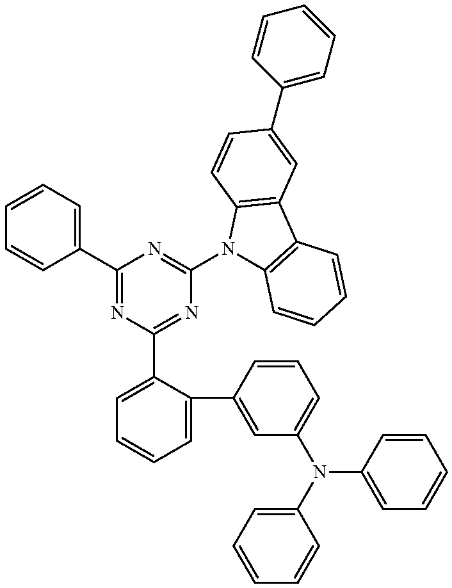
[99]
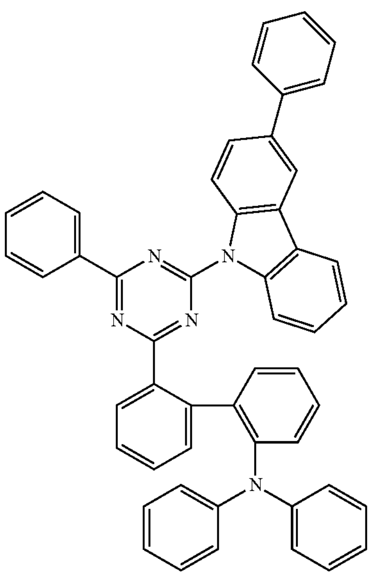
[100]
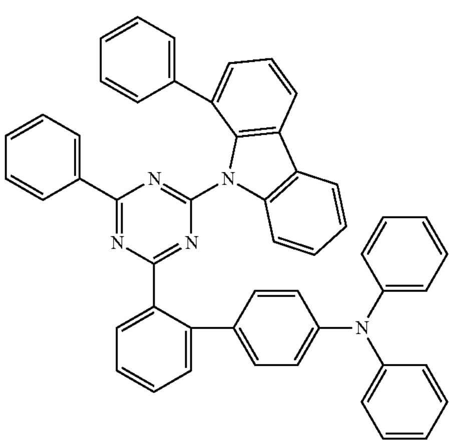
-continued
[101]
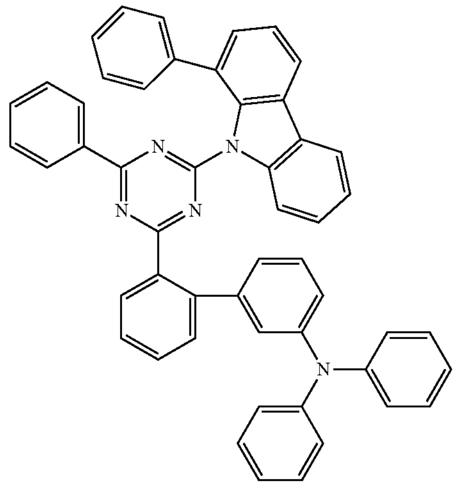
[102]
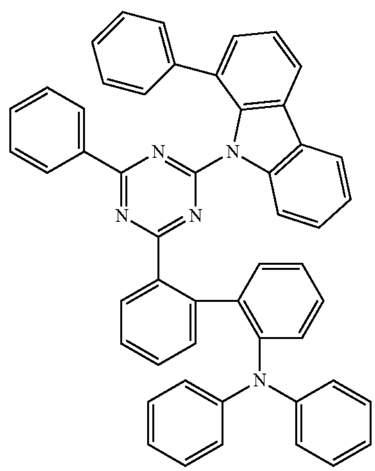
[103]
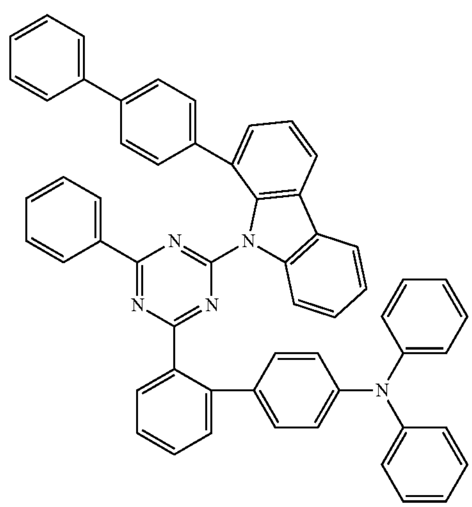

-continued
[104]
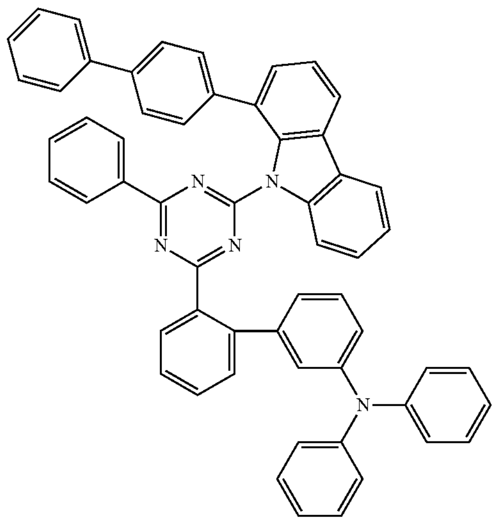
[105]
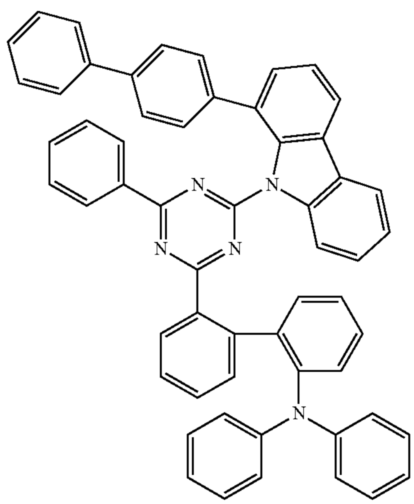
[106]
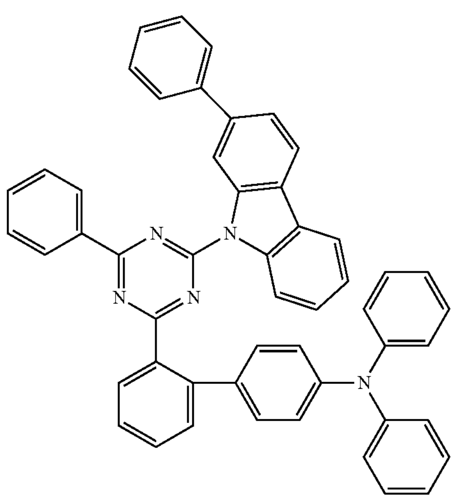
-continued
[107]
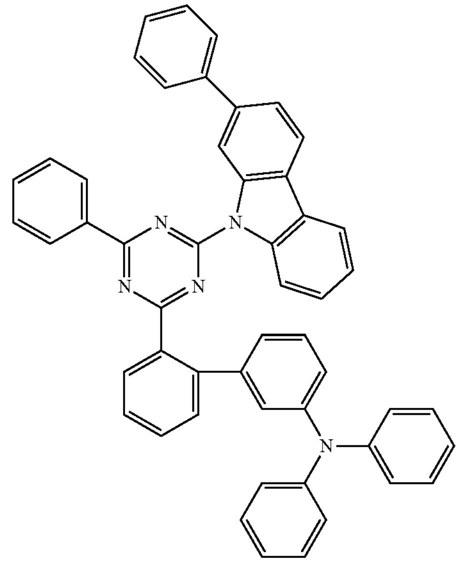
[108]
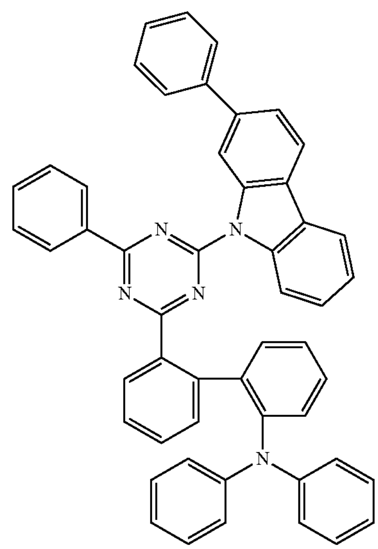
[109]
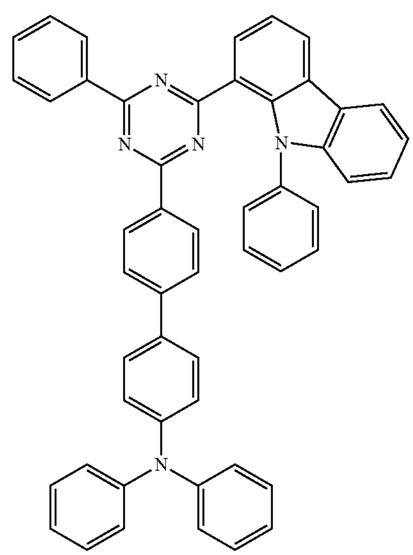

-continued
[110]
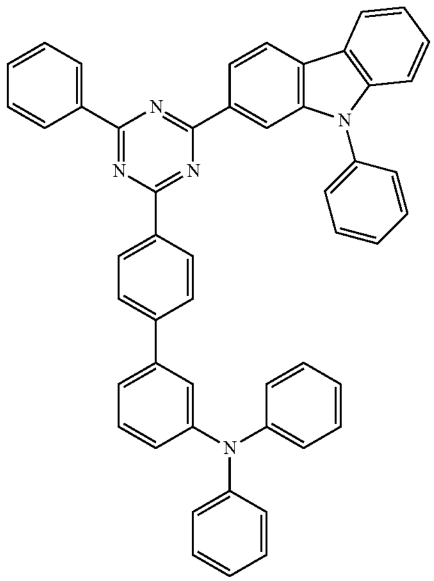
[111]
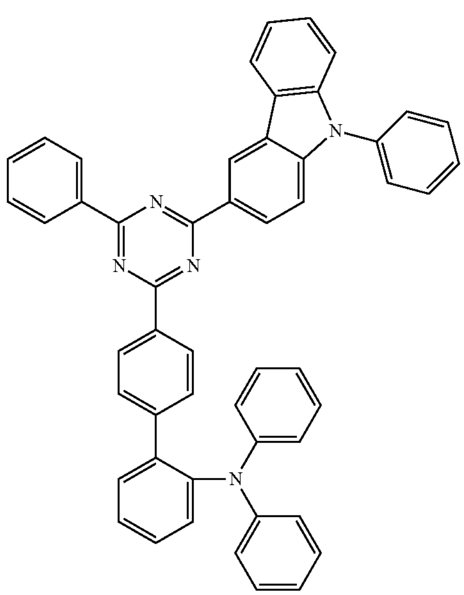
-continued
[112]
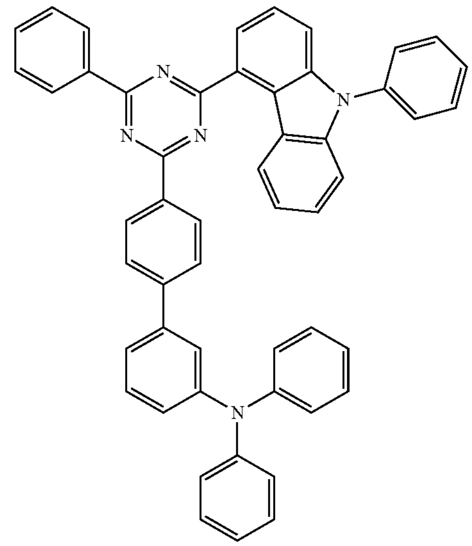
[113]
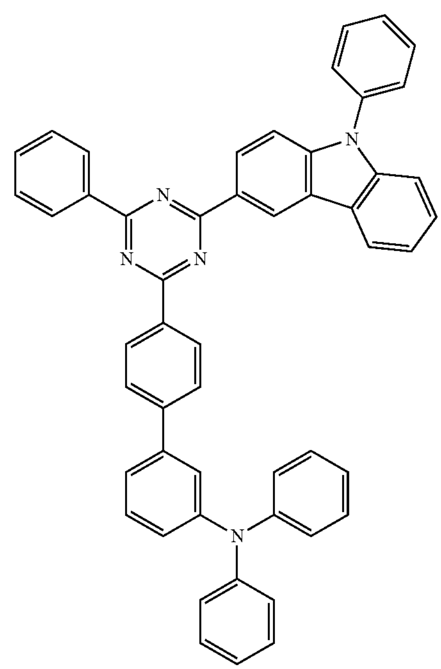

-continued
[114]
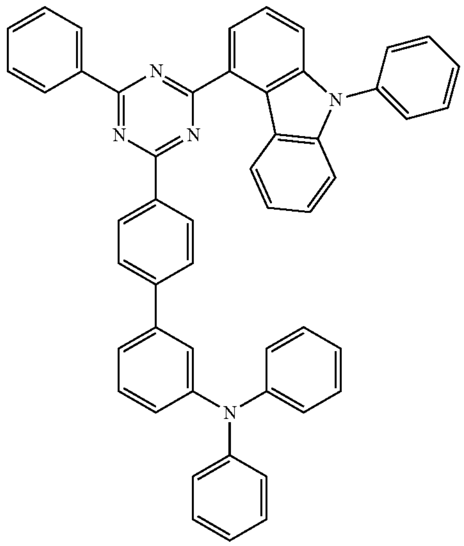
[115]
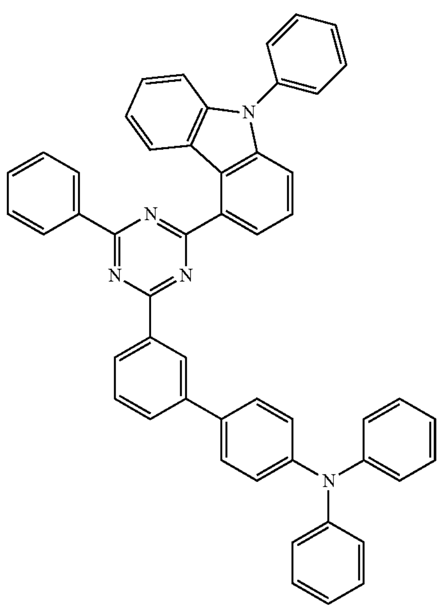
-continued
[116]
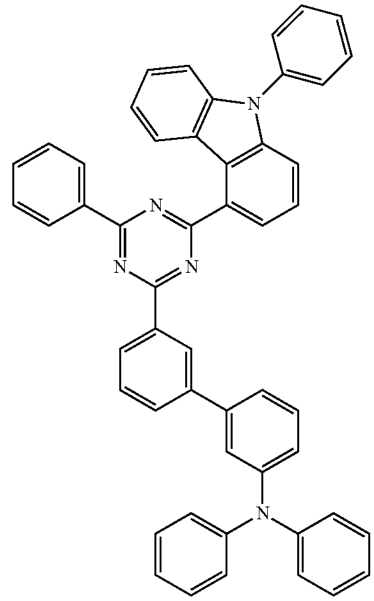
[117]
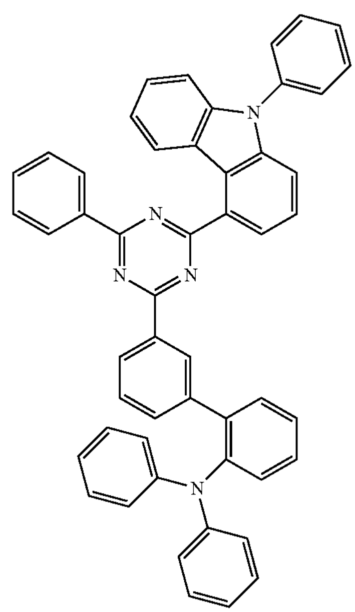

-continued

[118]

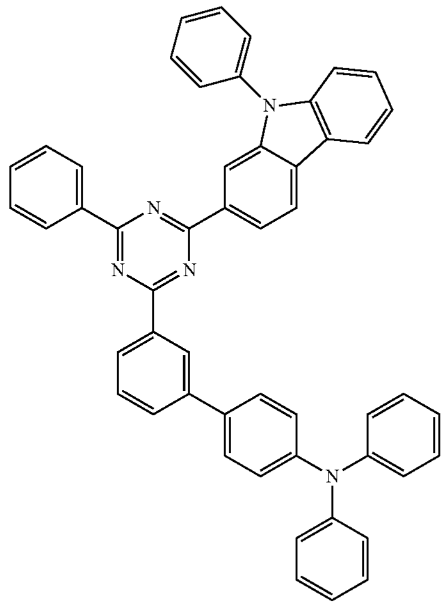

[119]

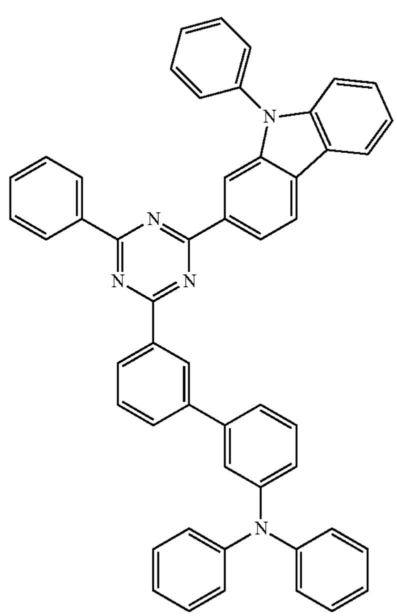

-continued

[120]

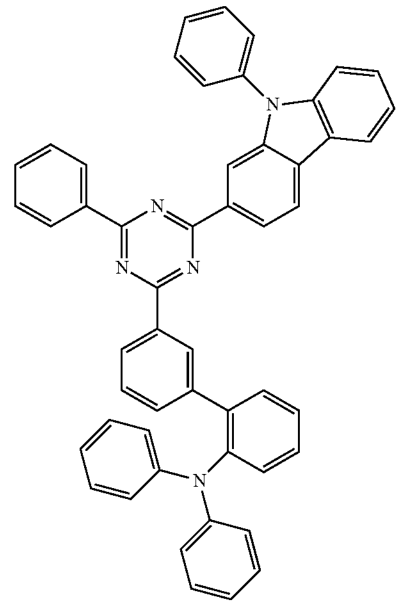

The embodiments may be realized by providing a composition for an organic optoelectronic device, the composition including a first compound and a second compound, wherein the first compound is the compound for an organic optoelectronic device according to an embodiment, and the second compound is represented by Chemical Formula 2; or a combination of Chemical Formula 3 and Chemical Formula 4,

[Chemical Formula 2]

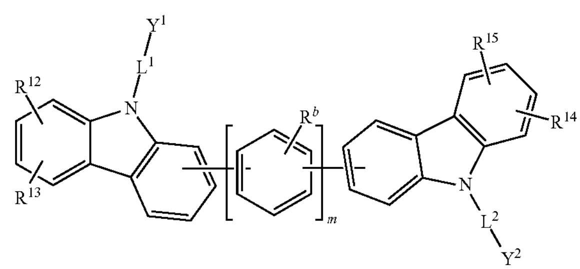

in Chemical Formula 2, $Y^1$ and $Y^2$ are independently a substituted or unsubstituted C6 to C20 aryl group or a substituted or unsubstituted C2 to C30 heterocyclic group, $L^1$ and $L^2$ are independently a single bond or a substituted or unsubstituted C6 to C20 arylene group, $R^1$ and $R^{12}$ to $R^{15}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and m is an integer of 0 to 2;

[Chemical Formula 3]

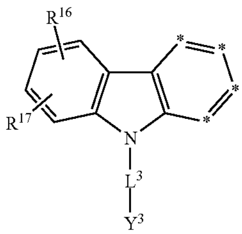

[Chemical Formula 4]

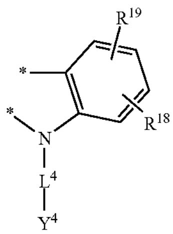

in Chemical Formulas 3 and 4, $Y^3$ and $Y^4$ are independently a substituted or unsubstituted C6 to C20 aryl group or a substituted or unsubstituted C2 to C30 heterocyclic group, adjacent two *s of Chemical Formula 3 are linked to Chemical Formula 4, *s of Chemical Formula 3 not linked to Chemical Formula 4 are independently C-$L^a$-$R^c$, $L^a$, $L^3$ and $L^4$ are independently a single bond or a substituted or unsubstituted C6 to C20 arylene group, and $R^c$ and $R^{16}$ to $R^{19}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

The second compound may be represented by Chemical Formula 2, the compound represented by Chemical Formula 2 may be represented by Chemical Formula 2-8:

[Chemical Formula 2-8]

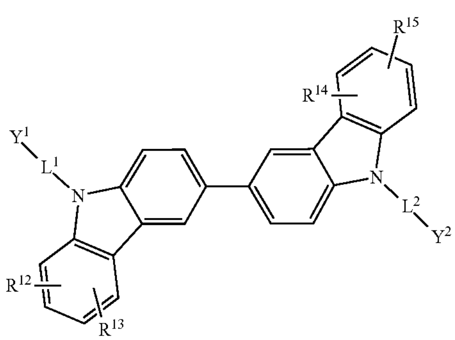

in Chemical Formula 2-8, $R^{12}$ to $R^{15}$ may be independently hydrogen or a substituted or unsubstituted C6 to C12 aryl group, and *-$L^1$-$Y^1$ and *-$L^2$-$Y^2$ may be independently a moiety of Group I,

[Group I]

C-1

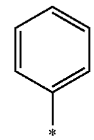

C-2

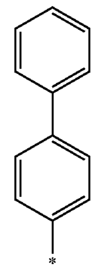

C-3

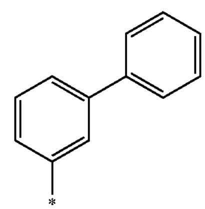

C-4

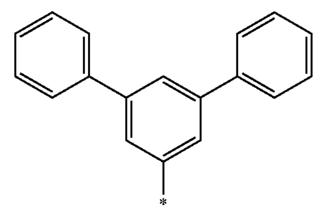

C-5

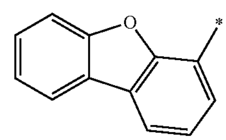

C-6

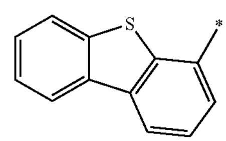

C-7

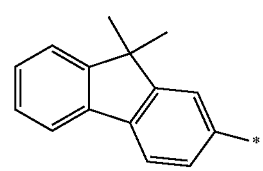

C-8

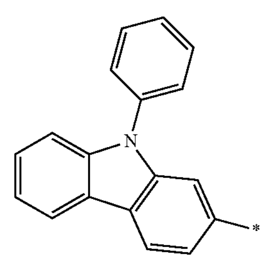

-continued
C-9
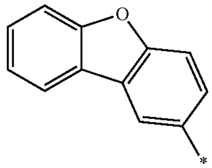
C-10
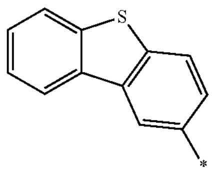
C-11
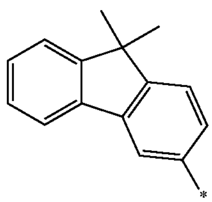
C-12
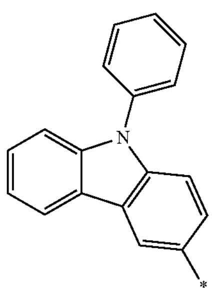
C-13
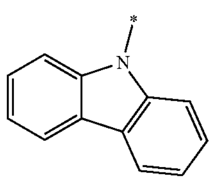
C-14
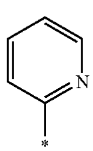
C-15
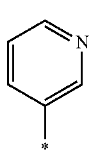
C-16
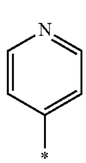
-continued
C-17
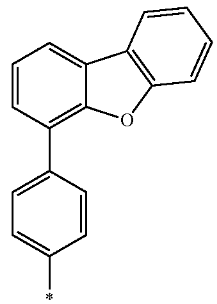
C-18
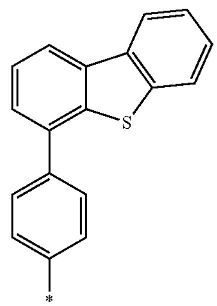
C-19
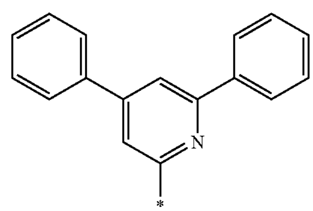
C-20
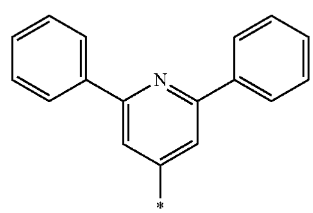
C-21
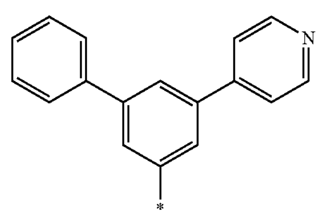
C-22
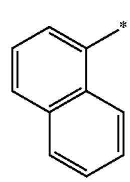
C-23
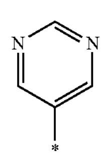

-continued

C-24

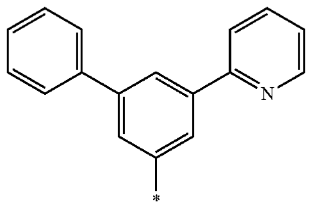

C-25

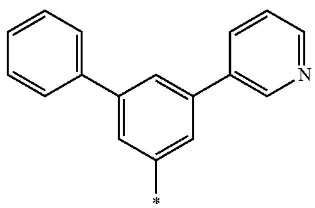

C-26

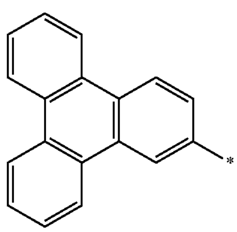

C-27

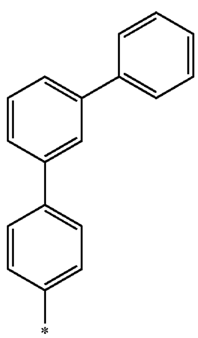

C-28

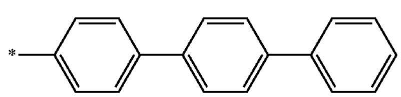

C-29

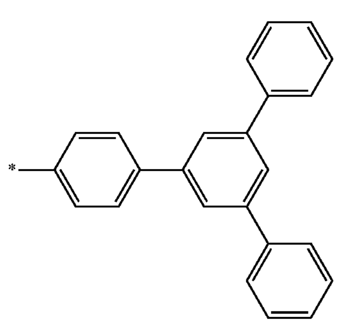

C-30

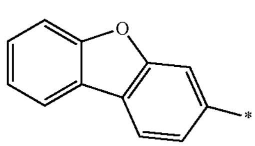

-continued

C-31

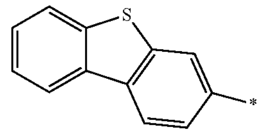

C-32

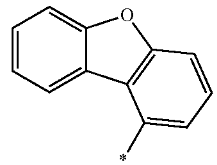

C-33

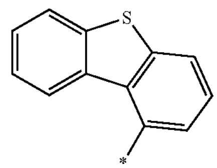

in Group I, * is a linking point.

*-$L^1$-$Y^1$ and *-$L^2$-$Y^2$ of Chemical Formula 2-8 may be independently one of moieties C-1, C-2, C-3, C-19, and C-26 of Group I.

The embodiments may be realized by providing an organic optoelectronic device including an anode and a cathode facing each other, at least one organic laver between the anode and the cathode, wherein the at least one organic layer includes the compound for an organic optoelectronic device according to an embodiment.

The at least one organic layer may include a light emitting layer, and the light emitting layer may include the compound for an organic optoelectronic device.

The embodiments may be realized by providing an organic optoelectronic device including an anode and a cathode facing each other, at least one organic layer between the anode and the cathode, wherein the at least one organic layer includes the composition for an organic optoelectronic device according to an embodiment.

The at least one organic layer may include a light emitting layer, and the light emitting layer may include the composition for an organic optoelectronic device.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
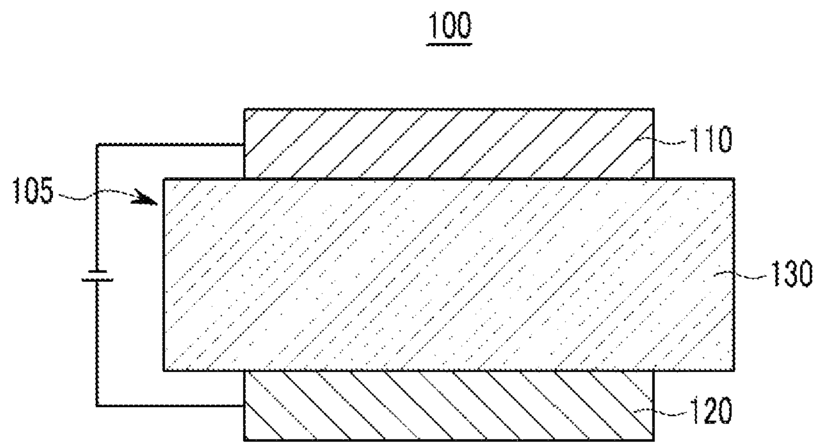
FIGS. 1 and 2 are cross-sectional views of organic light emitting diodes according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

In the present specification, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples, "substituted" refers to replacement of at least one hydrogen of a substituent or a compound by deuterium, a C1 to C20 alkyl group, a C6 to C30 aryl group, or a cyano group. In addition, in specific examples, "substituted" refers to replacement of at least one hydrogen of a substituent or a compound by deuterium, a C1 to C5 alkyl group, a C6 to C18 aryl group, or a cyano group. In addition, in specific examples, "substituted" refers to replacement of at least one hydrogen of a substituent or a compound by deuterium, a cyano group, a methyl group, an ethyl group, propyl group, a butyl group, a phenyl group, a biphenyl group, a terphenyl group, or a naphthyl group.

In the present specification, when a definition is not otherwise provided, "hetero" refers to one including one to three heteroatoms selected from N, O, S, P, and Si, and remaining carbons in one functional group.

In the present specification, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example a fluorenyl group, and the like.

The aryl group may include a monocyclic, polycyclic or fused ring polycyclic (i.e., rings sharing adjacent pairs of carbon atoms) functional group.

In the present specification, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for the organic optoelectronic device according to an embodiment may be, e.g., represented by Chemical Formula 1.

[Chemical Formula 1]

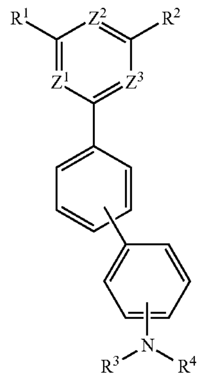

In Chemical Formula 1, $Z^1$ to $Z^3$ may each independently be, e.g., N or $CR^a$. In an implementation, at least two of $Z^1$ to $Z^3$ may be N. In an implementation, all of $Z^1$ to $Z^3$ may be N.

$R^1$ may be or may include, e.g., a substituted or unsubstituted carbazolyl group.

$R^2$ to $R^4$ may each independently be or include, e.g., a substituted or unsubstituted C6 to C20 aryl group.

$R^a$ may be or may include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

The compound represented by Chemical Formula 1 may help improve carrier balance in the light emitting layer to be driven at a low voltage by simultaneously including an amine group and a nitrogen-containing (e.g., heterocyclic) hexagonal or six-membered ring moiety, thus controlling hole mobility of the amine group and electron mobility of the nitrogen-containing six-membered ring moiety through a LUMO region.

In an implementation, by additionally including a carbazole moiety on the nitrogen-containing six-membered ring moiety, high efficiency and long life-span device characteristics may be realized.

Chemical Formula 1 may be represented by, e.g., one of Chemical Formula 1A to Chemical Formula 1C, depending on the specific form or arrangement of biphenylene linking the amine group with the nitrogen-containing six-membered ring.

[Chemical Formula 1A]

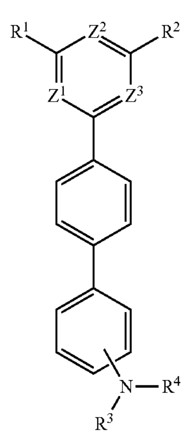

-continued

[Chemical Formula 1B]

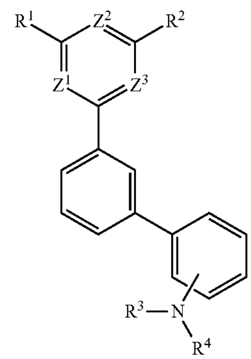

[Chemical Formula 1C]

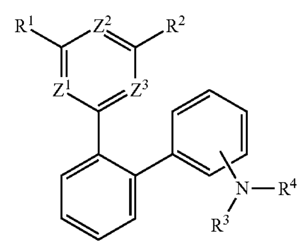

In Chemical Formula 1A to Chemical Formula 1C, $Z^1$ to $Z^3$, and $R^1$ to $R^4$ are defined the same as those described above.

In an implementation, the compound for the organic optoelectronic device according to an embodiment may be represented by Chemical Formula 1A or Chemical Formula 1B.

In an implementation, Chemical Formula 1A may be represented by one of Chemical Formulae 1A-1 to 1A-3.

[Chemical Formula 1A-1]

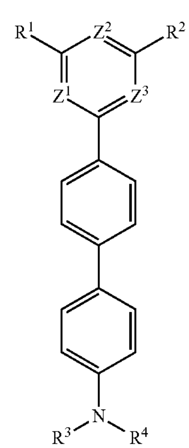

-continued

[Chemical Formula 1A-2]

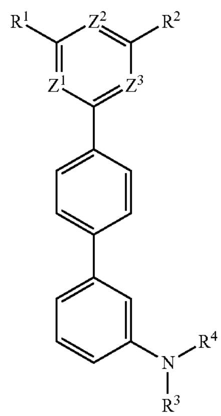

[Chemical Formula 1A-3]

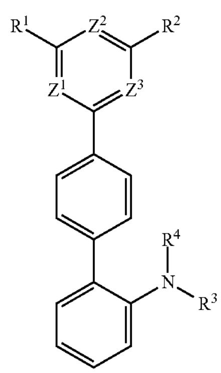

In Chemical Formulae 1A-1 to 1A-3, $Z^1$ to $Z^3$, and $R^1$ to $R^4$ may be defined the same as those described above.

In an implementation, Chemical Formula 1B may be represented by one of Chemical Formula 1B-1 to Chemical Formula 1B-3.

[Chemical Formula 1B-1]

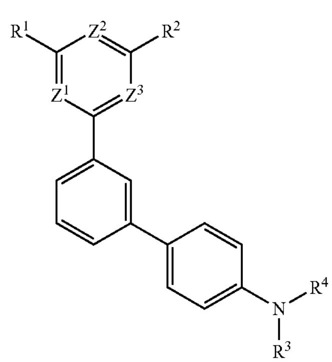

-continued

[Chemical Formula 1B-2]

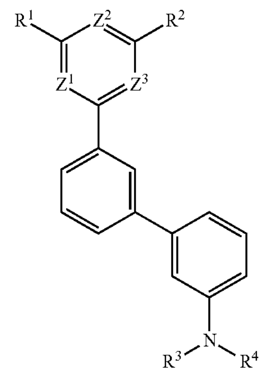

[Chemical Formula 1B-3]

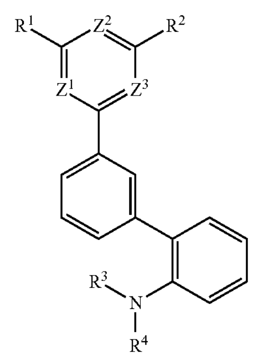

In Chemical Formula 1B-1 to Chemical Formula 1B-3, $Z^1$ to $Z^3$, and $R^1$ to $R^4$ may be defined the same as those described above.

In an implementation, the compound for the organic optoelectronic device may be represented by Chemical Formula 1A-1 or Chemical Formula 1A-2.

In an implementation, Chemical Formula 1 may be represented by Chemical Formula 1D or Chemical Formula 1E.

[Chemical Formula 1D]

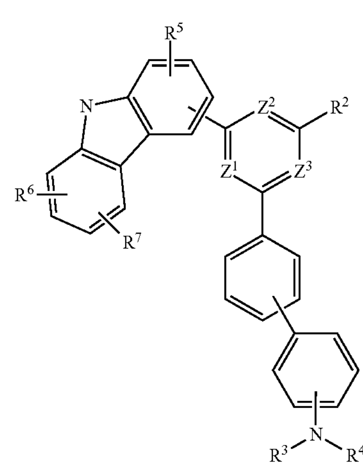

-continued

[Chemical Formula 1E]

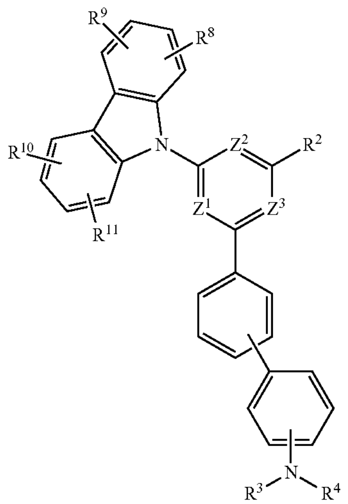

In Chemical Formula 1D and Chemical Formula 1E, $Z^1$ to $Z^3$, and $R^2$ to $R^4$ may be defined the same as those described above. $R^5$ to $R^{11}$ may each independently be or include, e.g., hydrogen, deuterium, a substituted or unsubstituted C1 to C10 alkyl group, a substituted or unsubstituted C6 to C20 aryl group or a combination thereof.

In an implementation, Chemical Formula 1D may be represented by one of Chemical Formula 1D-1 to Chemical Formula 1D-4.

[Chemical Formula 1D-1]

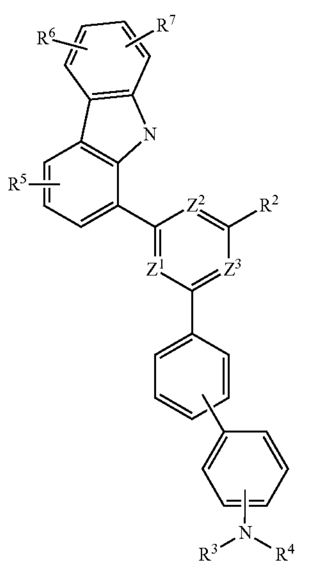

-continued

[Chemical Formula 1D-2]

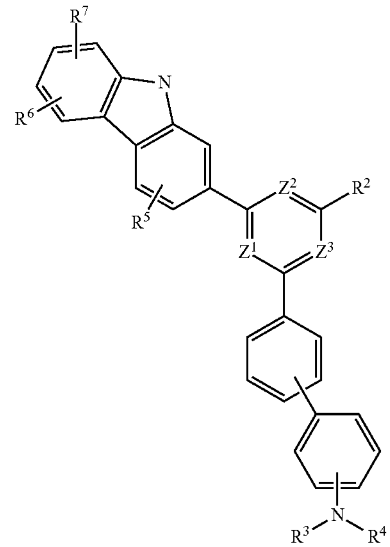

[Chemical Formula 1D-3]

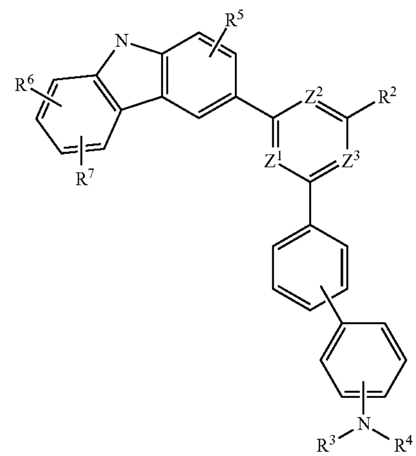

[Chemical Formula 1D-4]

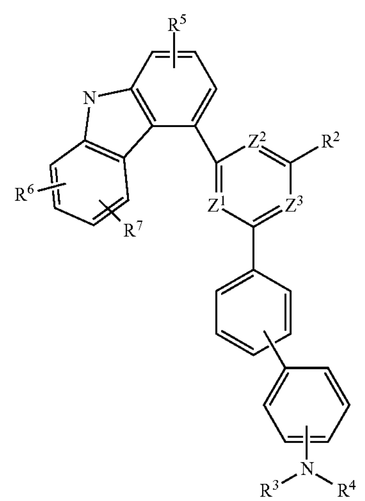

In Chemical Formula 1D-1 to Chemical Formula 1D-4, $Z^1$ to $Z^3$, and $R^2$ to $R^7$ may be defined the same as those described above.

In an implementation, the compound for the organic optoelectronic device may be represented by Chemical Formula 1E.

In an implementation, Chemical Formula 1E may be represented by one of Chemical Formula 1E-A, Chemical Formula 1E-B and Chemical Formula 1E-C.

[Chemical Formula 1E-A]

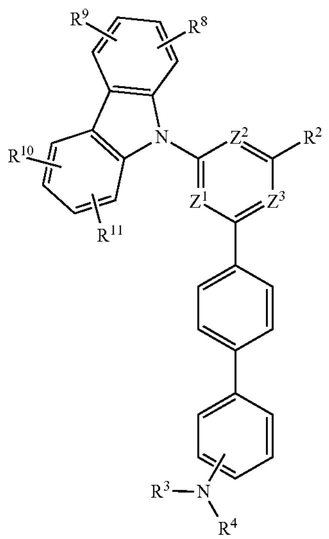

[Chemical Formula 1E-B]

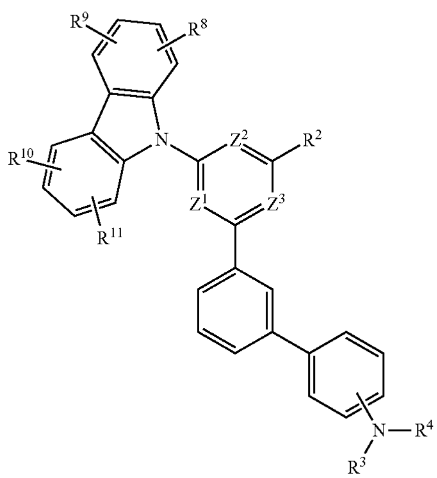

[Chemical Formula 1E-C]

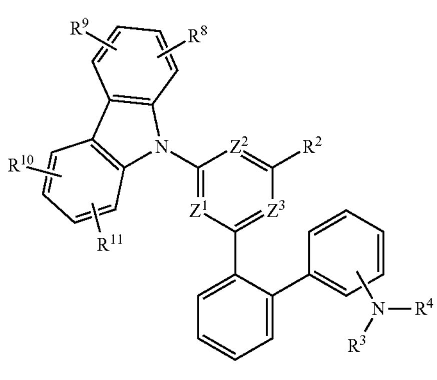

In an implementation, the compound for the organic optoelectronic device may be represented by Chemical Formula 1E-A. In an implementation, the compound for the organic optoelectronic device may be represented by one of Chemical Formula 1E-A-1, Chemical Formula 1E-A-2 and Chemical Formula 1E-A-3.

[Chemical Formula 1E-A-1]

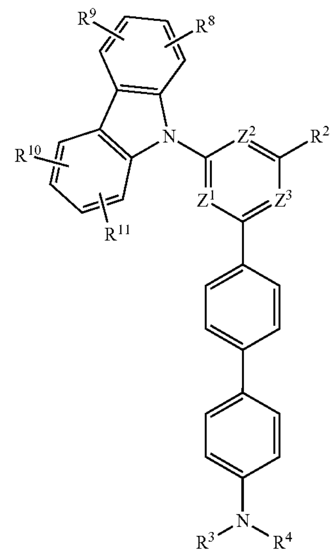

[Chemical Formula 1E-A-2]

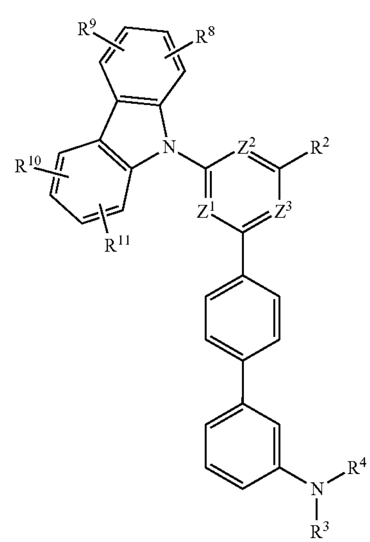

-continued

[Chemical Formula 1E-A-3]

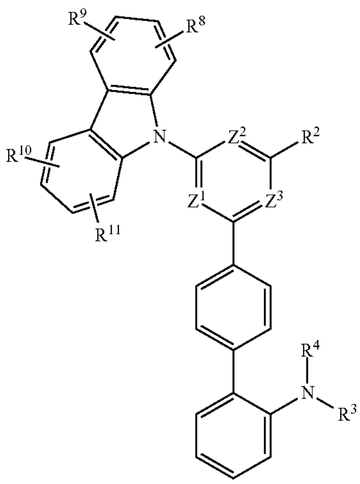

In an implementation, the compound for the organic optoelectronic device may be represented by Chemical Formula 1E-A-1 or Chemical Formula 1E-A-2.

In an implementation, $R^2$ may be or may include, e.g., a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, or a combination thereof.

In an implementation, $R^3$ and $R^4$ may each independently be or include, e.g., a substituted or unsubstituted phenyl group or a substituted or unsubstituted biphenyl group.

In an implementation, the nitrogen-containing six-membered ring moiety may be a pyrimidinyl moiety or a triazinyl moiety.

In an implementation, the compound for the organic optoelectronic device represented by Chemical Formula 1 may be a compound of Group 1.

[Group 1]

[1]

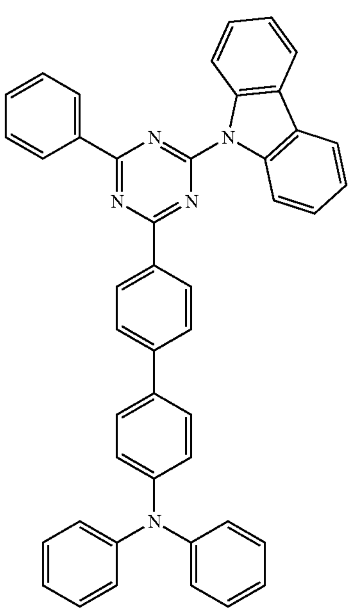

-continued

[2]

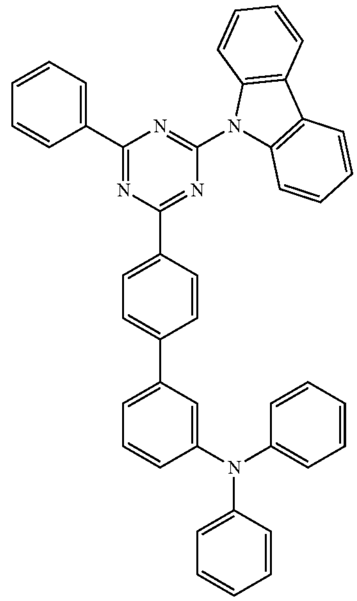

[3]

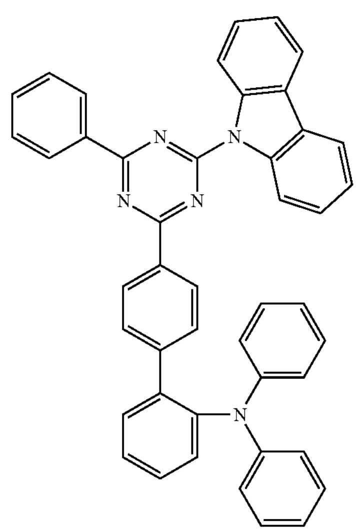

-continued
[4]
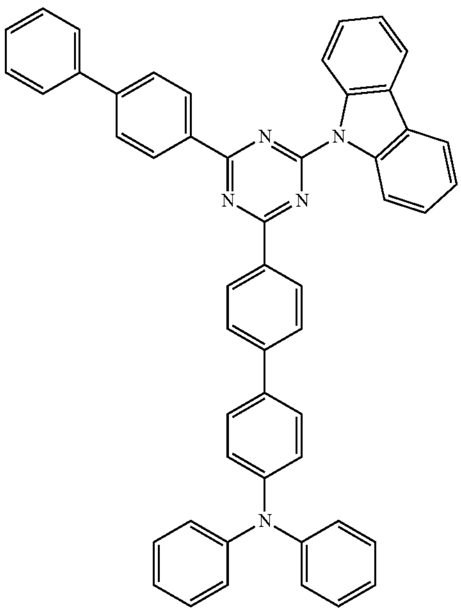
[5]
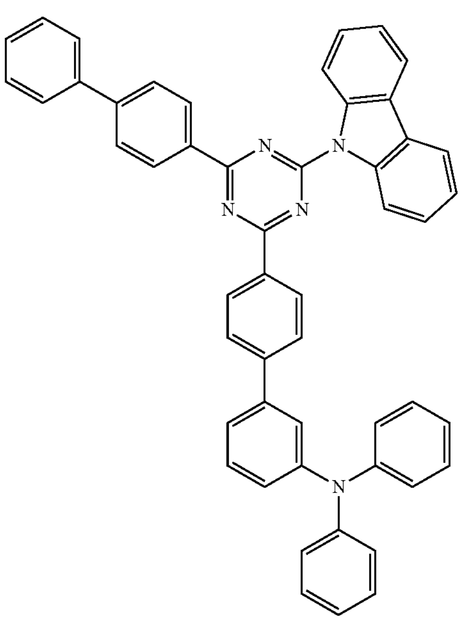
-continued
[6]
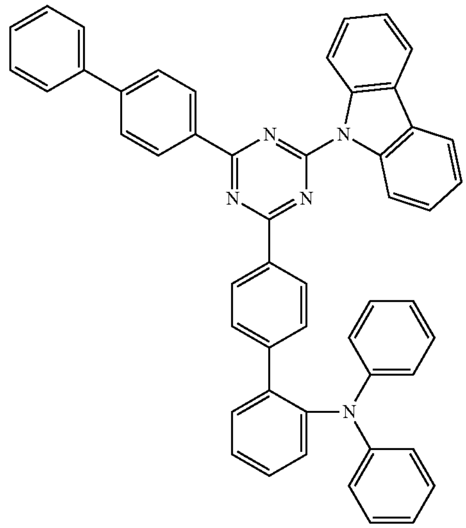
[7]
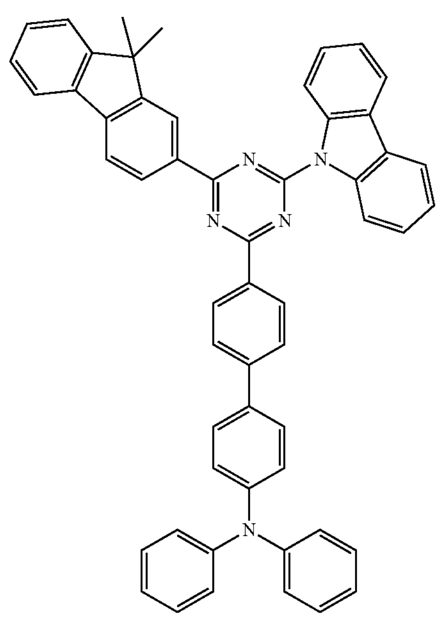

-continued
[8]
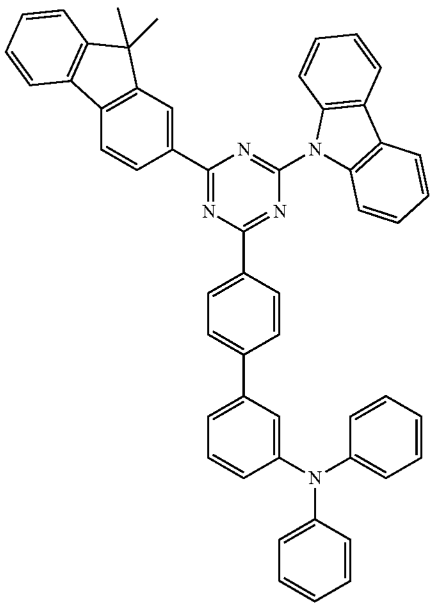
[9]
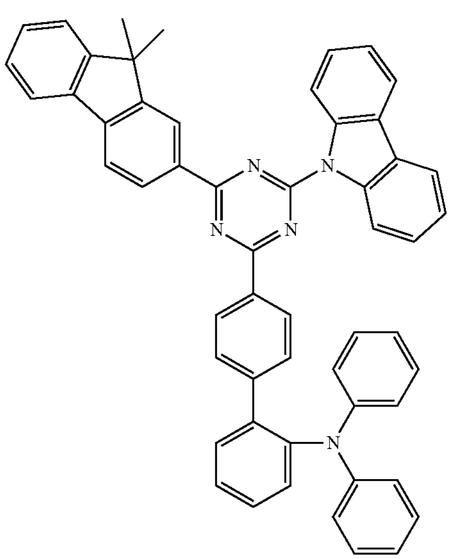
-continued
[10]
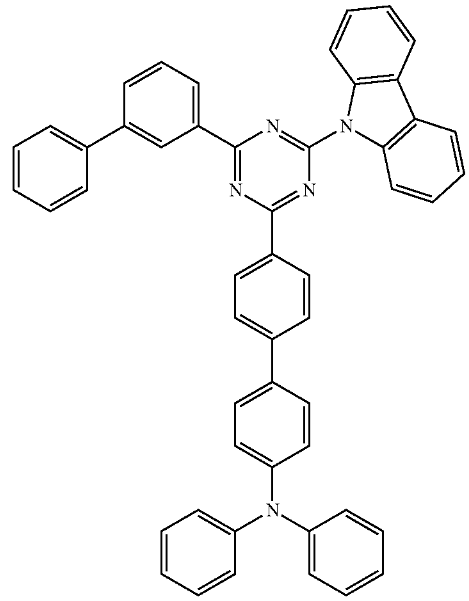
[11]
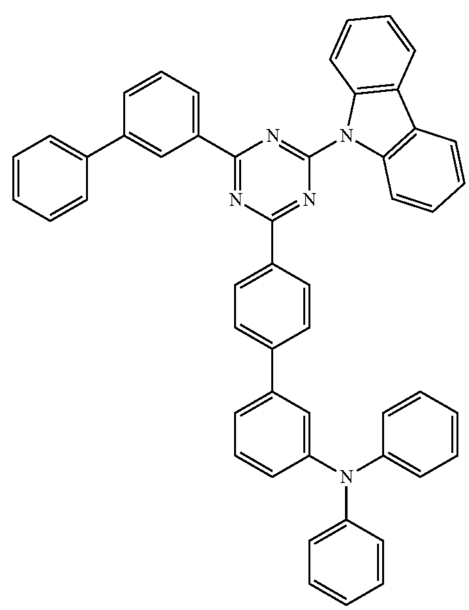

-continued
[12]
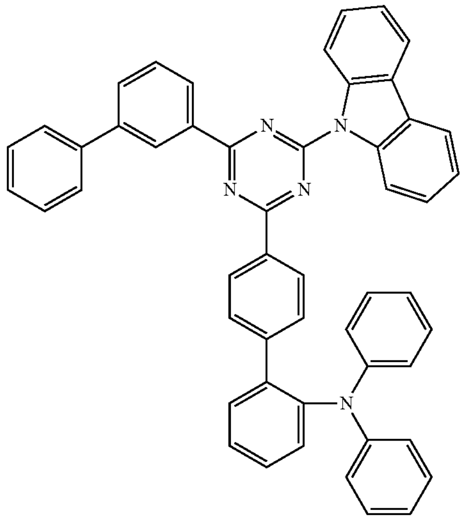
[13]
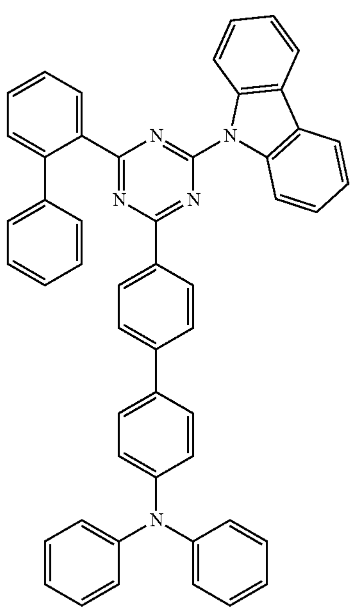
-continued
[14]
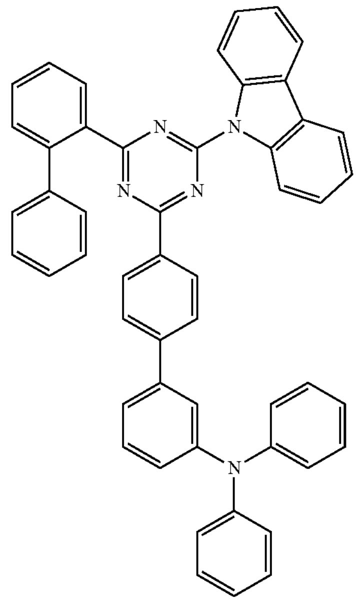
[15]
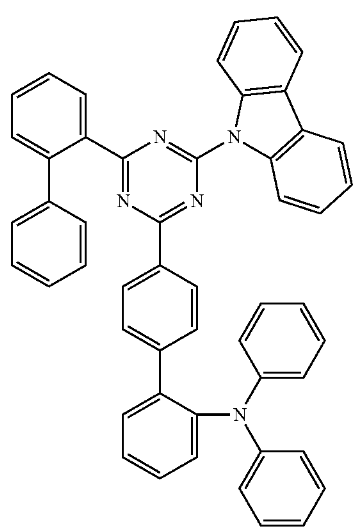

-continued
[16]
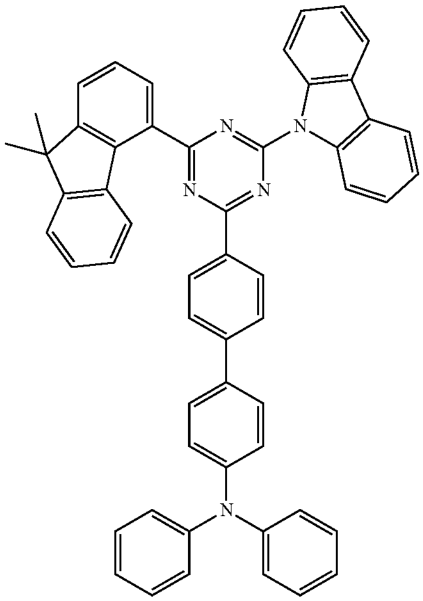
[17]
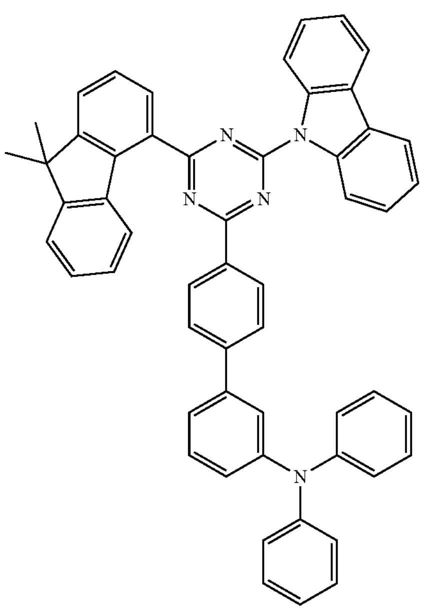
-continued
[18]
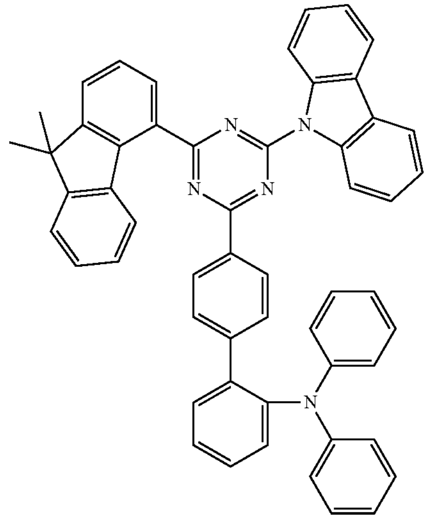
[19]
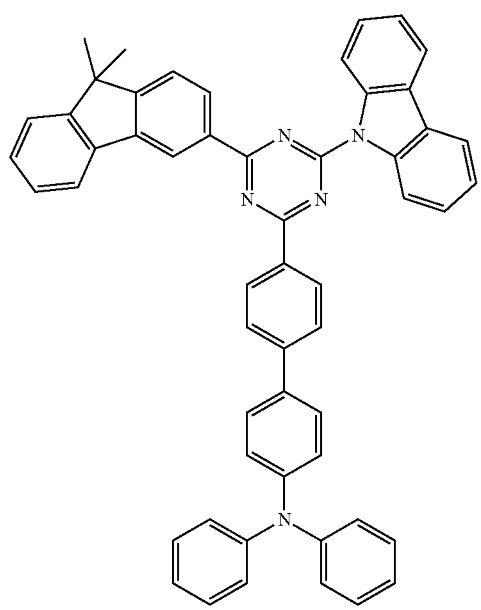

-continued
[20]
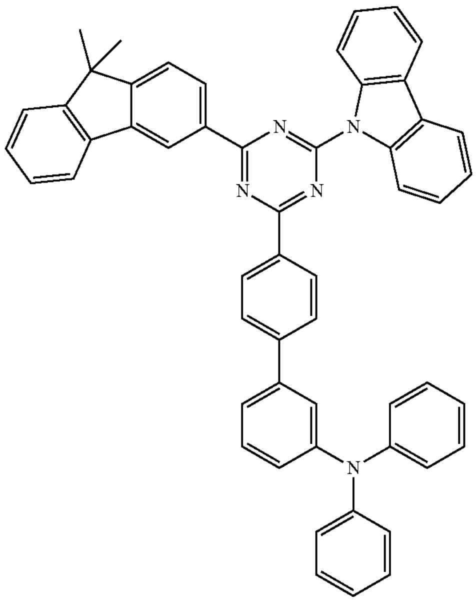
[21]
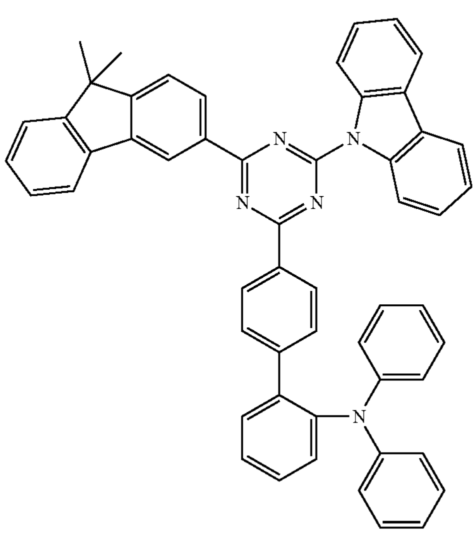
-continued
[22]
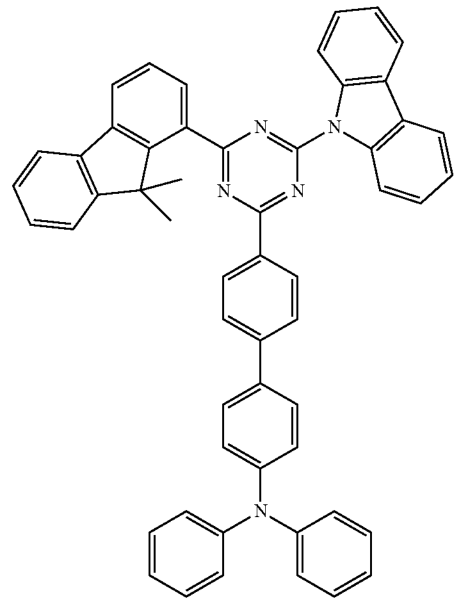
[23]
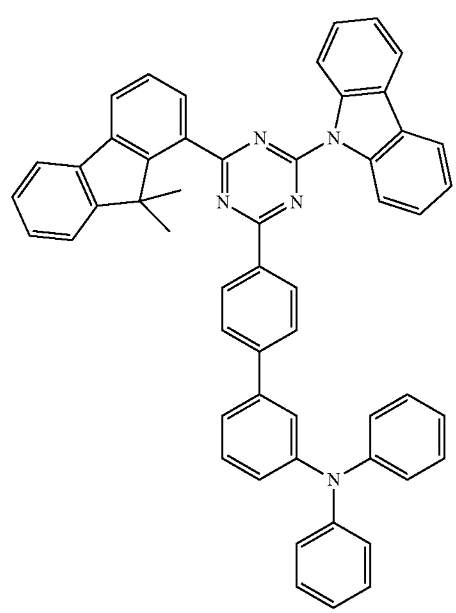

-continued
[24]
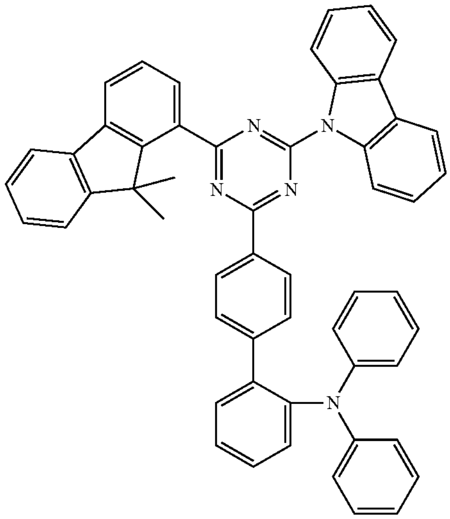
[25]
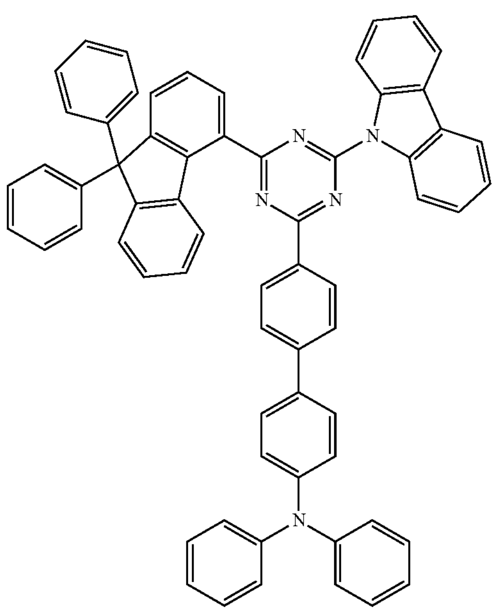
-continued
[26]
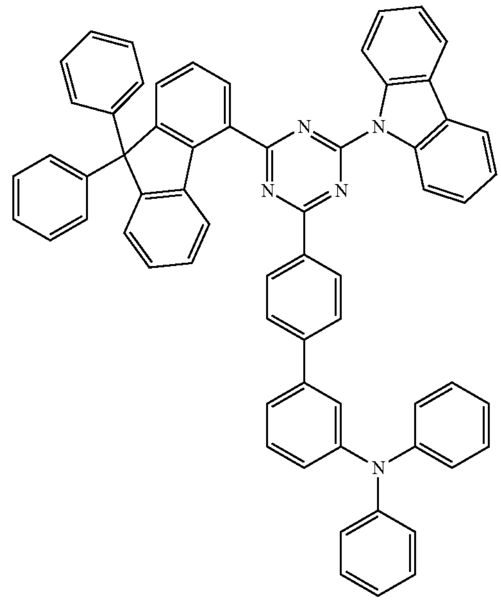
[27]
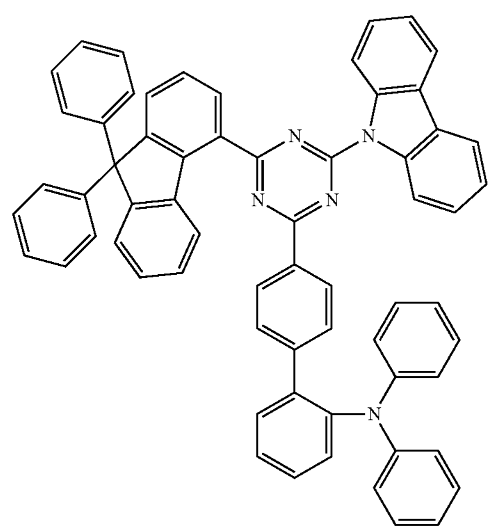

-continued
[28]
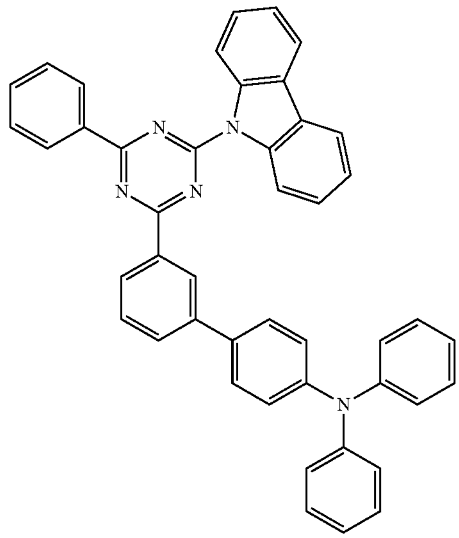
[29]
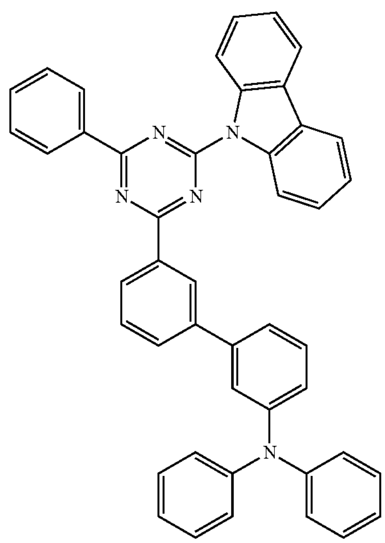
[30]
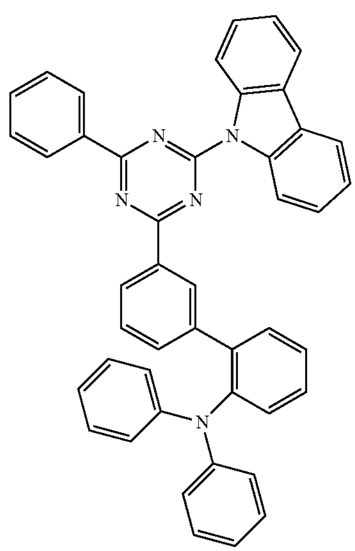
-continued
[31]
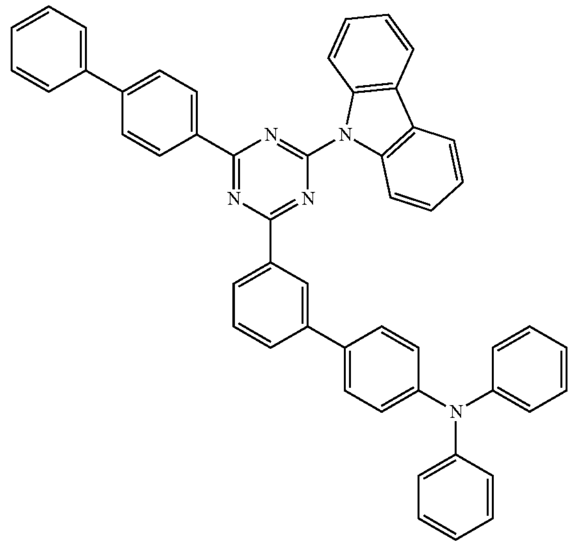
[32]
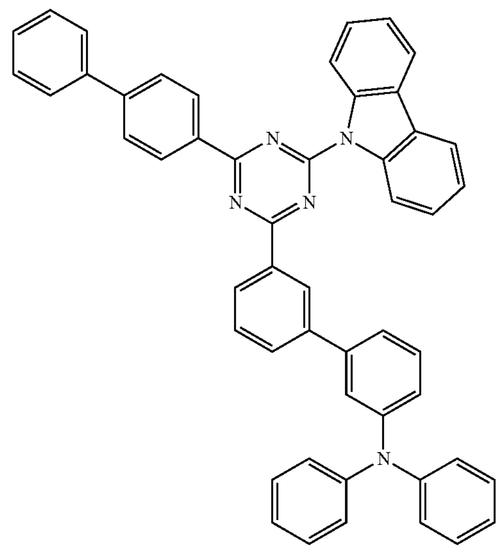

-continued
[33]
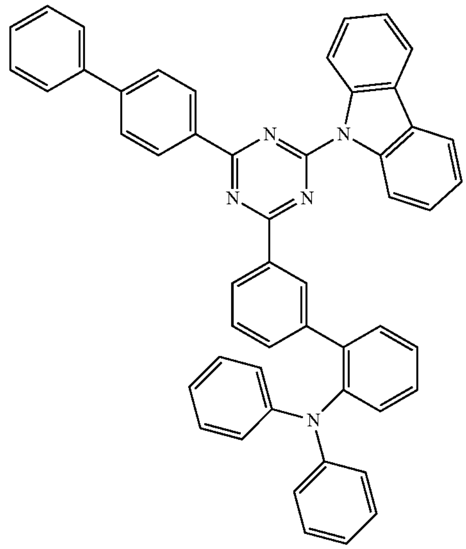
[34]
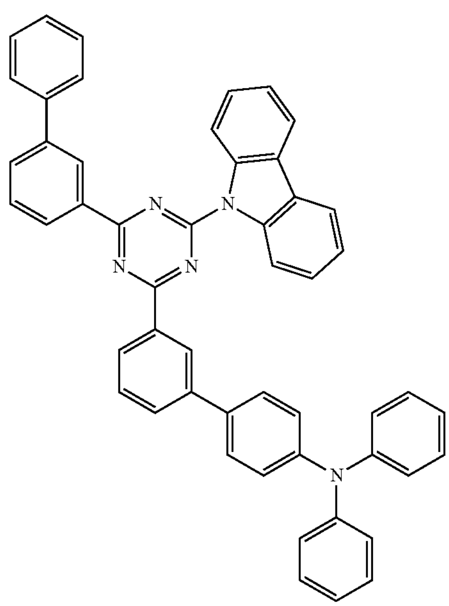
-continued
[35]
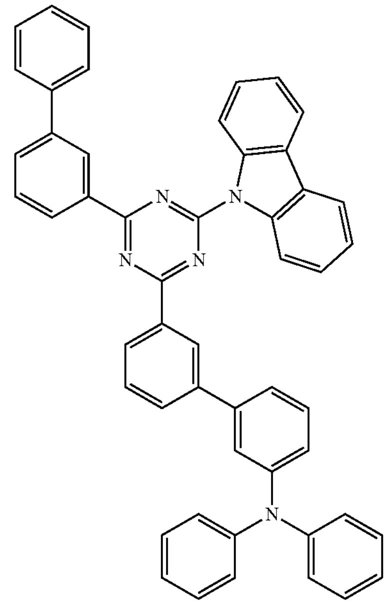
[36]
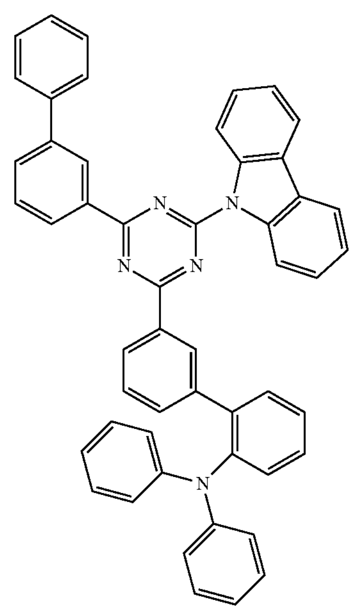

-continued
[37]
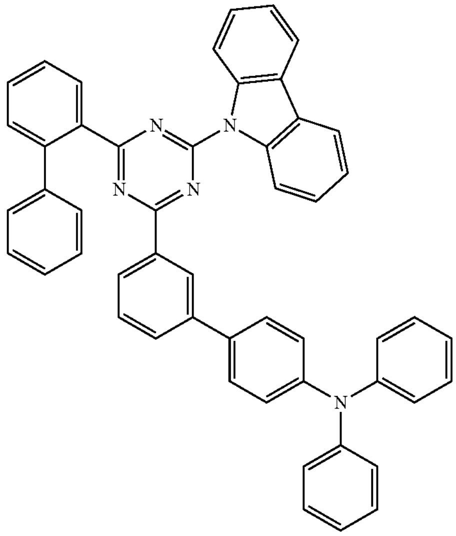
[38]
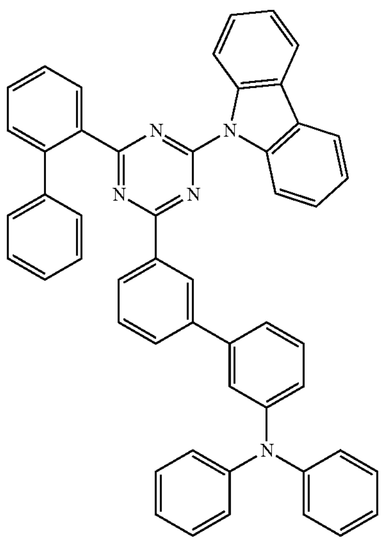
[39]
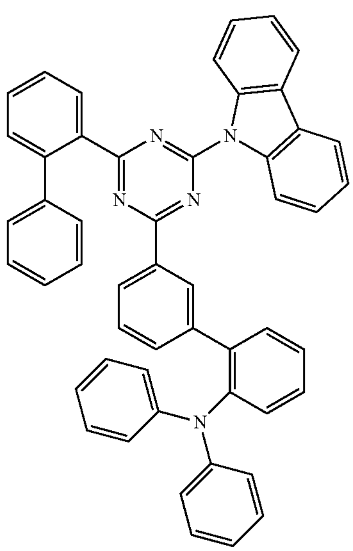
-continued
[40]
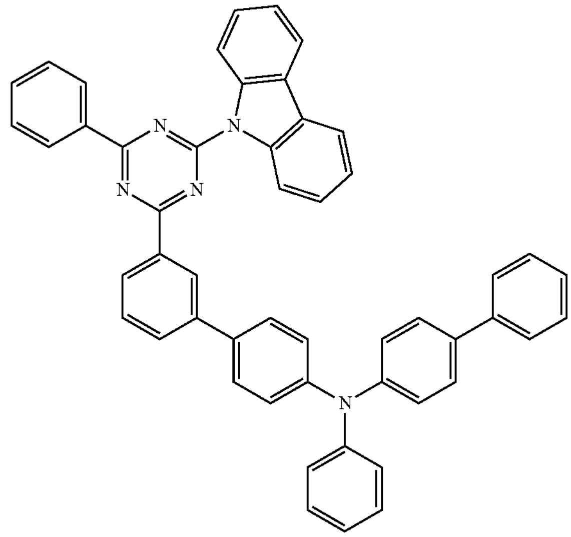
[41]
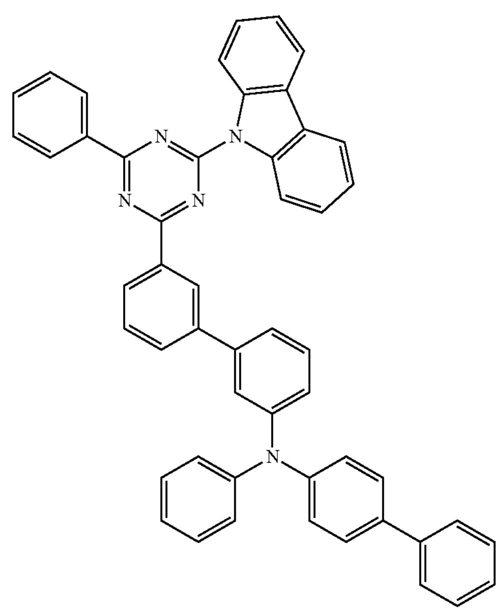

-continued
[42]
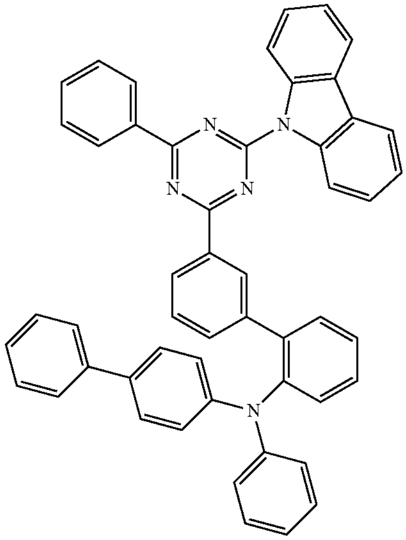
[43]
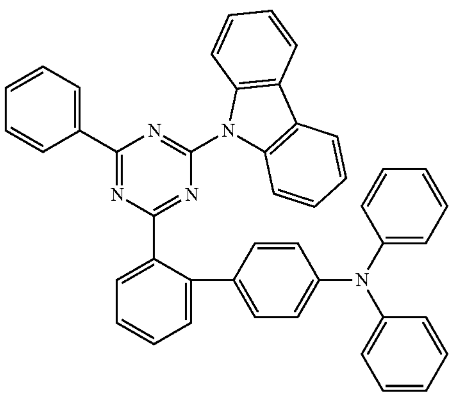
[44]
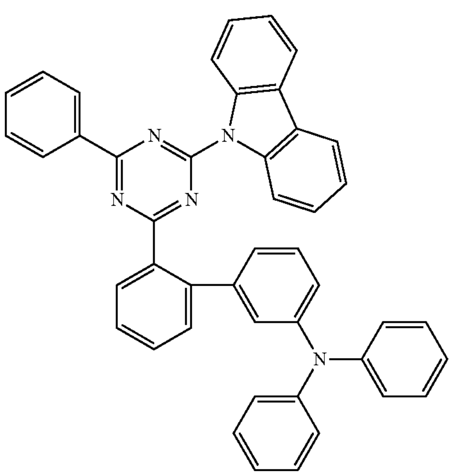
-continued
[45]
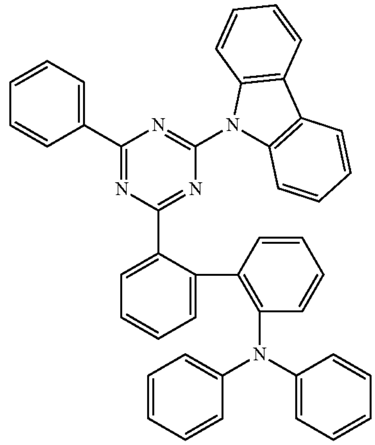
[46]
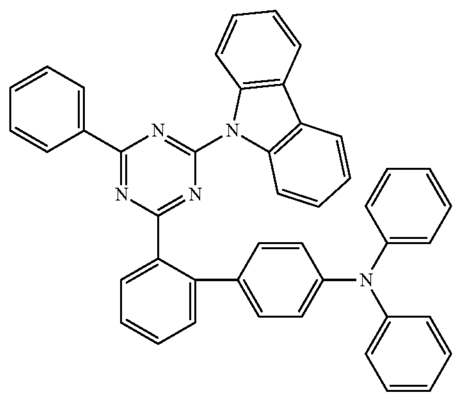
[47]
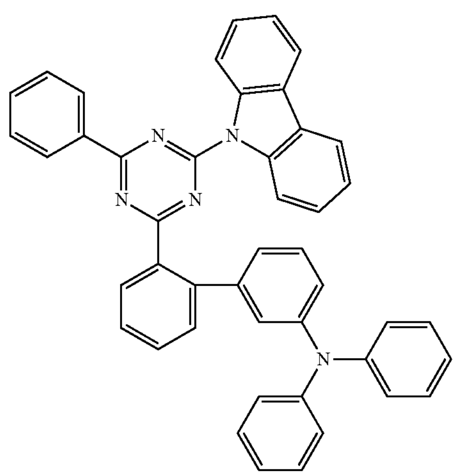

-continued
[48]
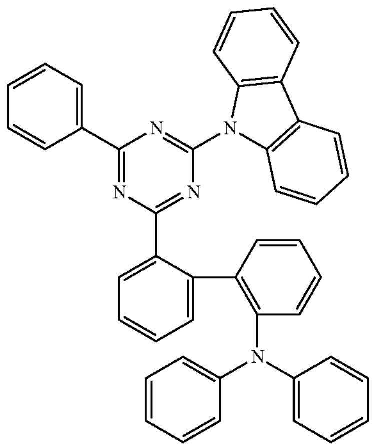
[49]
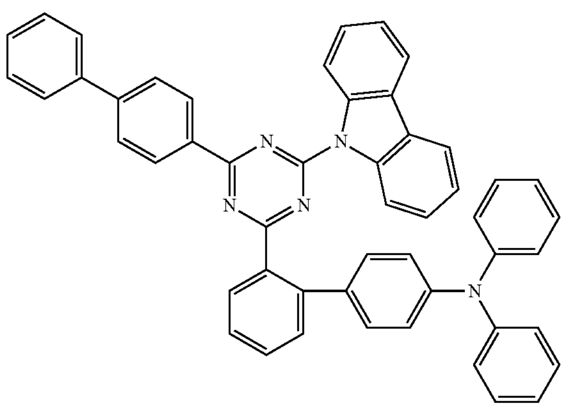
[50]
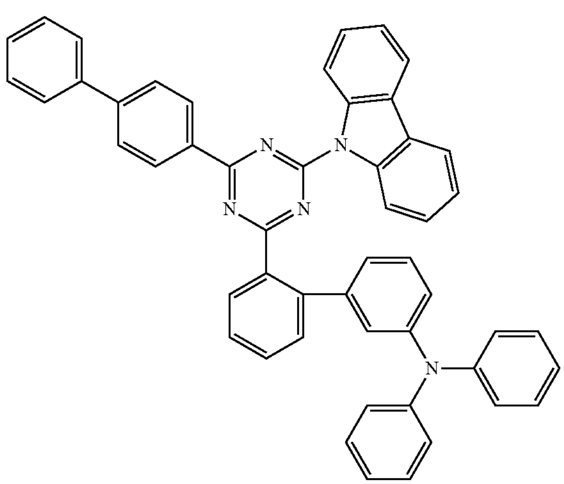
-continued
[51]
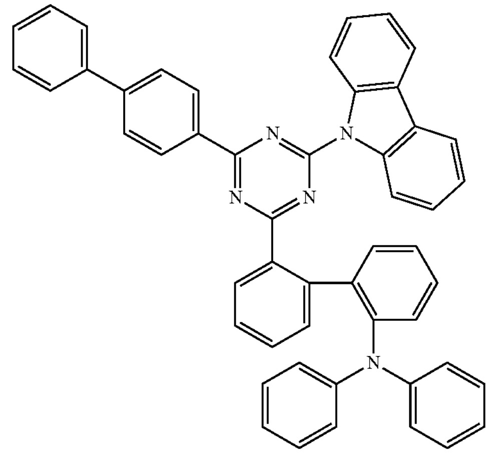
[52]
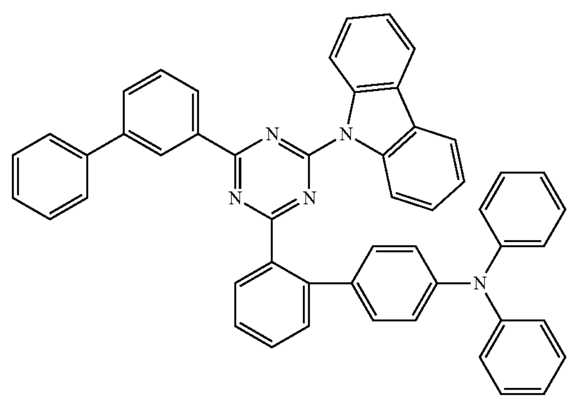
[53]
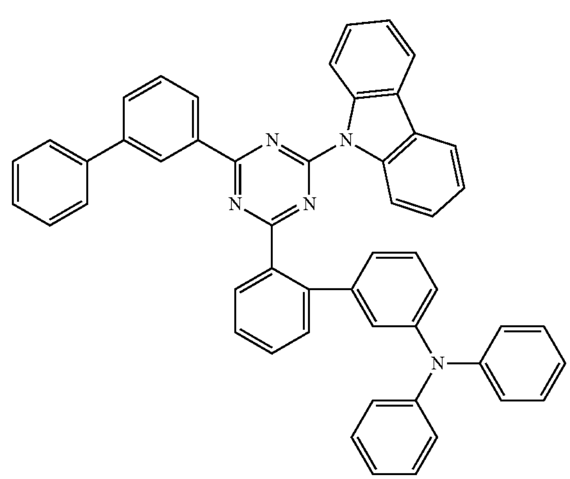

-continued
[54]
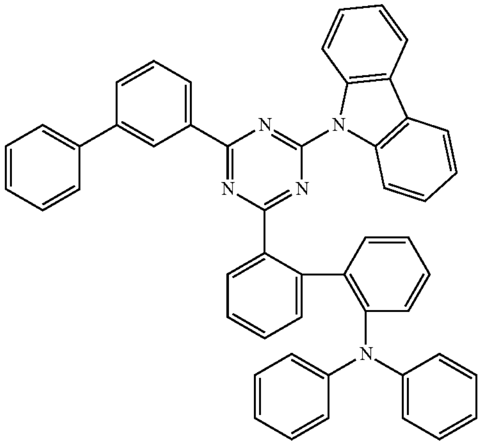
[55]
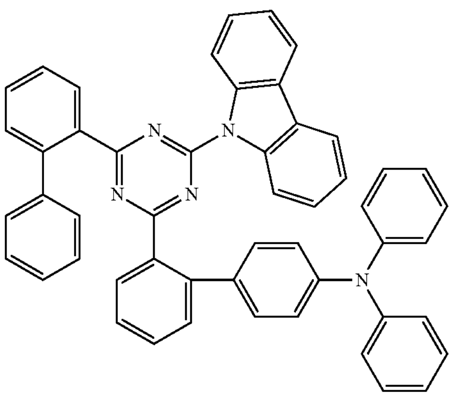
[56]
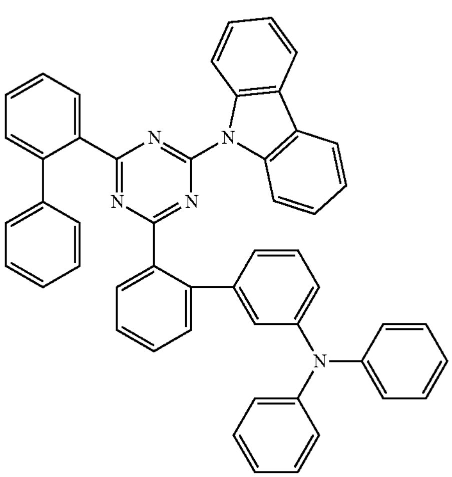
-continued
[57]
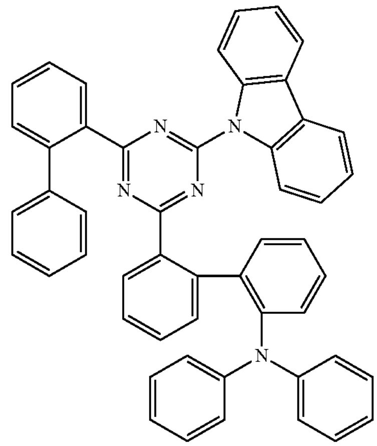
[58]
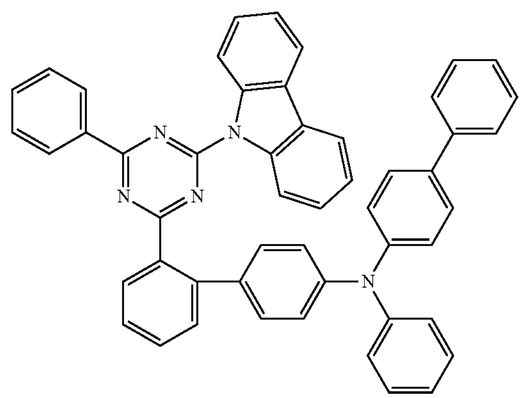
[59]
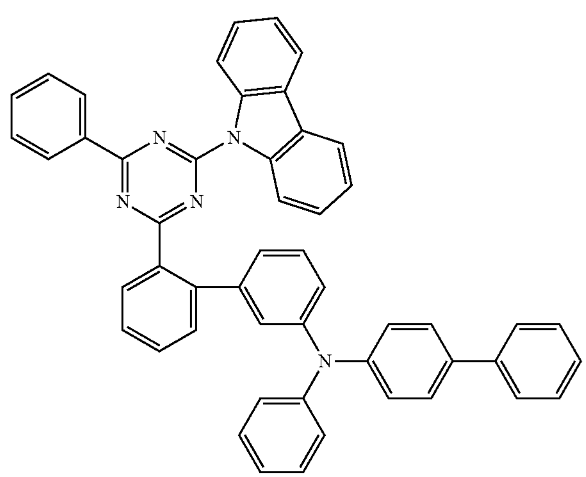

-continued
[60]
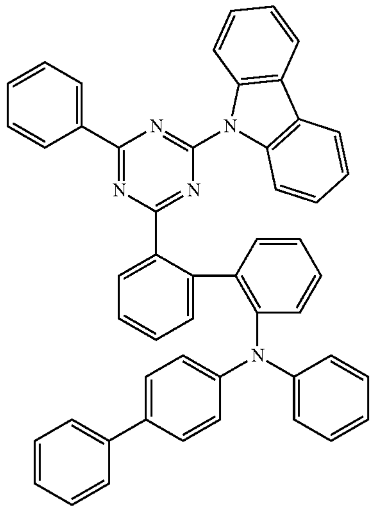
[61]
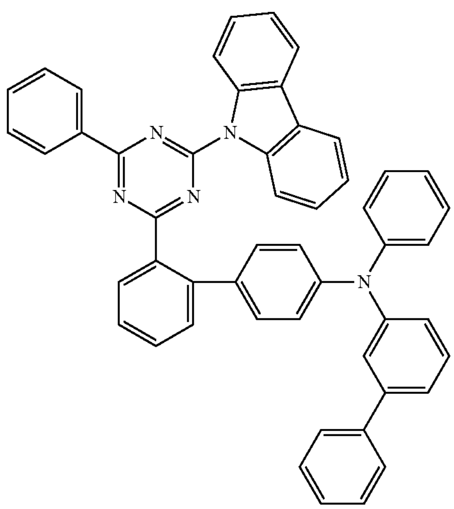
[62]
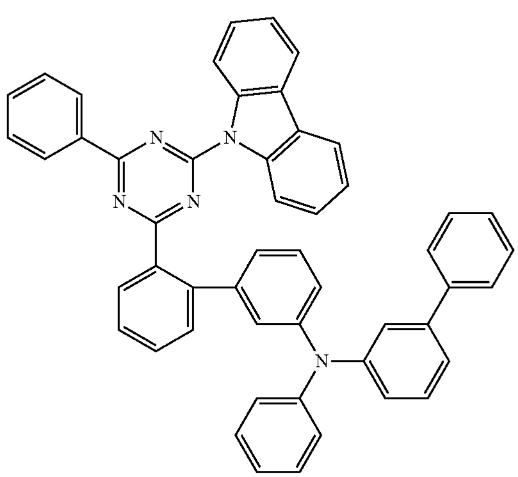
-continued
[63]
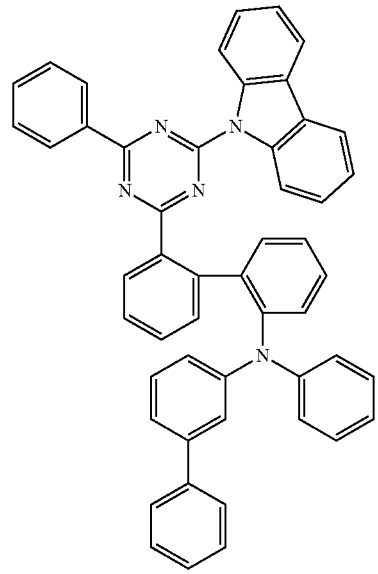
[64]
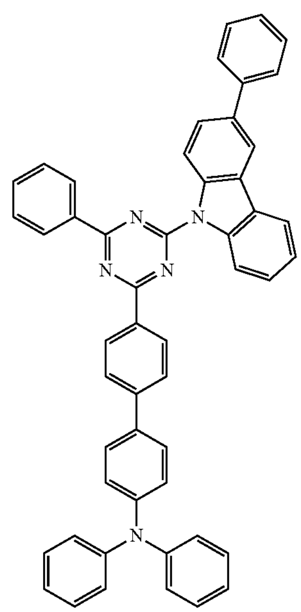

-continued
[65]
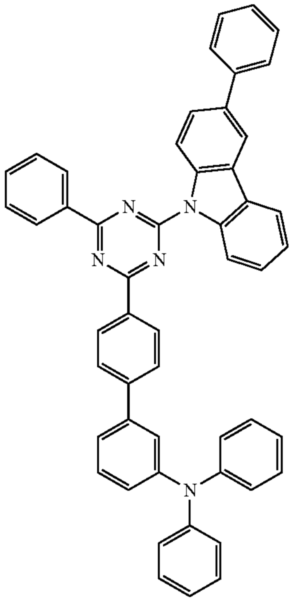
[66]
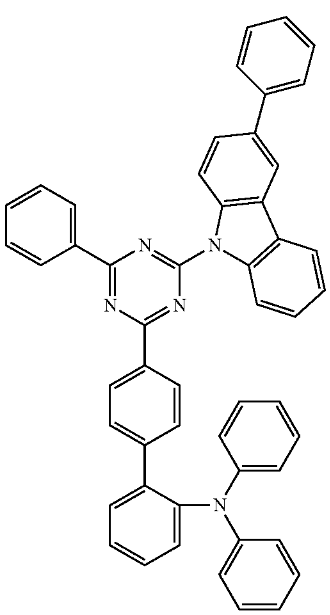
-continued
[67]
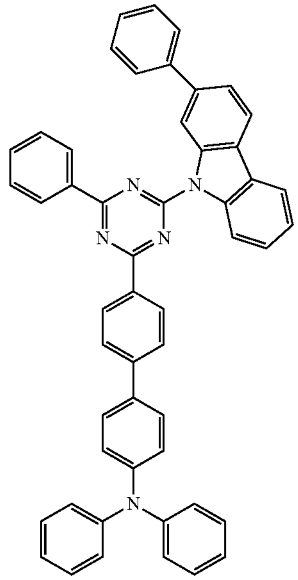
[68]
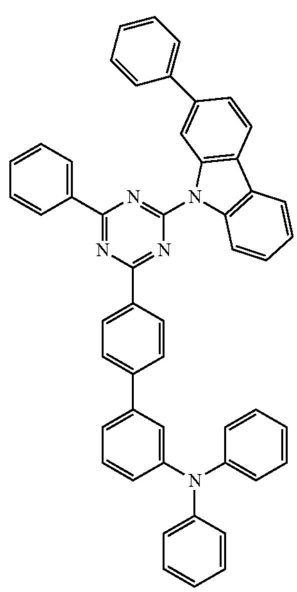

-continued
[69]
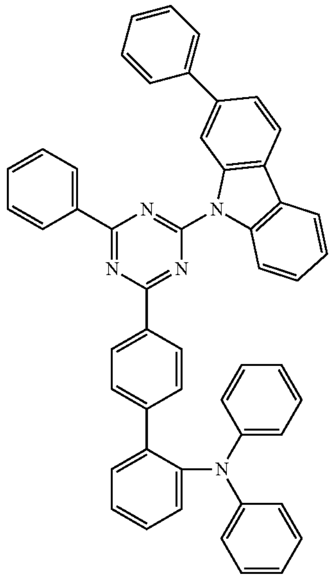
[70]
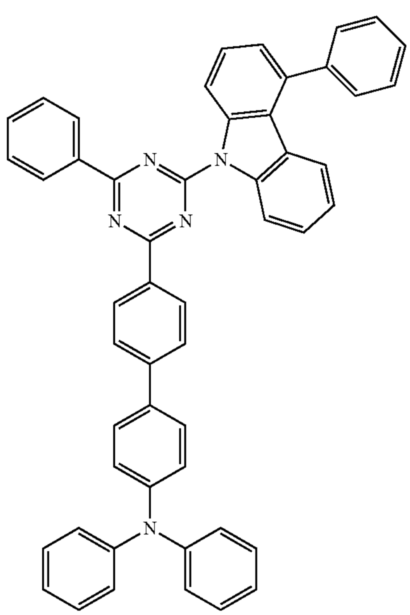
-continued
[71]
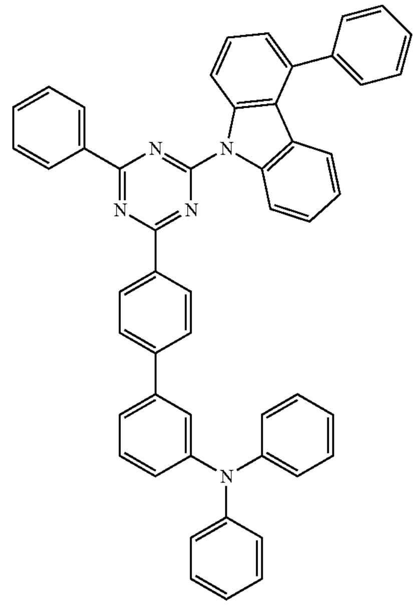
[72]
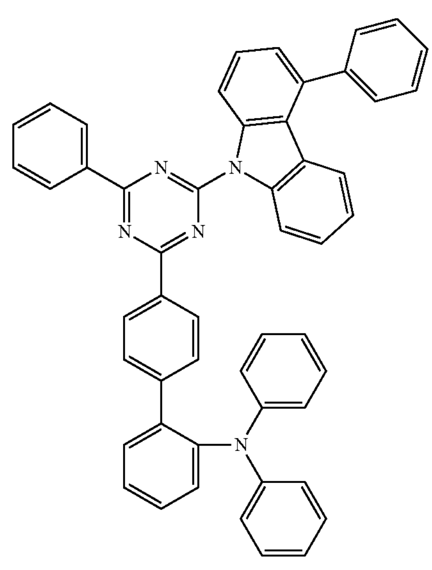

[73]
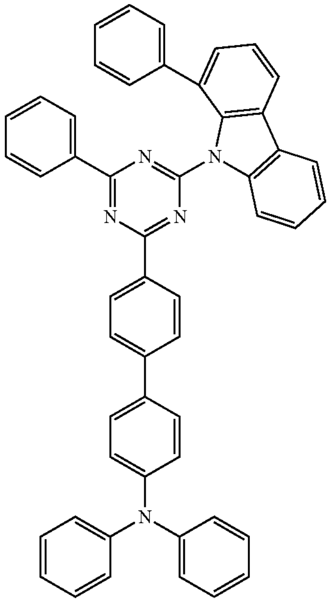
[74]
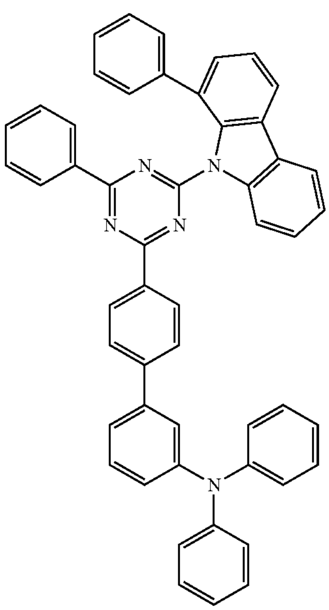
[75]
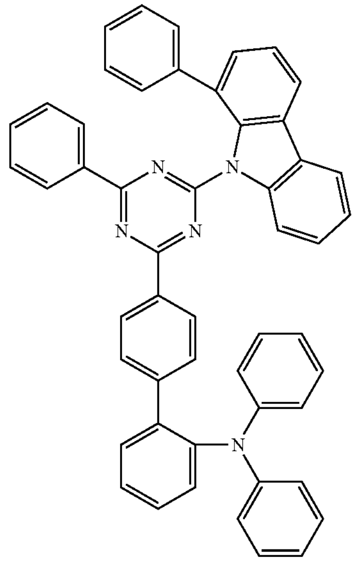
[76]
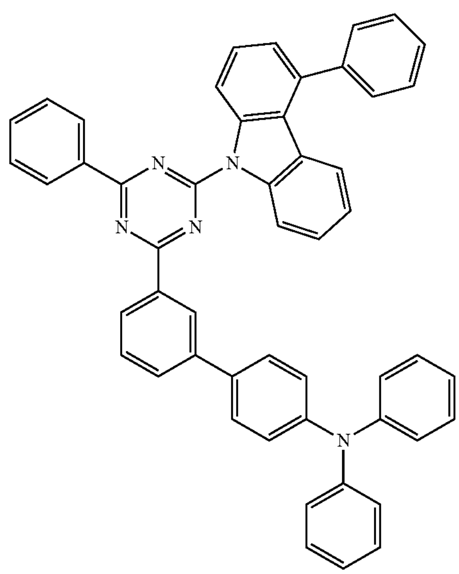

-continued
[77]
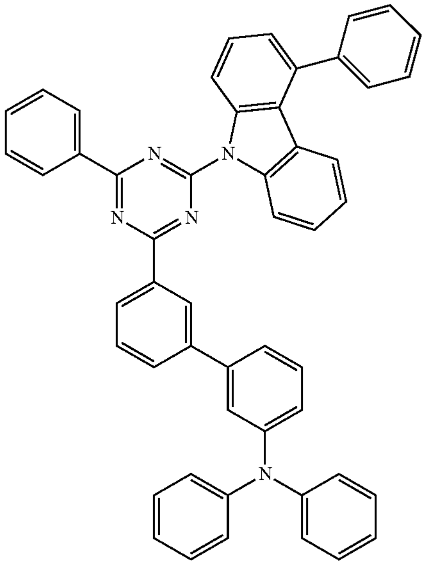
[78]
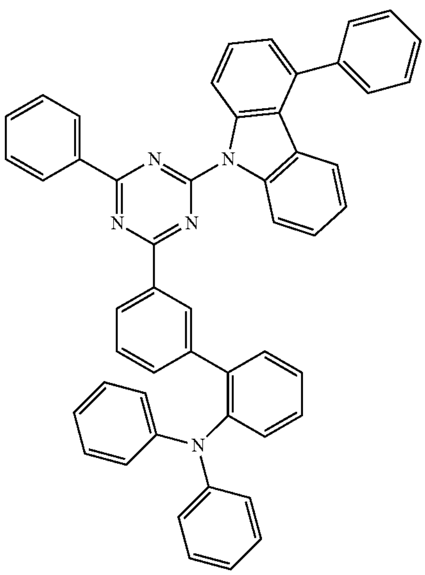
[79]
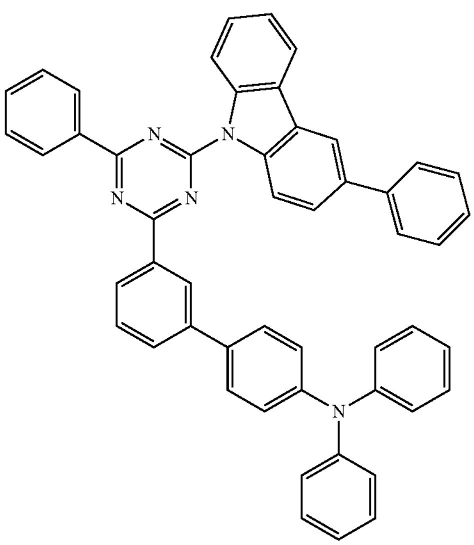
-continued
[80]
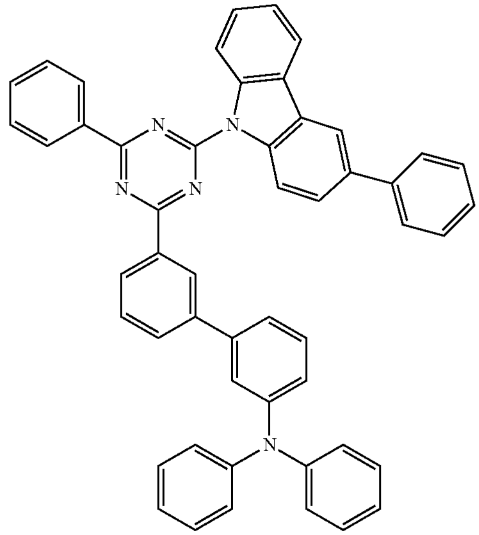
[81]
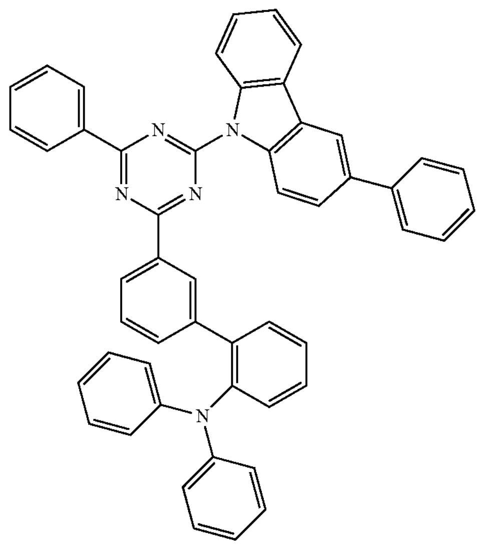
[82]
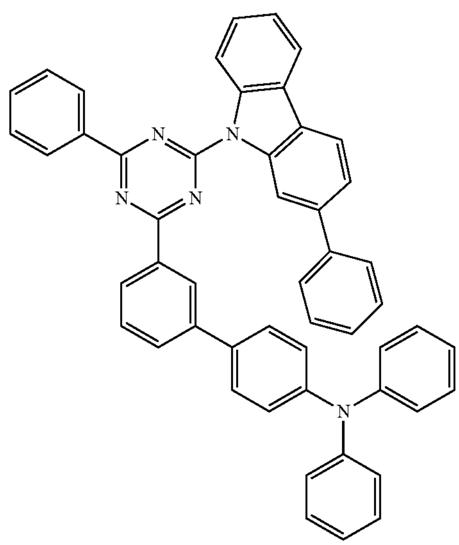

-continued
[83]
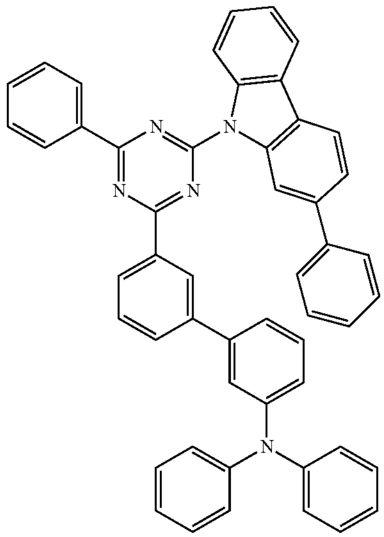
[84]
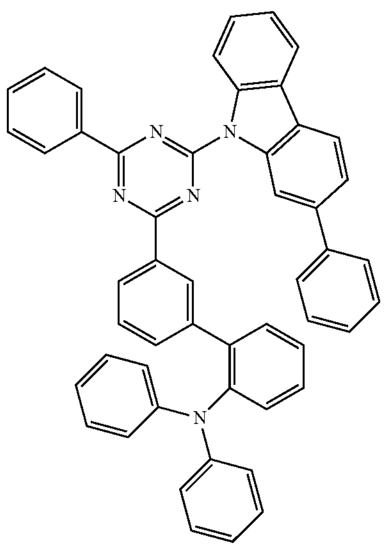
[85]
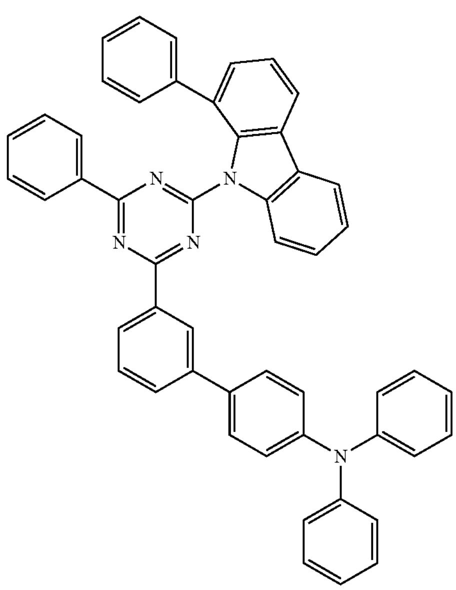
-continued
[86]
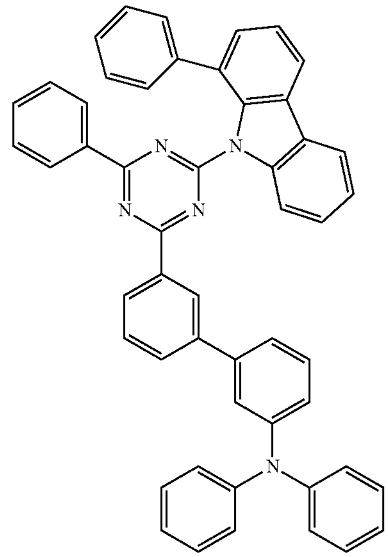
[87]
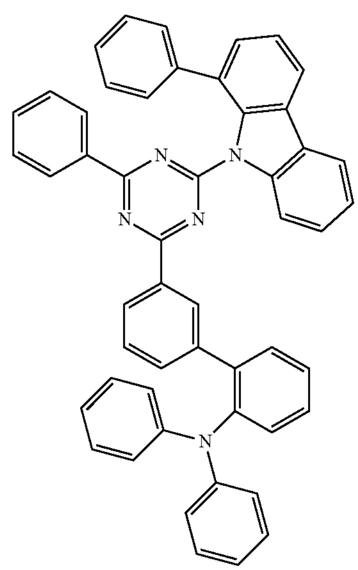

-continued
[88]
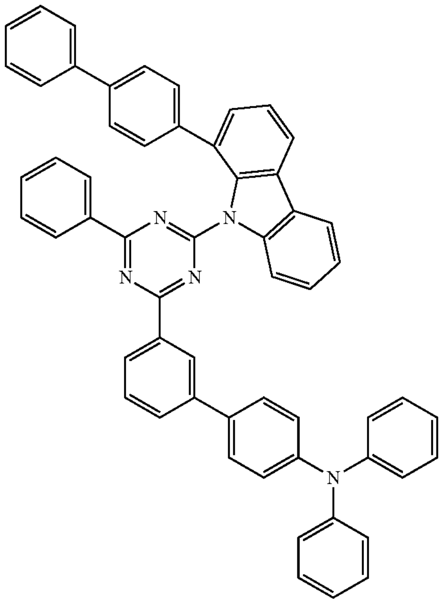
[89]
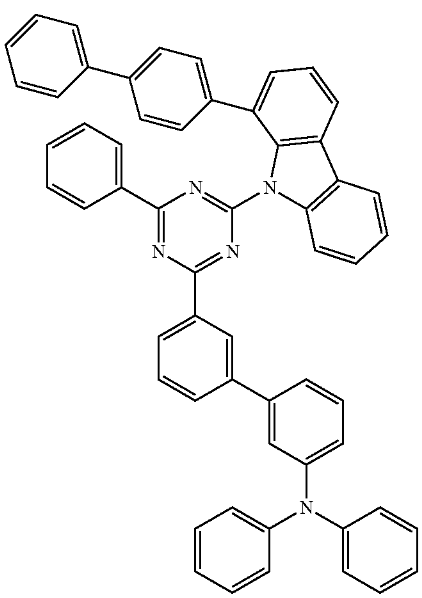
-continued
[90]
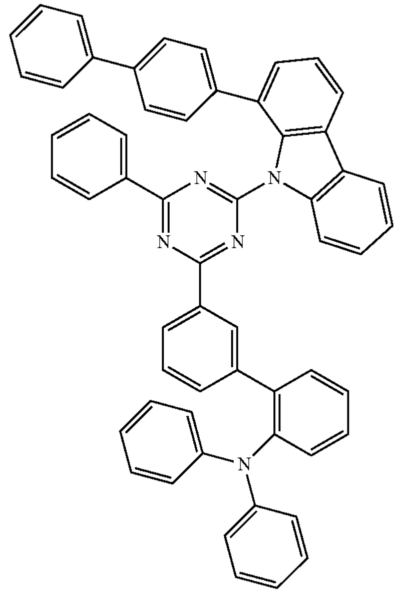
[91]
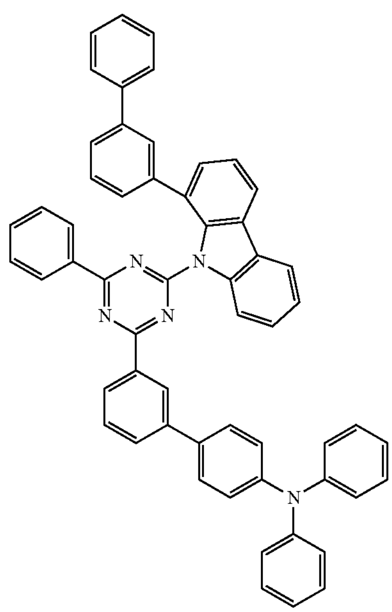

-continued
[92]
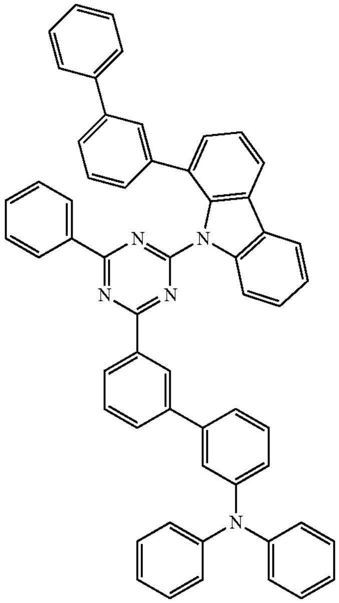
[93]
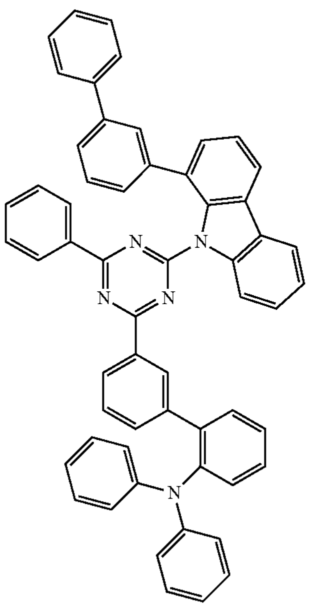
[94]
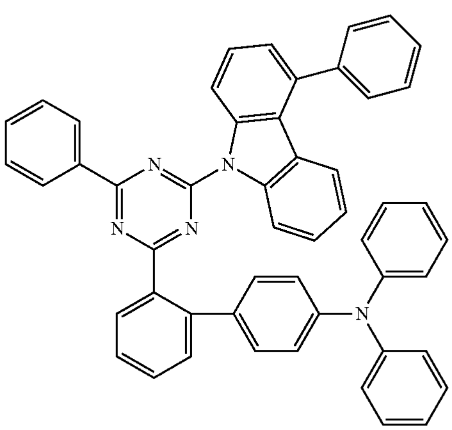
-continued
[95]
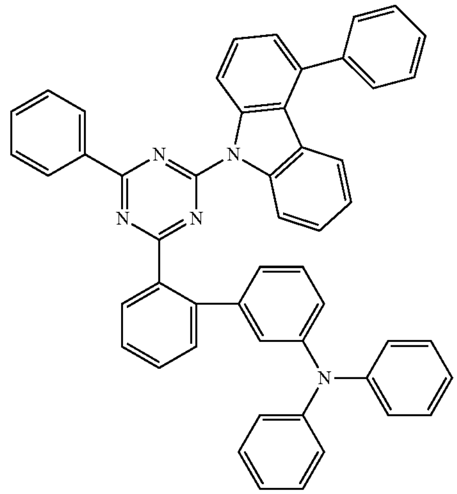
[96]
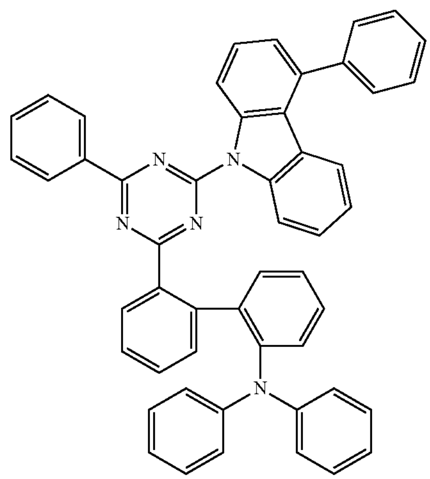
[97]
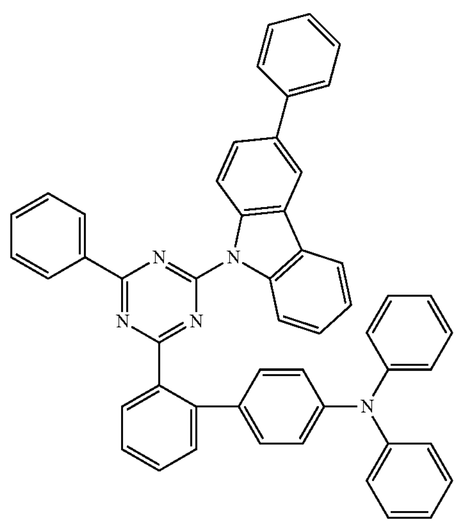

[98]
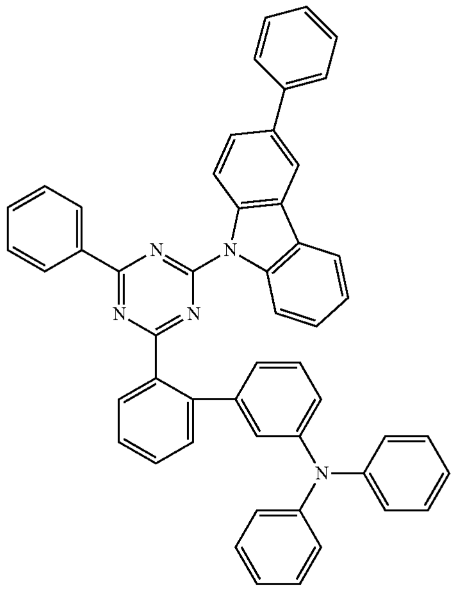
[99]
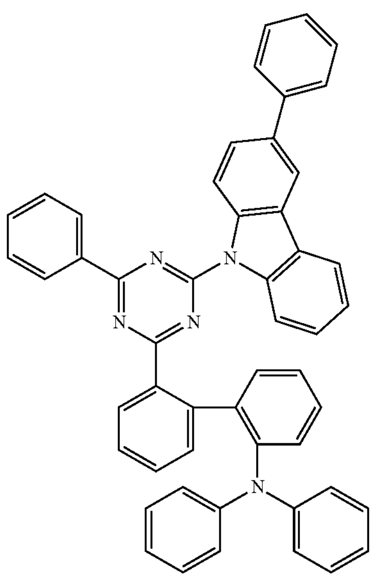
[100]
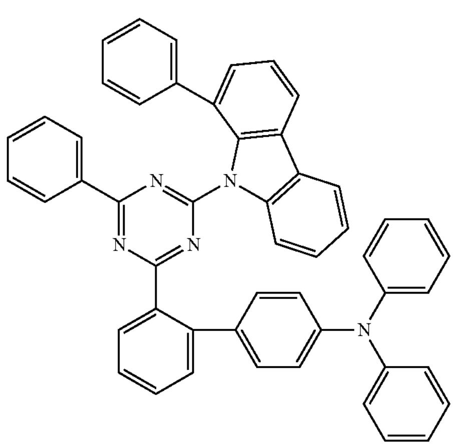
[101]
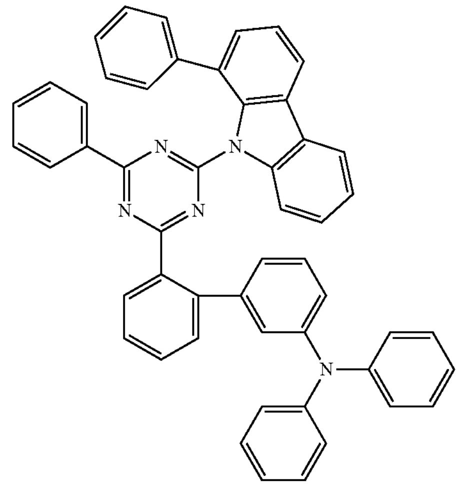
[102]
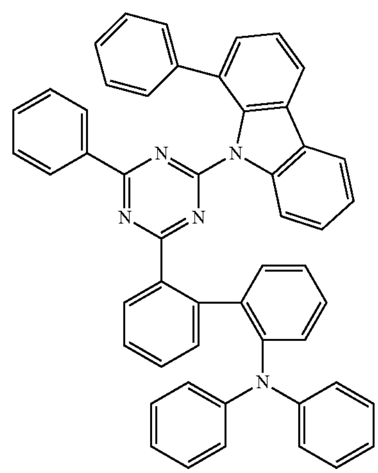
[103]
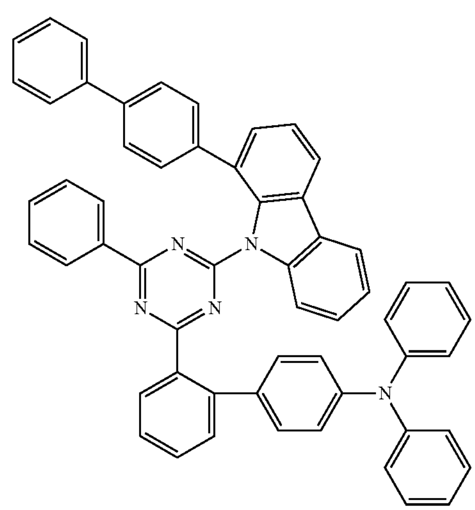

-continued
[104]
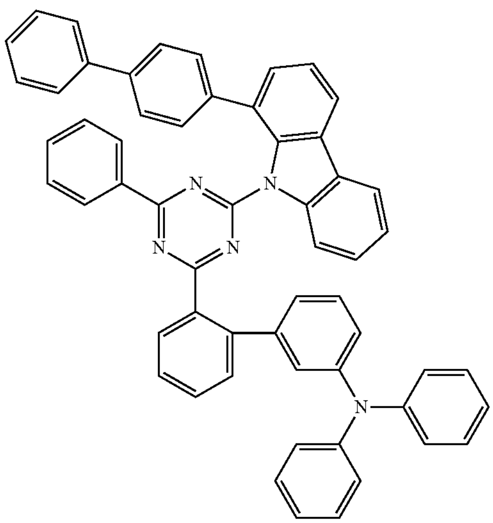
[105]
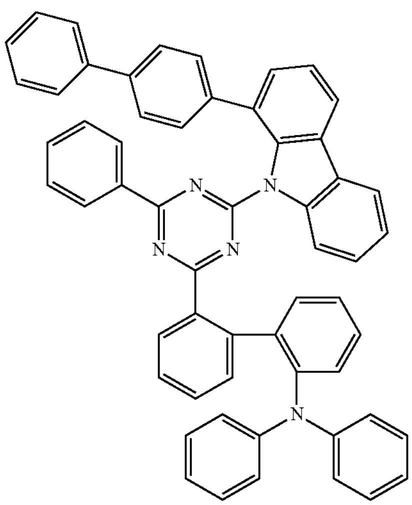
[106]
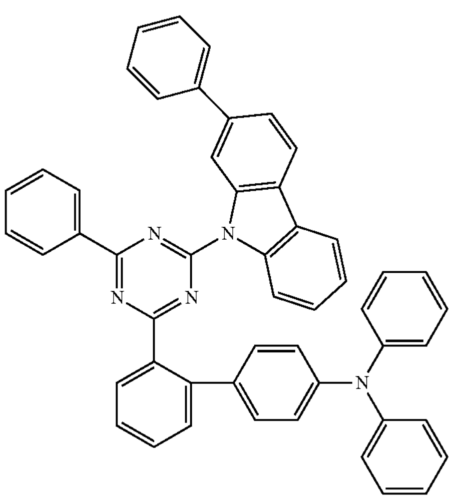
-continued
[107]
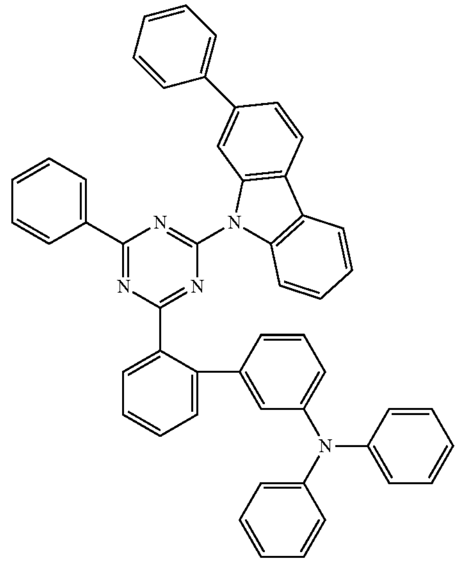
[108]
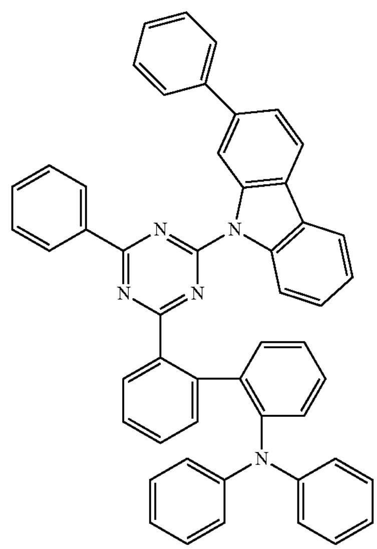
[109]
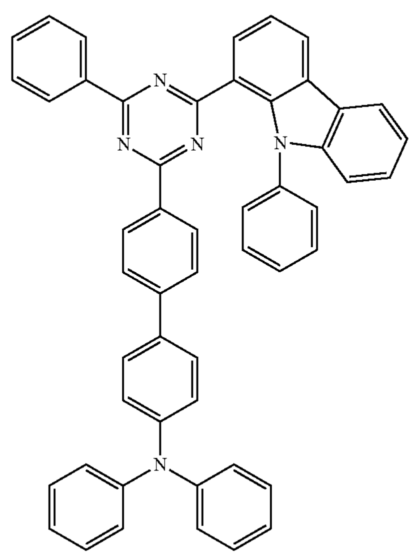

-continued
[110]
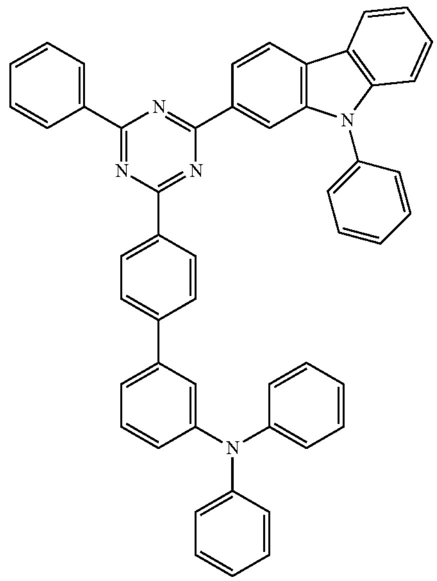
[111]
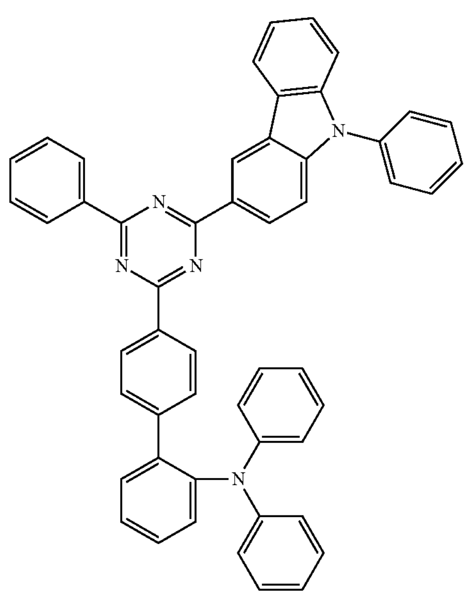
-continued
[112]
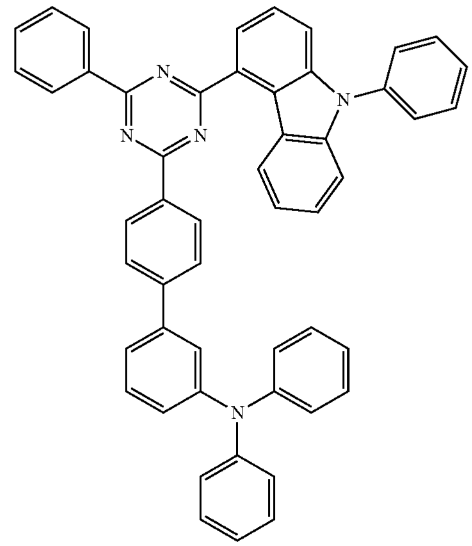
[113]
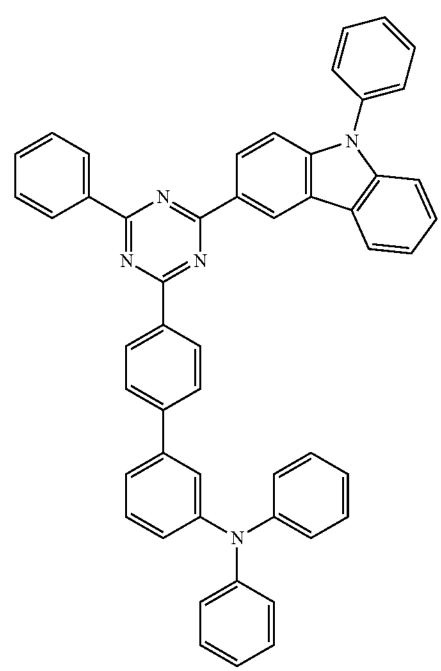

-continued
[114]
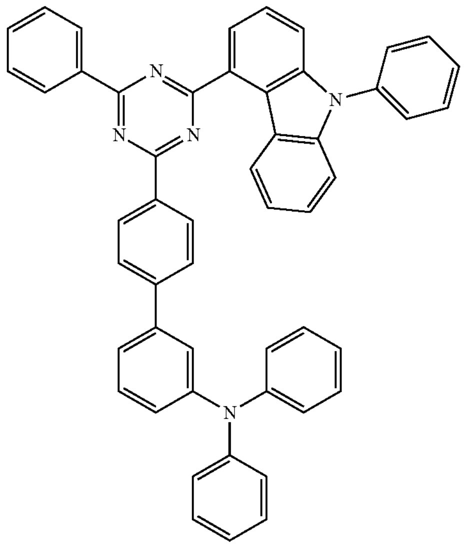
[116]
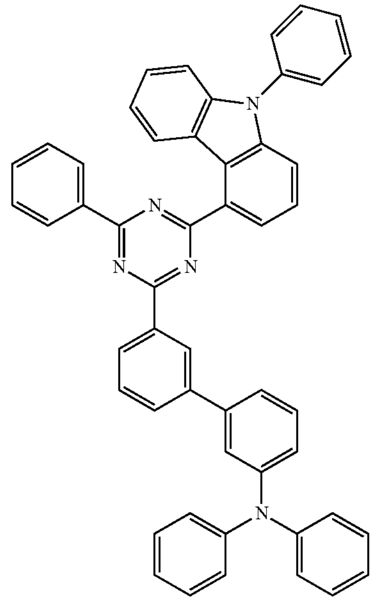
[115]
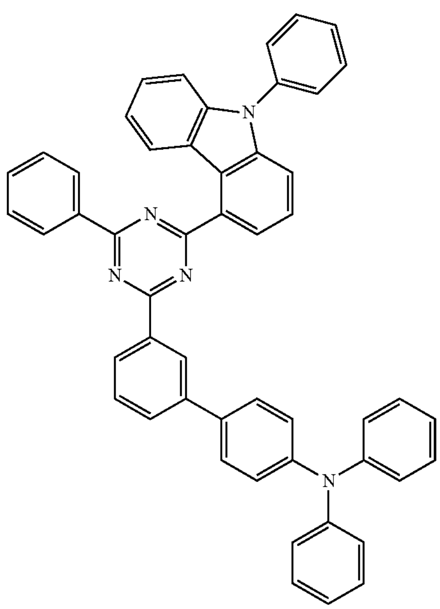
[117]
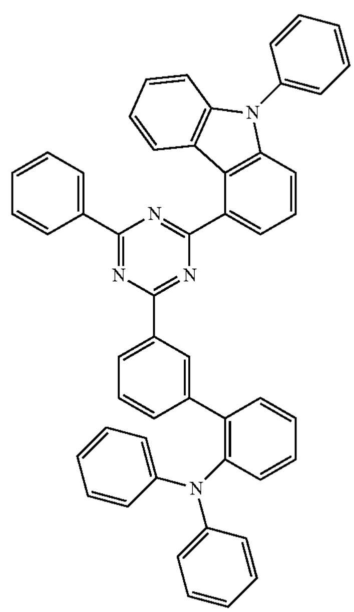

-continued

[118]

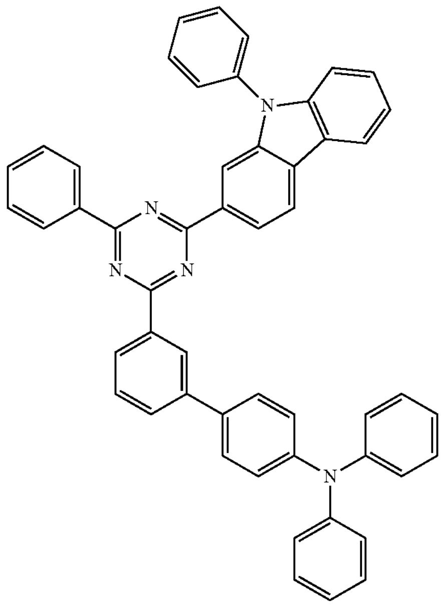

[119]

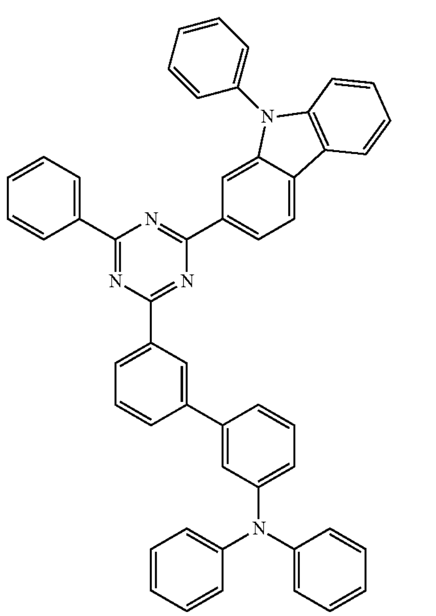

-continued

[120]

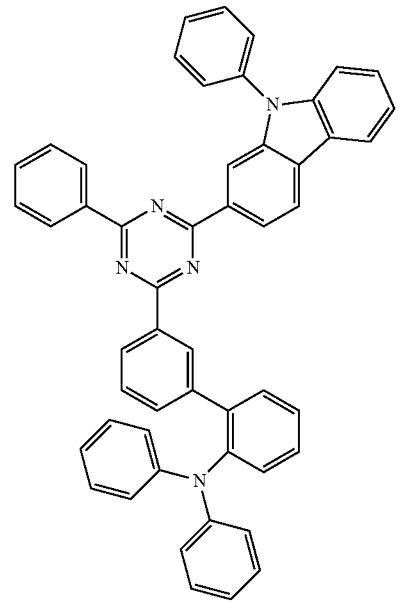

A composition for an organic optoelectronic device according to an embodiment may include a first compound for an organic optoelectronic device and a second compound for an organic optoelectronic device. In an implementation, the first compound may be the aforementioned compound for the organic optoelectronic device (e.g., represented by Chemical Formula 1) and the second compound may be represented by Chemical Formula 2 or a combination of Chemical Formula 3 and Chemical Formula 4.

[Chemical Formula 2]

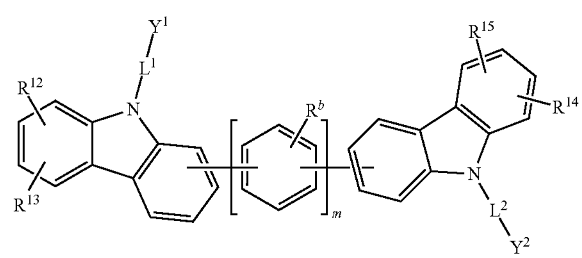

In Chemical Formula 2, $Y^1$ and $Y^2$ may each independently be or include, e.g., a substituted or unsubstituted C6 to C20 aryl group, or a substituted or unsubstituted C2 to C30 heterocyclic group.

$L^1$ and $L^2$ may each independently be or include, e.g., a single bond, or a substituted or unsubstituted C6 to C20 arylene group.

$R^b$ and $R^{12}$ to $R^{15}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and m may be, e.g., an integer of 0 to 2.

[Chemical Formula 3]

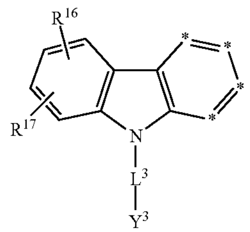

[Chemical Formula 4]

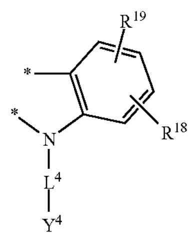

In Chemical Formulae 3 and 4, $Y^3$ and $Y^4$ may each independently be or include, e.g., a substituted or unsubstituted C6 to C20 aryl group, or a substituted or unsubstituted C2 to C30 heterocyclic group, adjacent two *s of Chemical Formula 3 are linked to Chemical Formula 4,

*s of Chemical Formula 3 not linked to Chemical Formula 4 may independently be C-$L^a$-$R^c$, $L^a$, $L^3$, and $L^4$ may each independently be or include, e.g., a single bond or a substituted or unsubstituted C6 to C20 arylene group, and $R^c$ and $R^{16}$ to $R^{19}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

The second compound may be used with the first compound in a light emitting layer, and charge mobility and stability may be increased and luminous efficiency and life-span characteristics may be improved.

In an implementation, $Y^1$ and $Y^2$ of Chemical Formula 2 may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted carbazolyl group, a substituted or unsubstituted dibenzothiophenyl group, a substituted or unsubstituted dibenzofuranyl group, a substituted or unsubstituted fluorenyl group, or a substituted or unsubstituted pyridinyl group.

In an implementation, $L^1$ and $L^2$ of Chemical Formula 2 may each independently be or include, e.g., a single bond, a substituted or unsubstituted phenylene group, or a substituted or unsubstituted biphenylene group.

In an implementation, $R^{12}$ to $R^{15}$ of Chemical Formula 2 may each independently be or include, e.g., hydrogen, deuterium, or a substituted or unsubstituted C6 to C12 aryl group.

In an implementation, m may be, e.g., 0 or 1.

In an implementation, "substituted" of Chemical Formula 2 may refer to replacement of at least one hydrogen by deuterium, a C1 to C4 alkyl group, a C6 to C18 aryl group, or a C2 to C30 heteroaryl group.

In an implementation, the compound represented by Chemical Formula 2 may be represented by, e.g., one of Chemical Formula 2-1 to Chemical Formula 2-15.

[Chemical Formula 2-1]

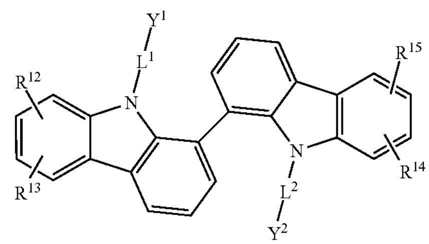

[Chemical Formula 2-2]

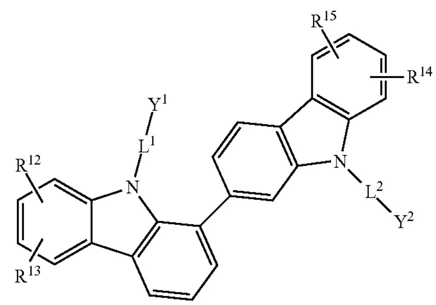

[Chemical Formula 2-3]

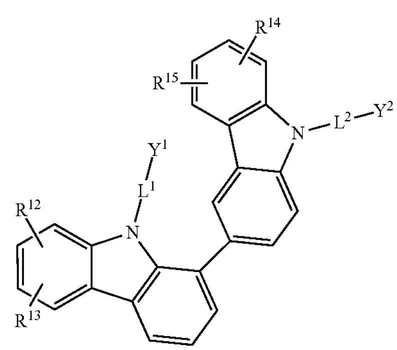

[Chemical Formula 2-4]

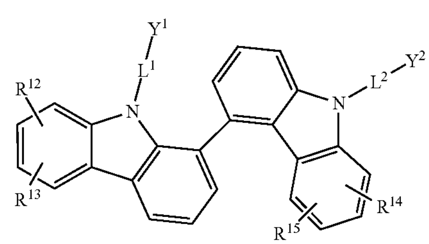

[Chemical Formula 2-5]

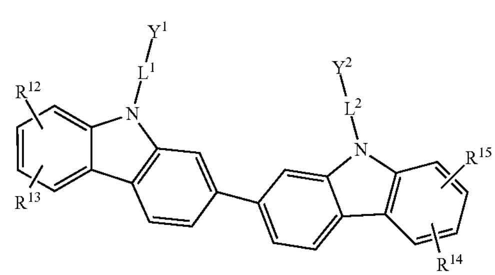

-continued
[Chemical Formula 2-6]
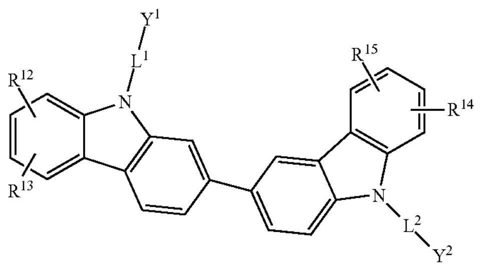
[Chemical Formula 2-7]
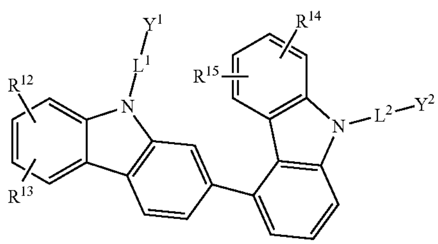
[Chemical Formula 2-8]
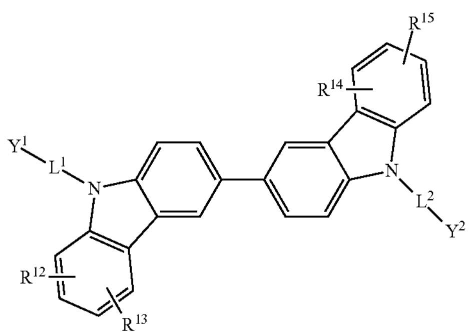
[Chemical Formula 2-9]
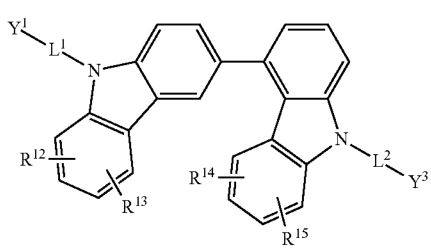
[Chemical Formula 2-10]
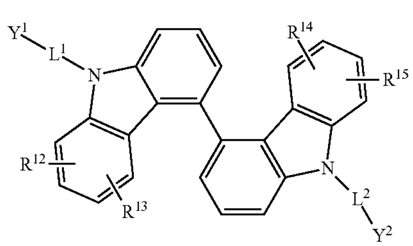
-continued
[Chemical Formula 2-11]
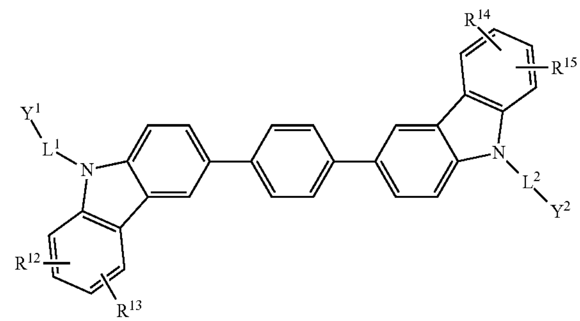
[Chemical Formula 2-12]
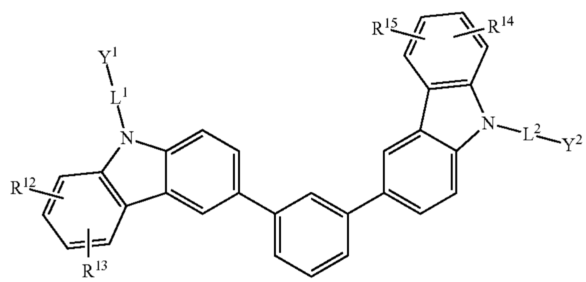
[Chemical Formula 2-13]
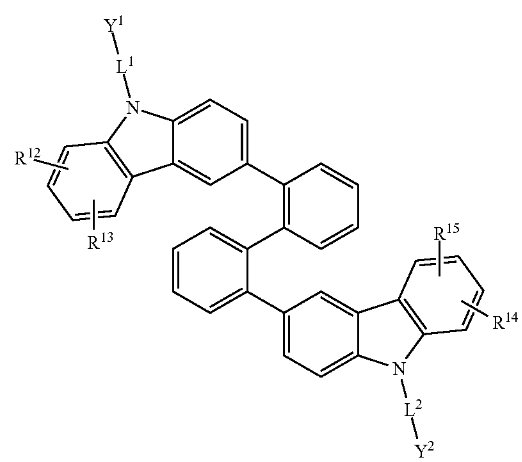
[Chemical Formula 2-14]
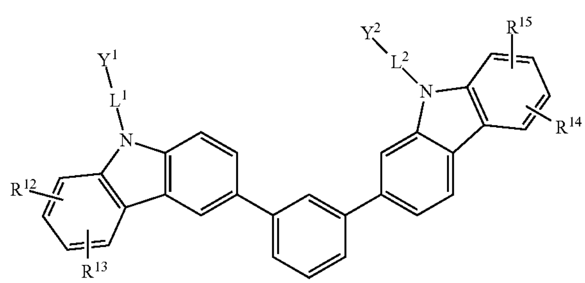

[Chemical Formula 2-15]
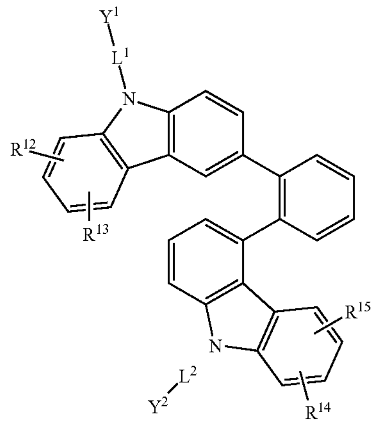
In Chemical Formula 2-1 to Chemical Formula 2-15, $R^{12}$ to $R^{15}$ may each independently be or include, e.g., hydrogen or a substituted or unsubstituted C6 to C12 aryl group and *-$L^1$-$Y^1$ and *-$L^2$-$Y^2$ may each independently be, e.g., a moiety of Group I.
[Group I]
C-1
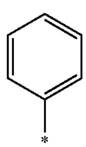
C-2
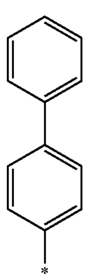
C-3
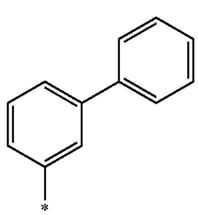
C-4
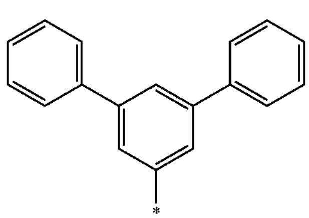
C-5
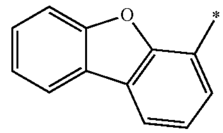
C-6
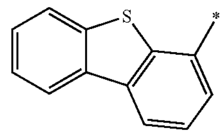
C-7
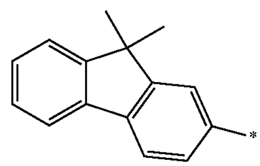
C-8
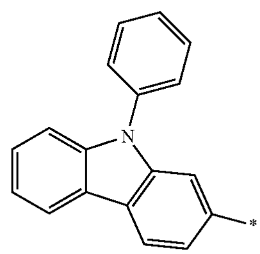
C-9
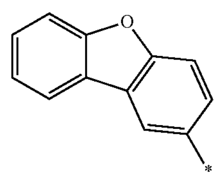
C-10
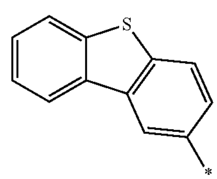
C-11
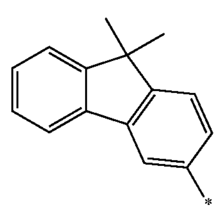
C-12
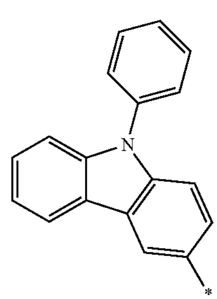

-continued
C-13
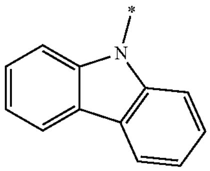
C-14
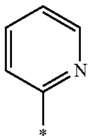
C-15
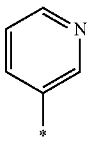
C-16
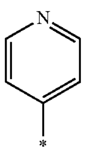
C-17
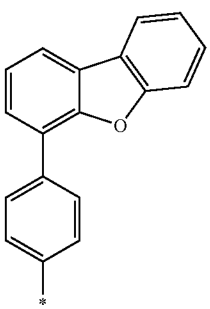
C-18
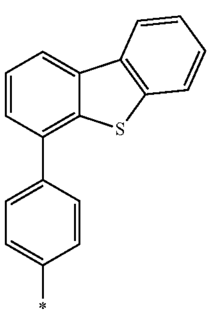
C-19
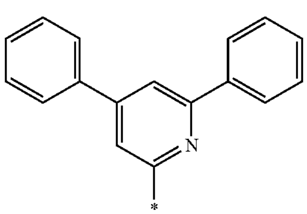
-continued
C-20
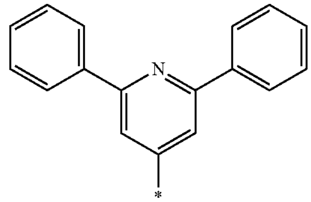
C-21
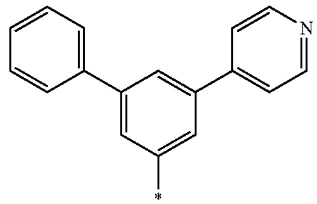
C-22
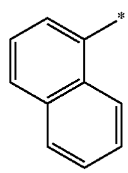
C-23
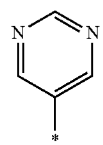
C-24
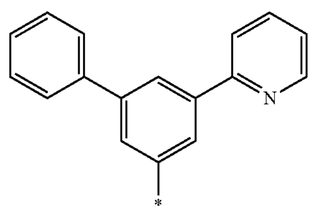
C-25
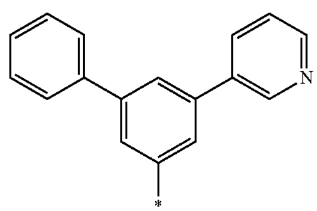
C-26
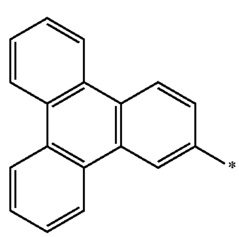

-continued

C-27

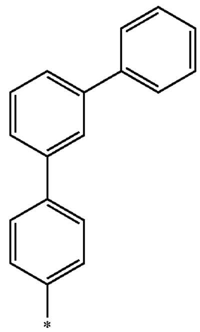

C-28

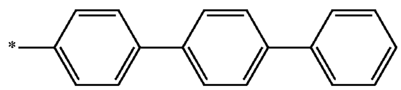

C-29

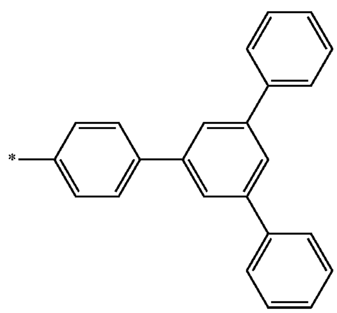

C-30

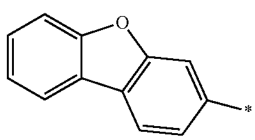

C-31

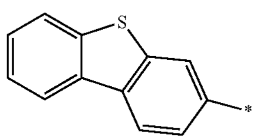

C-32

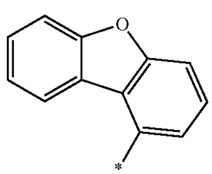

C-33

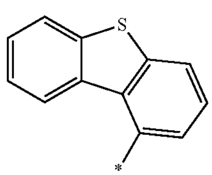

In Group I, * is a linking point.

In an implementation, the second compound represented by Chemical Formula 2 may be represented by Chemical Formula 2-8.

In an implementation, *-$L^1$-$Y^1$ and *-$L^2$-$Y^2$ of Chemical Formula 2-8 may each independently be a moiety of Group I, e.g., C-1, C-2, or C-3.

In an implementation, *-$L^1$-$Y^1$ and *-$L^2$_$Y^2$ may each be C-2 of Group I.

In an implementation, the second compound may be represented by the combination of Chemical Formula 3 and Chemical Formula 4, e.g., may be represented by Chemical Formula Chemical Formula 3A, Chemical Formula 3B, Chemical Formula 3C, Chemical Formula 3D, or Chemical Formula 3E.

[Chemical Formula 3A]

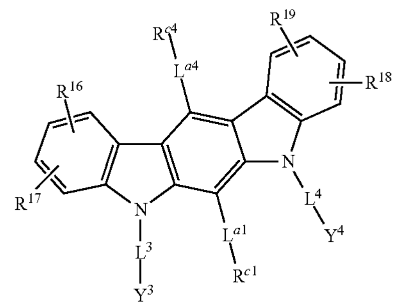

[Chemical Formula 3B]

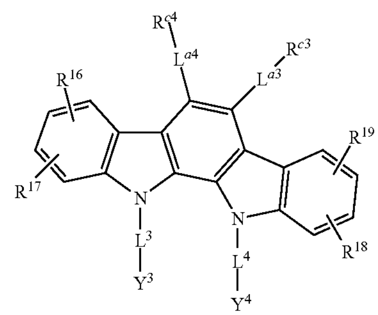

[Chemical Formula 3C]

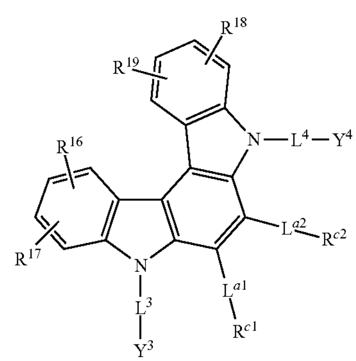

[Chemical Formula 3D]

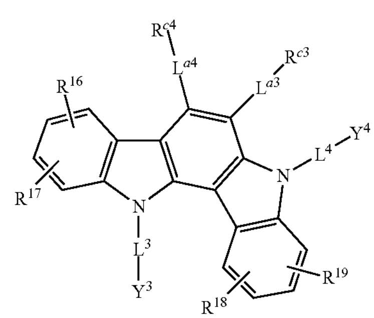

-continued

[Chemical Formula 3E]

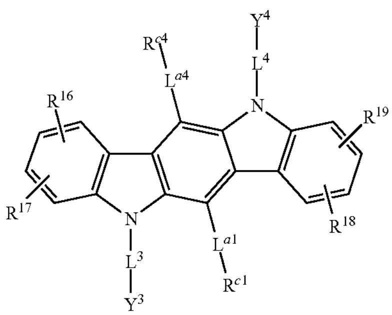

In Chemical Formula 3A to Chemical Formula 3E, $Y^3$ and $Y^4$, $L^3$ and $L^4$, and $R^{16}$ to $R^{19}$ may be defined the same as those described above.

$L^{a1}$ to $L^{a4}$ may be defined the same as $L^3$ and $L^4$, and $R^{c1}$ to $R^{c4}$ may be defined the same as $R^{16}$ to $R^{19}$.

In an implementation, $Y^3$ and $Y^4$ of Chemical Formulae 3 and 4 may each independently be or include, e.g., a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{16}$ to $R^{19}$ may each independently be or include, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $Y^3$ and $Y^4$ of Chemical Formulae 3 and 4 may each independently be a moiety Group II.

[Group II]

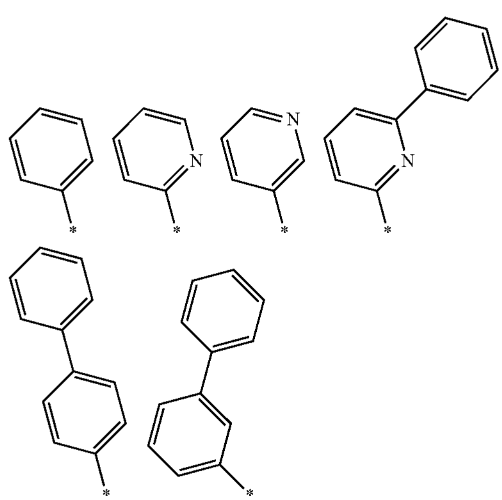

-continued

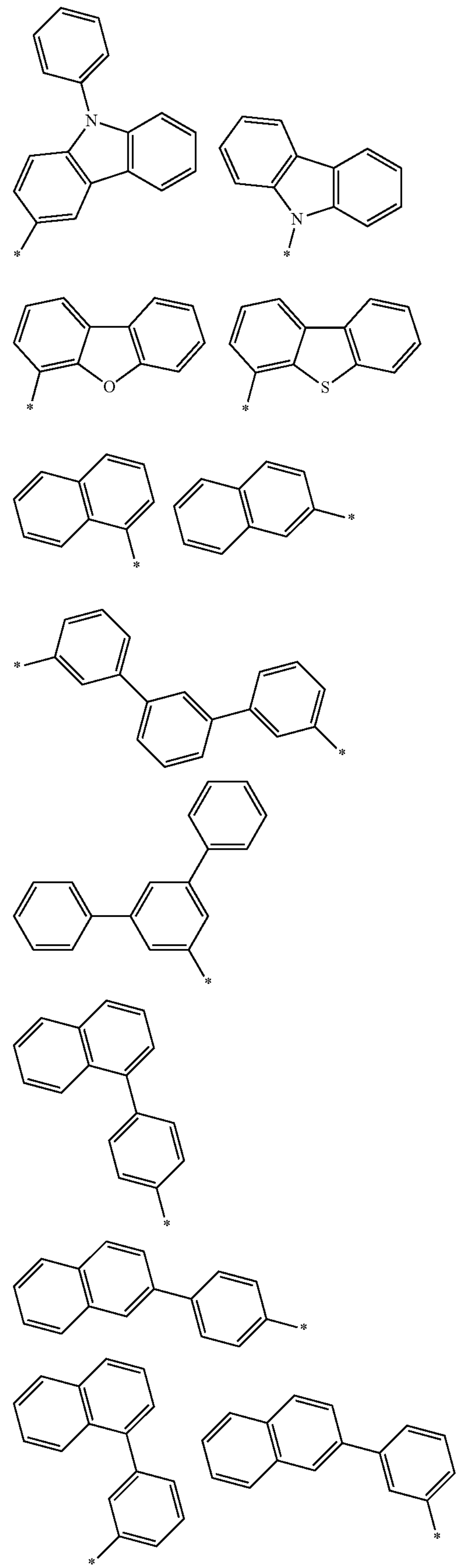

-continued

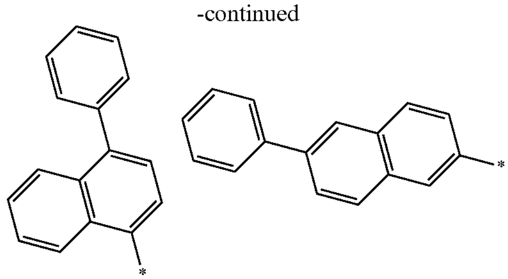

In Group II, * is each linking point of $L^3$ and $L^4$.

In an implementation, $R^{c1}$ to $R^{c4}$ and $R^{16}$ to $R^{19}$ may each independently be or include, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{16}$ to $R^{19}$ may each independently be or include, e.g., hydrogen, deuterium, a cyano group, or a substituted or unsubstituted phenyl group.

In an implementation, $R^{c1}$ to $R^4$ may each be hydrogen, and $R^{16}$ to $R^{19}$ may each independently be hydrogen or a substituted or unsubstituted phenyl group.

In an implementation, the second compound may be represented by Chemical Formula 2-8.

In an implementation, $Y^1$ and $Y^2$ of Chemical Formula 2-8 may each independently be or include, e.g., a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group, $L^1$ and $L^2$ may each independently be or include, e.g., a single bond or a substituted or unsubstituted C6 to C20 arylene group, and $R^{12}$ to $R^{15}$ may each independently be or include, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $*-L^1-Y^1$ and $*-L^2-Y^2$ of Chemical Formula 2-8 may each be a moiety represented by C-2 of Group I.

In an implementation, the second compound may be a compound of Group 2.

[Group 2]

[A-1]

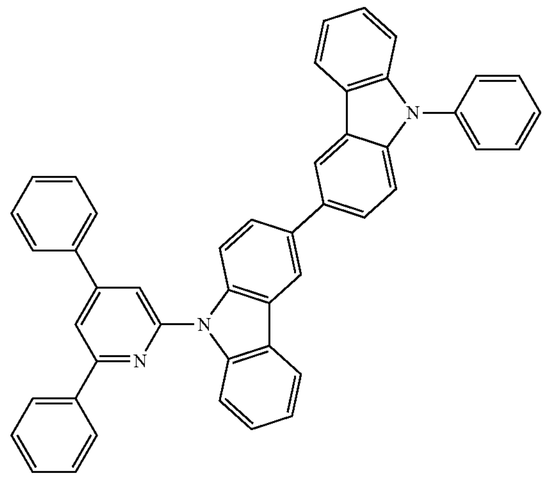

[A-2]

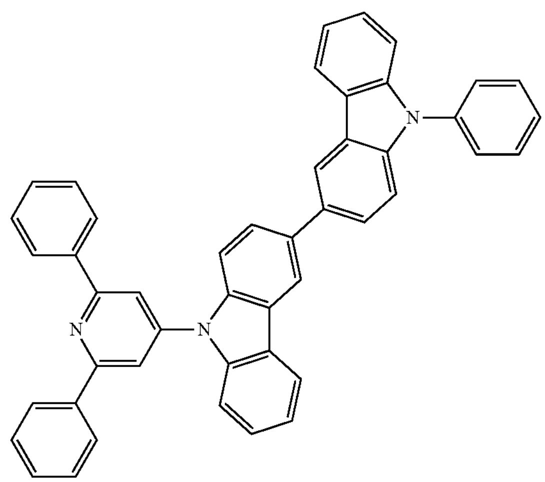

[A-3]

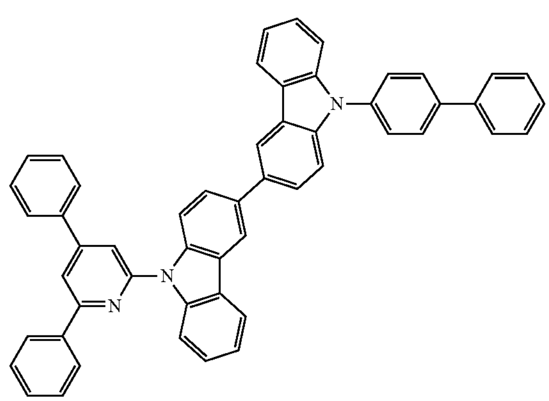

-continued
[A-4]
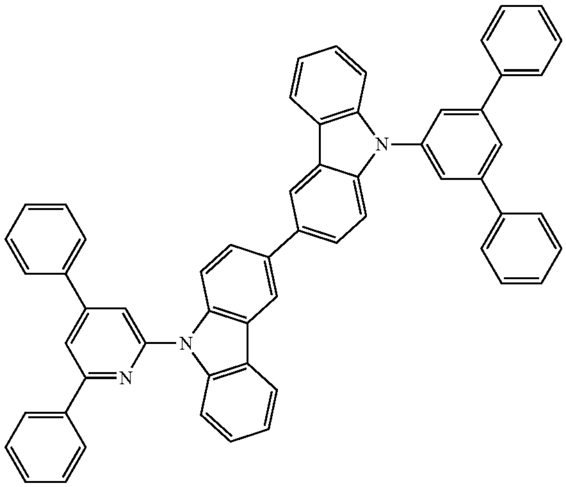
[A-5]
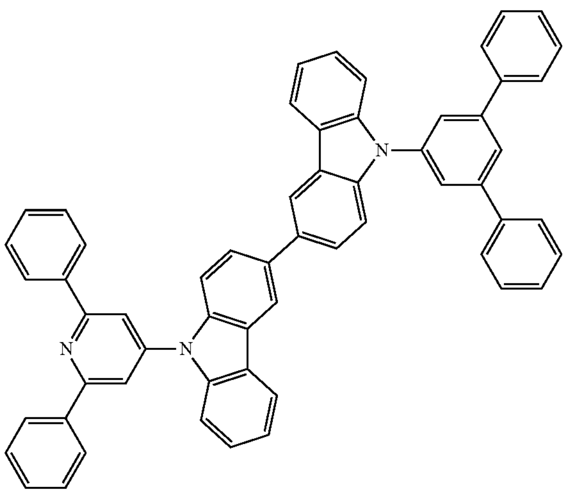
[A-6]
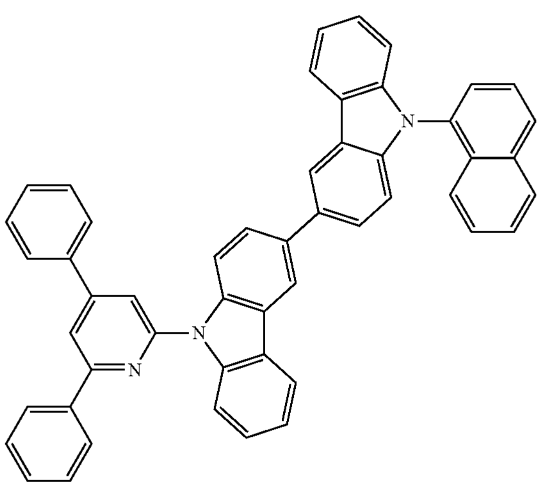
-continued
[A-7]
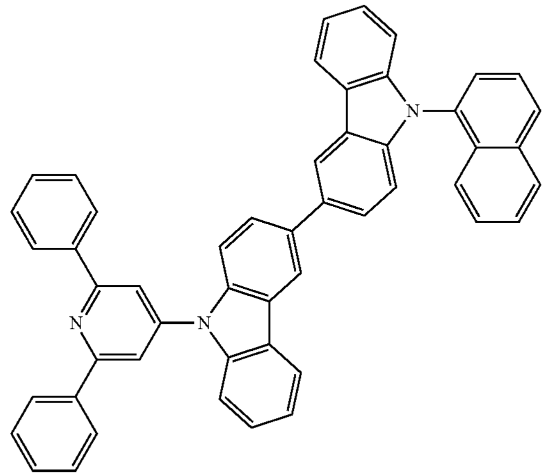
[A-8]
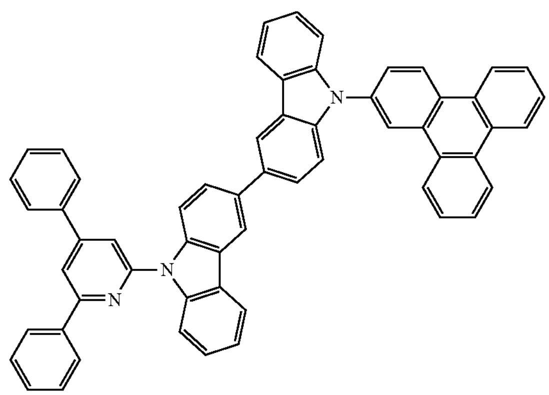
[A-9]
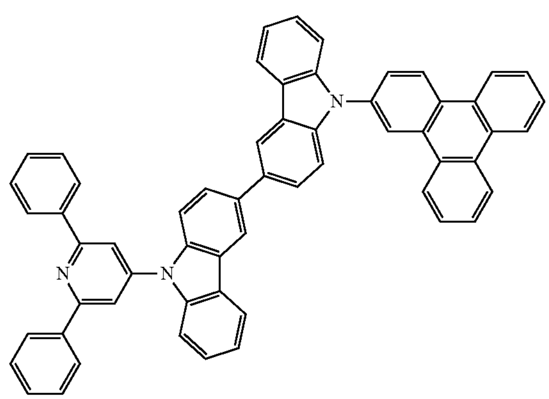

-continued
[A-10]
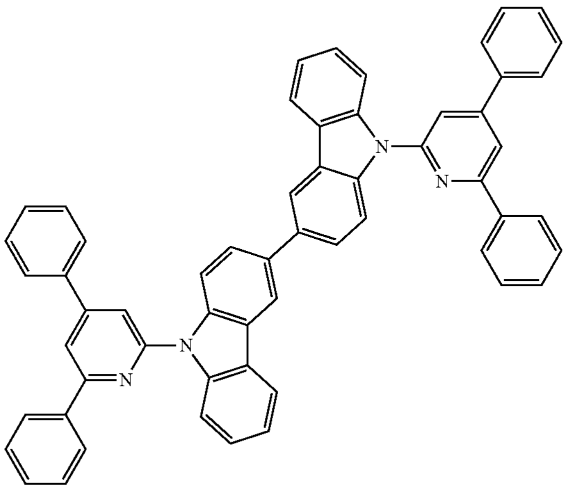
[A-11]
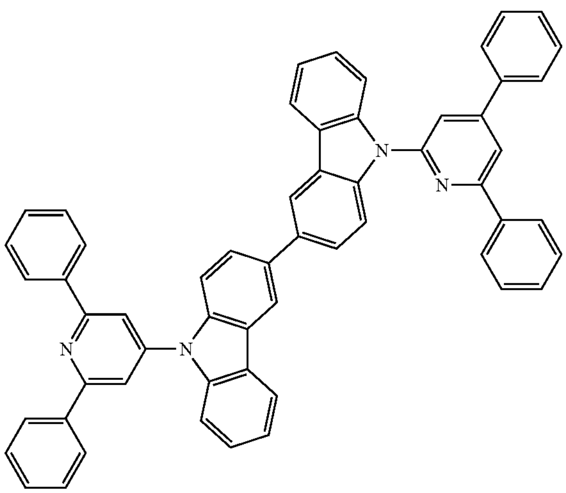
[A-12]
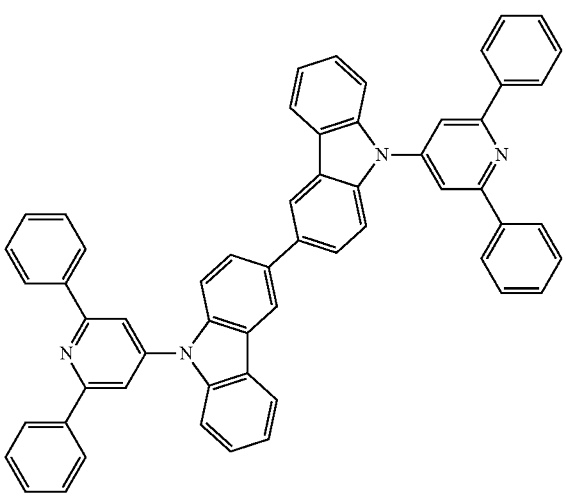
-continued
[A-13]
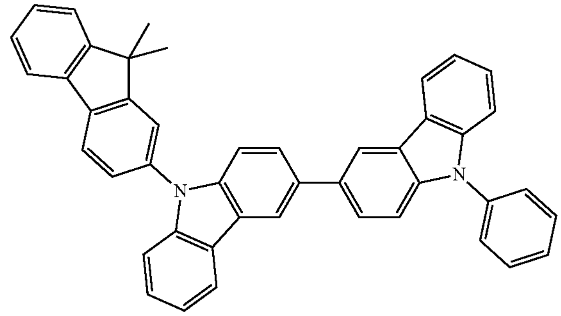
[A-14]
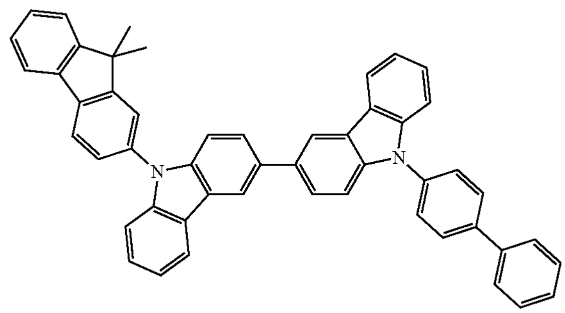
[A-15]
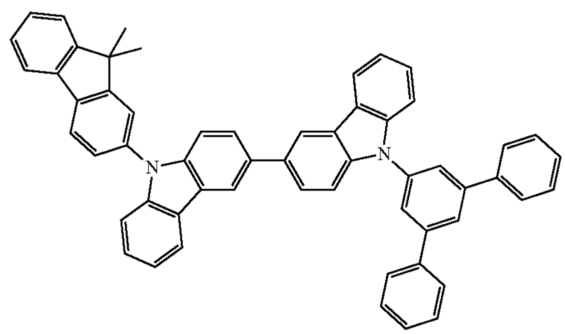
[A-16]
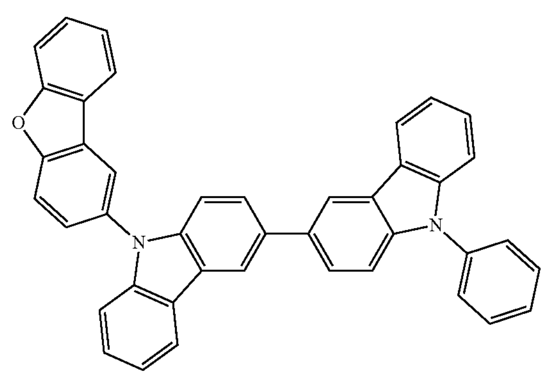

-continued
[A-17]
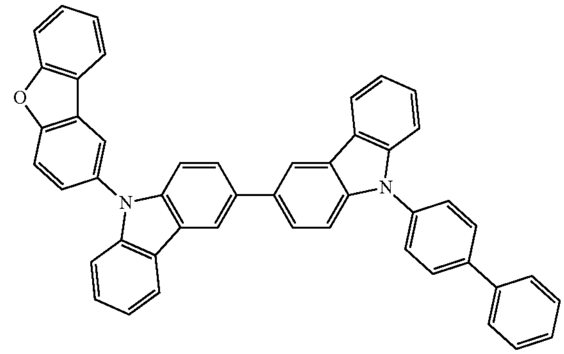
[A-18]
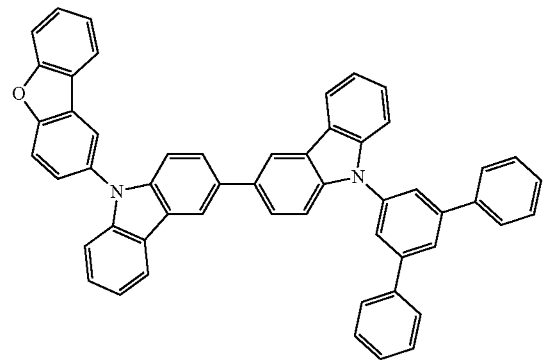
[A-19]
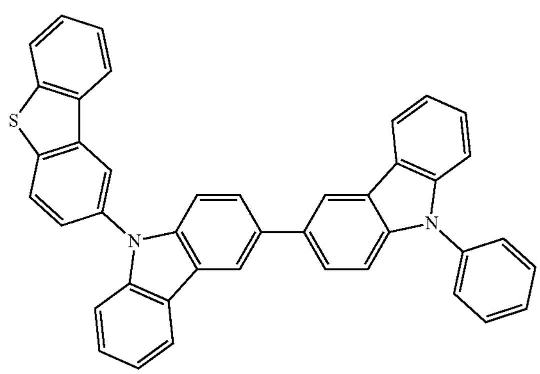
[A-20]
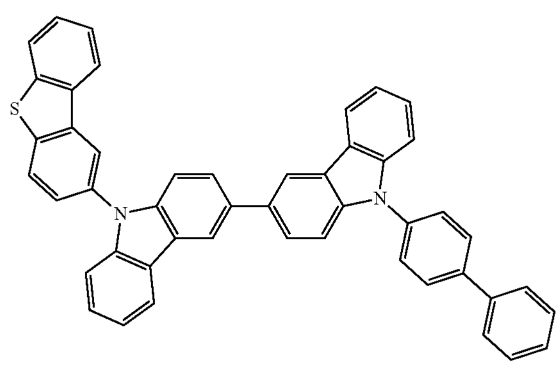
-continued
[A-21]
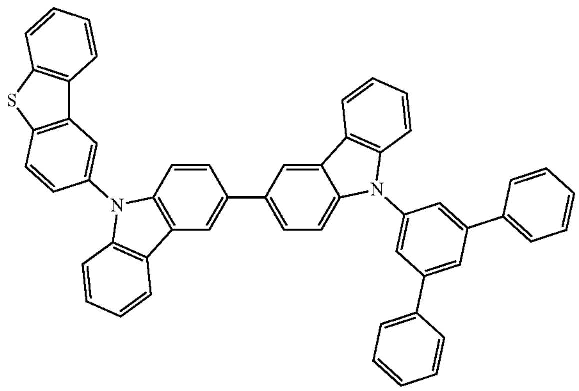
[A-22]
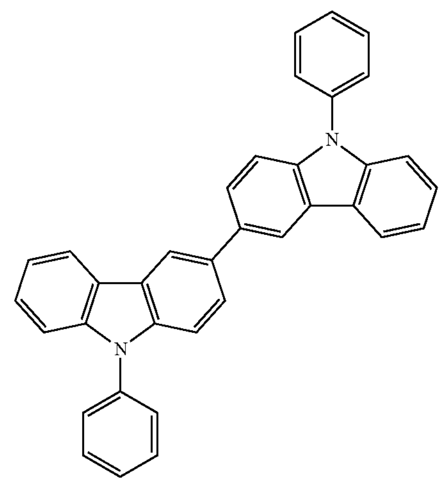
[A-23]
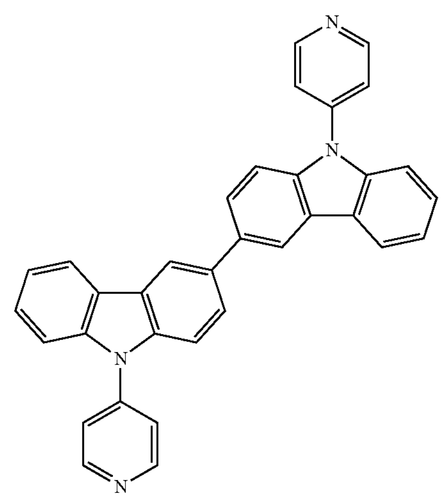

-continued
[A-24]
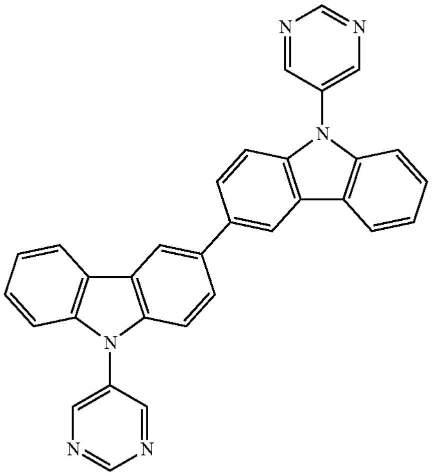
[A-25]
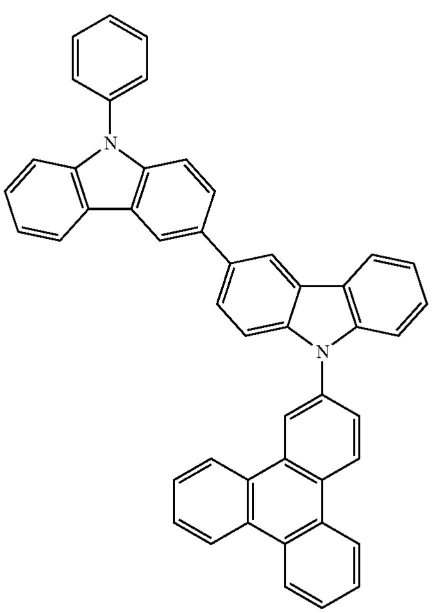
-continued
[A-26]
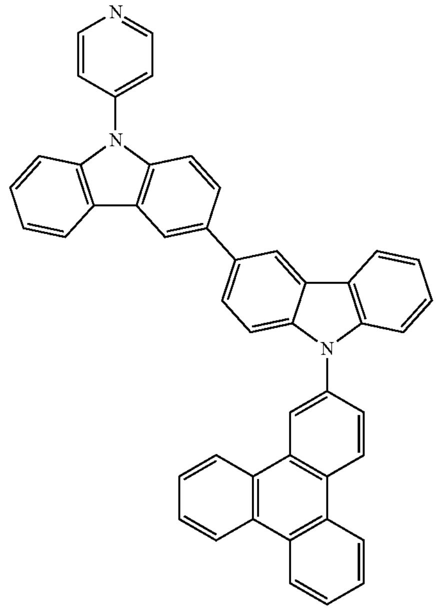
[A-27]
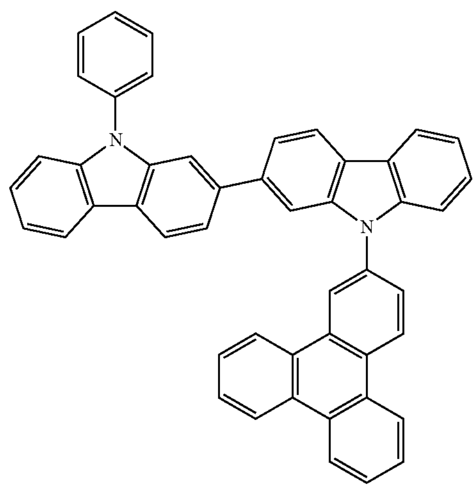
[A-28]
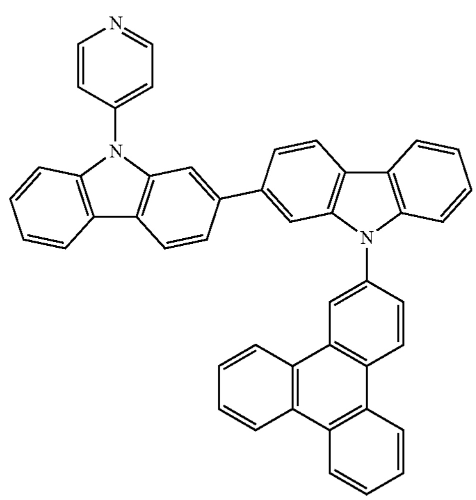

-continued
[A-29]
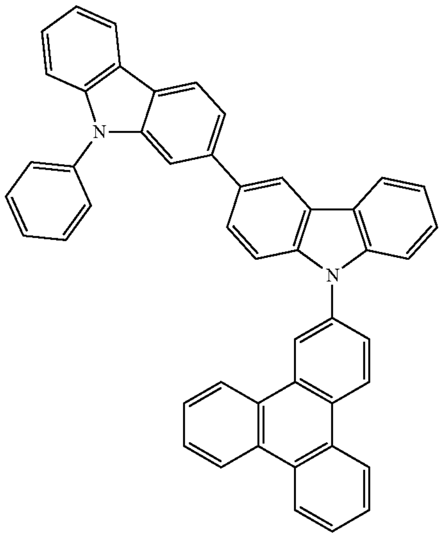
[A-30]
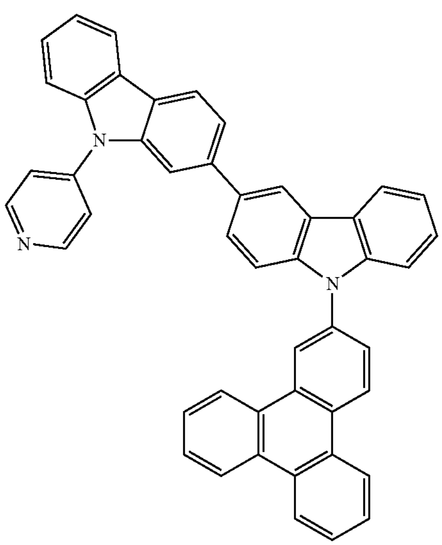
-continued
[A-31]
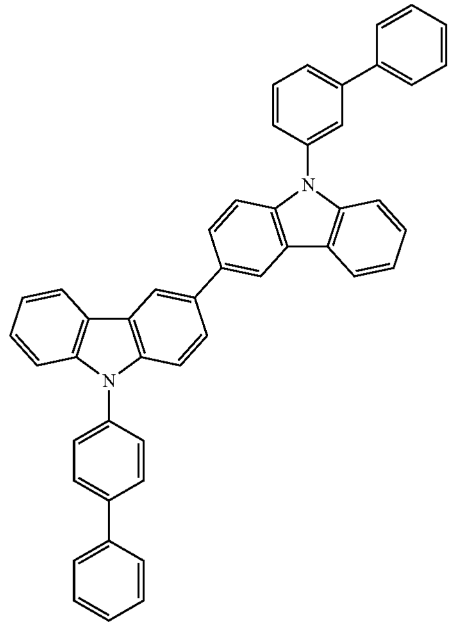
[A-32]
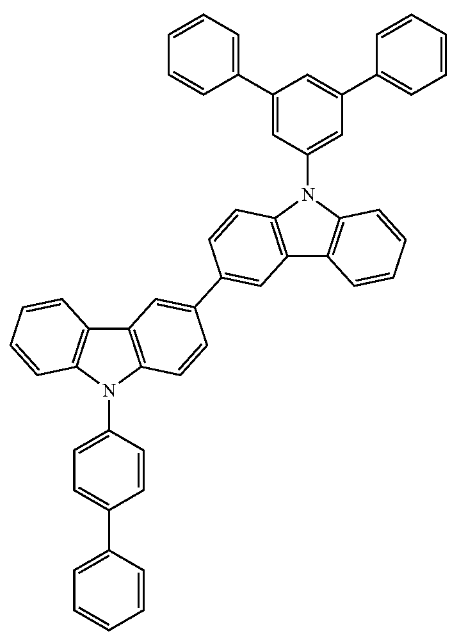

-continued
[A-33]
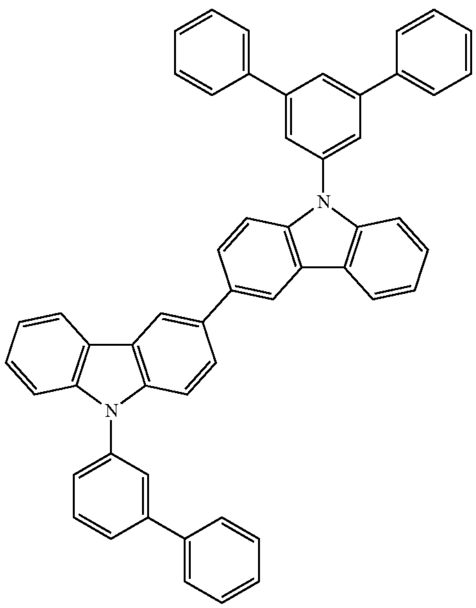
[A-34]
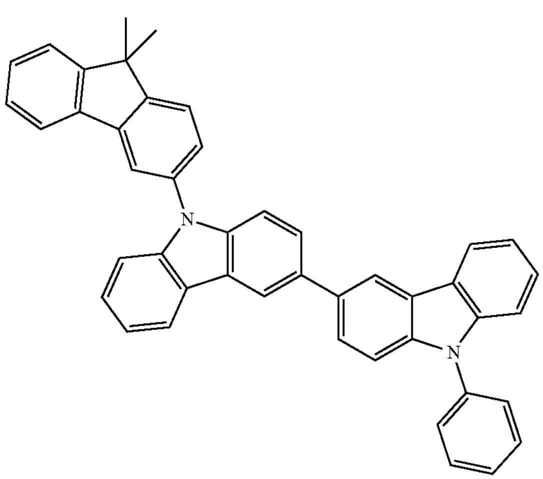
-continued
[A-35]
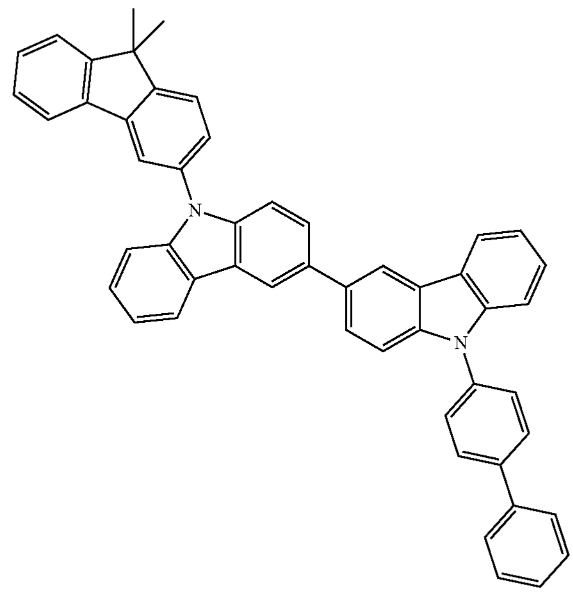
[A-36]
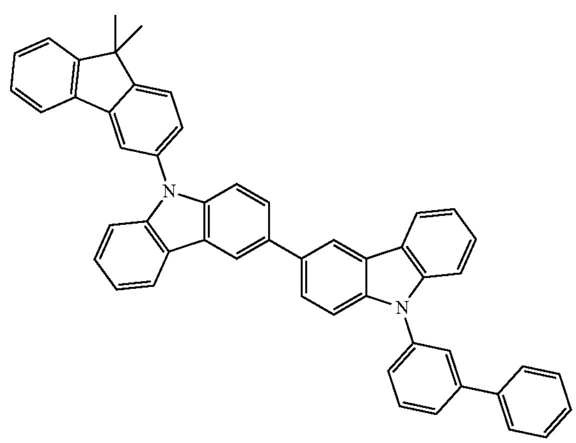
[A-37]
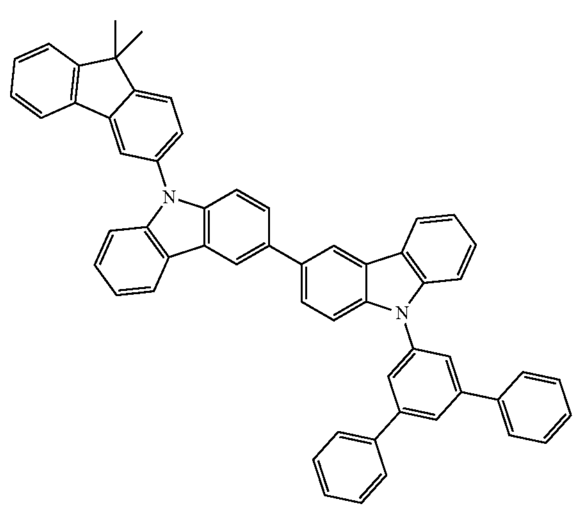

-continued
[A-38]
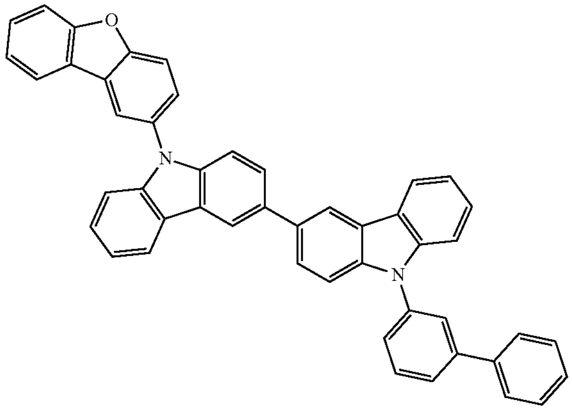
[A-39]
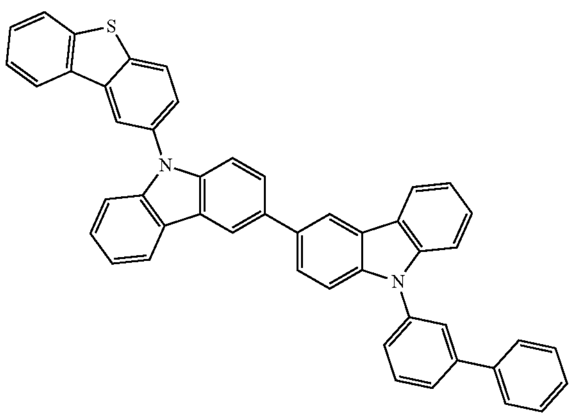
[A-40]
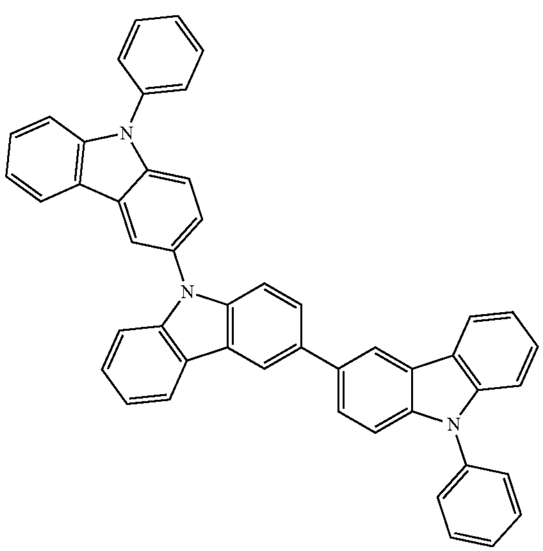
-continued
[A-41]
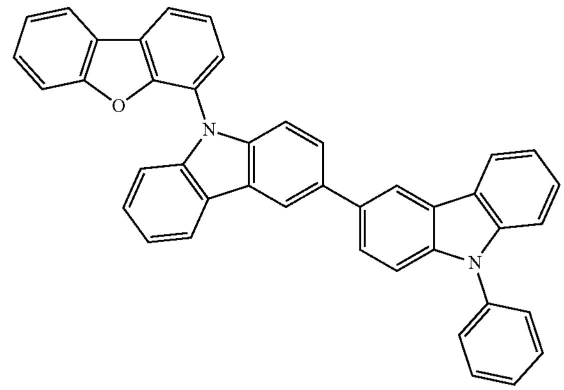
[A-42]
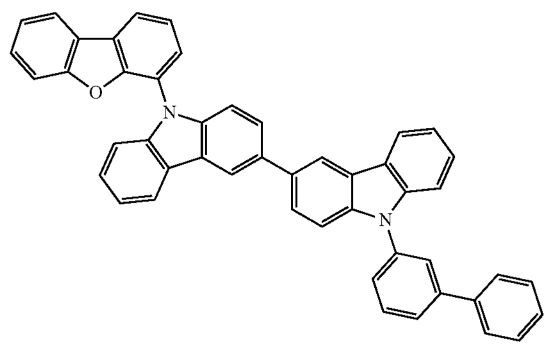
[A-43]
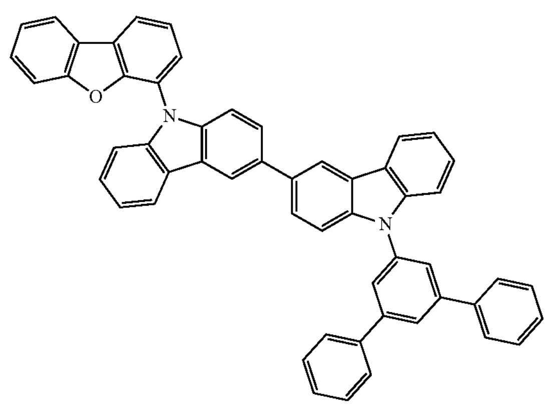

-continued
[A-44]
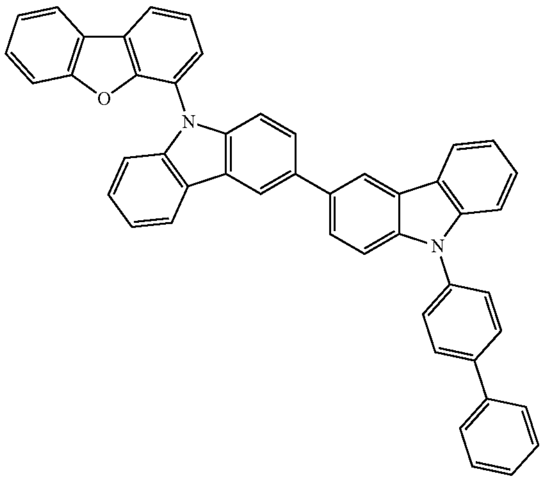
[A-45]
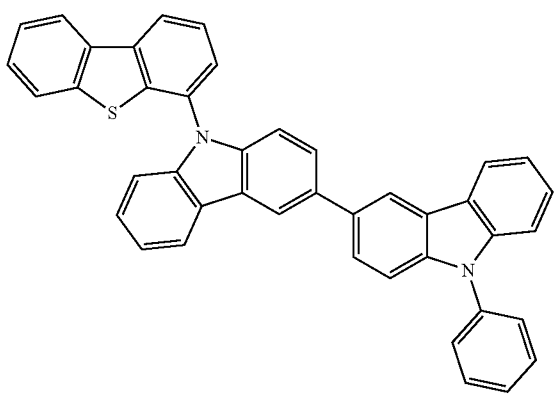
[A-46]
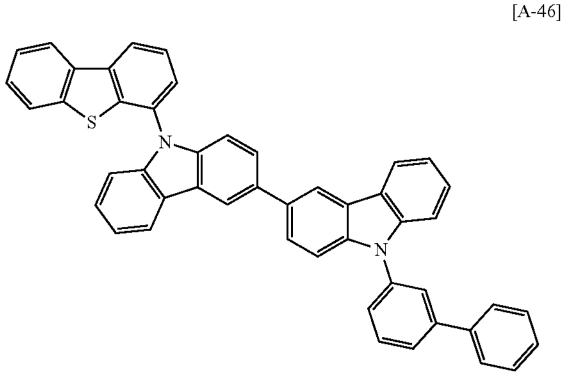
-continued
[A-47]
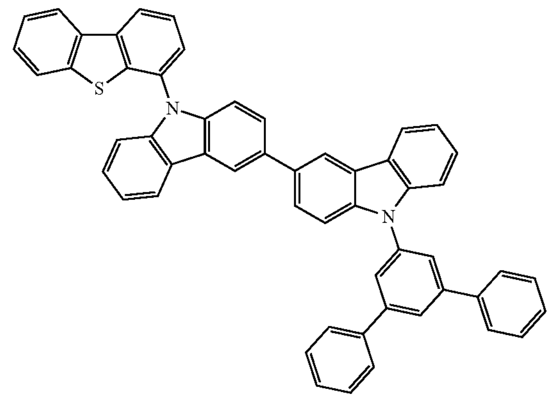
[A-48]
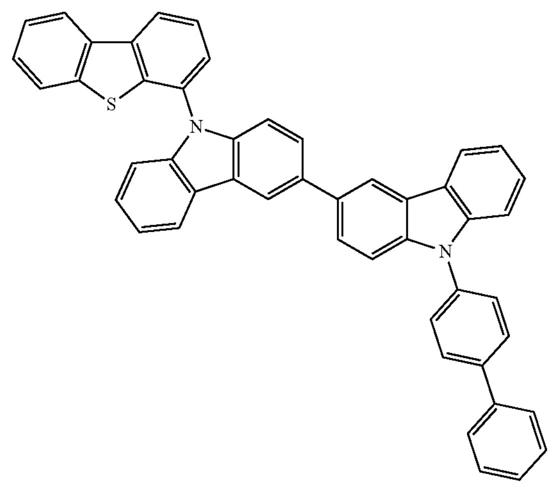
[A-49]
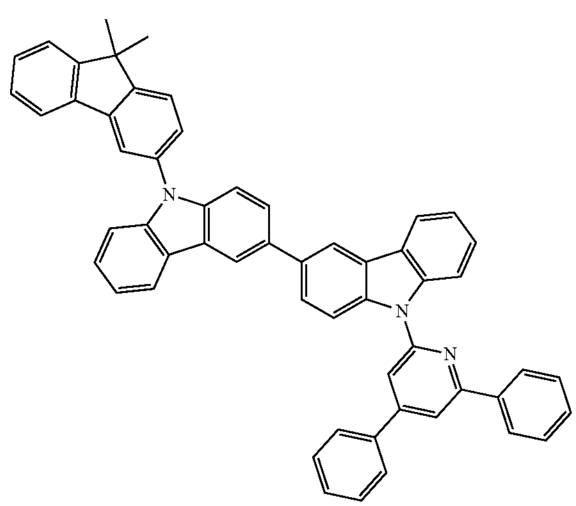

[A-50]
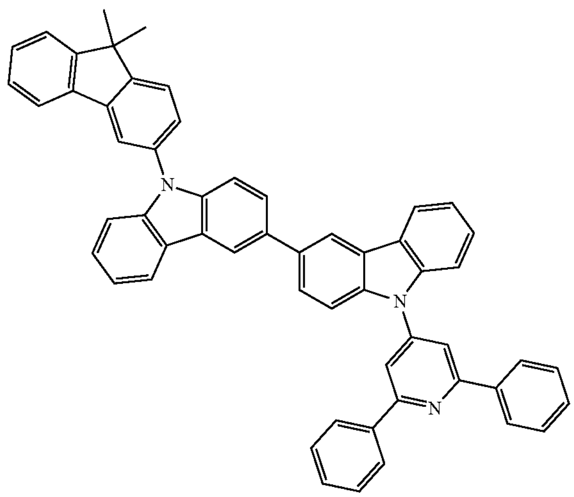
[A-51]
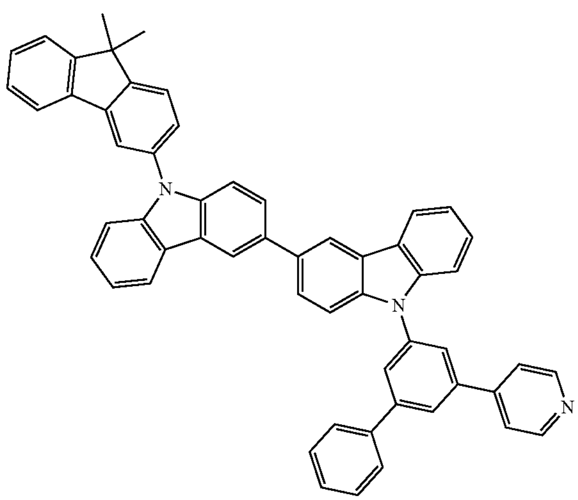
[A-52]
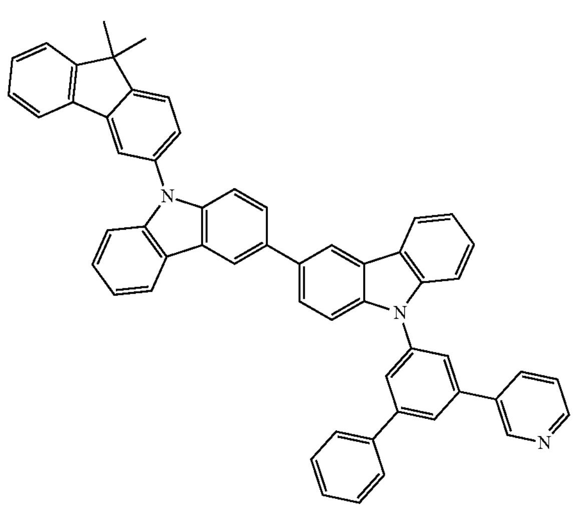
[A-53]
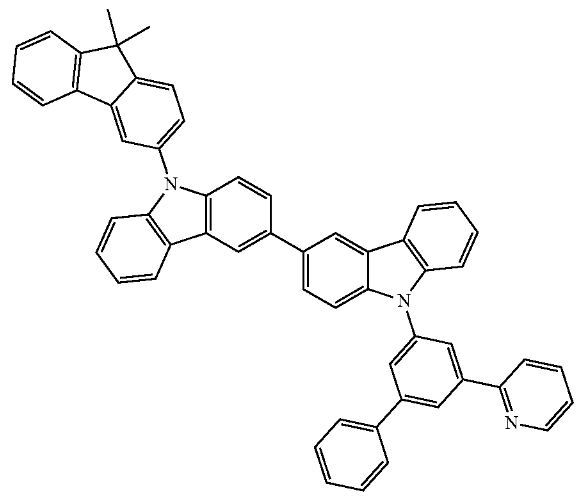
[A-54]
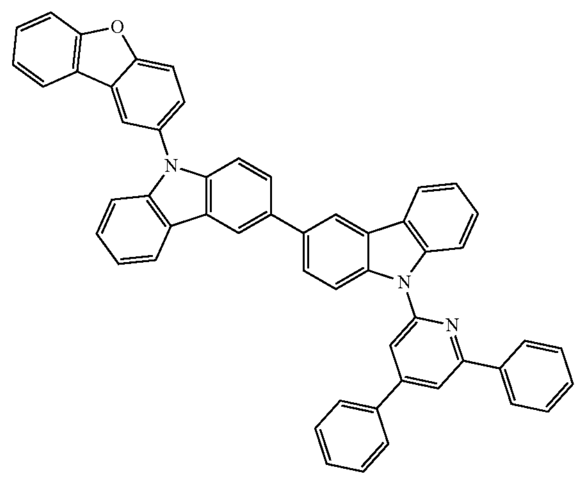
[A-55]
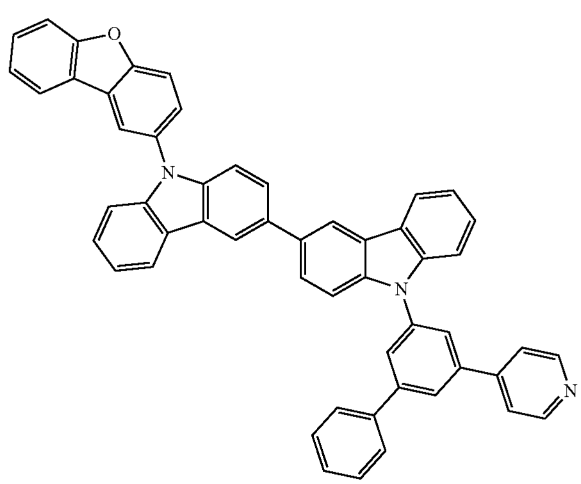

-continued
[A-56]
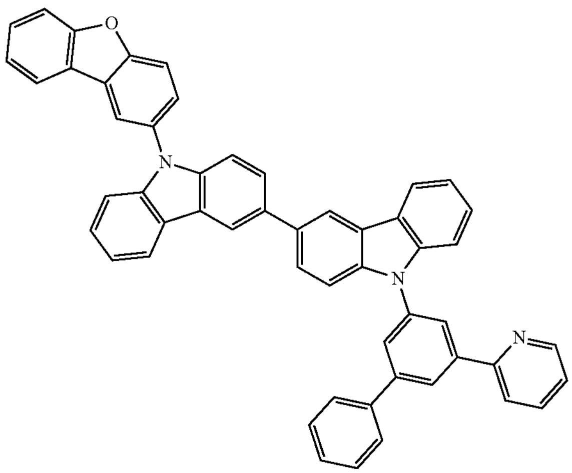
[A-57]
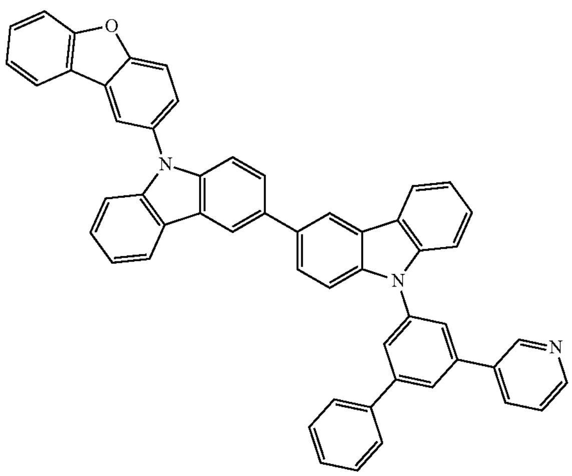
[A-58]
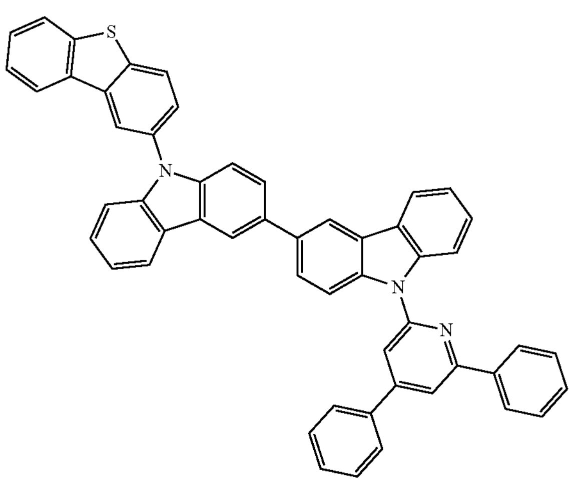
-continued
[A-59]
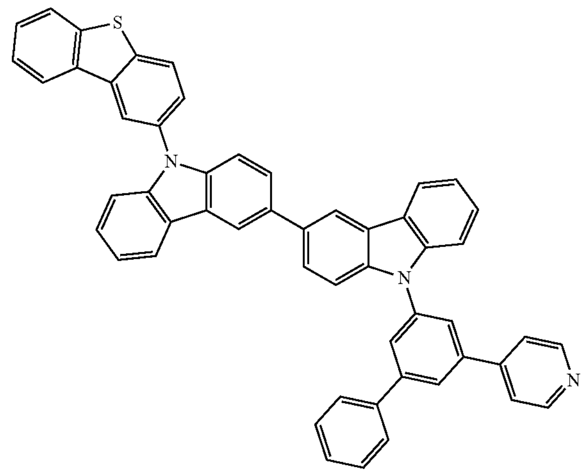
[A-60]
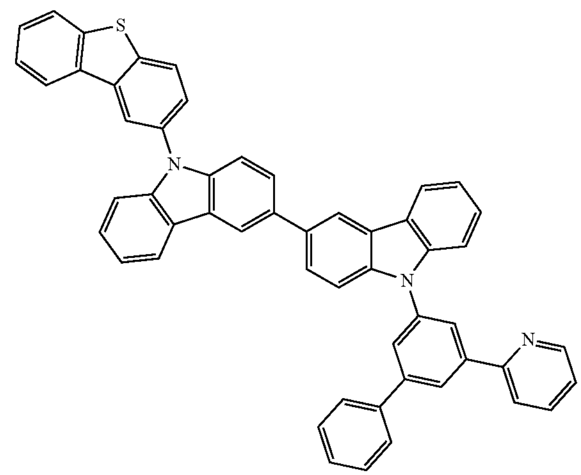
[A-61]
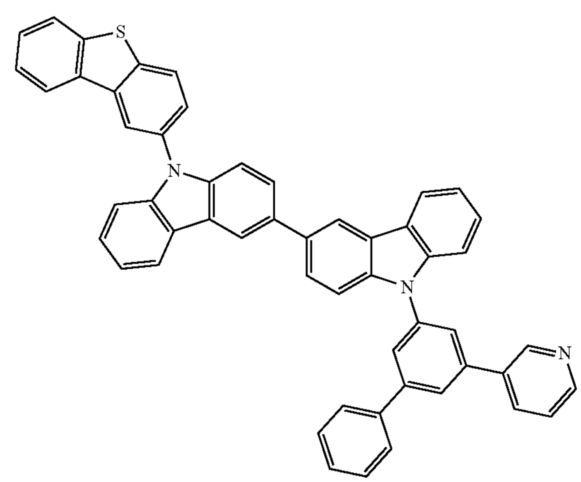

-continued
[A-62]
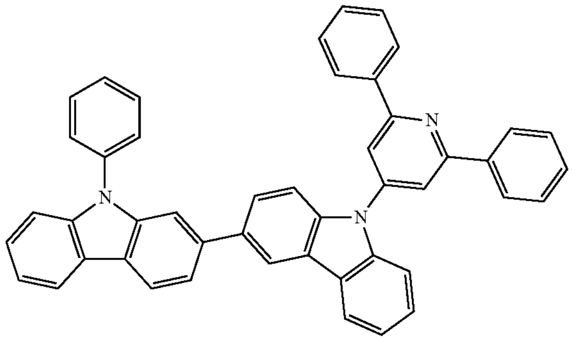
[A-63]
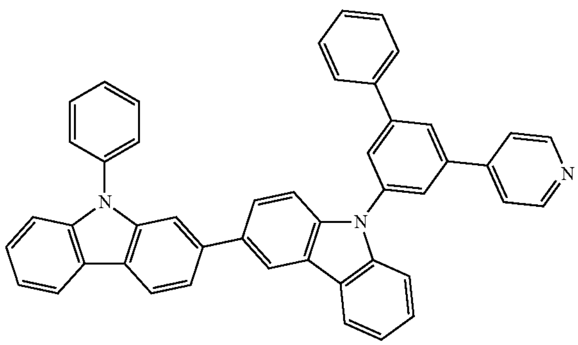
[A-64]
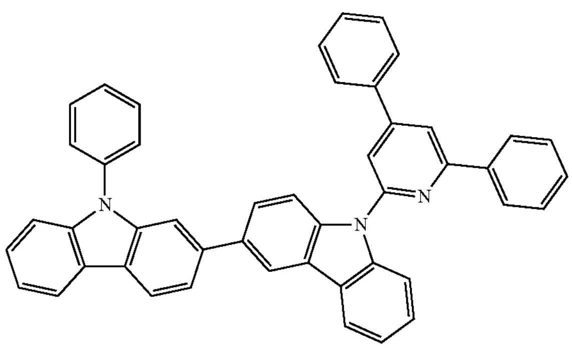
[A-65]
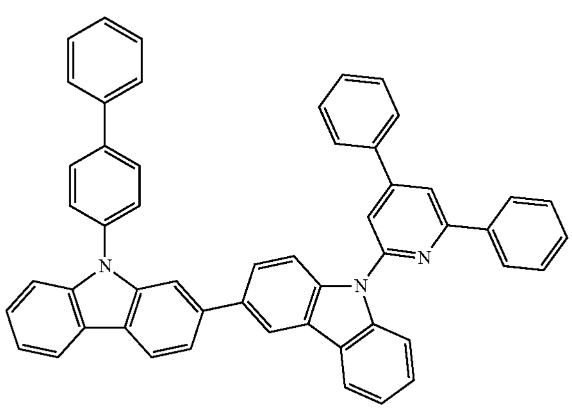
-continued
[A-66]
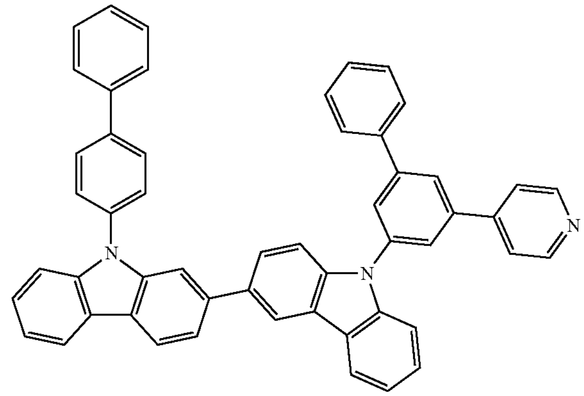
[A-67]
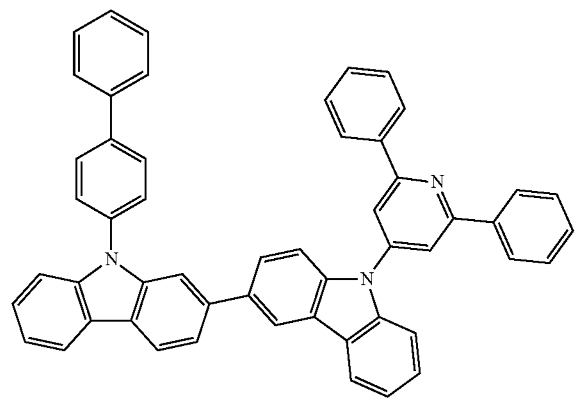
[A-68]
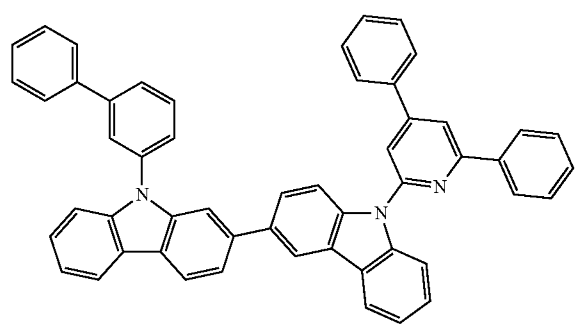
[A-69]
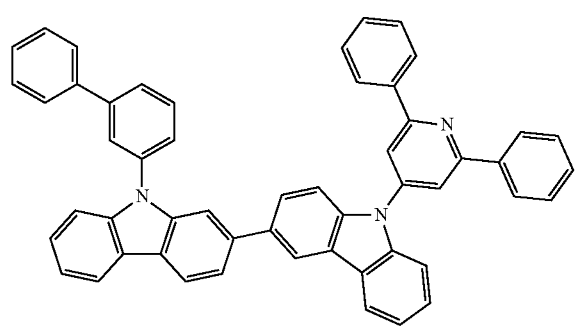

[A-70]
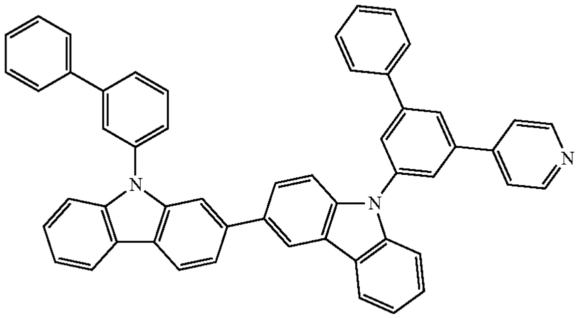
[A-71]
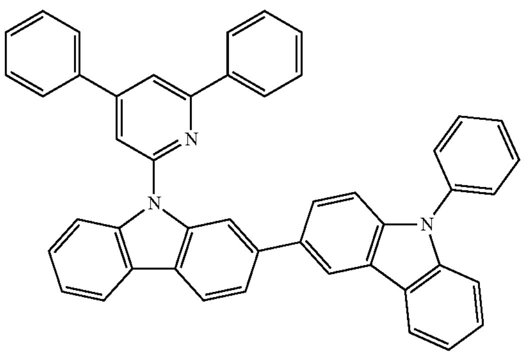
[A-72]
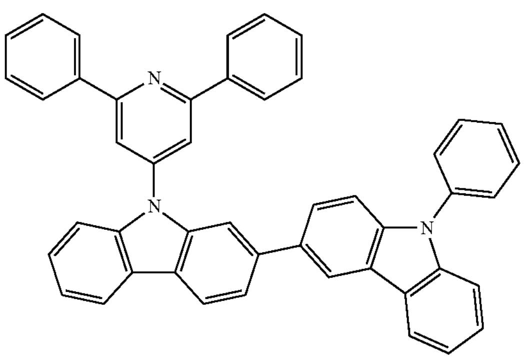
[A-73]
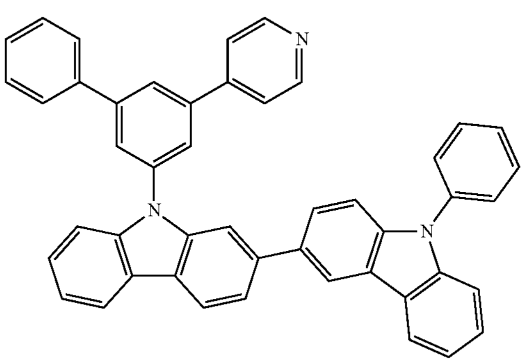
[A-74]
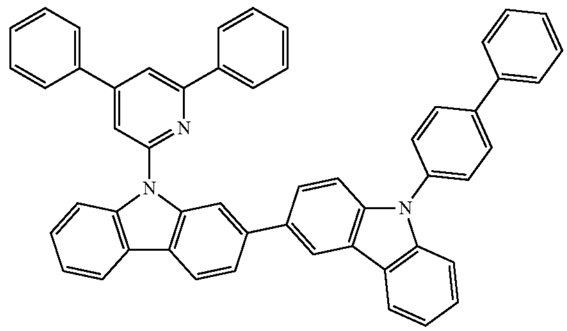
[A-75]
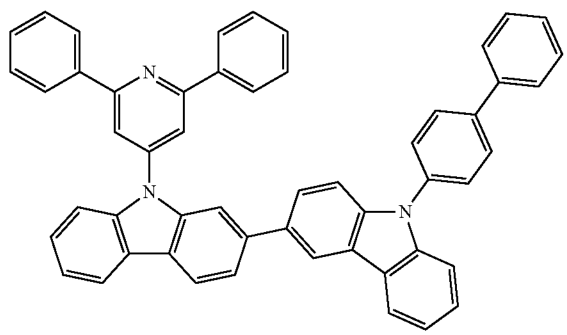
[A-76]
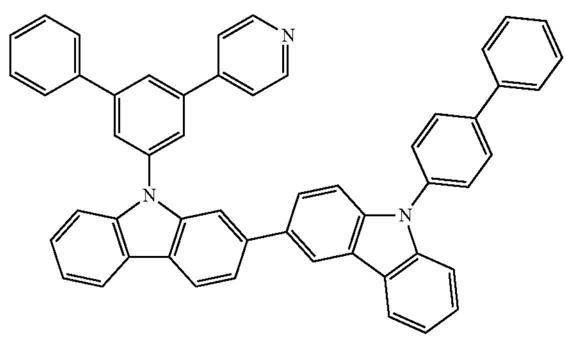
[A-77]
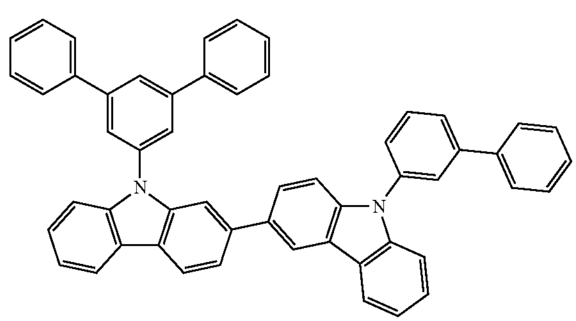

-continued
[A-78]
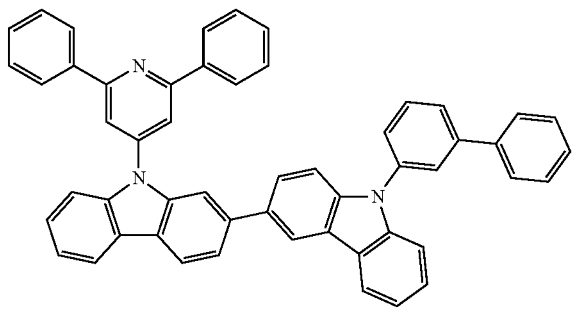
[A-79]
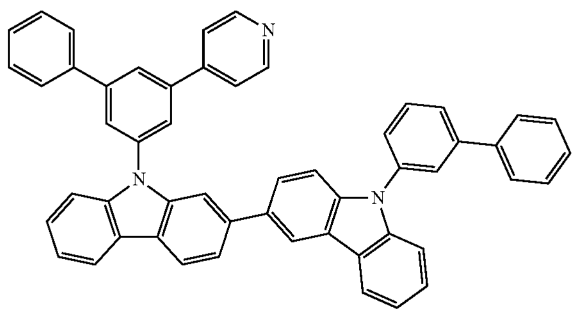
[A-80]
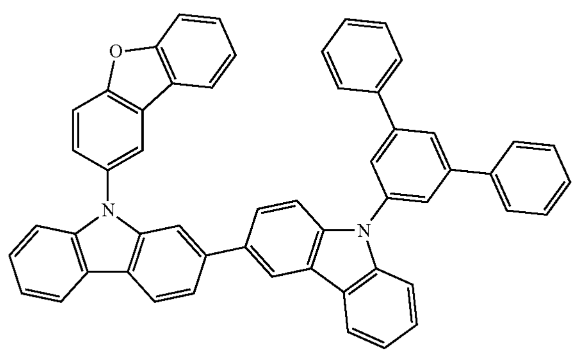
[A-81]
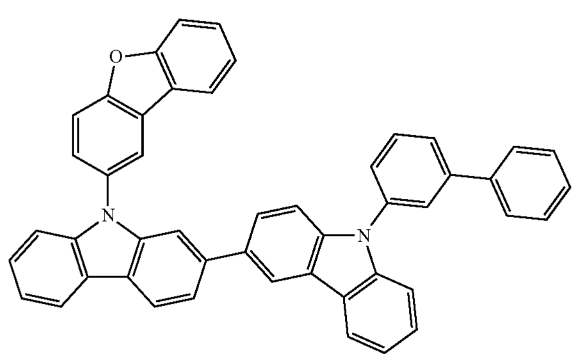
-continued
[A-82]
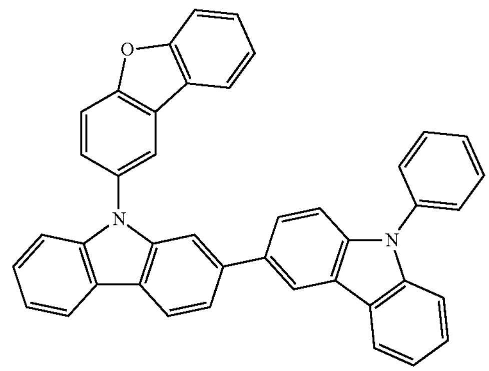
[A-83]
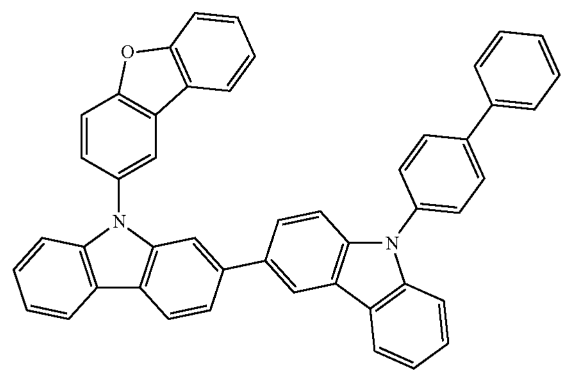
[A-84]
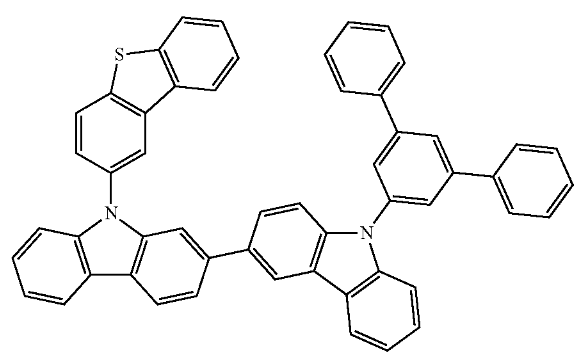
[A-85]
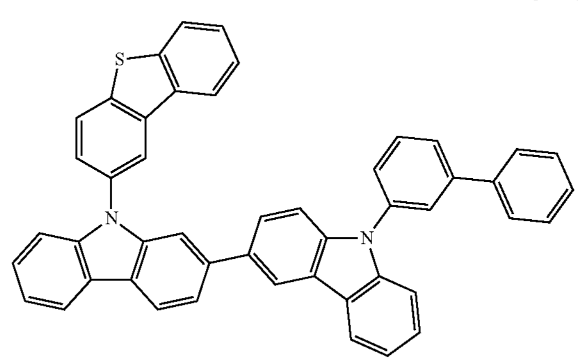

-continued
[A-86]
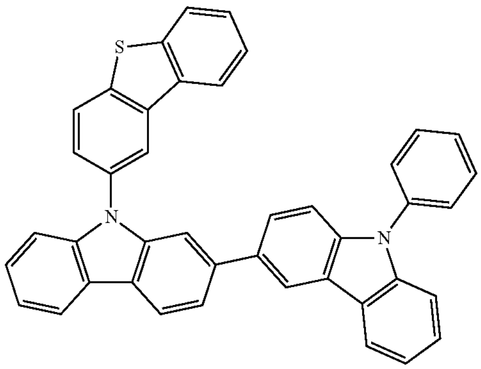
[A-87]
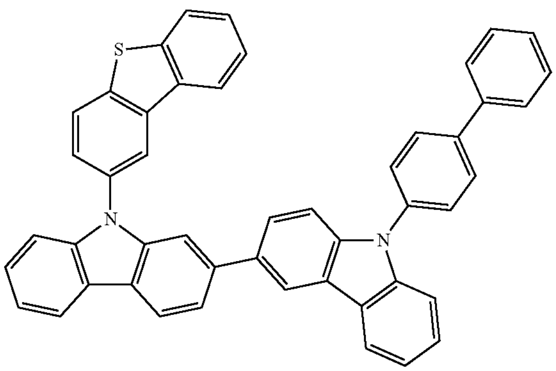
[A-88]
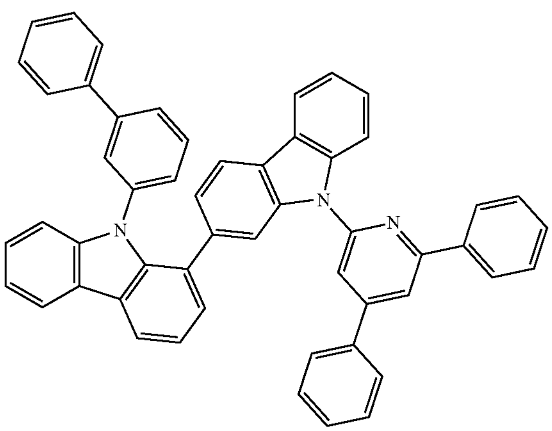
[A-89]
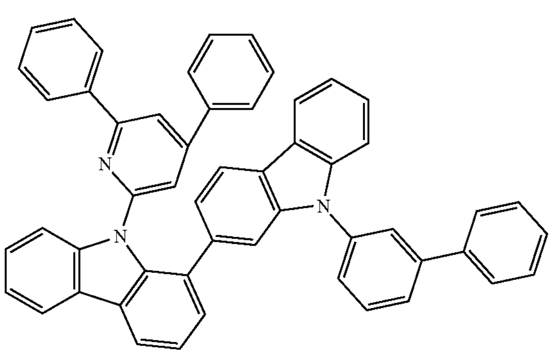
-continued
[A-90]
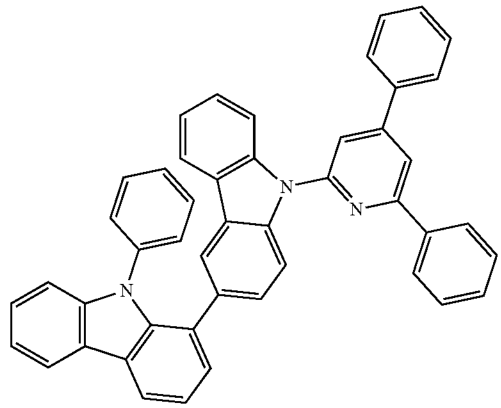
[A-91]
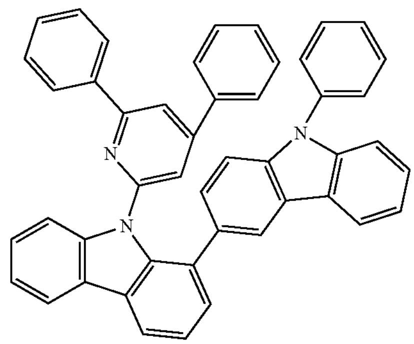
[A-92]
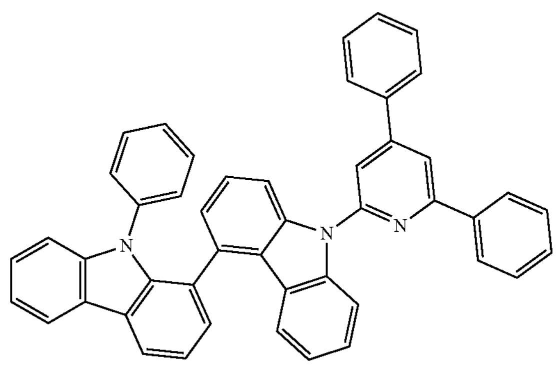
[A-93]
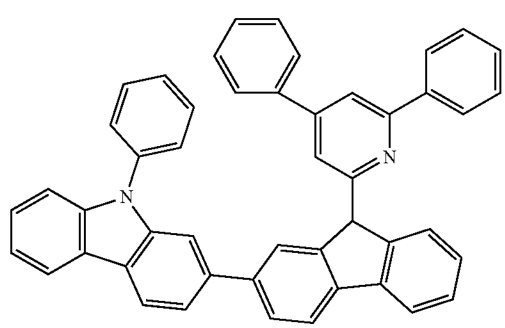

-continued
[A-94]
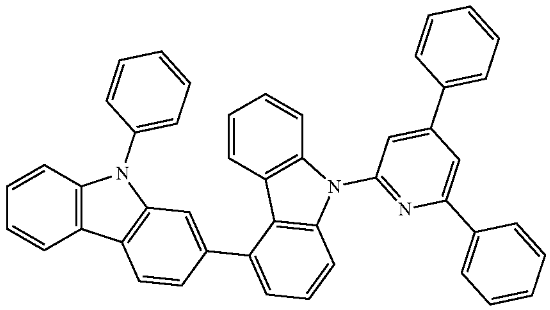
[A-95]
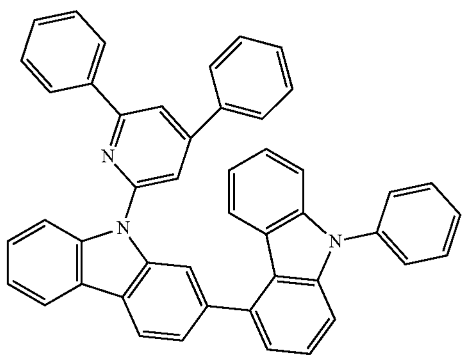
[A-96]
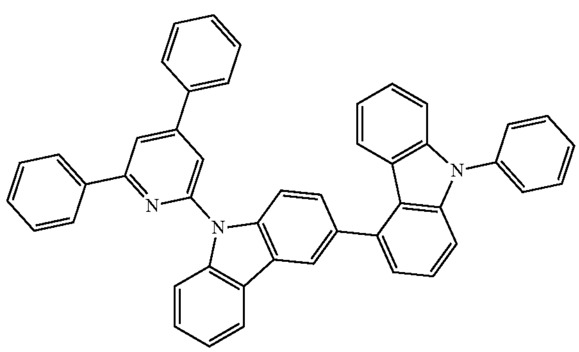
[A-97]
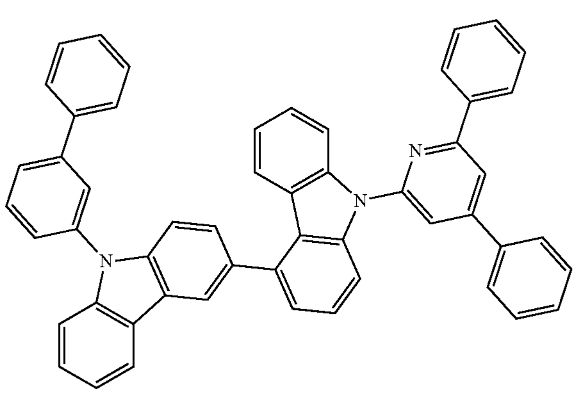
-continued
[A-98]
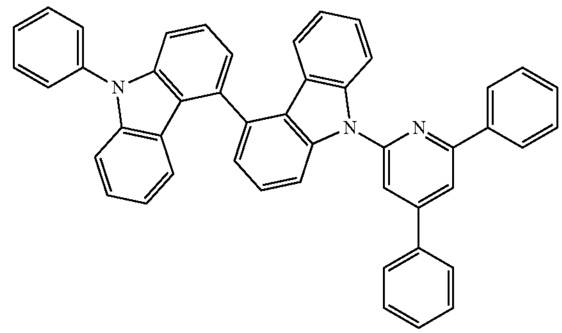
[A-99]
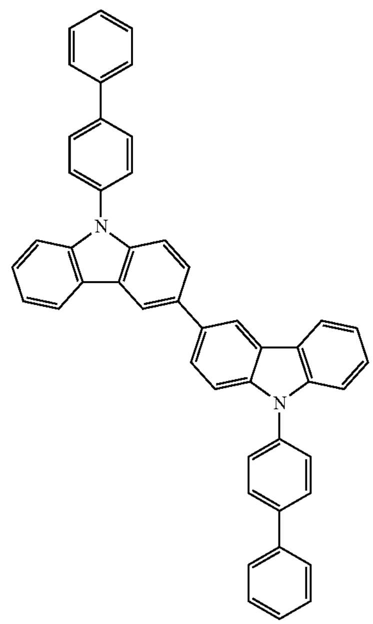
[A-100]
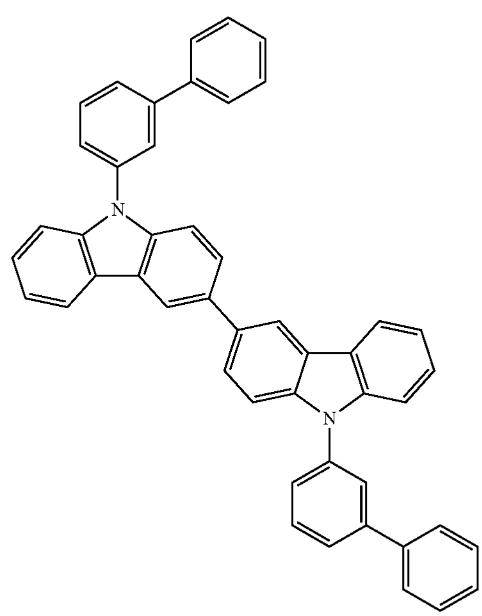

-continued
[A-101]
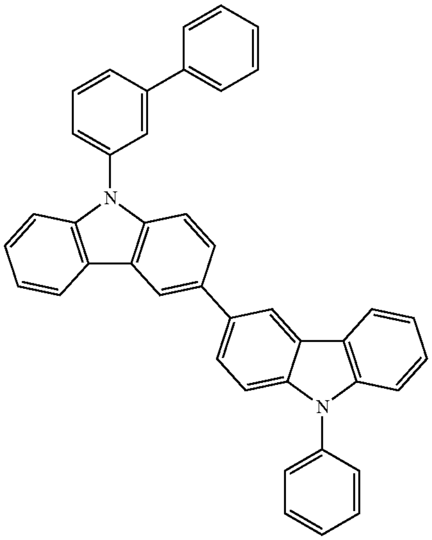
[A-102]
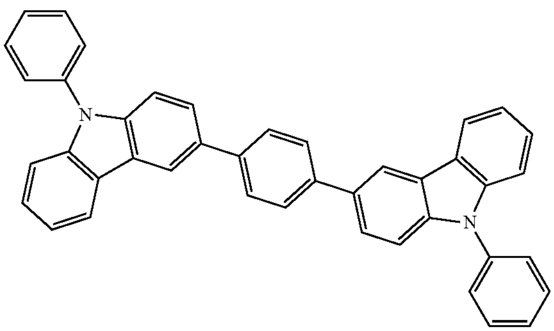
[A-103]
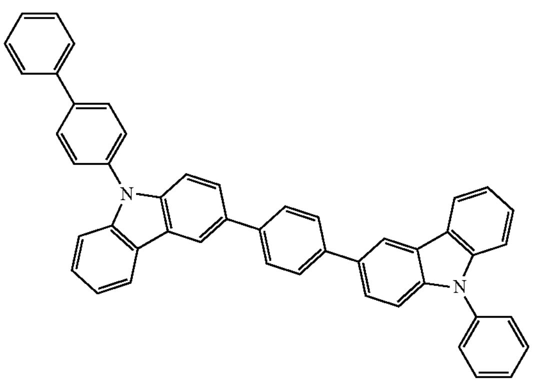
[A-104]
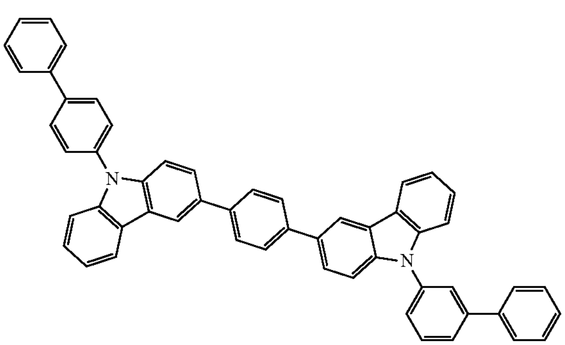
-continued
[A-105]
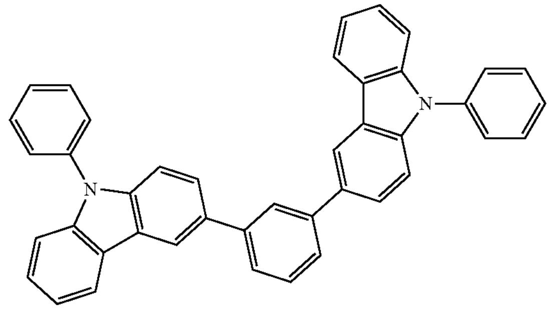
[A-106]
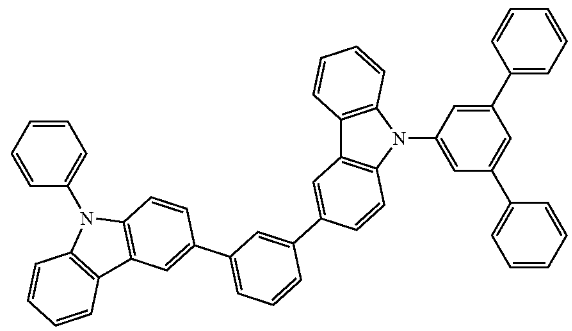
[A-107]
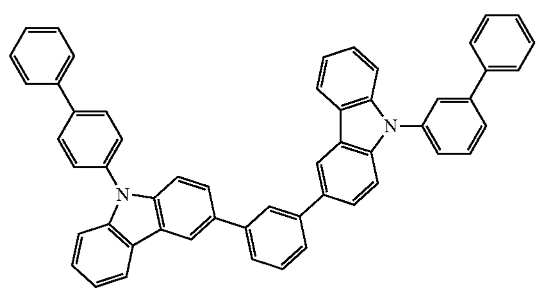
[A-108]
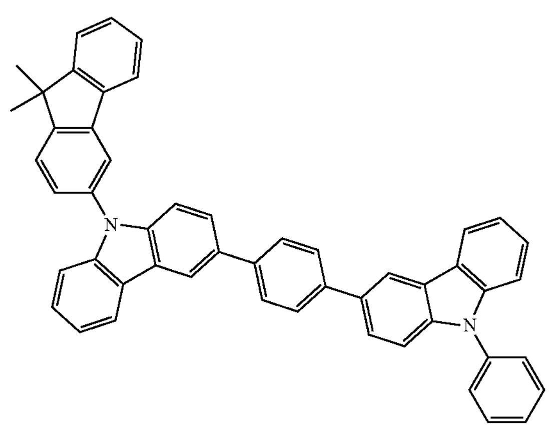

-continued
[A-109]
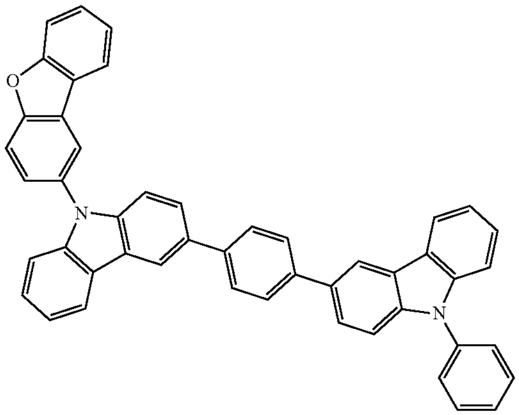
[A-110]
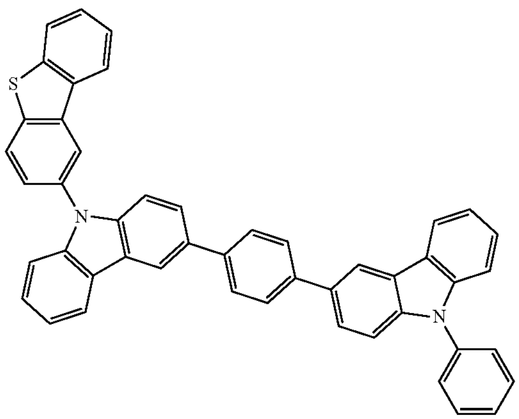
[A-111]
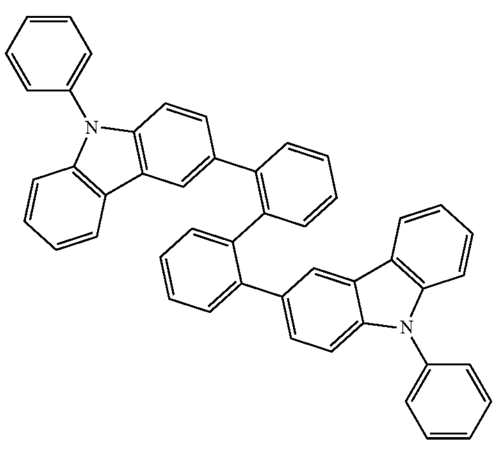
-continued
[A-112]
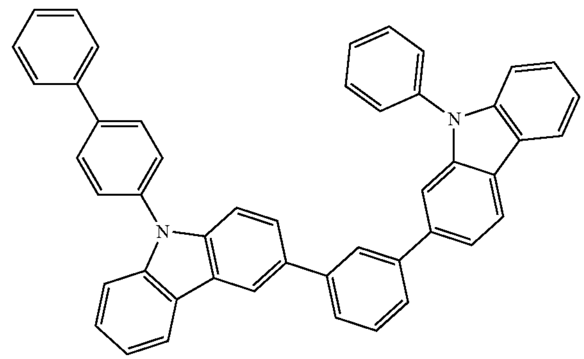
[A-113]
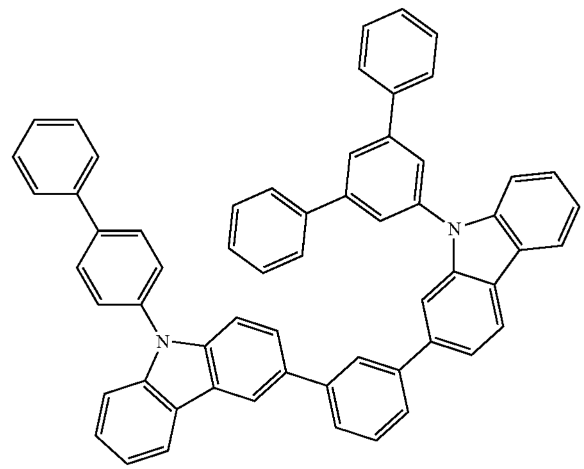
[A-114]
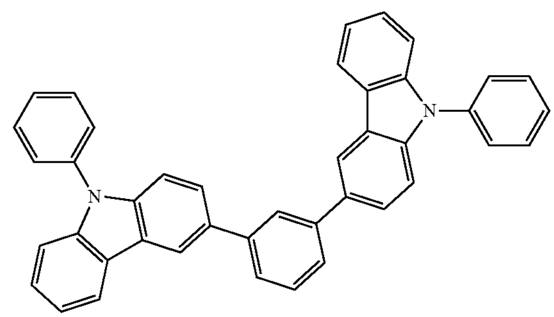
[A-115]
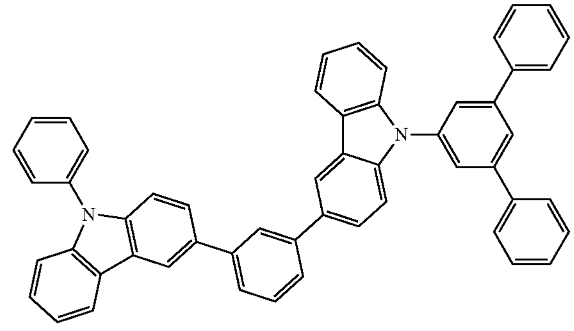

[A-116]
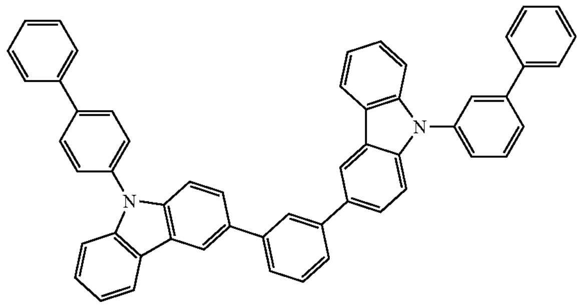
[A-117]
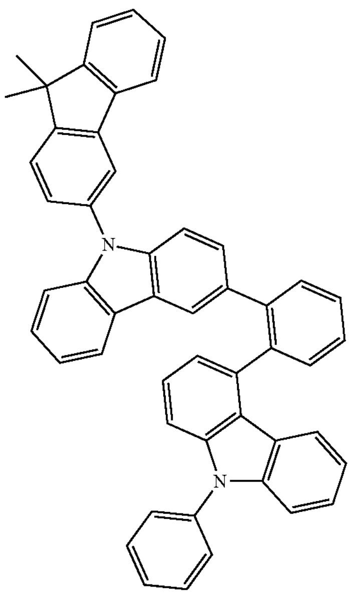
[A-118]
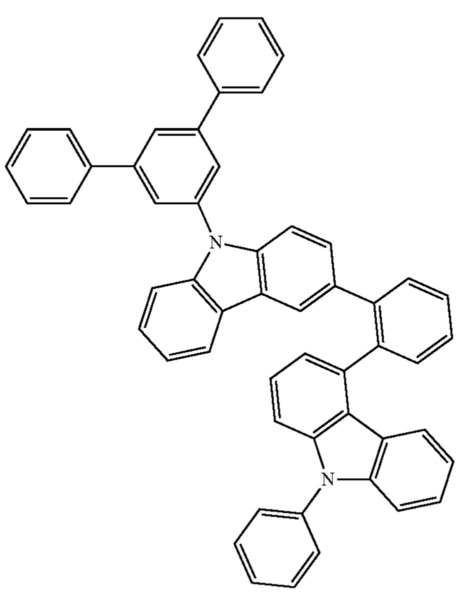
[A-119]
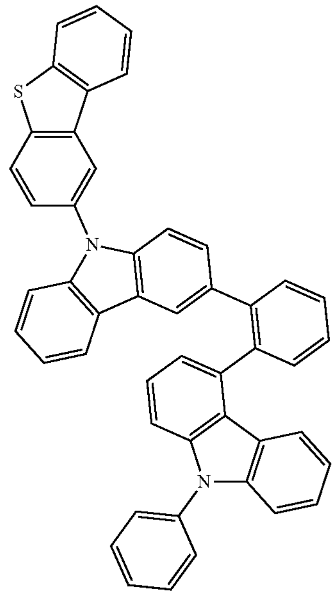
[A-120]
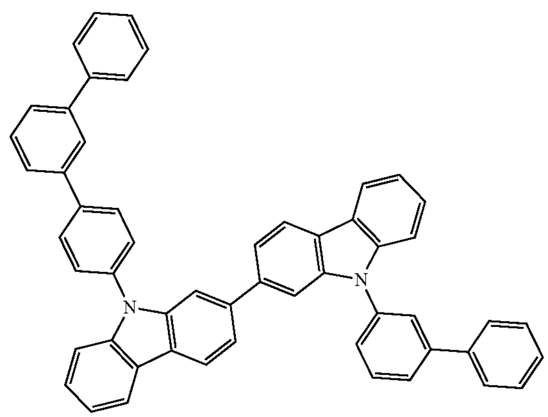
[A-121]
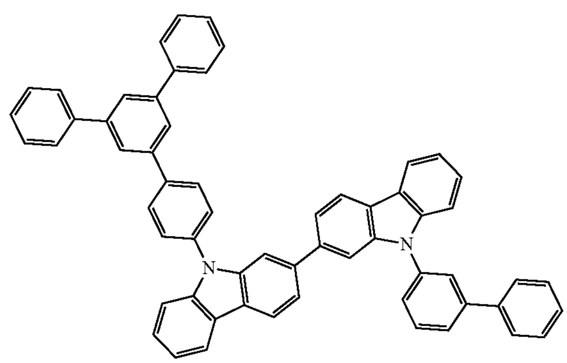

-continued
[A-122]
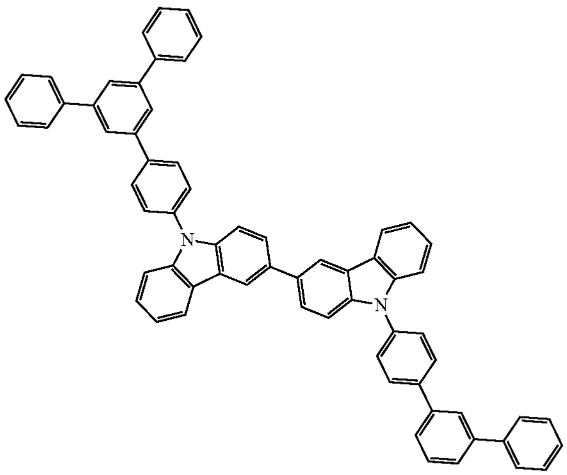
[A-123]
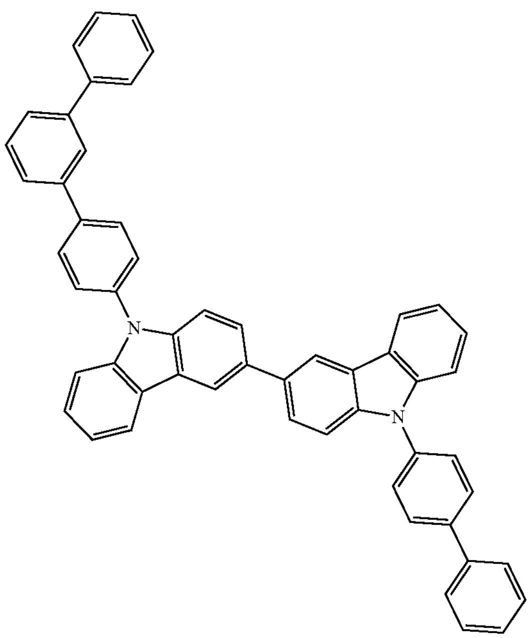
[A-124]
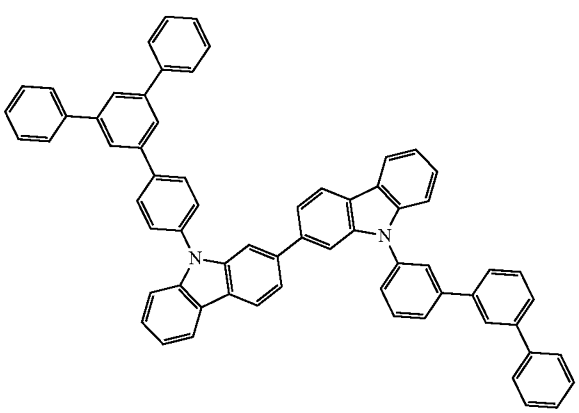
-continued
[A-125]
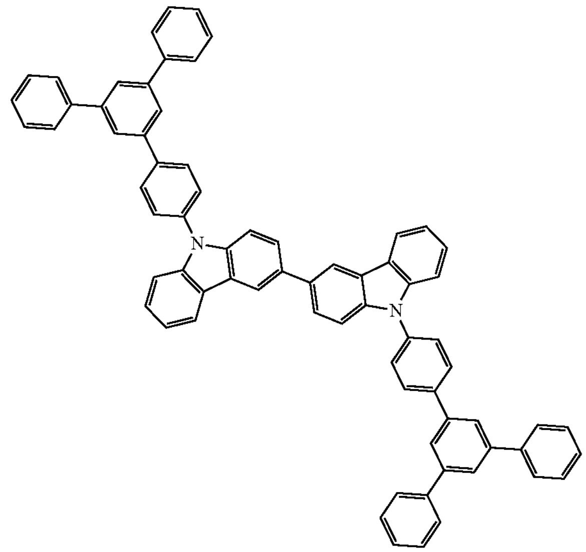
[A-126]
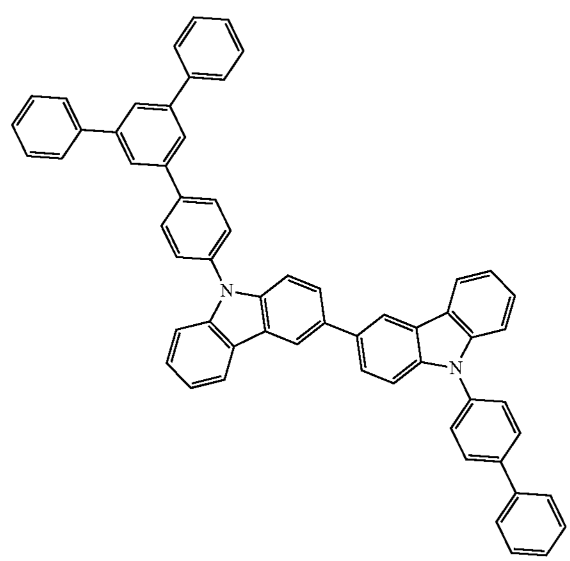

-continued
[A-127]
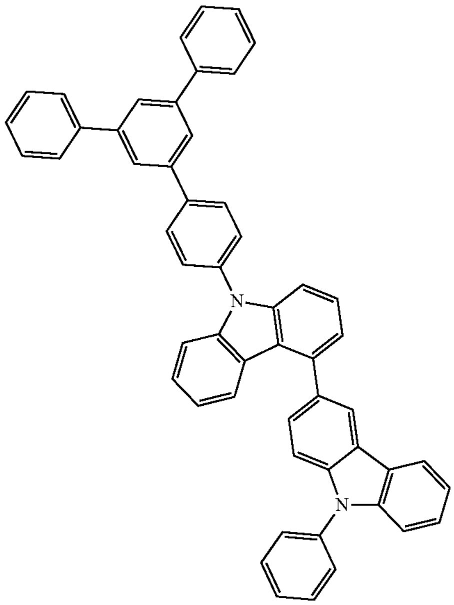
[A-128]
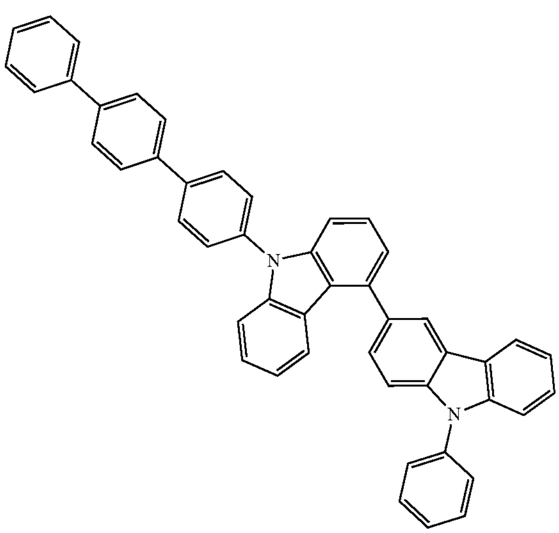
-continued
[A-129]
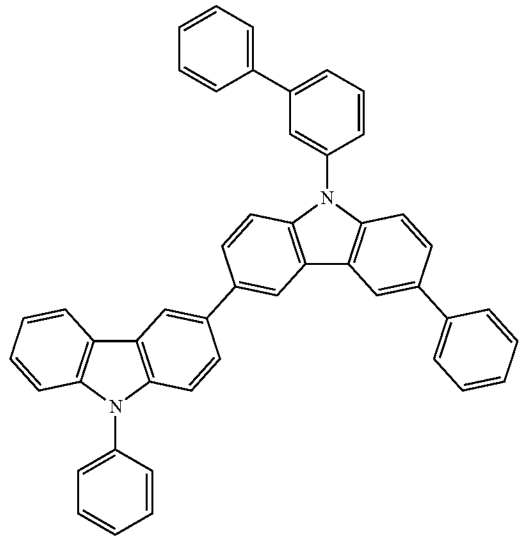
[A-130]
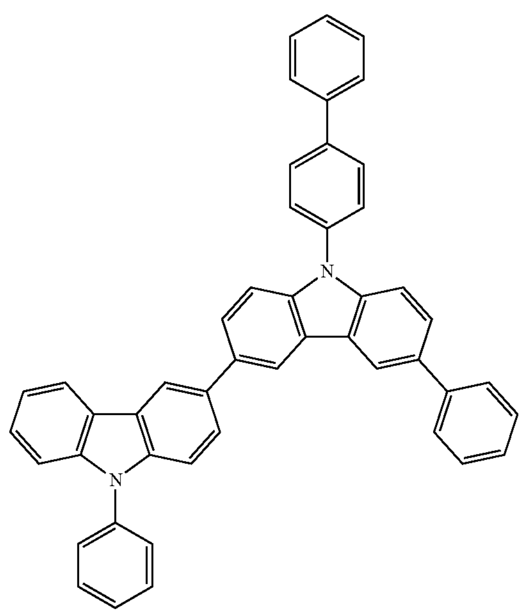

-continued
[A-131]
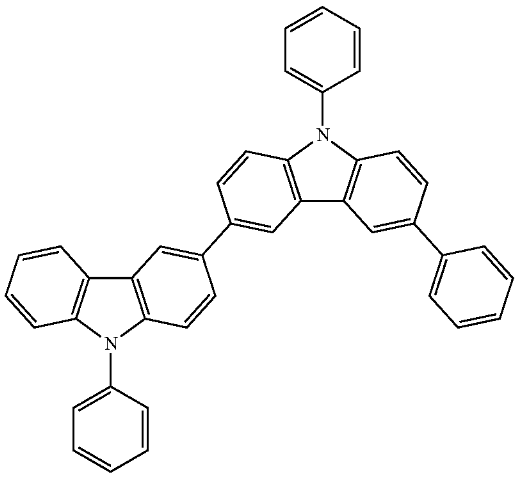
[A-132]
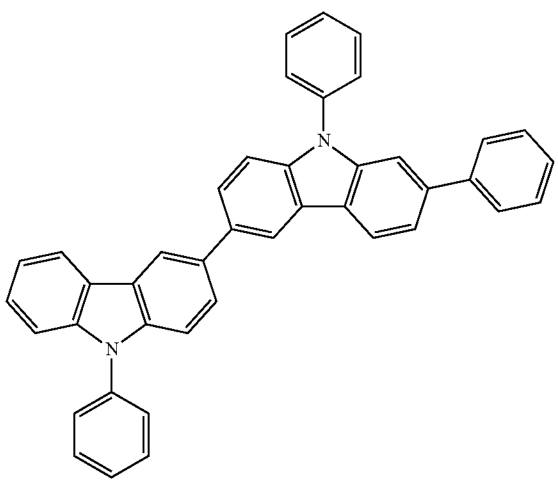
[A-133]
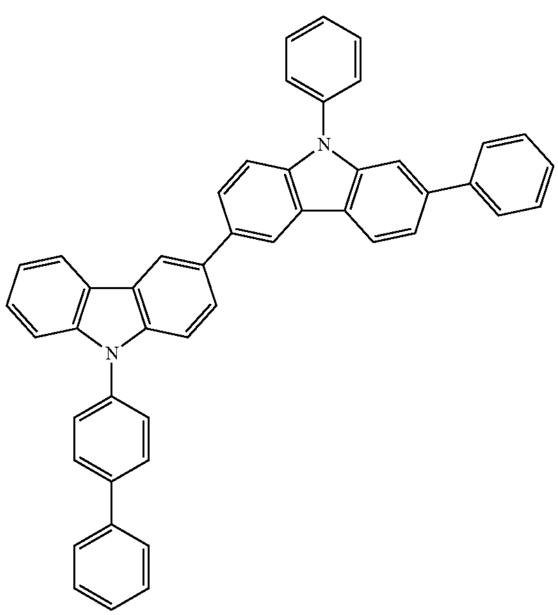
-continued
[A-134]
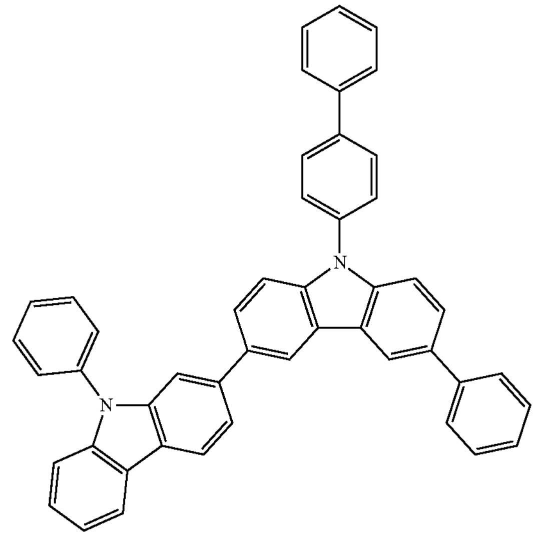
[A-135]
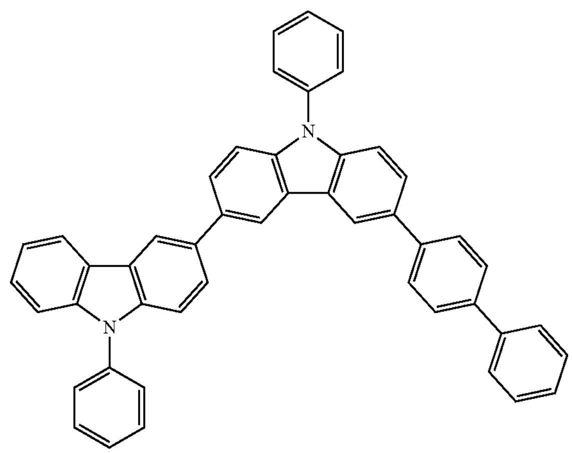
[A-136]
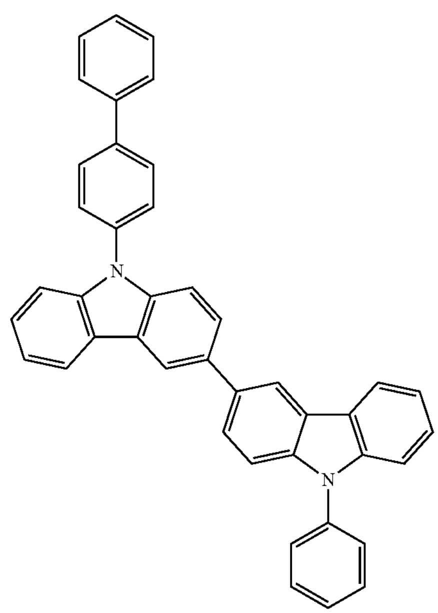

-continued
[A-137]
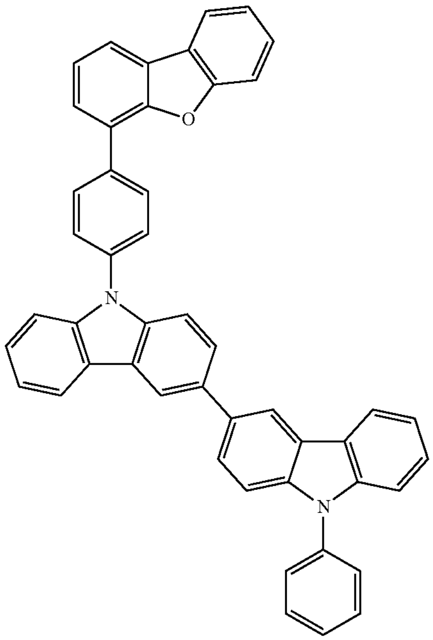
[A-138]
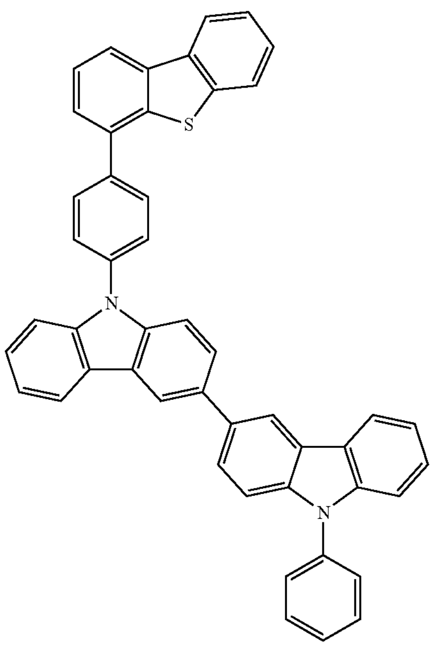
[B-1]
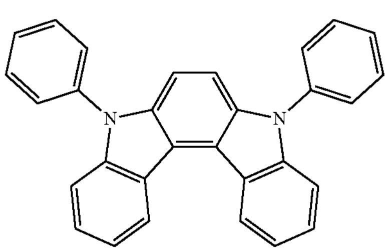
-continued
[B-2]
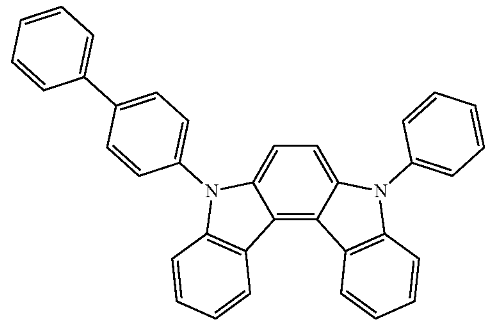
[B-3]
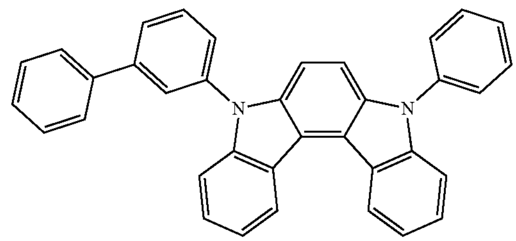
[B-4]
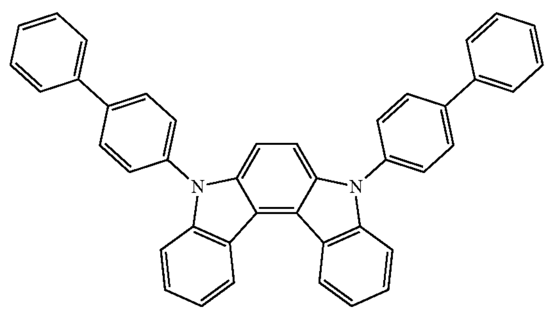
[B-5]
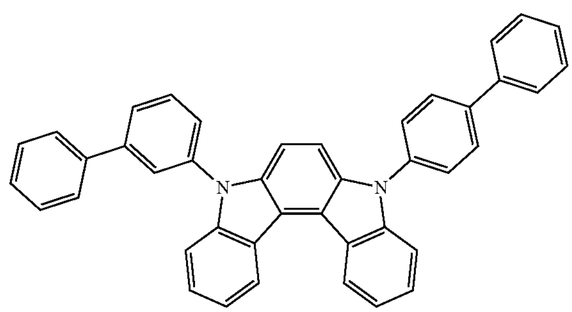
[B-6]
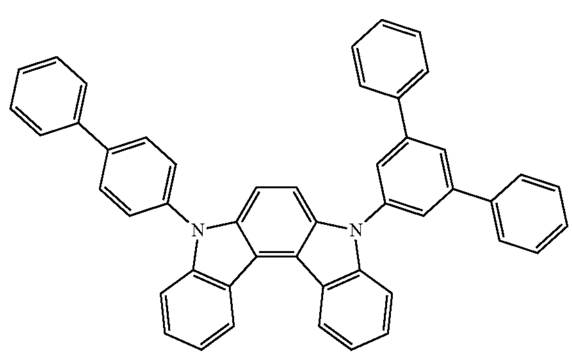

-continued
[B-7]
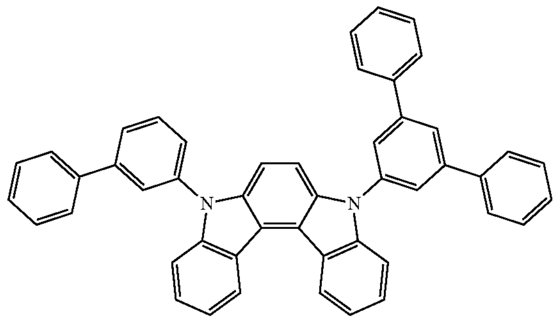
[B-8]
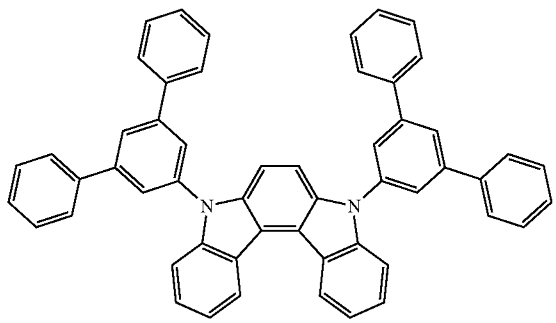
[B-9]
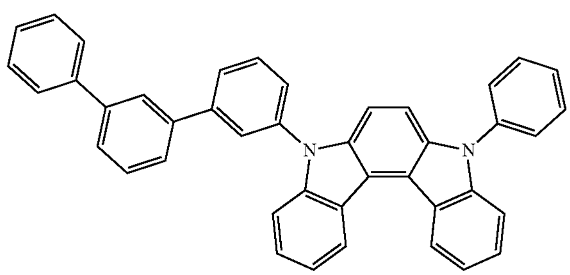
[B-10]
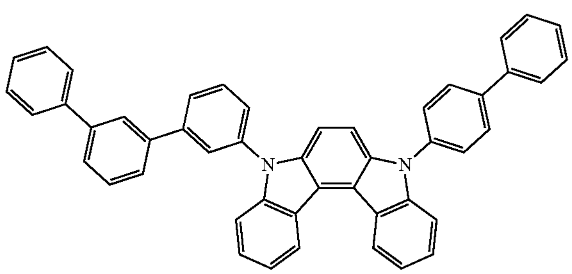
[B-11]
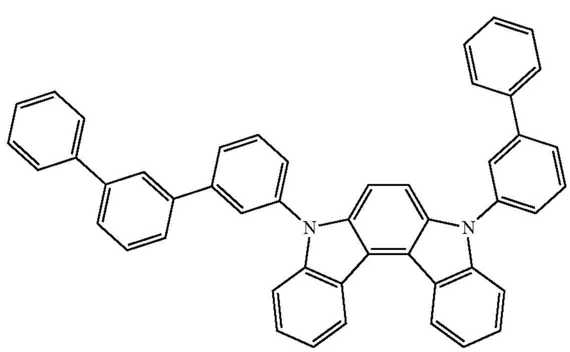
-continued
[B-12]
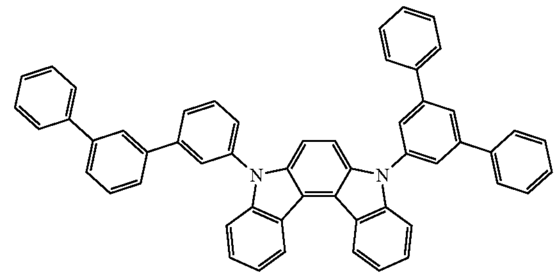
[B-13]
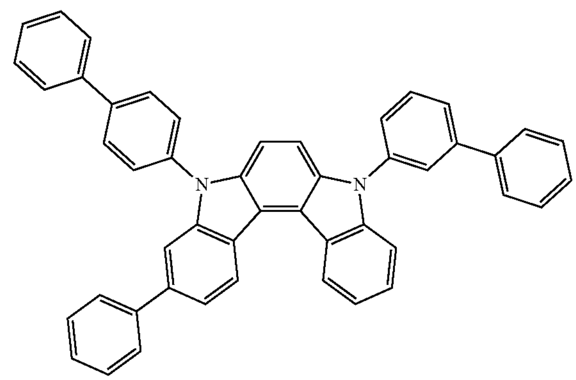
[B-14]
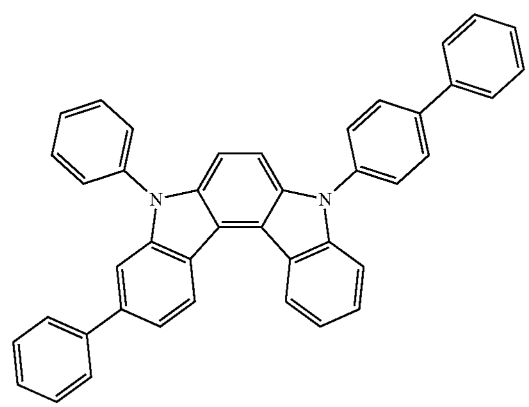
[B-15]
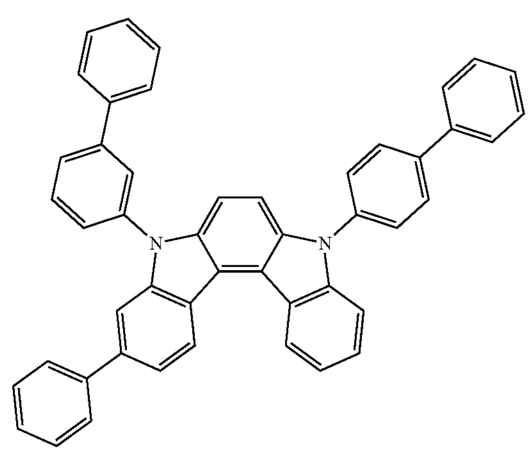

-continued
[B-16]
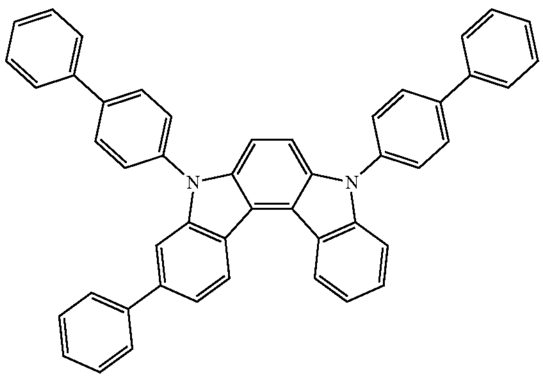
[B-17]
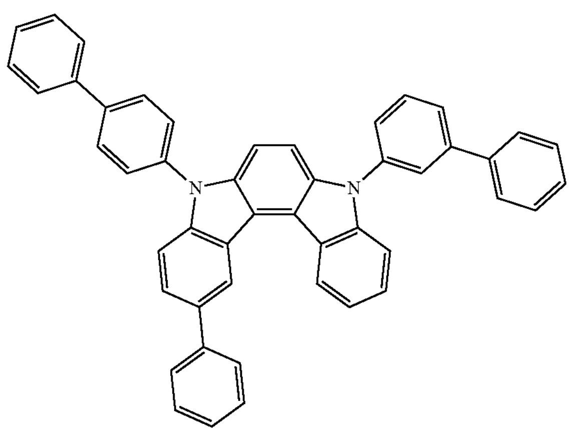
[B-18]
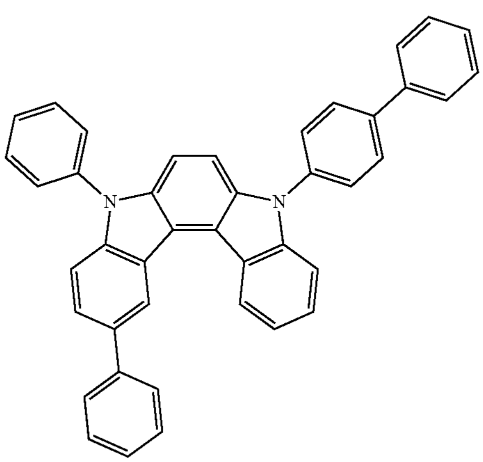
-continued
[B-19]
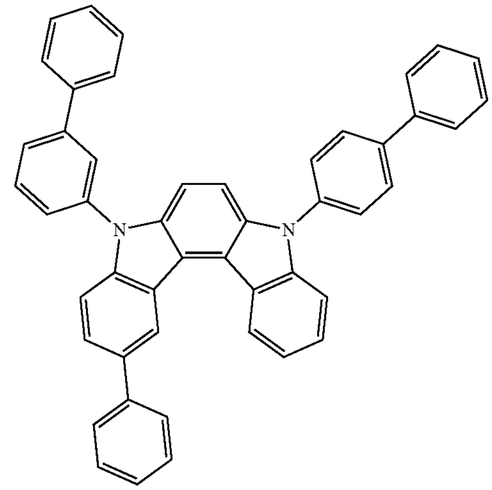
[B-20]
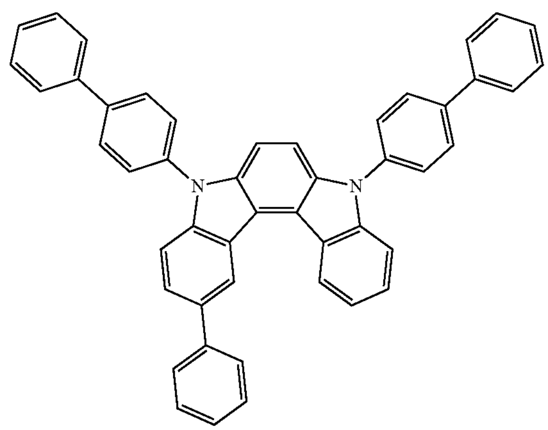
[B-21]
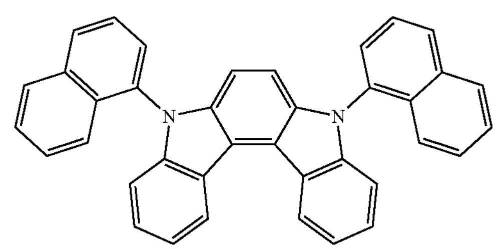
[B-22]
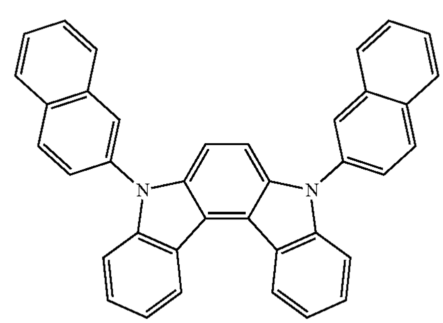

-continued
[B-23]
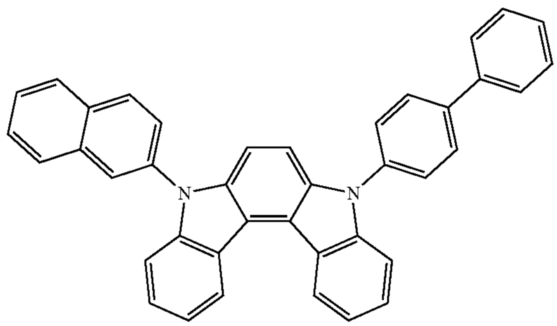
[B-24]
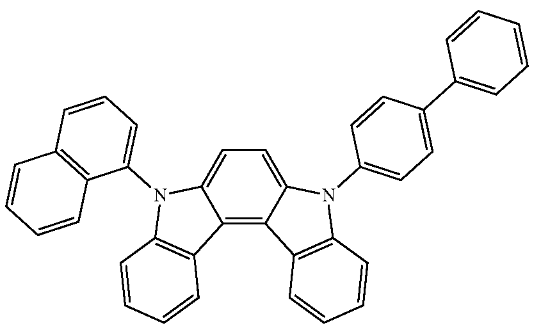
[B-25]
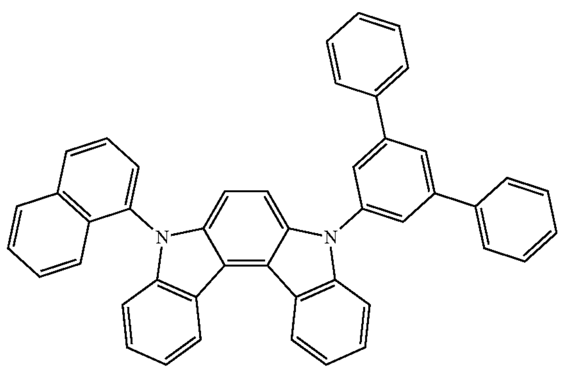
[B-26]
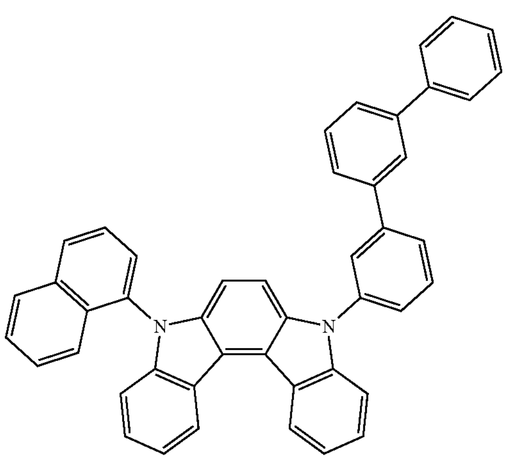
-continued
[B-27]
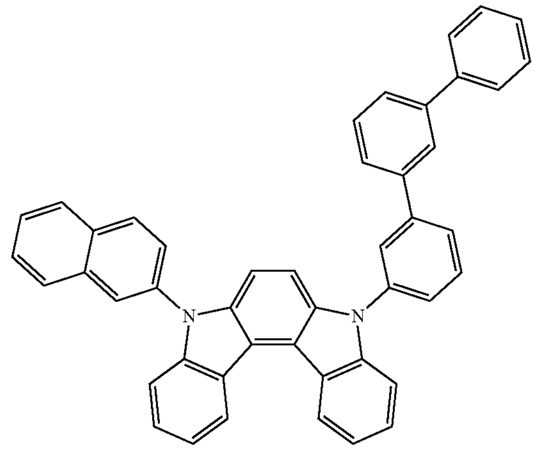
[B-28]
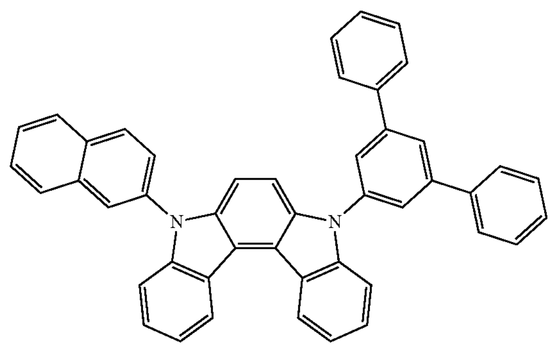
[B-29]
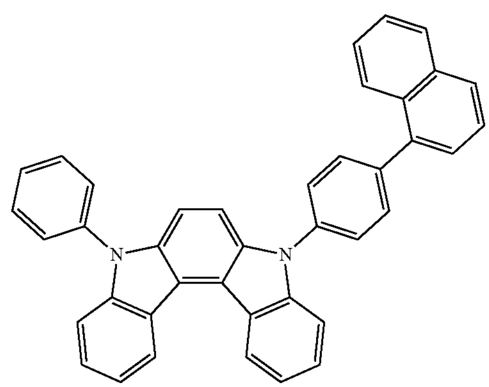
[B-30]
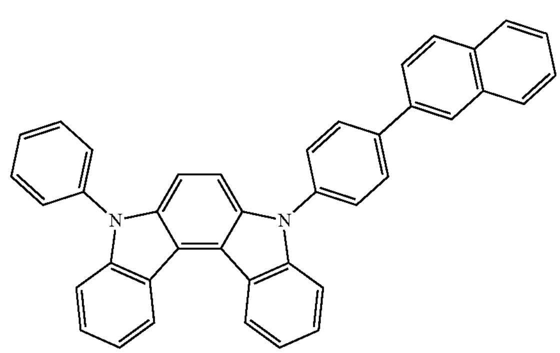

-continued
[B-31]
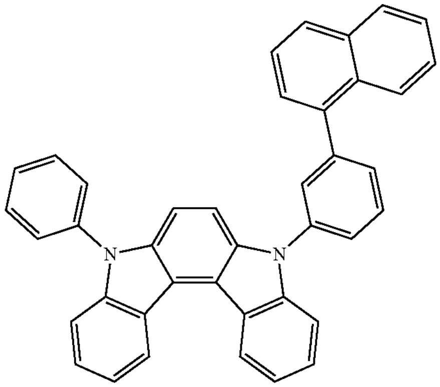
[B-32]
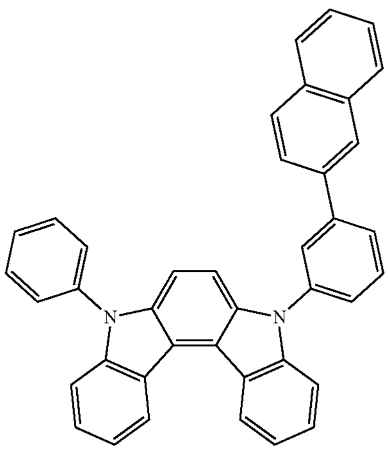
[B-33]
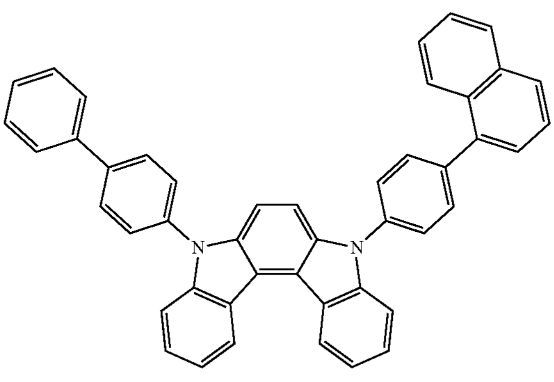
[B-34]
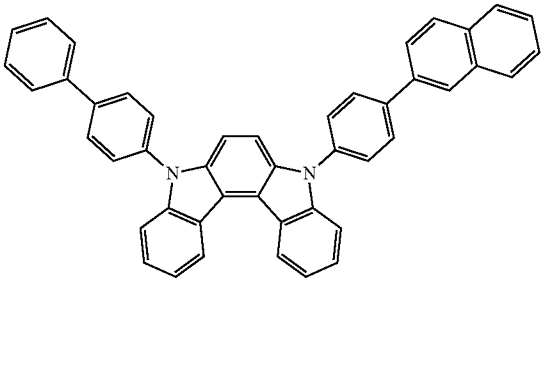
-continued
[B-35]
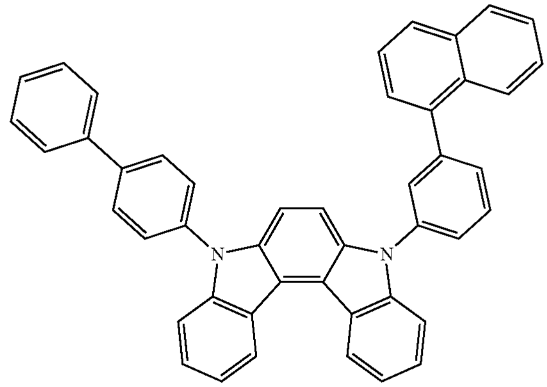
[B-36]
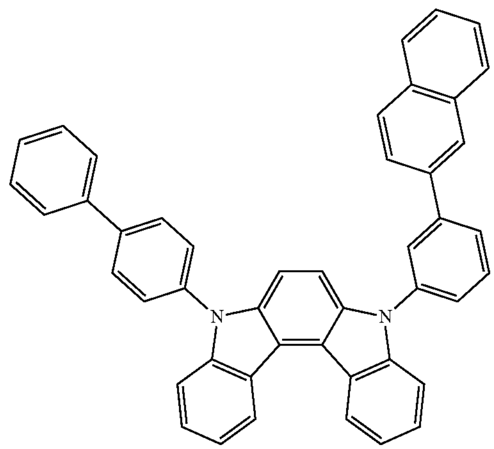
[B-37]
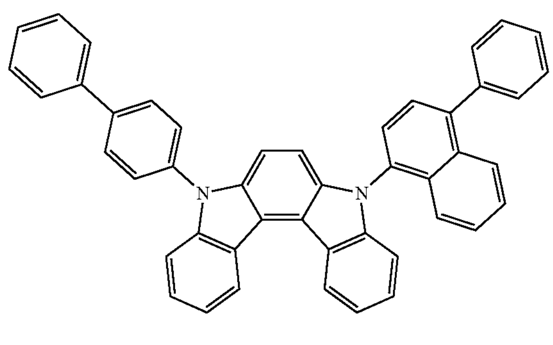
[B-38]
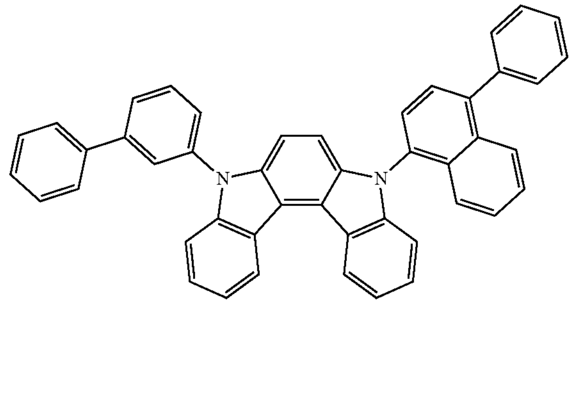

-continued
[B-39]
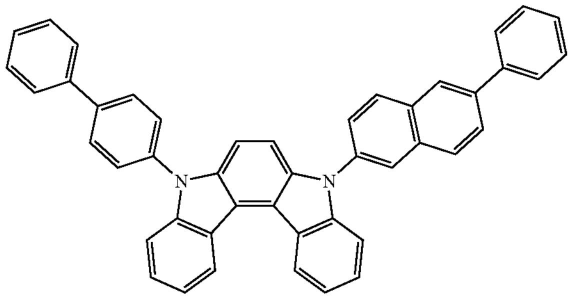
[B-40]
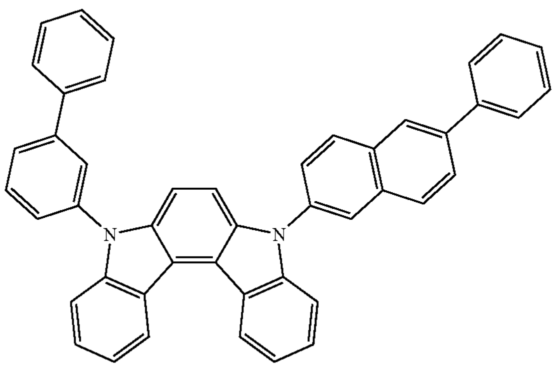
[B-41]
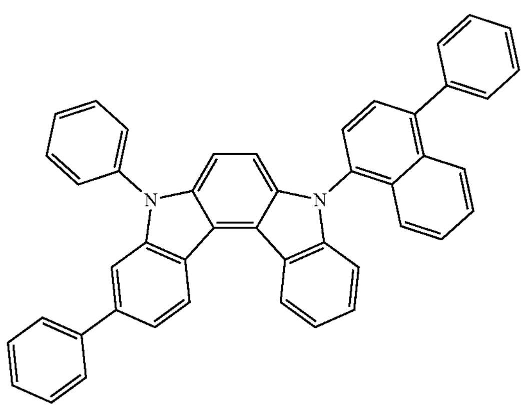
[B-42]
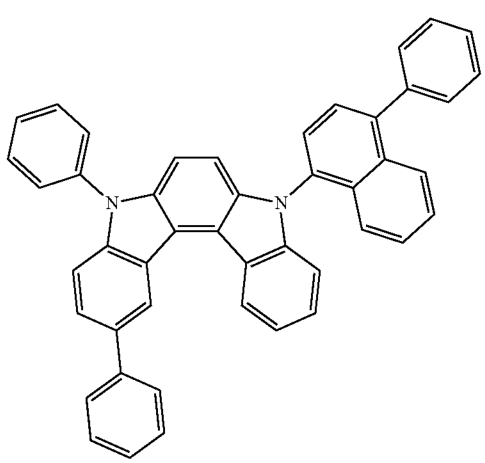
-continued
[B-43]
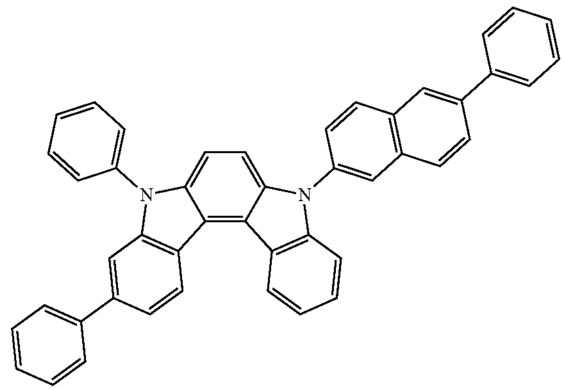
[B-44]
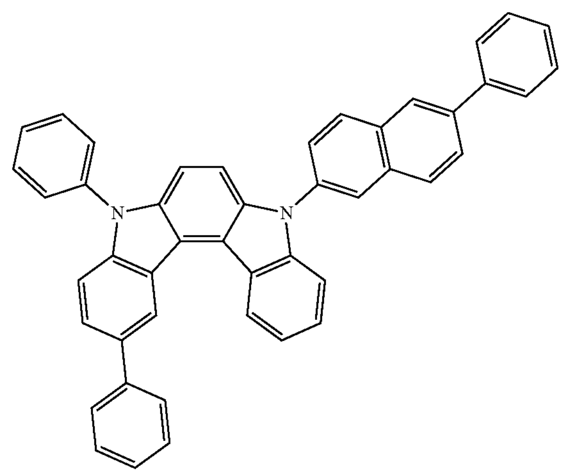
[B-45]
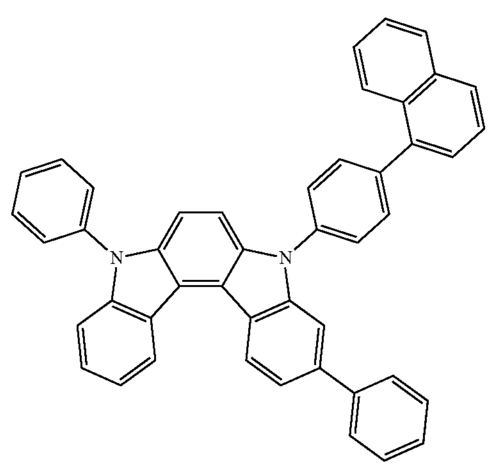

-continued
[B-46]
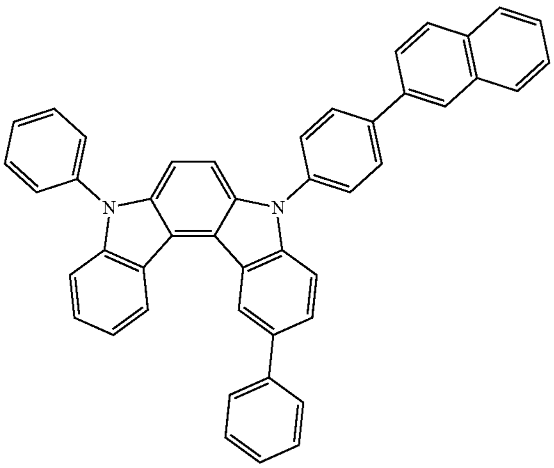
[B-47]
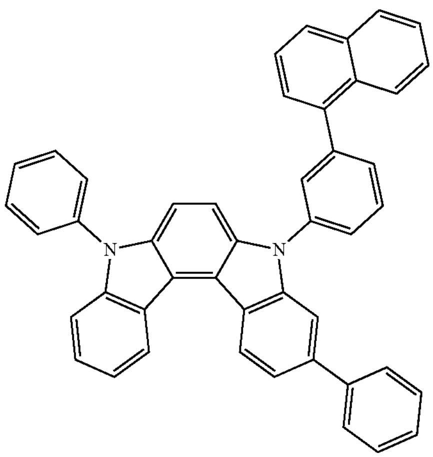
[B-48]
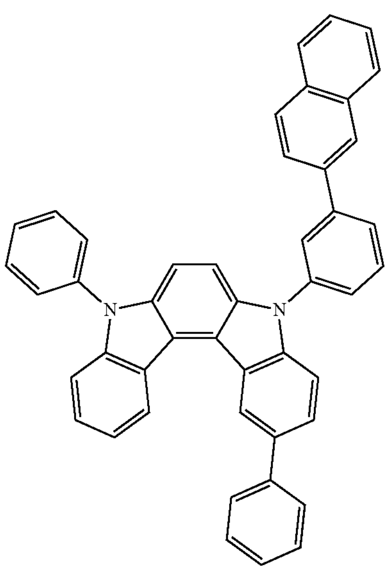
-continued
[B-49]
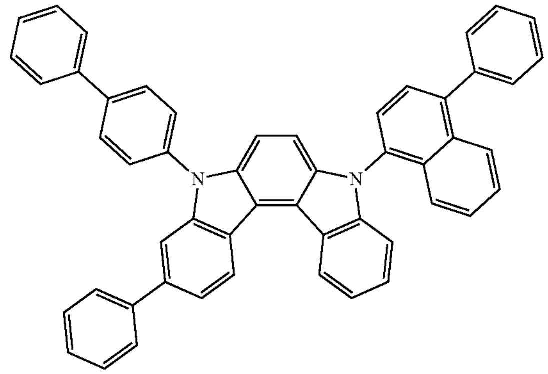
[B-50]
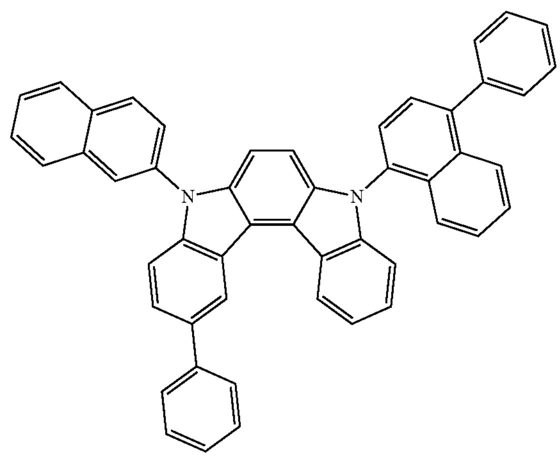
[B-51]
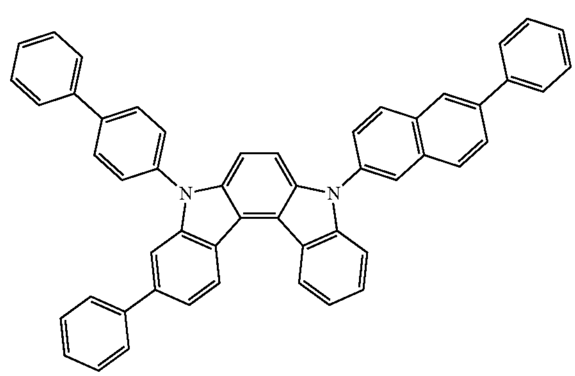

-continued

[B-52]

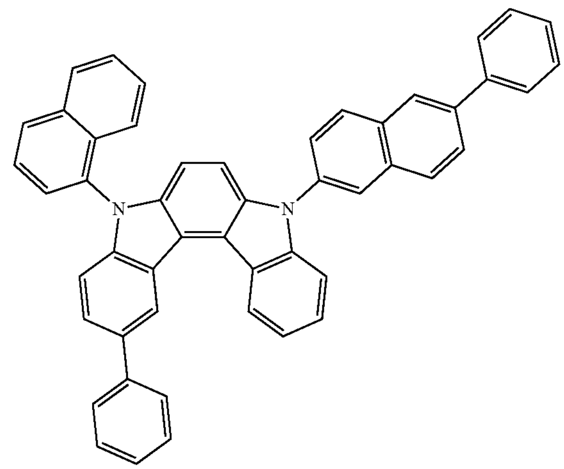

[B-53]

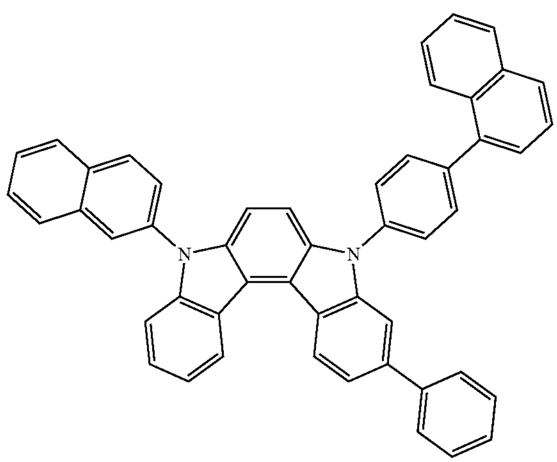

[B-54]

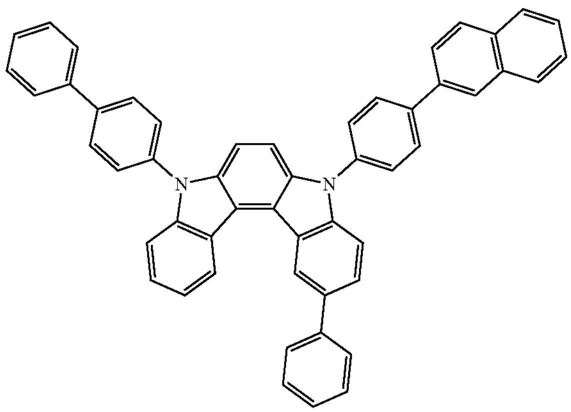

-continued

[B-55]

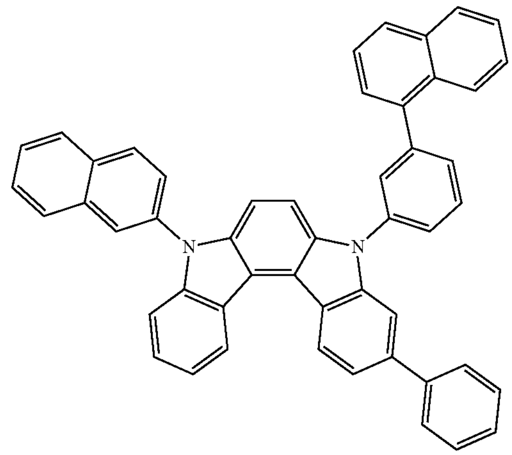

[B-56]

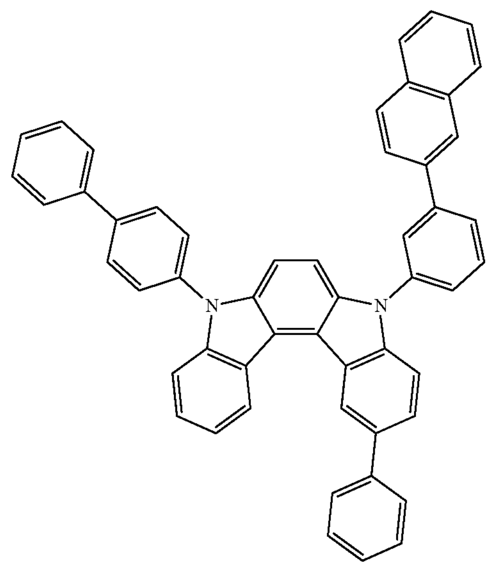

The first compound and the second compound may be, e.g., included in a weight ratio of about 1:99 to about 99:1. Within the above range, bipolar characteristics may be implemented to improve efficiency and life-span by adjusting an appropriate weight ratio using an electron transport capability of the first compound for the organic optoelectronic device and a hole transport capability of the second compound for the organic optoelectronic device. Within the range, they may be, e.g., included in a weight ratio of about 10:90 to about 90:10, about 20:80 to about 80:20, about 20:80 to about 70:30, about 20:80 to about 60:40, or about 20:80 to about 50:50. As a specific example, they may be included in a weight ratio of about 30:70, about 40:60, or about 50:50. In an implementation, the first compound may be mixed with the second compound.

In an implementation, the first compound may be represented by Chemical Formula 1E-A-1 or Chemical Formula 1E-A-2 and the second compound may be represented by Chemical Formula 2-8.

One or more type of compound may be further included in addition to the aforementioned first compound and second compound.

The aforementioned compound for the organic optoelectronic device or composition for the organic optoelectronic device may be a composition that further includes a dopant.

The dopant may be, e.g., a phosphorescent dopant, for example, a red, green, or blue phosphorescent dopant, e.g., a red or green phosphorescent dopant.

The dopant may be a material mixed with the compound or composition for an organic optoelectronic device in a small amount to cause light emission and generally a material such as a metal complex that emits light by multiple excitation into a triplet or more. The dopant may be, e.g., an inorganic, organic, or organic/inorganic compound, and one or more types thereof may be used.

An example of the dopant may include a phosphorescent dopant. Examples of the phosphorescent dopant may include an organometal compound including Ir, Pt, Os, Ti, Zr, Hf, Eu, Tb, Tm, Fe, Co, Ni, Ru, Rh, Pd, or a combination thereof. In an implementation, the phosphorescent dopant may be, e.g., a compound represented by Chemical Formula Z.

$$L^5MX^a \quad \text{[Chemical Formula Z]}$$

In Chemical Formula Z, M may be a metal, $L^5$ and $X^a$ may each independently be a ligand to form a complex compound with M.

The M may be, e.g., Ir, Pt, Os, Ti, Zr, Hf, Eu, Tb, Tm, Fe, Co, Ni, Ru, Rh, Pd, or a combination thereof and $L^5$ and $X^a$ may be, e.g., a bidendate ligand.

The aforementioned compound for the organic optoelectronic device or composition for the organic optoelectronic device may be formed or applied using a dry film-forming method such as chemical vapor deposition (CVD).

Hereinafter, an organic optoelectronic device including the aforementioned compound for the organic optoelectronic device or composition for the organic optoelectronic device is described.

The organic optoelectronic device may be a device to convert electrical energy into photoenergy and vice versa, and may be, e.g., an organic photoelectric device, an organic light emitting diode, an organic solar cell, and an organic photo conductor drum, and the like.

Herein, an organic light emitting diode, which is an example of an organic optoelectronic device, is described with reference to the drawings.

Figure 2:
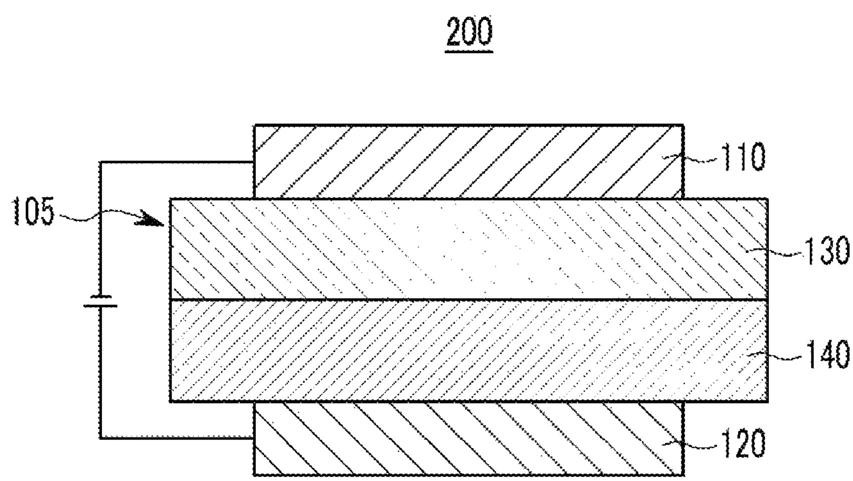

FIGS. 1 and 2 are cross-sectional views of organic light emitting diodes according to embodiments.

Referring to FIG. 1, an organic light emitting diode 100 according to an embodiment may include an anode 120 and a cathode 110 facing each other, and an organic layer 105 between the anode 120 and the cathode 110.

The anode 120 may be a conductor having a large work function to facilitate hole injection, and may be, e.g., a metal, a metal oxide, or a conductive polymer. The anode 120 may include, e.g., nickel, platinum, vanadium, chromium, copper, zinc, gold, or the like or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; or a conductive polymer such as poly(3-methylthiophene), poly(3,4-(ethylene-1,2-dioxy)thiophene) (PEDOT), polypyrrole, or polyaniline.

The cathode 110 may be a conductor having a small work function to facilitate electron injection, and may include, e.g., a metal, a metal oxide, or a conductive polymer. The cathode 110 may include, e.g., a metal such as magnesium, calcium, sodium, potassium, titanium, indium, yttrium, lithium, gadolinium, aluminum silver, tin, lead, cesium, barium, and the like, or an alloy thereof; a multi-layer structure material such as LiF/Al, $LiO_2$/Al, LiF/Ca, LiF/Al, and $BaF_2$/Ca.

The organic layer 105 may include the aforementioned compound for the organic optoelectronic device or composition for the organic optoelectronic device.

The organic layer 105 may include a light emitting layer 130, and the light emitting layer 130 may include the aforementioned compound for the organic optoelectronic device or composition for the organic optoelectronic device.

The composition for the organic optoelectronic device further including a dopant may be, e.g., a green light emitting composition.

The light emitting layer 130 may include, e.g., the aforementioned compound for the organic optoelectronic device or composition for the organic optoelectronic device, respectively, as phosphorescent hosts.

The organic layer may further include an auxiliary layer in addition to the light emitting layer.

The auxiliary layer may be, e.g., a hole auxiliary layer 140.

Referring to FIG. 2, the organic light emitting diode 200 may further include a hole auxiliary layer 140 in addition to the light emitting layer 130. The hole auxiliary layer 140 may further increase hole injection or hole mobility and block electrons between the anode 120 and the light emitting layer 130.

The hole auxiliary layer 140 may include, e.g., a compound of Group D.

In an implementation, the hole auxiliary layer 140 may include a hole transport layer between the anode 120 and the light emitting layer 130, and a hole transport auxiliary layer between the light emitting layer 130 and the hole transport layer. At least one of the compounds of Group D may be included in the hole transport auxiliary layer.

[Group D]

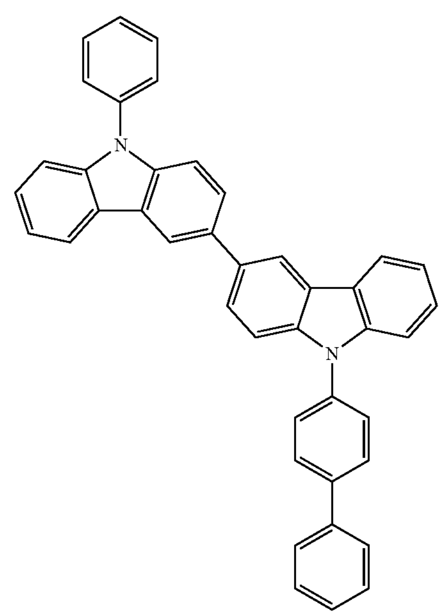

-continued
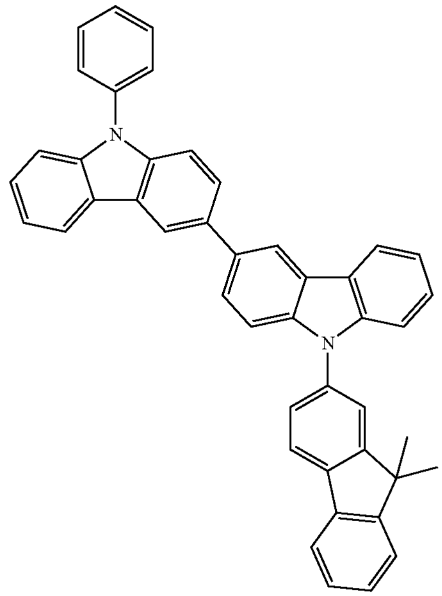
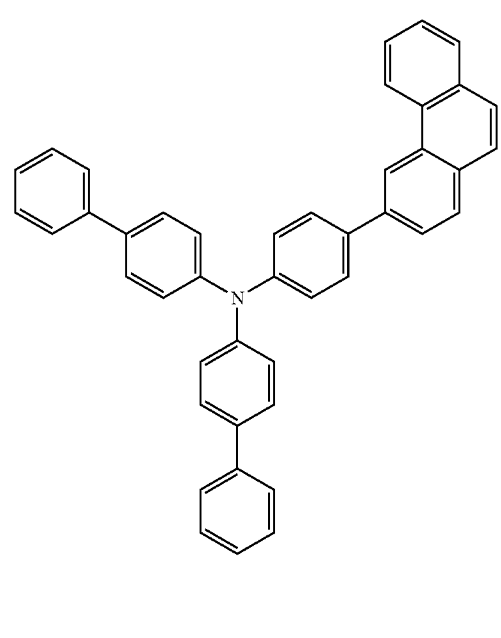
-continued
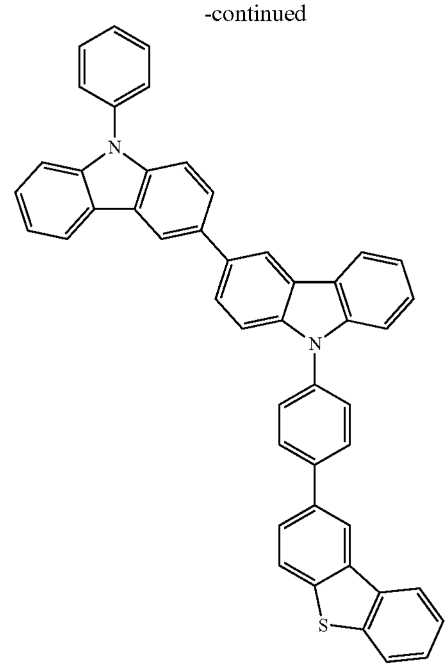
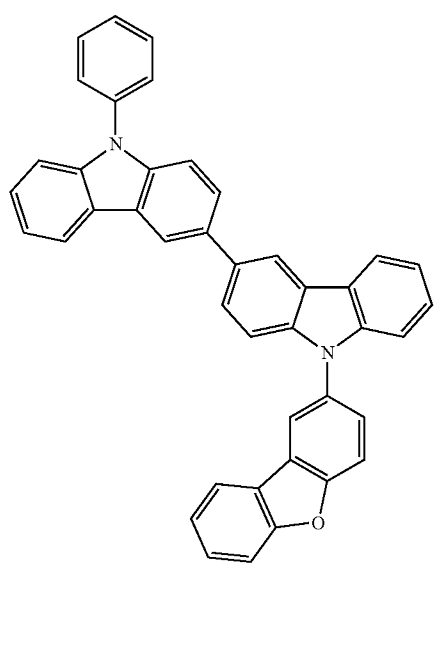

-continued
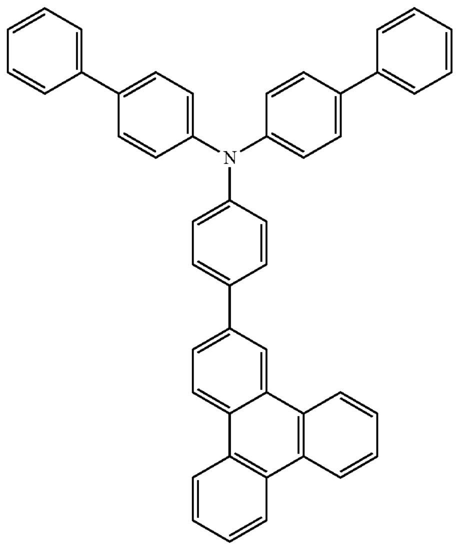
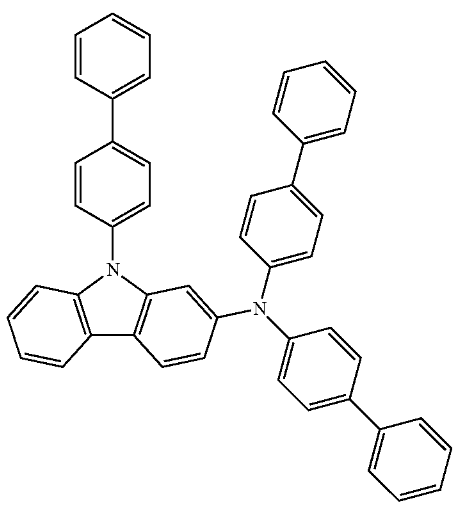
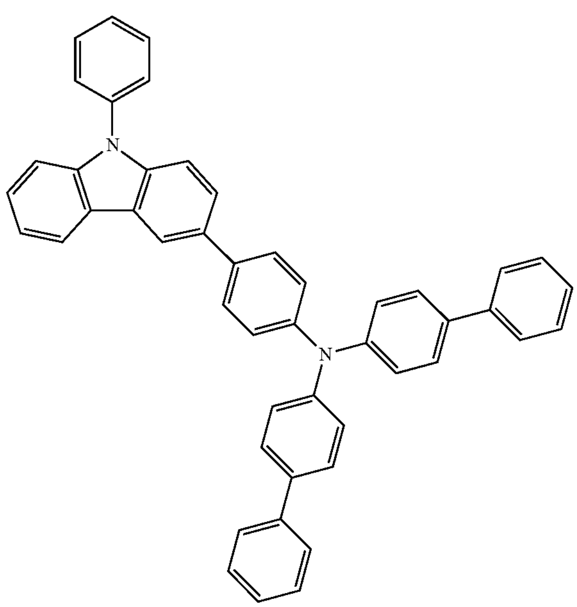
-continued
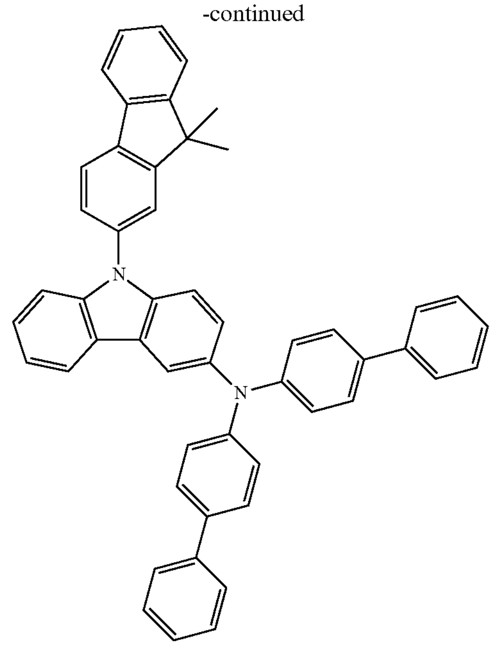
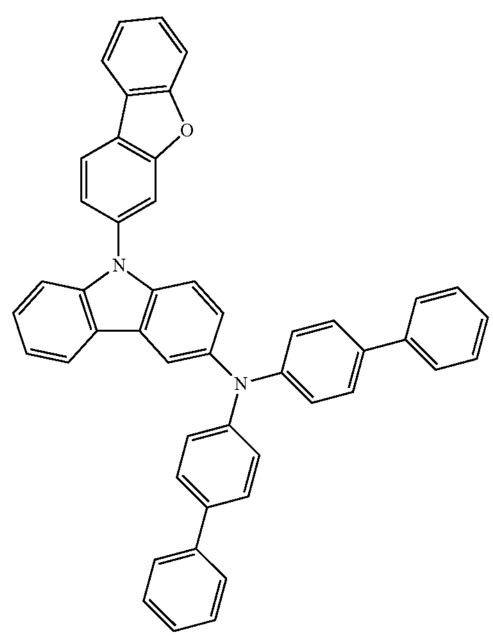

-continued
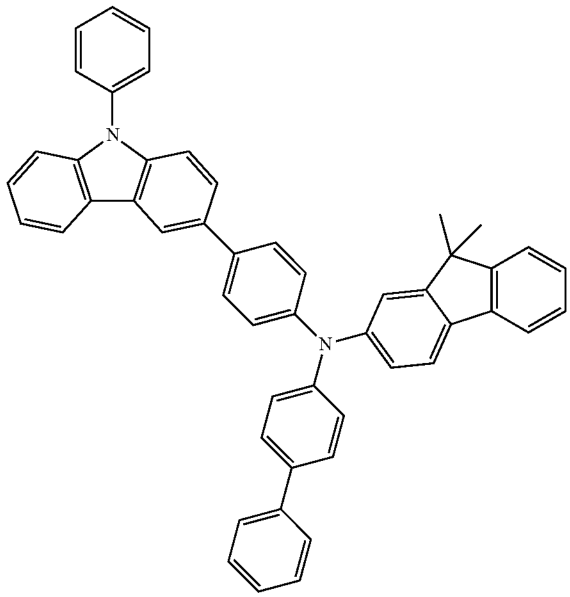
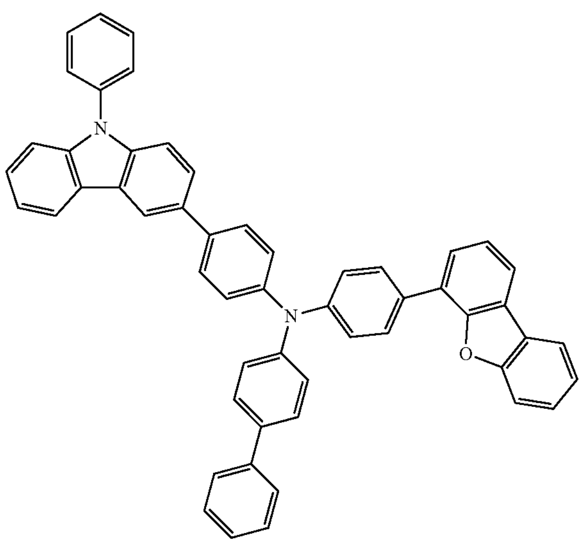
-continued
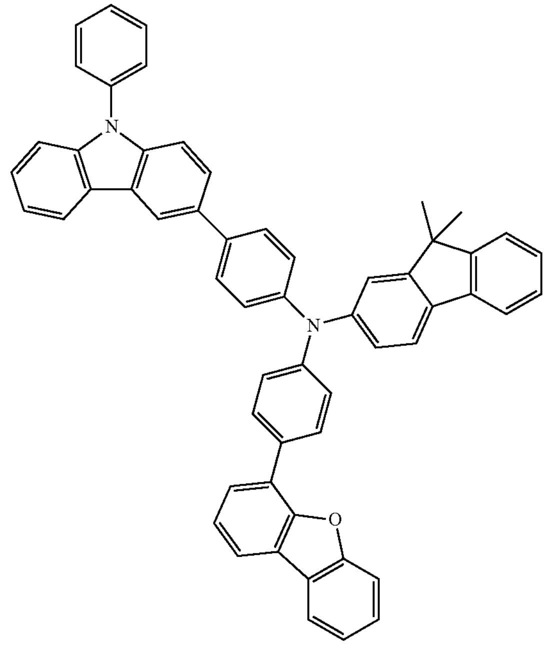
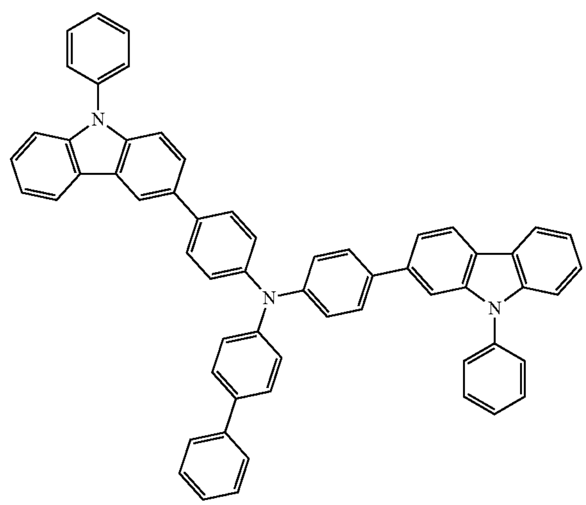
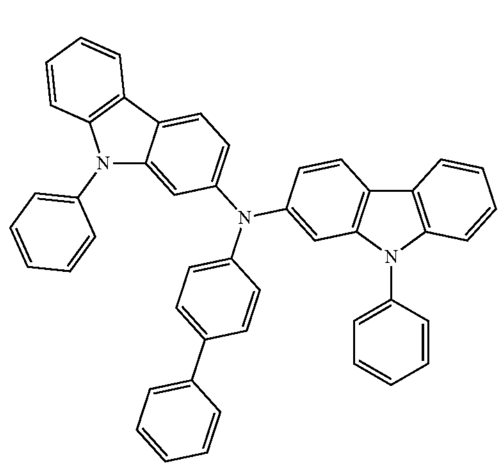

-continued
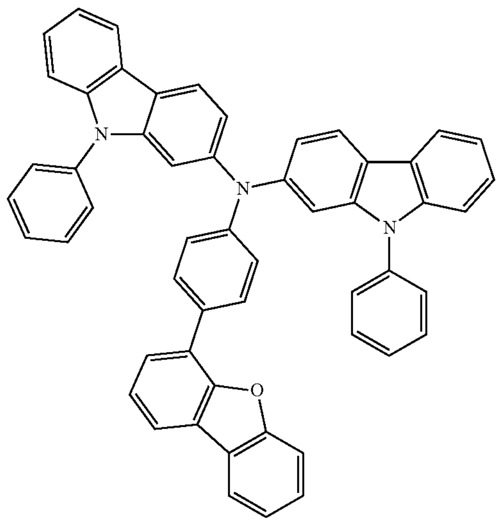
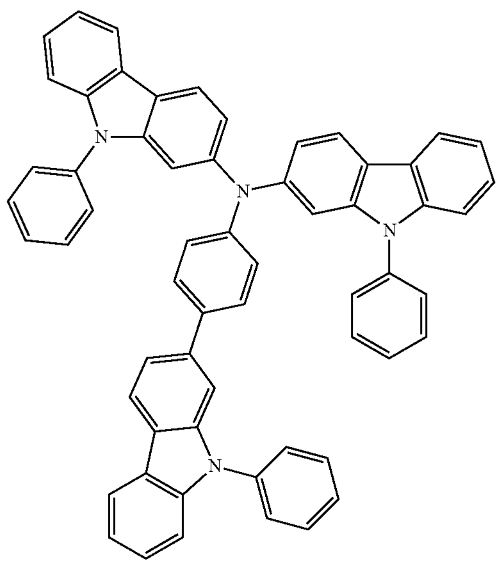
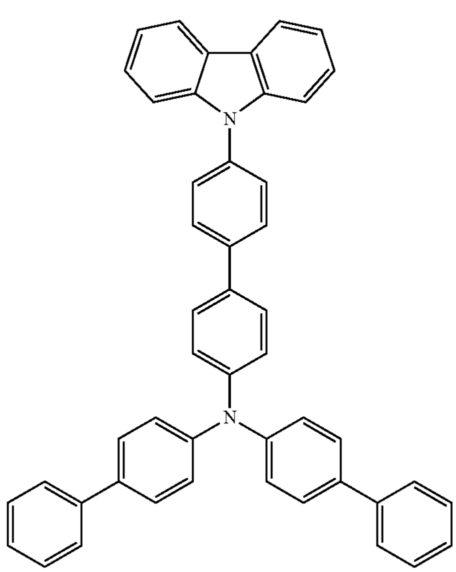
-continued
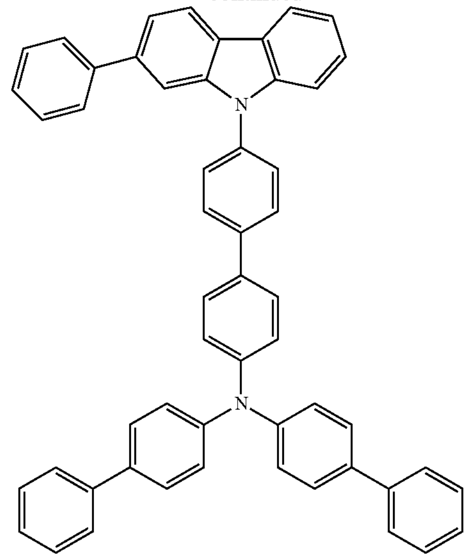
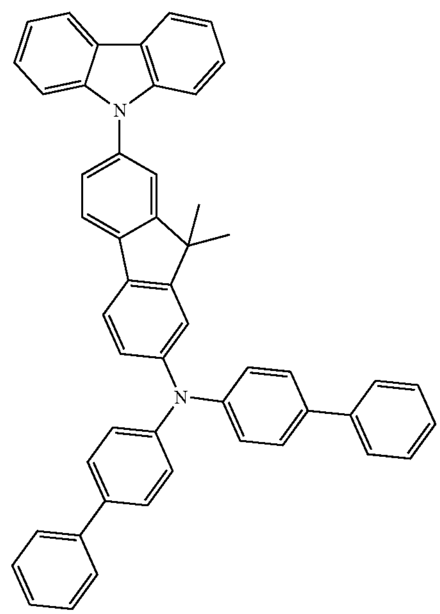
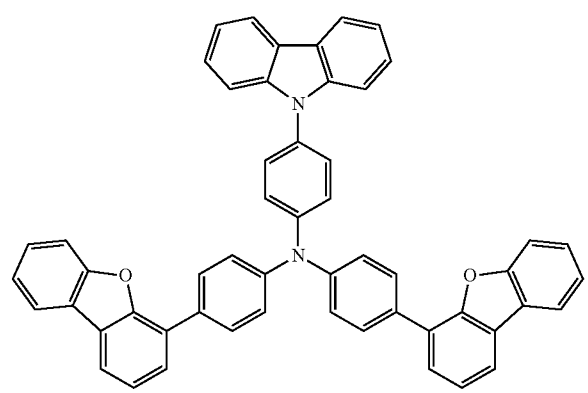

-continued
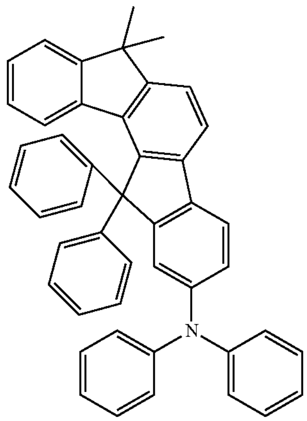
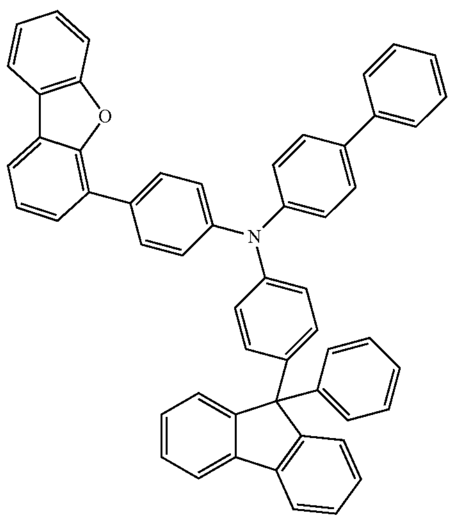
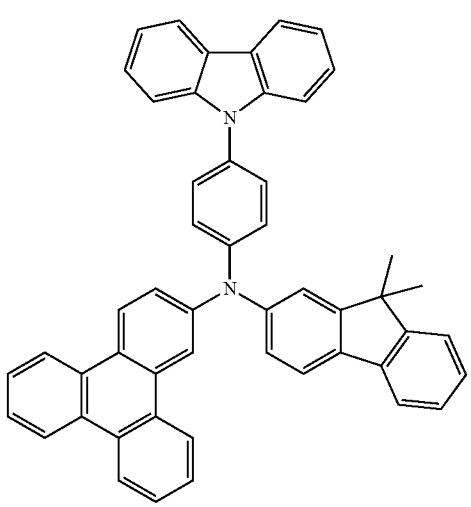
-continued
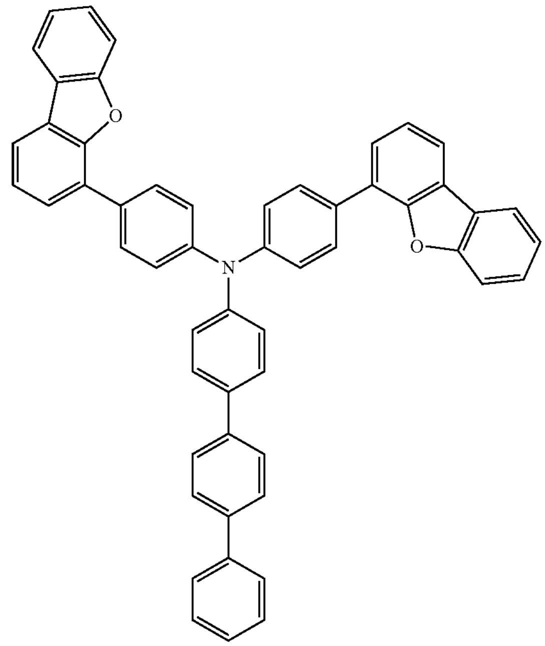
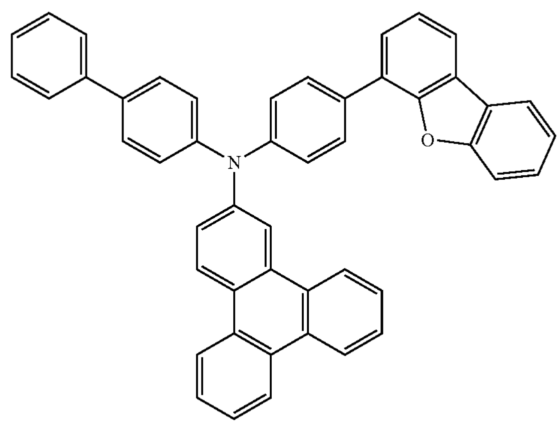
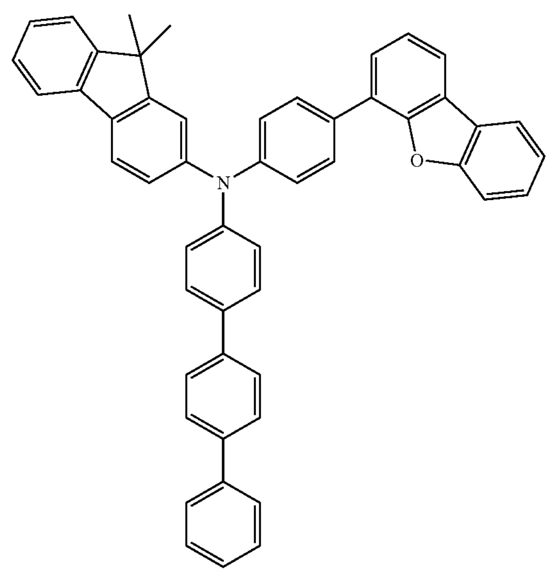

-continued
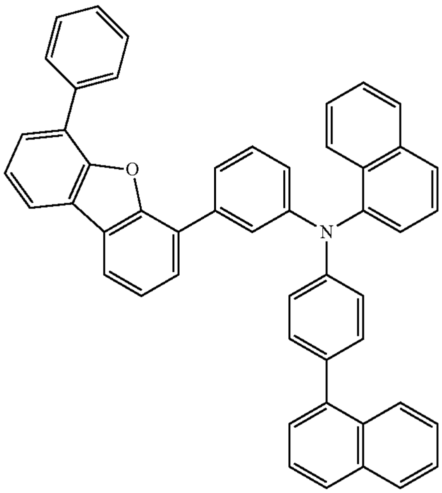
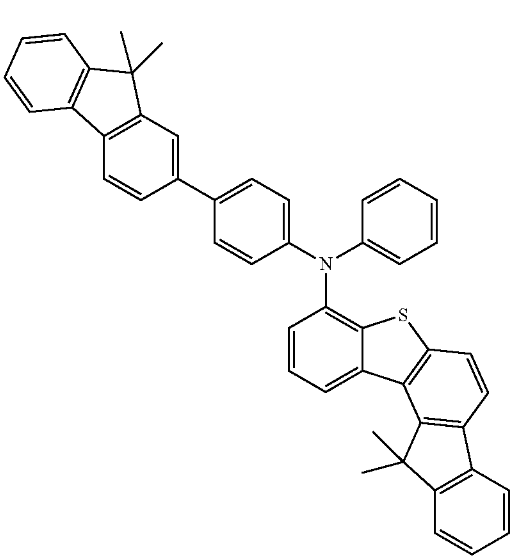
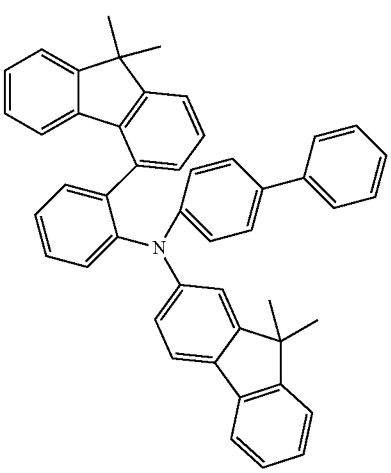
-continued
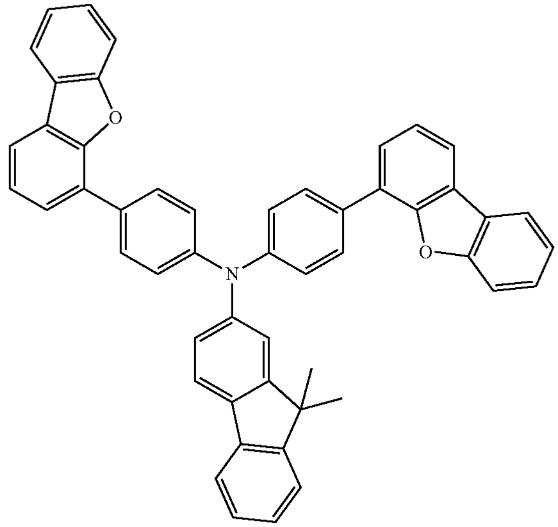
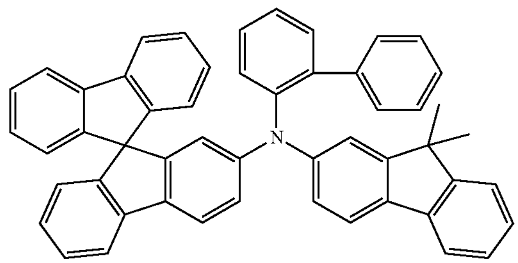
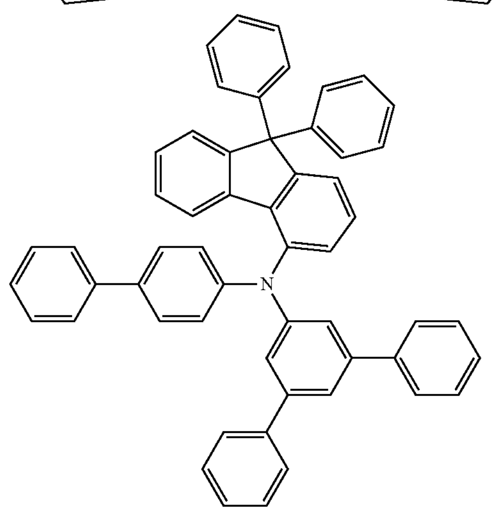
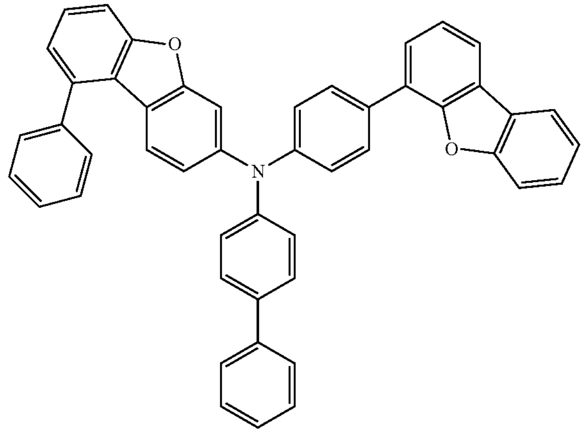

-continued
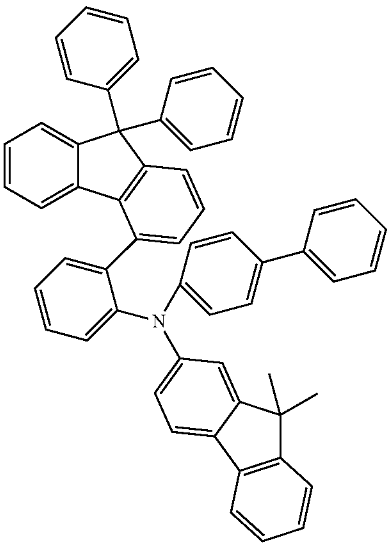
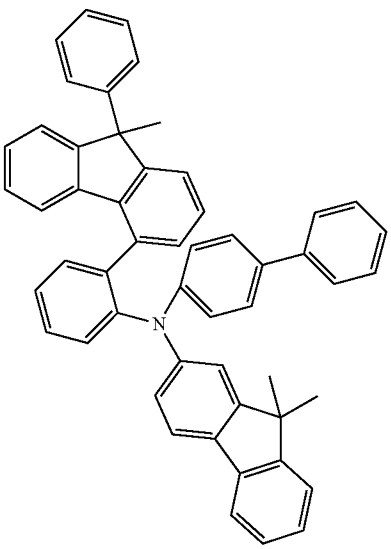
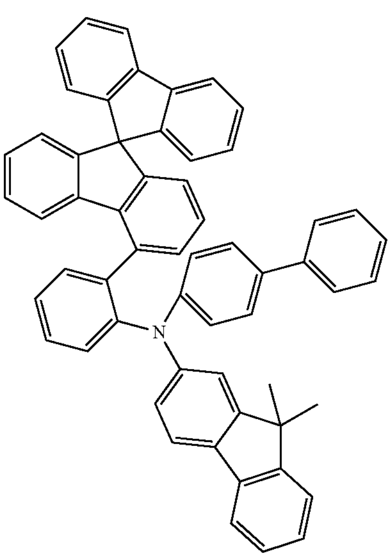
-continued
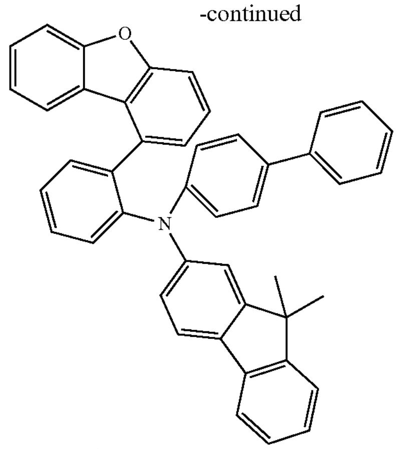
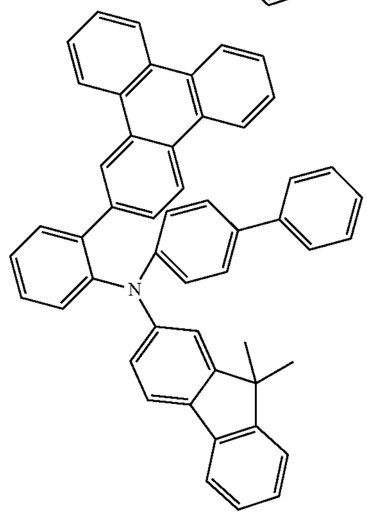
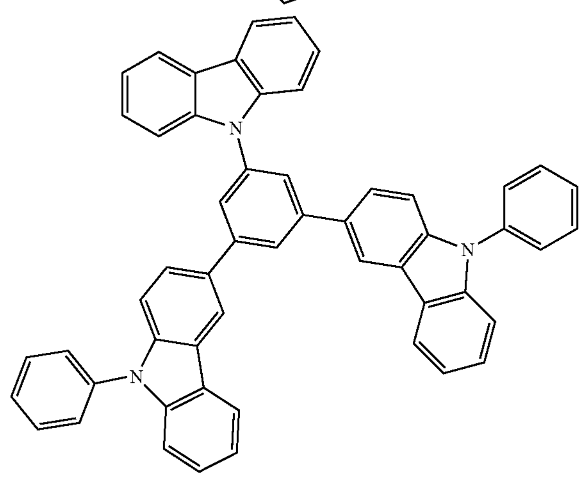
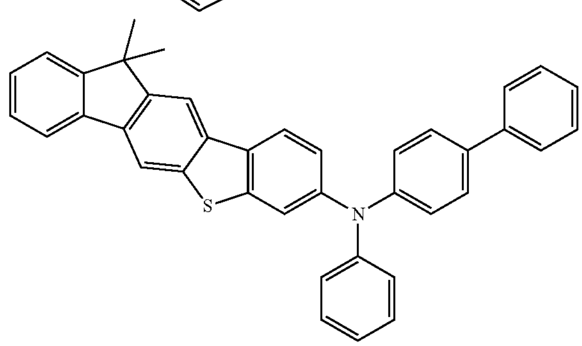

-continued
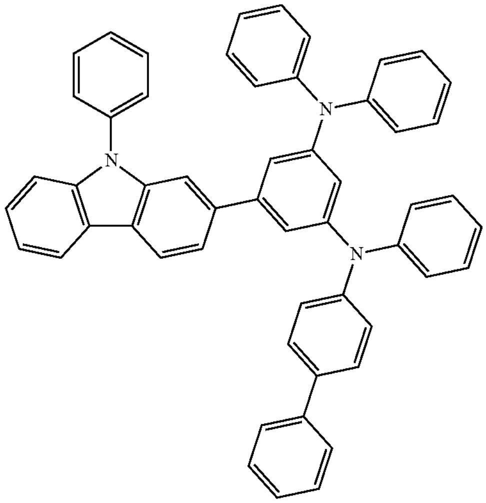
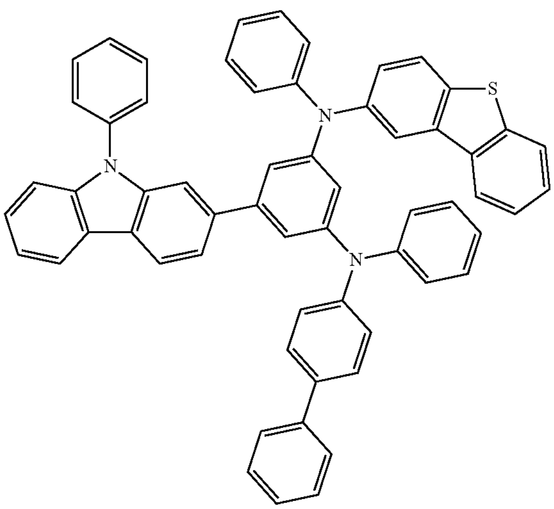
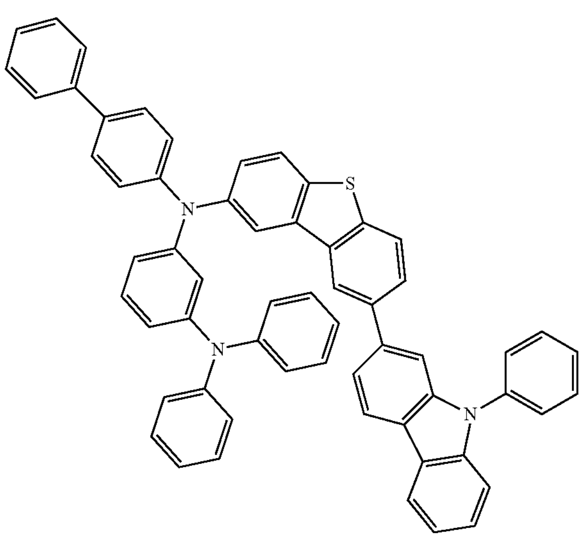
-continued
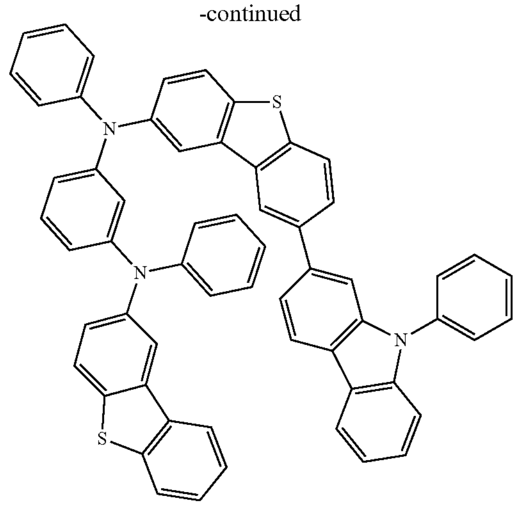
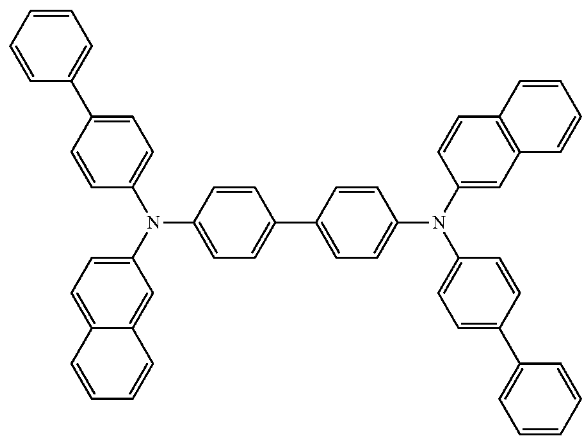
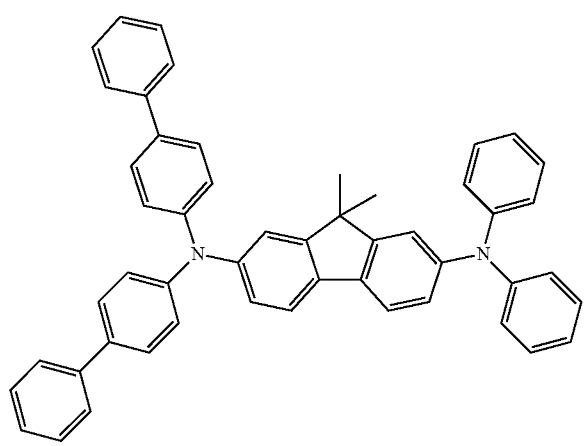

-continued
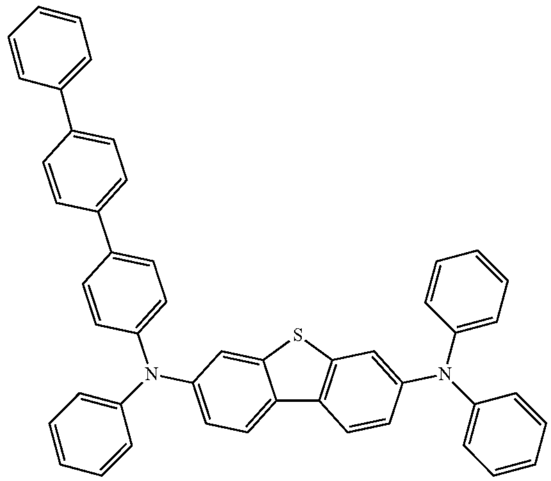
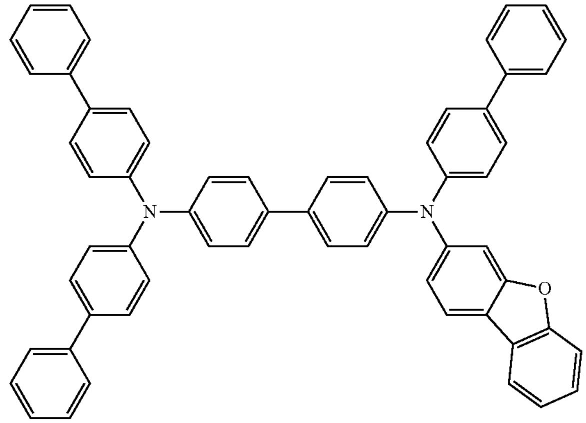
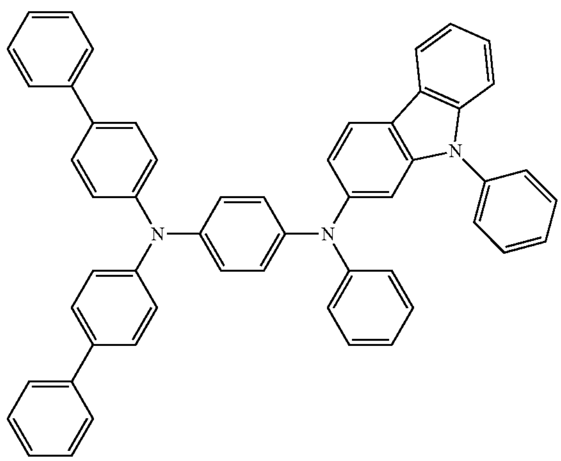
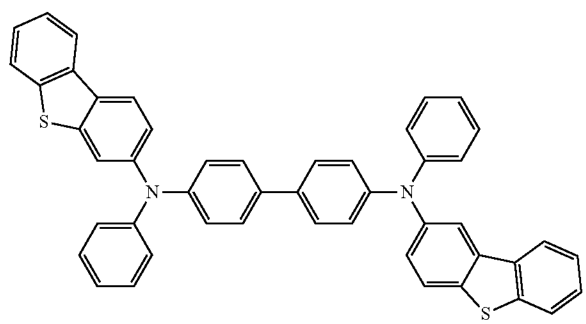
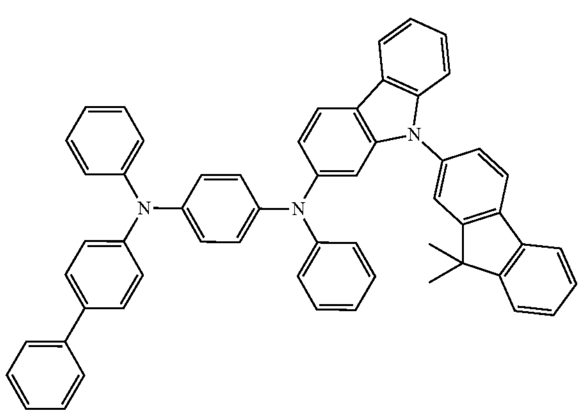
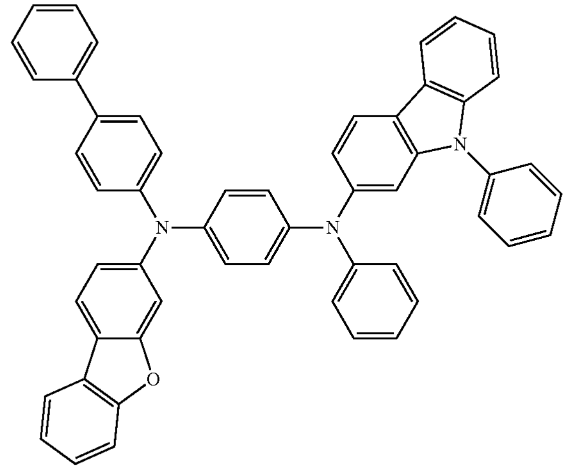
-continued -continued
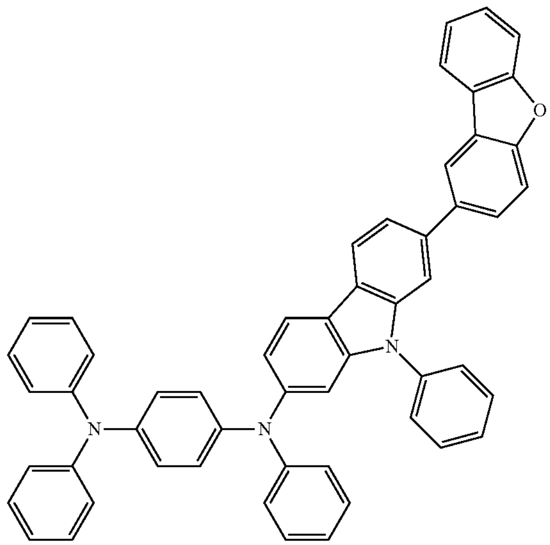
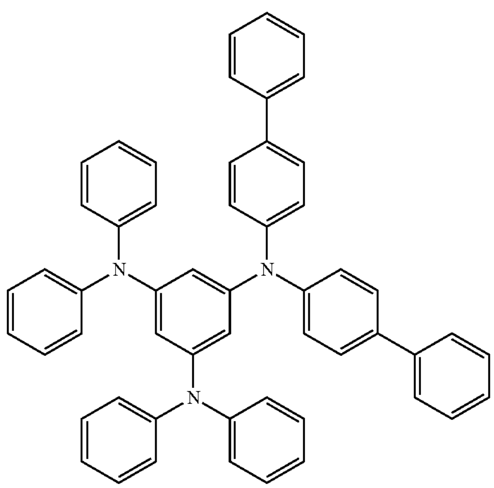
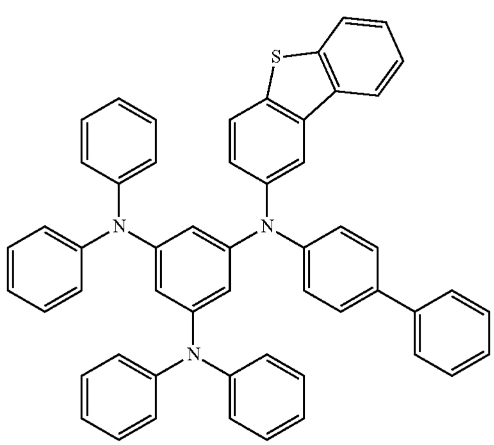
-continued
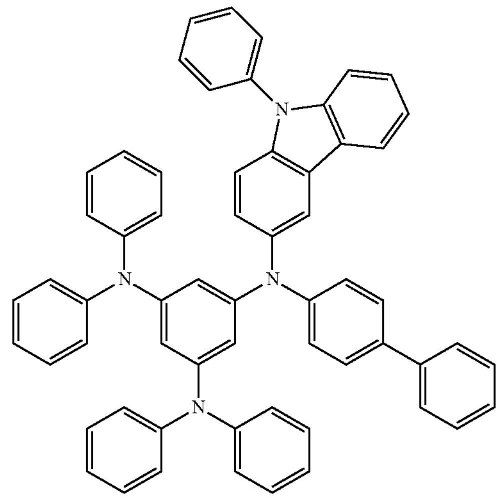
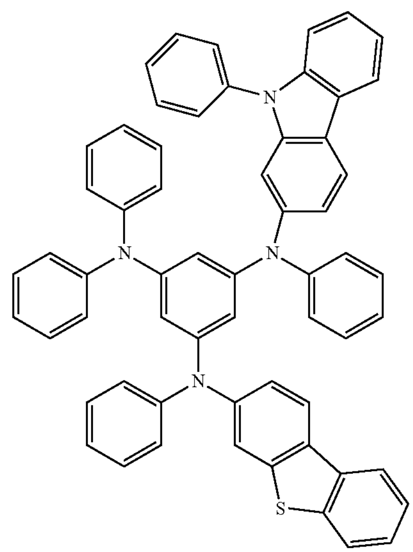
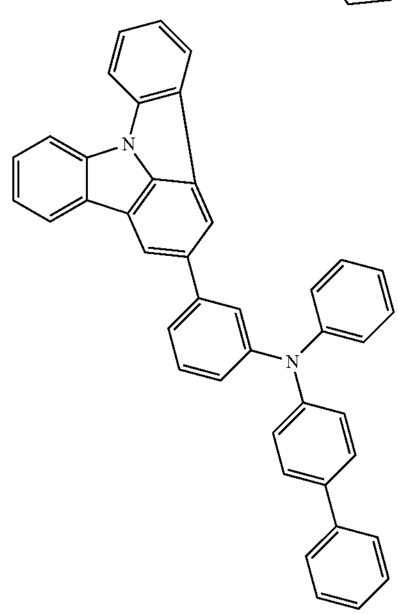

-continued
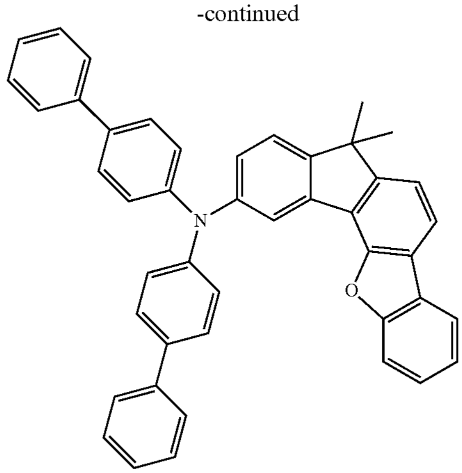
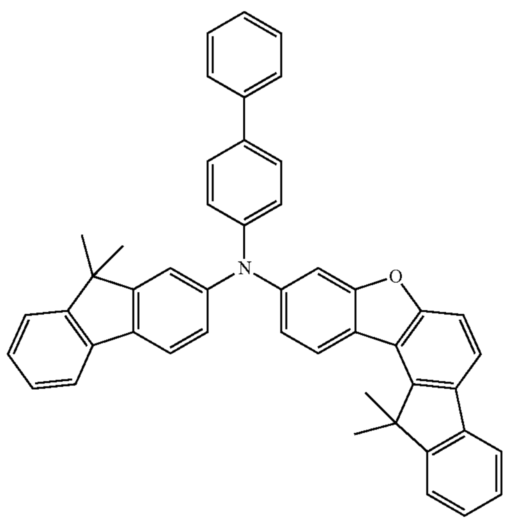
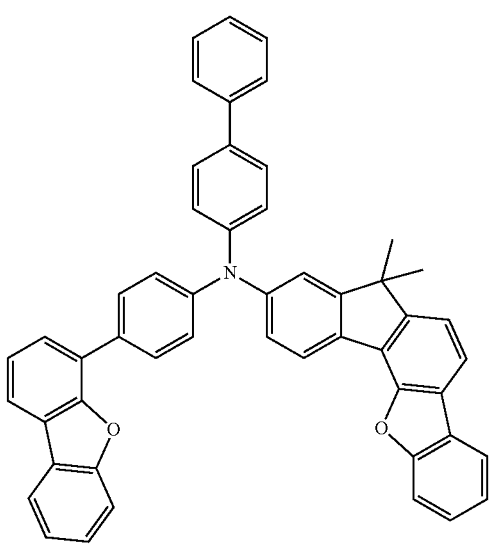
-continued
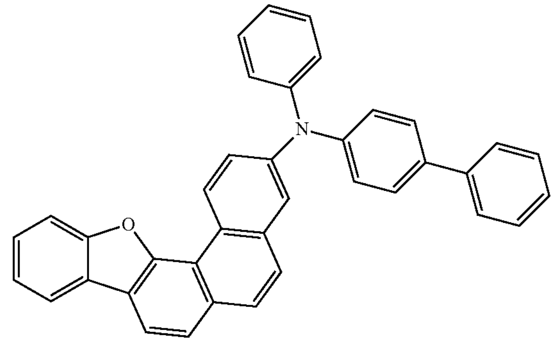
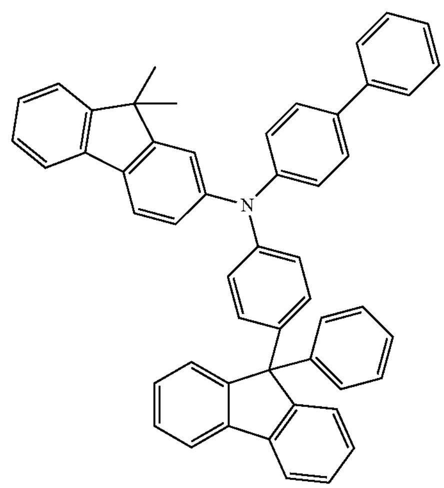
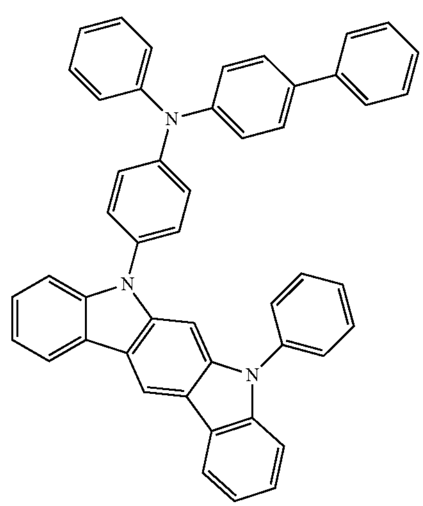

-continued

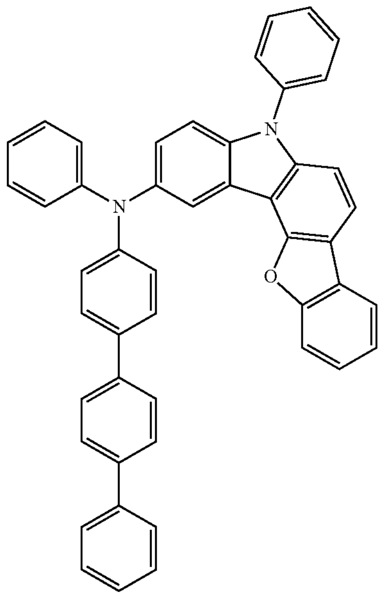

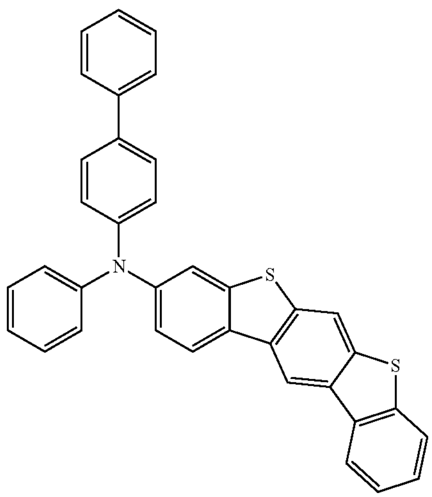

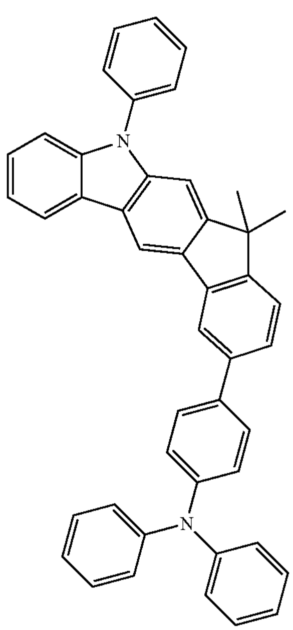

-continued

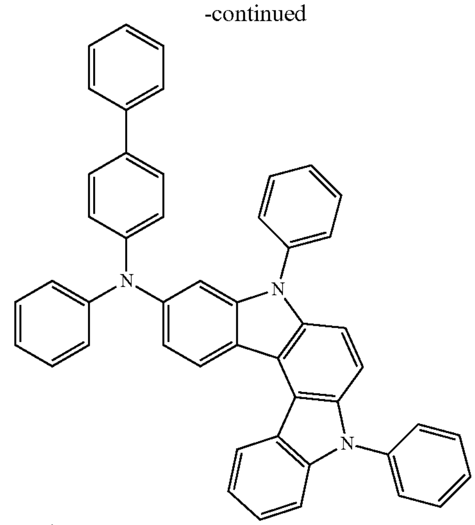

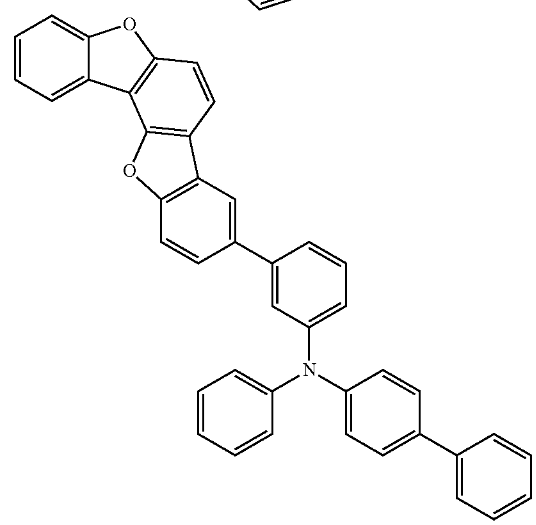

In an implementation, in addition to the compounds described above, the hole transport auxiliary layer may also include known compounds of U.S. Pat. No. 5,061,569A, JP1993-009471A, WO1995-009147A1, JP1995-126615A, JP1998-095973A, and compounds having similar structures.

In an implementation, in FIG. 1 or 2, an organic light emitting diode according to an embodiment may further include an electron transport layer, an electron injection layer, or a hole injection layer as the organic layer 105.

The organic light emitting diodes 100 and 200 may be manufactured by forming an anode or a cathode on a substrate, forming an organic layer using a dry film-forming method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in the Examples and Synthesis Examples were purchased from Sigma-Aldrich Co. Ltd., TCI Inc., Tokyo Chemical Industry, or P&H Tech as far as there in no particular comment or were synthesized by suitable methods.

(Preparation of Compound for Organic Optoelectronic Device)

Compounds according to an embodiment were synthesized through the following steps.

(Preparation of Compound for Organic Optoelectronic Device)

Synthesis Example 1: Synthesis of Intermediate A

[Reaction Scheme 1]

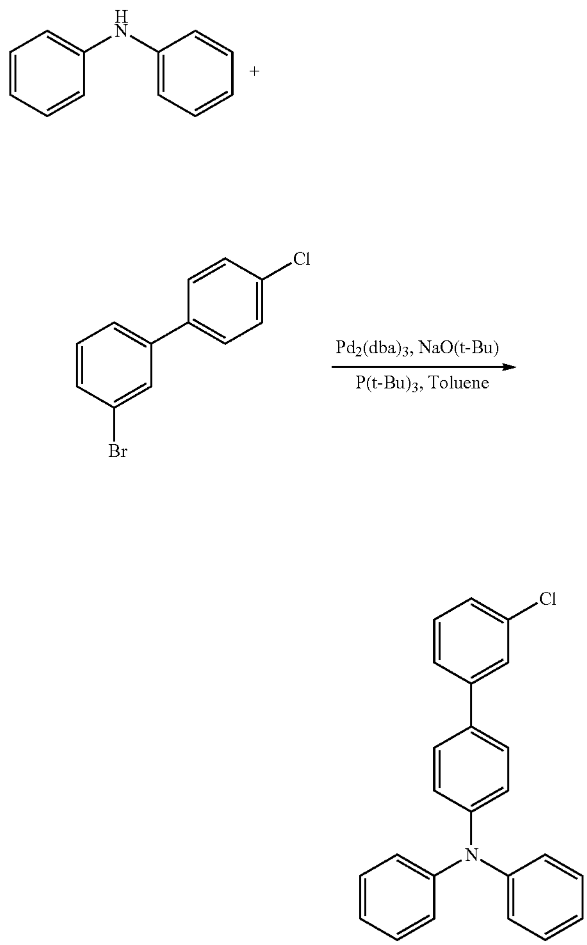

A 20 g (118.19 mmol) of diphenylamine, 37.95 g (141.83 mmol) of 3-bromo-4'-chloro-1,1-biphenyl, 3.25 g (3.55 mmol) of $Pd_2(dba)_3$, 22.72 g (236.38 mmol) of NaO(t-Bu), and 0.72 g (3.55 mmol) of $P(t\text{-}Bu)_3$ were suspended in 600 ml of toluene and then, stirred at 80° C. for 12 hours. When a reaction was complete, distilled water was added thereto and then, extracted, and an organic layer therefrom was concentrated and treated through silica gel column chromatography (hexane:EA=9:1) to obtain 34 g (Yield: 81%) of a target compound, Intermediate A.

Synthesis Example 2: Synthesis of Intermediate B

[Reaction Scheme 2]

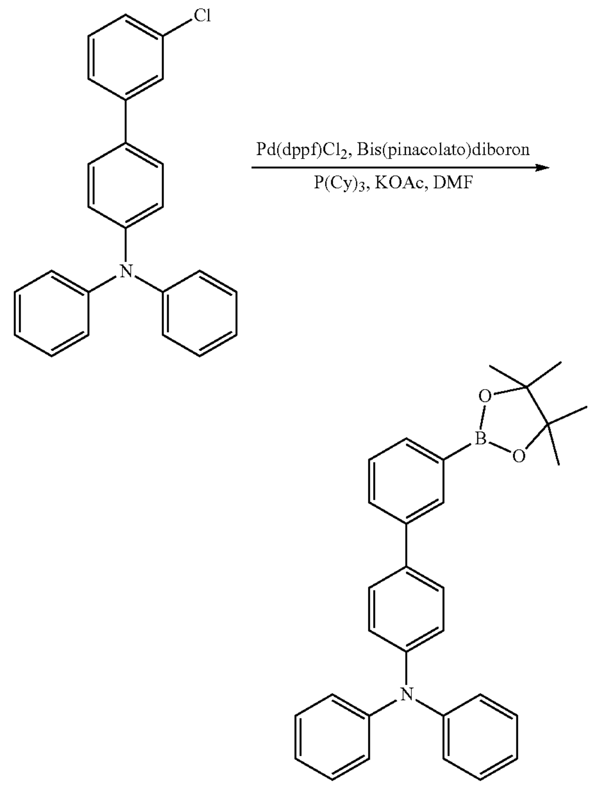

B 34 g (95.54 mmol) of Intermediate A according to Synthesis Example 1, 4.68 g (5.73 mmol) of $Pd(dppf)Cl_2$, 26.69 g (105.10 mmol) of bis(pinacolato)diboron, 6.43 g (22.93 mmol) of $P(Cy)_3$, and 28.13 g (286.63 mmol) of KOAc were suspended in 300 ml of DMF and then, refluxed and stirred for 12 hours. When the reaction was complete, the reaction solution was slowly added to 1 L of distilled water including ice to produce a solid, and the solid was filtered and washed with distilled water. Subsequently, the solid was dried and then, silica gel-columned to obtain 30 g (Yield=71%) of a target compound, Intermediate B.

Synthesis Example 3: Synthesis of Intermediate C

[Reaction Scheme 3]

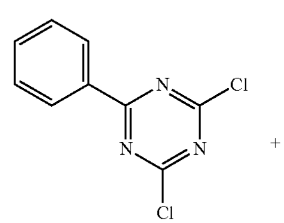

-continued

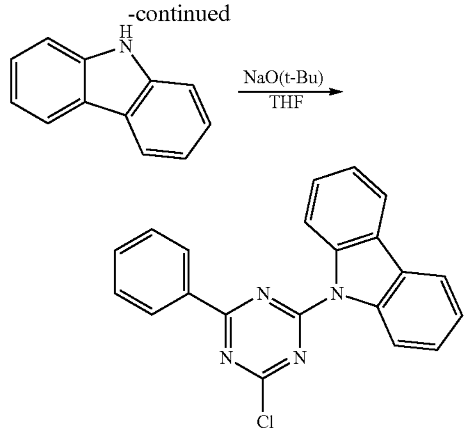

C 58.81 g (260.15 mmol) of 2-phenyl-4,6-dichlorotriazine and 30 g (179.42 mmol) of carbazole were suspended in 500 ml of THF, and 18.11 g of NaO(t-Bu) was slowly added thereto and then, stirred at ambient temperature for 12 hours. When a reaction was complete, a solid produced therein was filtered, washed with distilled water and acetone, and dried to obtain 40 g (Yield: 62.5%) of a target compound, Intermediate C.

Synthesis Example 4: Synthesis of Intermediate D

[Reaction Scheme 4]

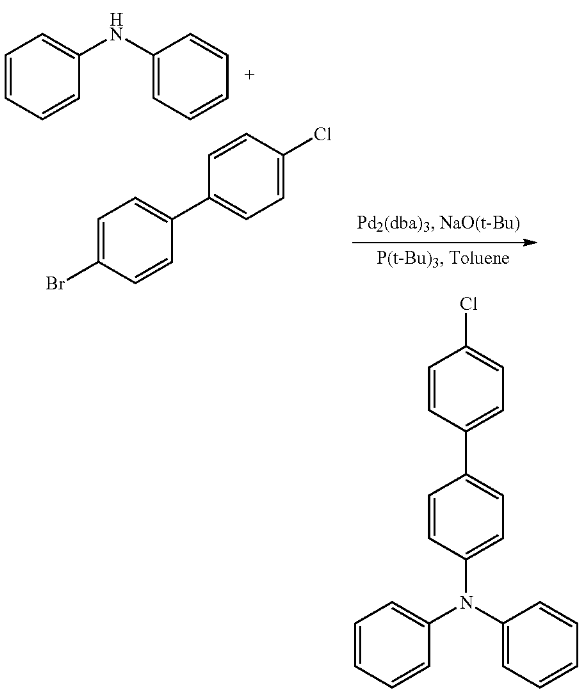

D 25 g (Yield=59.5%) of Intermediate D as a target compound was obtained according to the same method as Synthesis Example 1 except that 4-bromo-4'-chloro-1,1-biphenyl was used instead of the 3-bromo-4'-chloro-1,1-biphenyl.

Synthesis Example 5: Synthesis of Intermediate E

[Reaction Scheme 5]

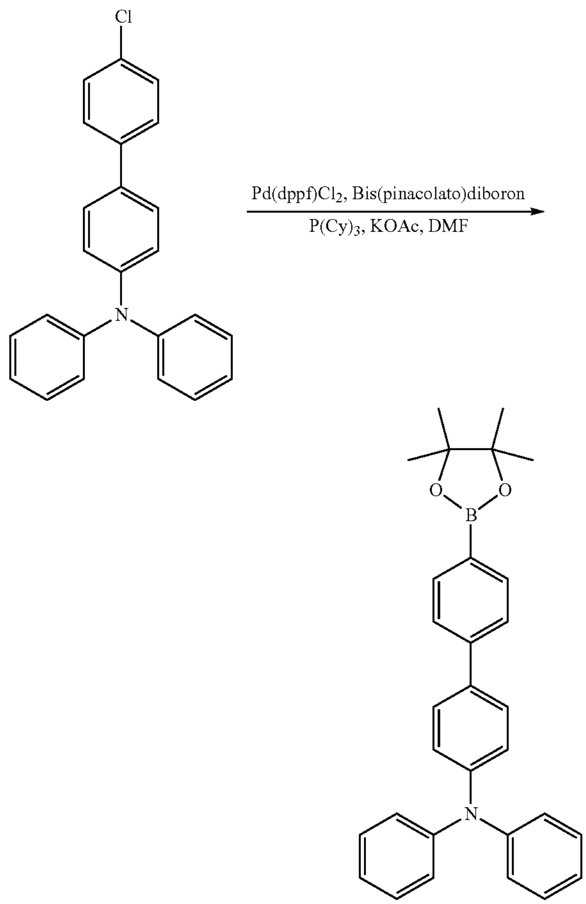

E 20 g (Yield=64.5%) of Intermediate E as a target compound was obtained according to the same method as Synthesis Example 2 except that Intermediate D synthesized according to Synthesis Example 4 was used.

Synthesis Example 6: Synthesis of Compound 1

[Reaction Scheme 6]

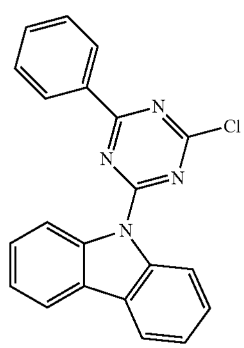

+

-continued

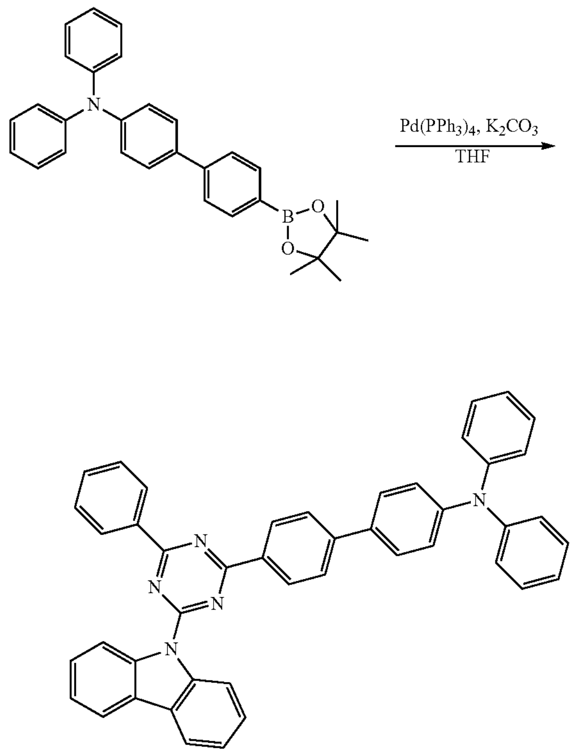

10 g (28.03 mmol) of Intermediate C synthesized in Synthesis Example 3, 13.79 g (30.83 mmol) of Intermediate E synthesized in Synthesis Example 5, 0.97 g (0.84 mmol) of $Pd(PPh_3)_4$, and 7.75 g (56.05 mmol) of $K_2CO_3$ were suspended in 150 ml of THF and 75 ml of distilled water and then, refluxed and stirred for 12 hours. When a reaction was complete, a solid therefrom was filtered, washed with distilled water and acetone, and dried. Subsequently, the solid was dissolved in 200 ml of monochlorobenzene under heating condition and then, silica gel-filtered and recrystallized to obtain 12 g (Yield=67%) of Compound 1 as a target compound.

(LC/MS: theoretical value: 641.76, measured value: 642.30)

Synthesis Example 7: Synthesis of Compound 2

[Reaction Scheme 7]

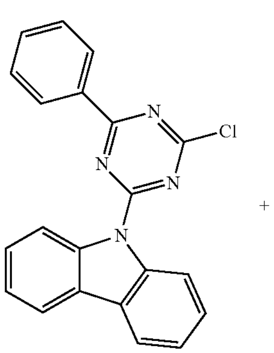

-continued

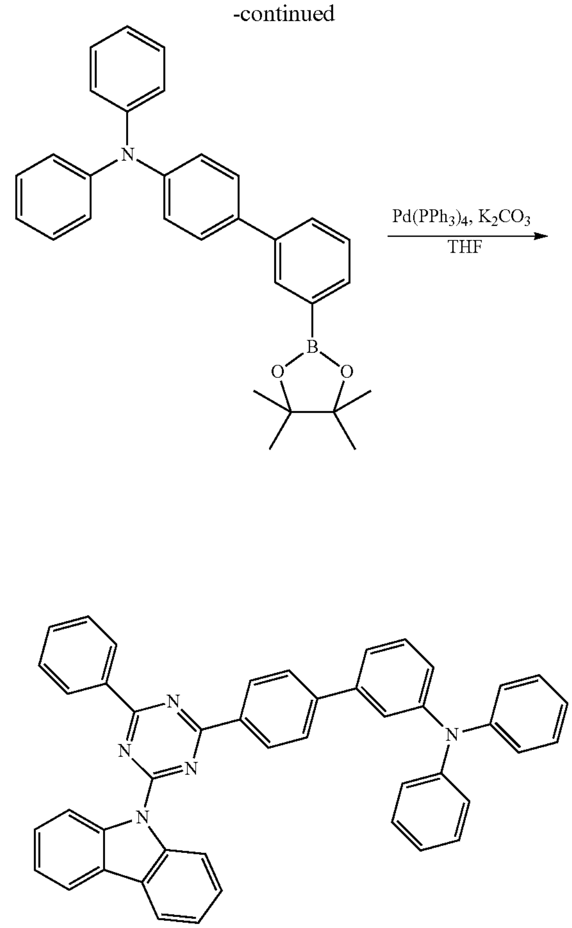

11 g (Yield=61%) of Compound 2 was obtained according to the same method as Synthesis Example 6 except that 10 g (28.03 mmol) of Intermediate C synthesized in Synthesis Example 3 and 13.79 g (30.83 mmol) of Intermediate B synthesized in Synthesis Example 2 were used.

(LC/MS: theoretical value: 641.76, measured value: 642.30)

Comparative Synthesis Example 1: Synthesis of Comparative Compound 1

[Reaction Scheme 8]

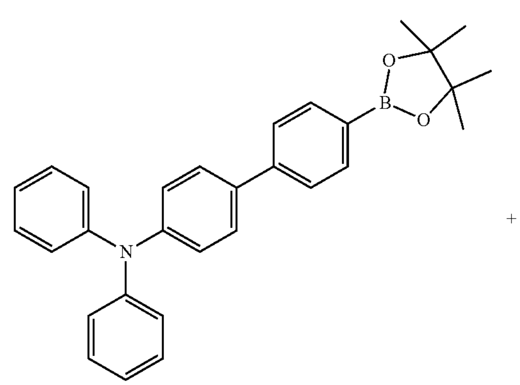

-continued

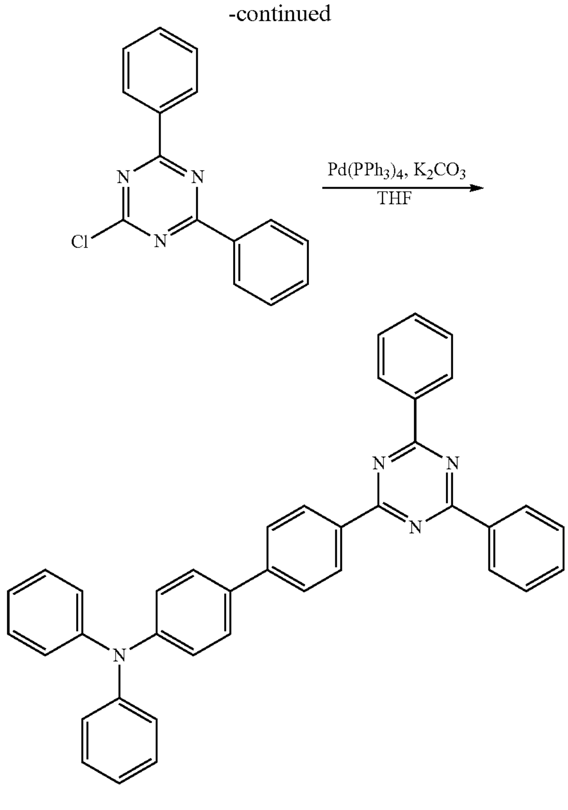

15 g (Yield=75%) of Comparative Compound 1 was obtained according to the same method as Synthesis Example 6 except that 17.54 g (39.22 mmol) of Intermediate E synthesized in Synthesis Example 5 and 10 g (37.35 mmol) of 2-chloro-4,6-diphenyltriazine were used.

(LC/MS: theoretical value: 552.67, measured value: 553.50)

(Manufacture of Organic Light Emitting Diode)

Example 1

A glass substrate coated with ITO (indium tin oxide) with a thickness of 1,500 Å was washed with distilled water. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, and Compound B was deposited to be 50 Å-thick on the hole injection layer, and then Compound C was deposited to be 1,020 Å-thick to form a hole transport layer. Compound 1 of Synthesis Example 6 as a host and 7 wt % of PhGD as a dopant were vacuum-deposited to form 400 Å-thick light emitting layer. Subsequently, Compound D and Liq were vacuum-deposited simultaneously at a weight ratio of 1:1 on the light emitting layer to form a 300 Å-thick electron transport layer and Liq (15 Å) and Al (1,200 Å) were sequentially vacuum-deposited on the electron transport layer to form a cathode, thereby manufacturing an organic light emitting diode.

The organic light emitting diode had a structure of five organic thin layers as follows.

ITO/Compound A (700 Å)/Compound B (50 Å)/Compound C (1,020 Å)/EML [Compound 1:PhGD (7 wt %)] (400 Å)/Compound D:Liq (300 Å)/Liq (15 Å)/Al (1,200 Å).

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN), Compound C: N-(biphenyl-4-yl)-9,9-dimethyl-N-(4-(9-phenyl-9H-carbazol-3-yl)phenyl)-9H-fluoren-2-amine Compound D: 8-(4-(4,6-di(naphthalen-2-yl)-1,3,5-triazin-2-yl)phenyl)quinoline

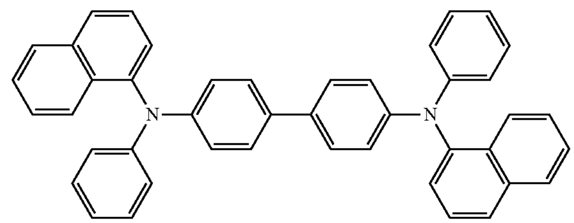

[NPB]

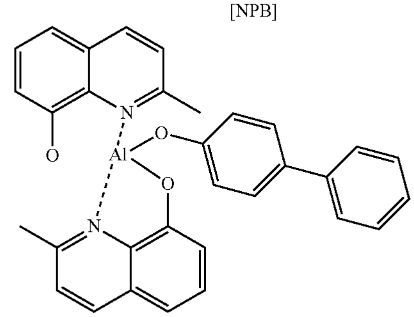

[BAlq]

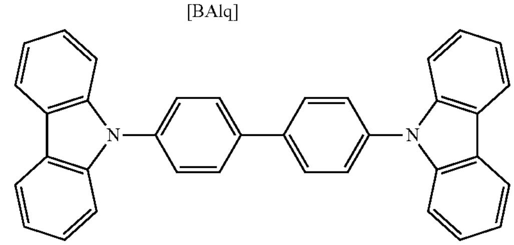

[CBP]

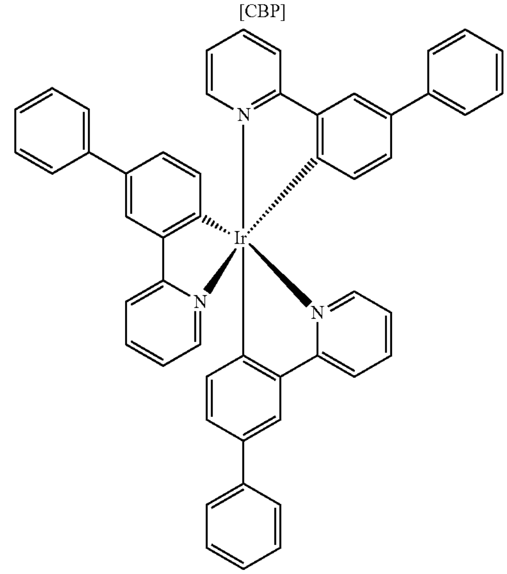

PhGD

Examples 2 to 4 and Comparative Examples 1 and 2

As shown in Table 1 and 2, organic light emitting diodes according to Examples 2 to 4 and Comparative Examples 1 and 2 were manufactured according to the same method as Example 1 except that the host and its ratio were changed.

Evaluation: Effect of Increasing of Life-Span

Life-span characteristics of the organic light emitting diodes according to Examples 1 to 4 and Comparative Examples 1 and 2 were evaluated. A specific measuring method is as follows, and the results are shown in Tables 1 and 2.

(1) Measurement of Life-Span

T90 life-spans of the organic light emitting diodes according to Examples 1 to 4 and Comparative Examples 1 and 2 were measured as a time when their luminance decreased down to 90% relative to the initial luminance (cd/$m^2$) after emitting light with 24,000 cd/$m^2$ as the initial luminance (cd/$m^2$) and measuring their luminance decreases depending on a time with a Polanonix life-span measurement system.

(2) T90 Life-Span Ratio (%) Calculation

T90(h) of the Examples using a single host or a mixed host including the same second host (using the first compound for the organic optoelectronic device as a first host) and the Comparative Examples (using Comparative Compound 1 as a first host) were compared.

T90 life-span ratio (%)={[T90(h) of the Examples (using the first compound for the organic optoelectronic device as a single or mixed host)/[T90(h) of the Comparative Example (using Comparative Compound 1 as a single or mixed host)]}×100

TABLE 1

| | Single host | T90 life-span ratio (%) |
|---|---|---|
| Example 1 | Compound 1 | 120% |
| Example 2 | Compound 2 | 140% |
| Comparative Example 1 | Comparative Compound 1 | 100% |

TABLE 2

| | Host | | | |
|---|---|---|---|---|
| | First host | Second host | First and second host ratio | T90 life-span ratio (%) |
| Example 3 | Compound 1 | A-99 | 3:7 | 140% |
| Example 4 | Compound 2 | A-99 | 3:7 | 180% |
| Comparative Example 2 | Comparative Compound 1 | A-99 | 3:7 | 100% |

Referring to Tables 1 and 2, the compound of the Examples exhibited greatly improved life-span compared with the Comparative Examples.

One or more embodiments may provide a compound for an organic optoelectronic device capable of implementing an organic optoelectronic device having high efficiency and long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being represented by Chemical Formula 1:

[Chemical Formula 1]

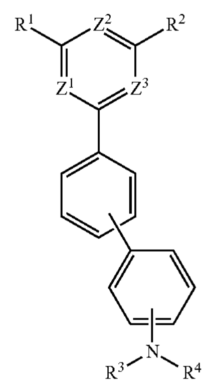

wherein, in Chemical Formula 1, $Z^1$ to $Z^3$ are each N, $R^1$ is a substituted or unsubstituted carbazolyl group, $R^2$ is a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, or a combination thereof, $R^3$ and $R^4$ are independently a substituted or unsubstituted phenyl group or a substituted or unsubstituted biphenyl group, and "substituted" refers to replacement of at least one hydrogen by deuterium, a C1 to C5 alkyl group, a phenyl group, a biphenyl group, or a cyano group.

2. The compound as claimed in claim 1, wherein the compound represented by Chemical Formula 1 is represented by Chemical Formula 1A or Chemical Formula 1B:

[Chemical Formula 1A]

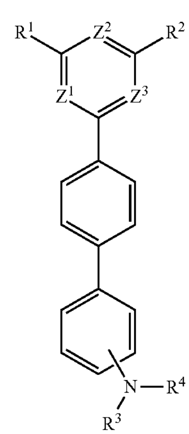

-continued

[Chemical Formula 1B]

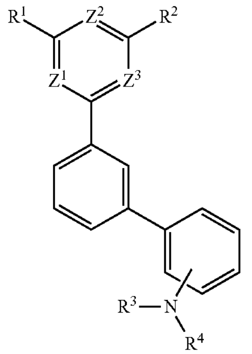

wherein, in Chemical Formula 1A and Chemical Formula 1B, $Z^1$ to $Z^3$ and $R^1$ to $R^4$ are defined the same as those of Chemical Formula 1.

3. The compound as claimed in claim 2, wherein:

the compound represented by Chemical Formula 1 is represented by Chemical Formula 1A, the compound represented by Chemical Formula 1A is represented by Chemical Formula 1A-1 or Chemical Formula 1A-2:

[Chemical Formula 1A-1]

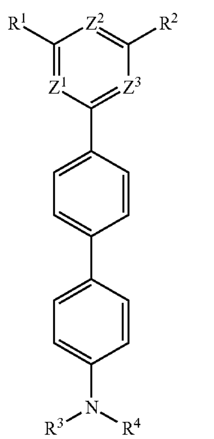

[Chemical Formula 1A-2]

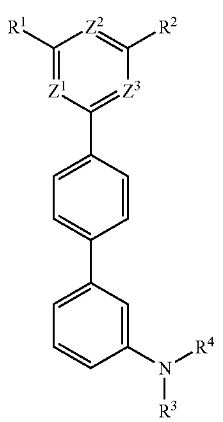

in Chemical Formula 1A-1 and Chemical Formula 1A-2, $Z^1$ to $Z^3$ and $R^1$ to $R^4$ are defined the same as those of Chemical Formula 1.

4. The compound as claimed in claim 1, wherein:

the compound represented by Chemical Formula 1 is represented by Chemical Formula 1D or Chemical Formula 1E:

[Chemical Formula 1D]

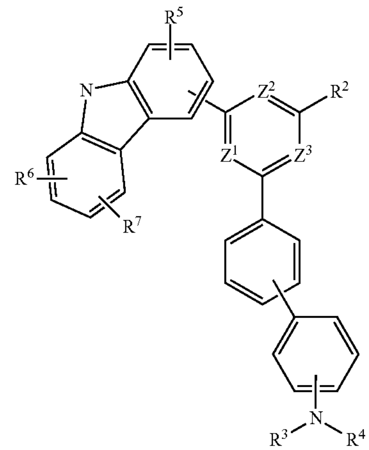

[Chemical Formula 1E]

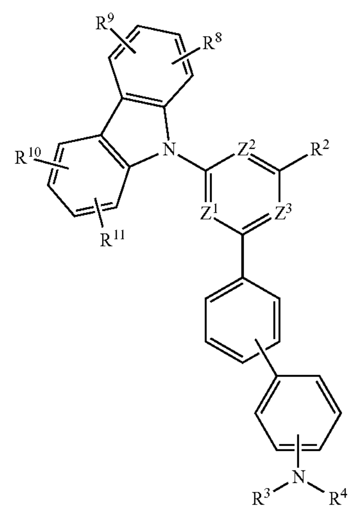

in Chemical Formula 1D and Chemical Formula 1E, $Z^1$ to $Z^3$ and $R^2$ to $R^4$ are defined the same as those of Chemical Formula 1, and $R^5$ to $R^{11}$ are independently hydrogen, deuterium, a C1 to C5 alkyl group, a C6 to C18 aryl group, or a combination thereof.

5. The compound as claimed in claim 4, wherein:

the compound represented by Chemical Formula 1 is represented by Chemical Formula 1E, the compound represented by Chemical Formula 1E is represented by Chemical Formula 1E-A-1 or Chemical Formula 1E-A-2:

[Chemical Formula 1E-A-1]
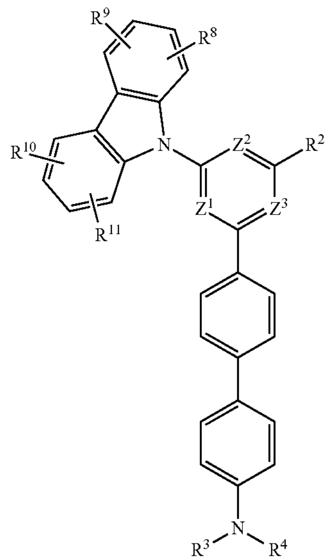
[Chemical Formula 1E-A-2]
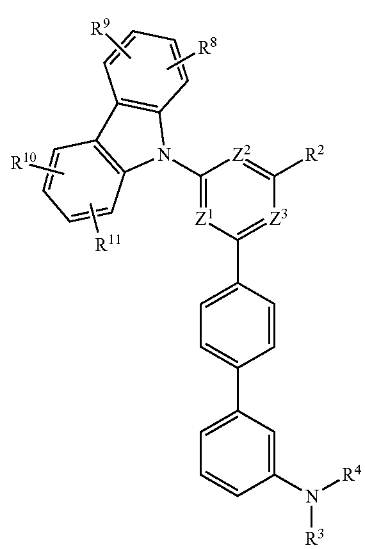
in Chemical Formula 1E-A-1 and Chemical Formula 1E-A-2, $Z^1$ to $Z^3$, $R^2$ to $R^4$, and $R^1$ to $R^{11}$ are defined the same as those of Chemical Formula 1E.
6. The compound as claimed in claim 1, wherein the compound is a compound of Group 1:
[Group 1]
[1]
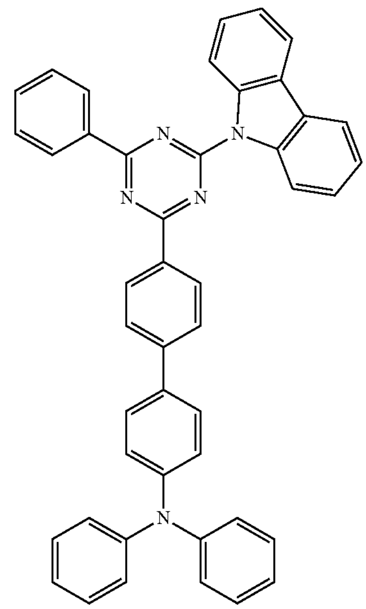
[2]
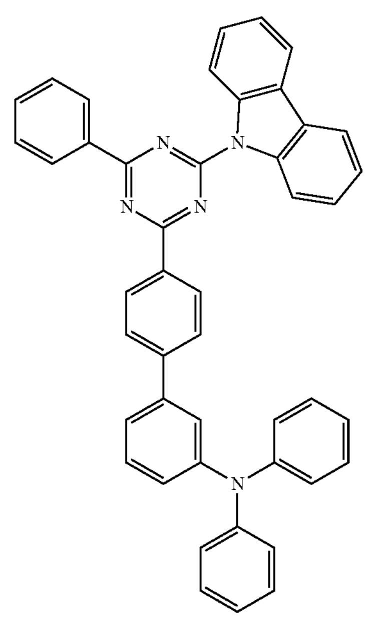

-continued
[3]
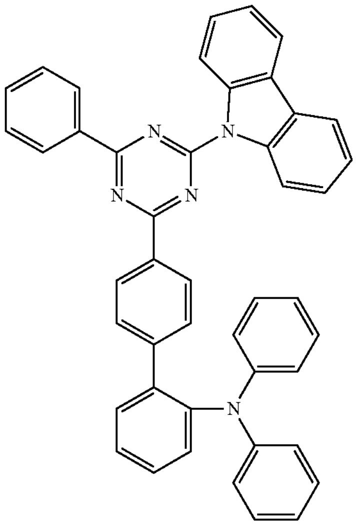
[4]
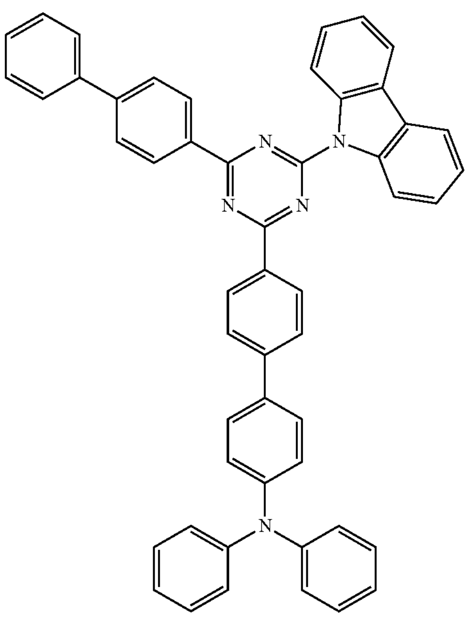
-continued
[5]
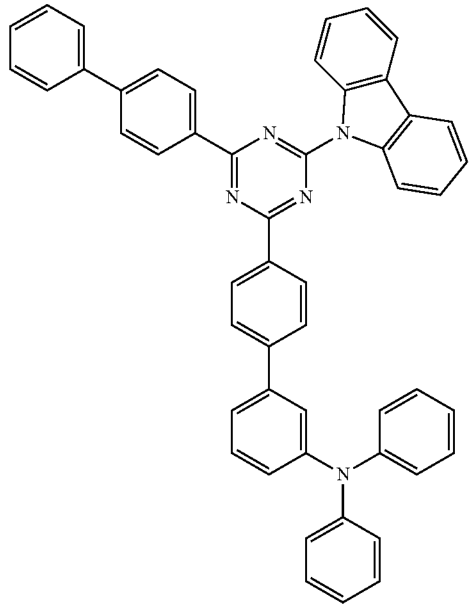
[6]
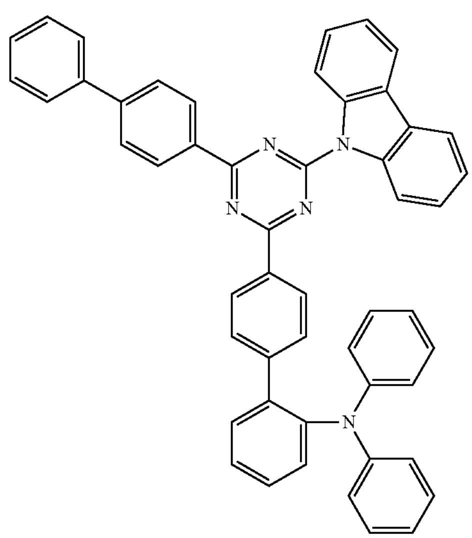

-continued
[7]
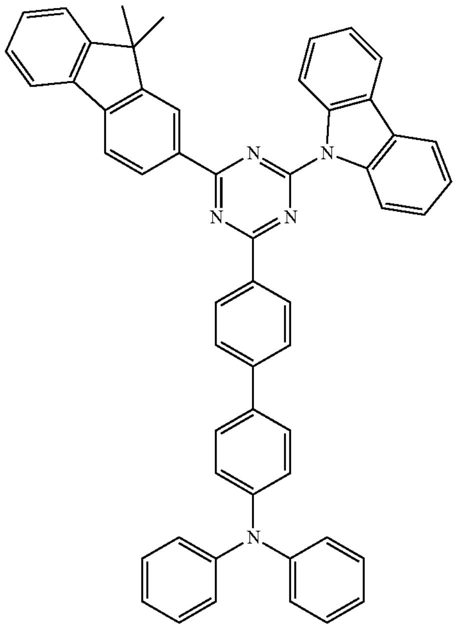
[8]
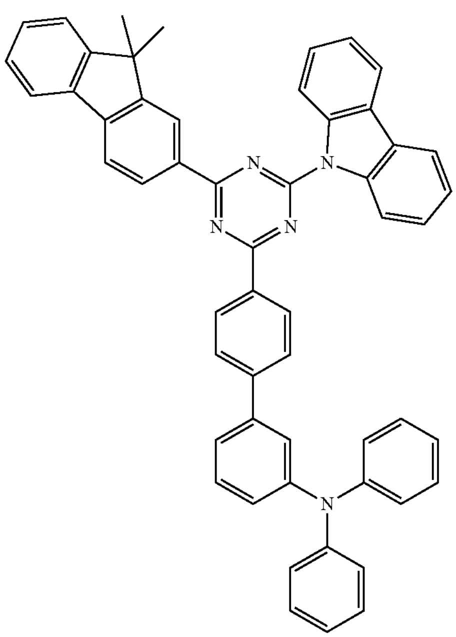
-continued
[9]
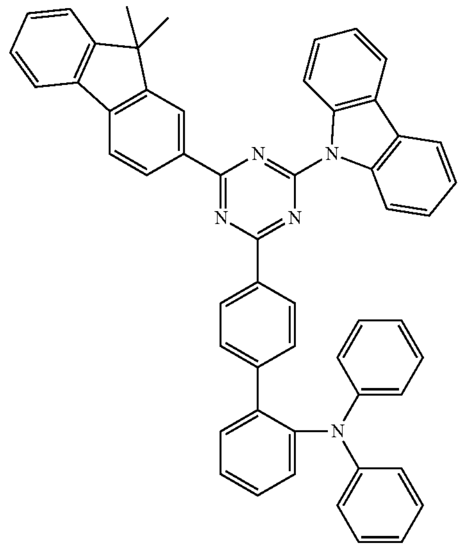
[10]
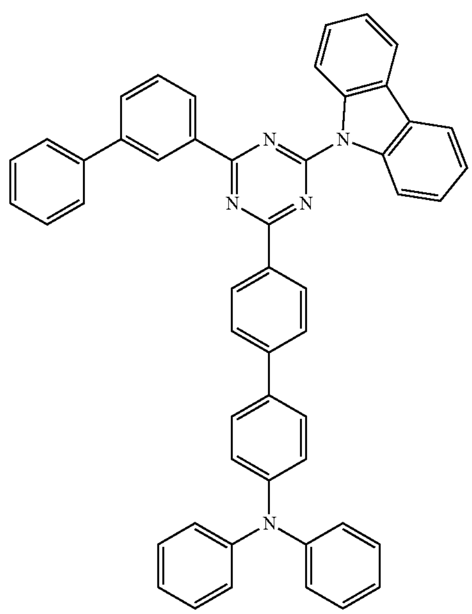

-continued
[11]
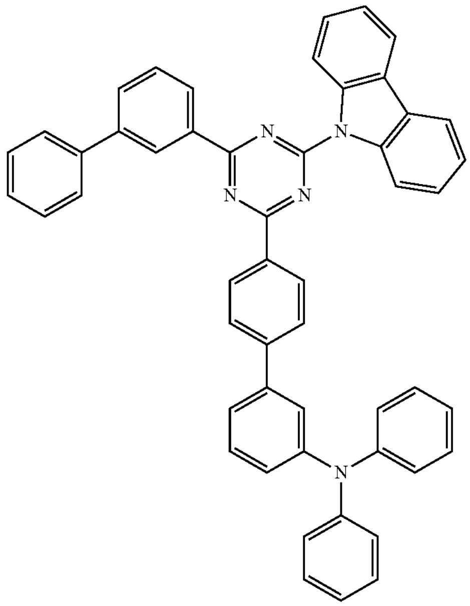
[12]
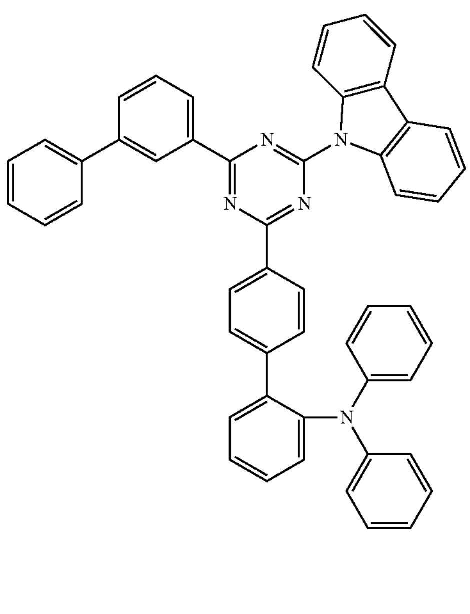
-continued
[13]
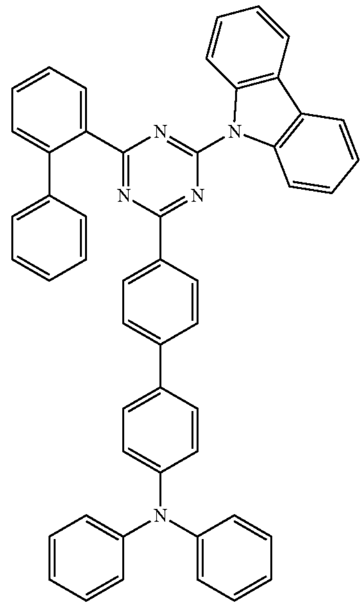
[14]
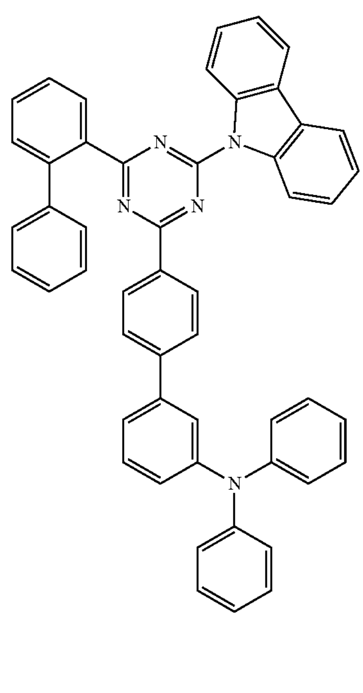

-continued
[15]
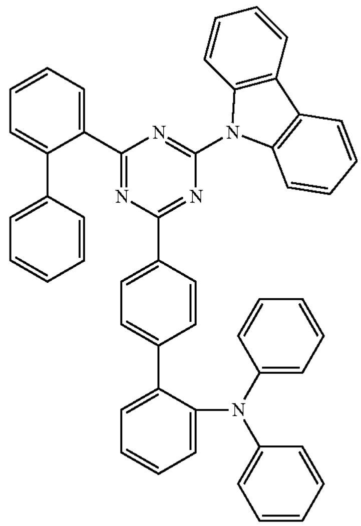
[16]
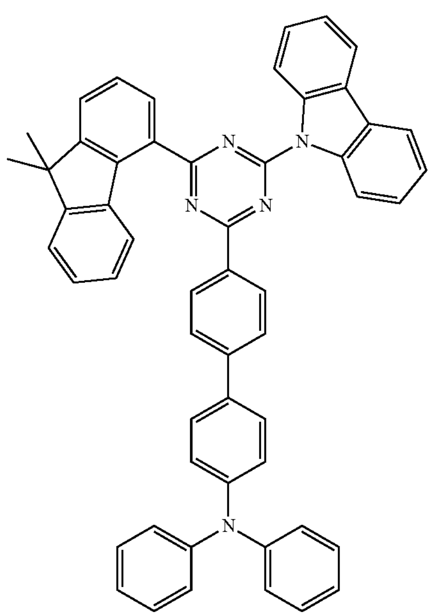
-continued
[17]
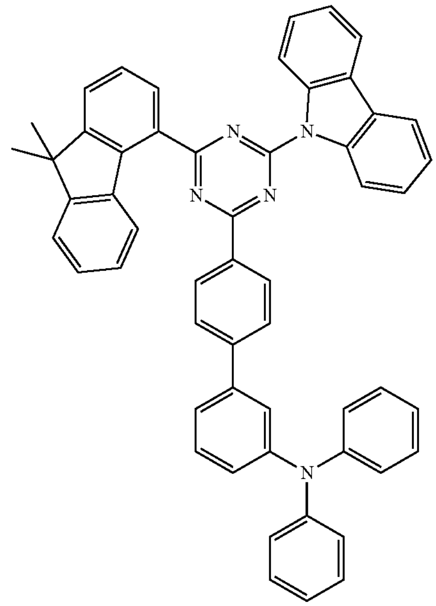
[18]
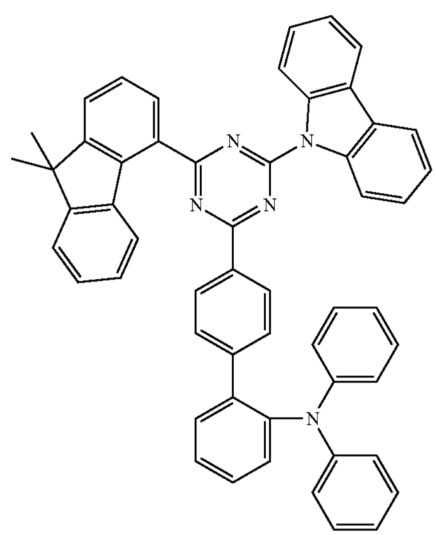

-continued
[19]
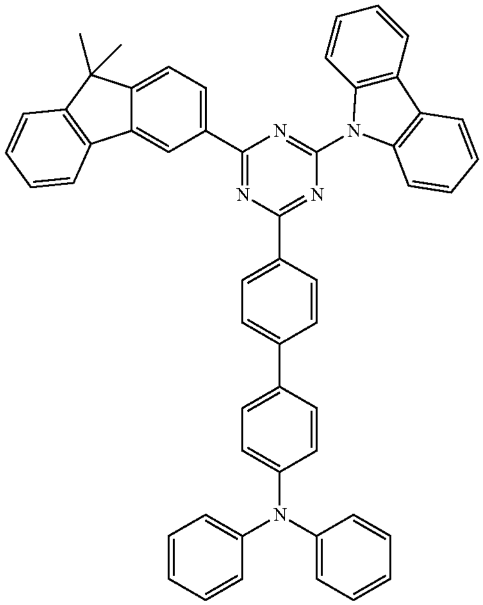
[20]
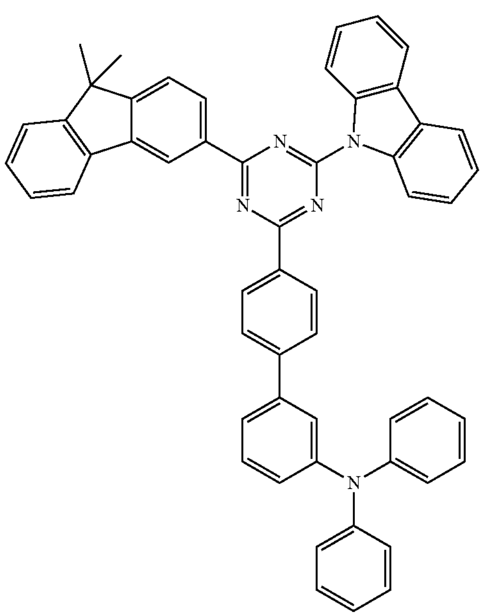
-continued
[21]
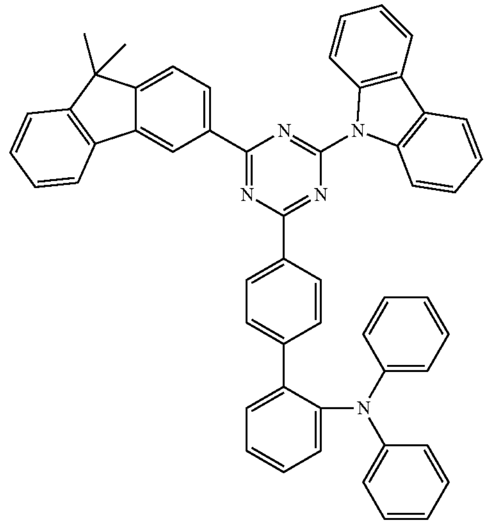
[22]
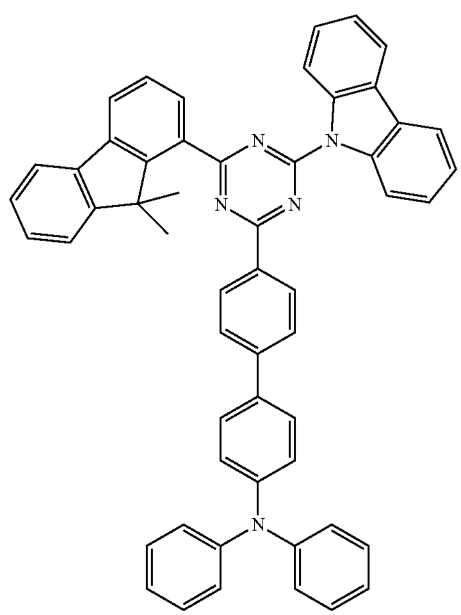

-continued
[23]
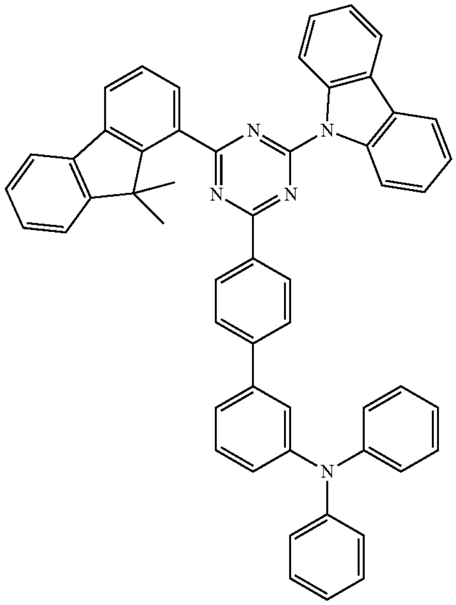
[24]
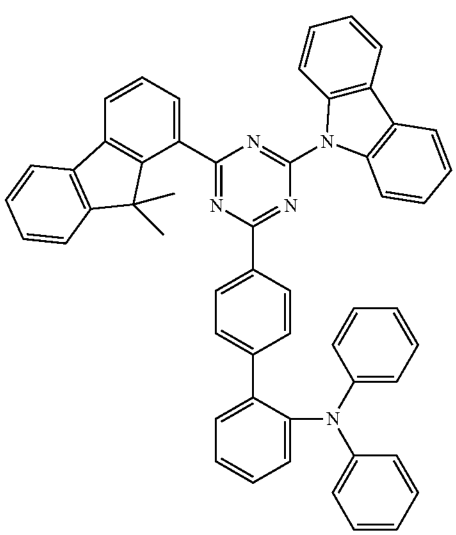
-continued
[25]
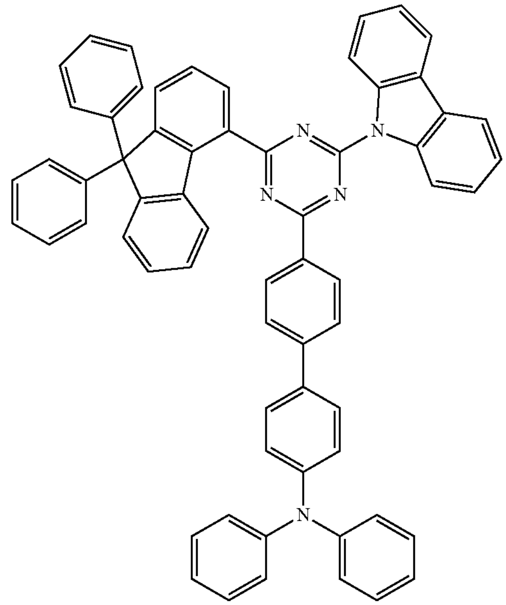
[26]
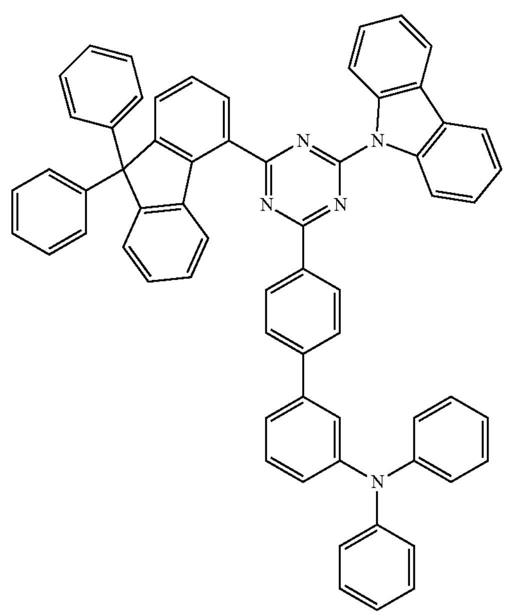

-continued
[27]
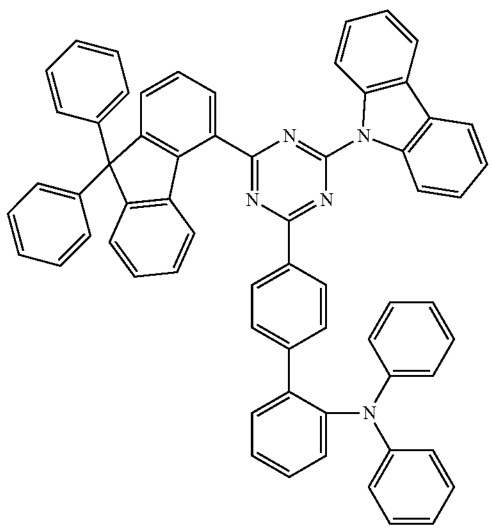
[28]
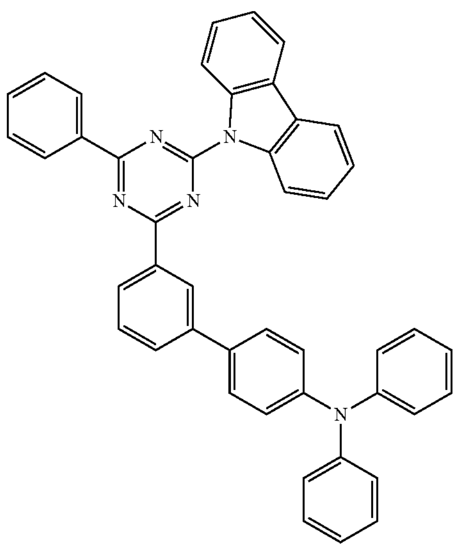
[29]
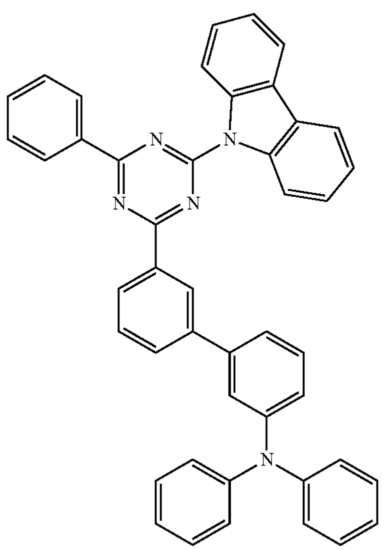
-continued
[30]
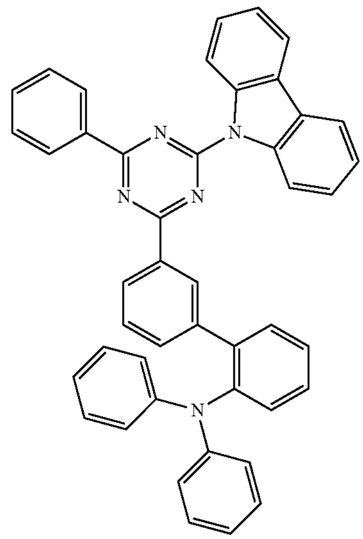
[31]
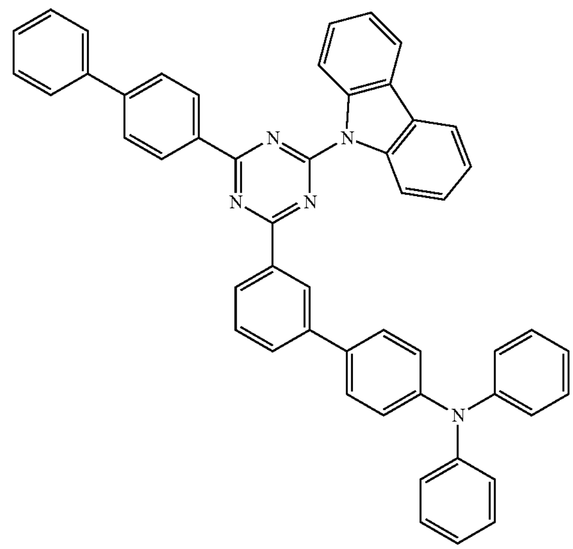
[32]
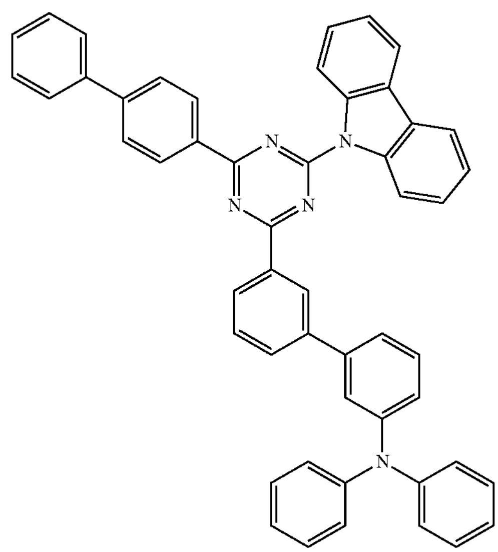

-continued
[33]
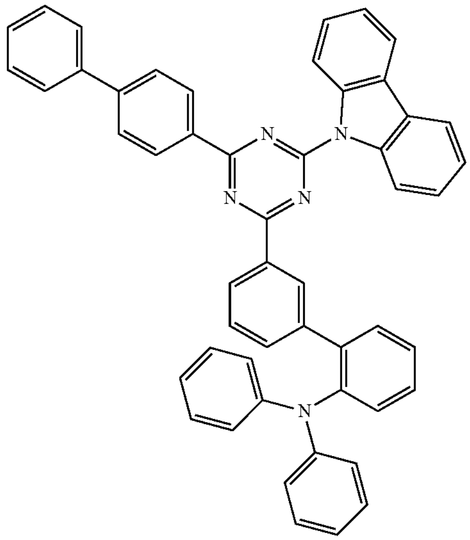
[34]
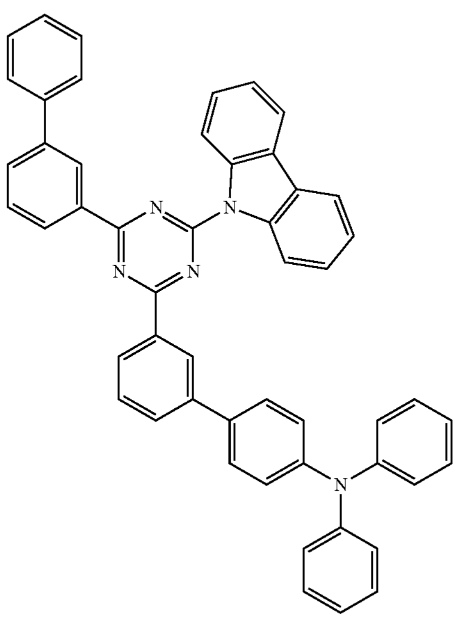
-continued
[35]
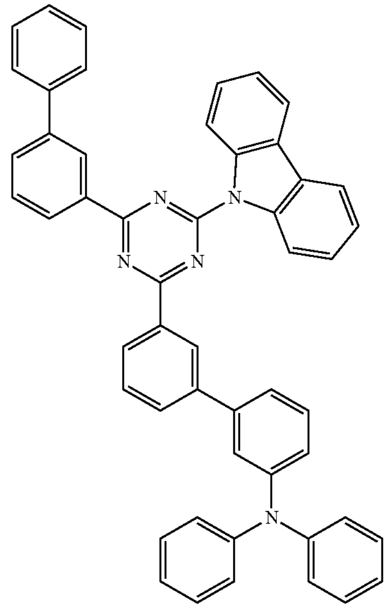
[36]
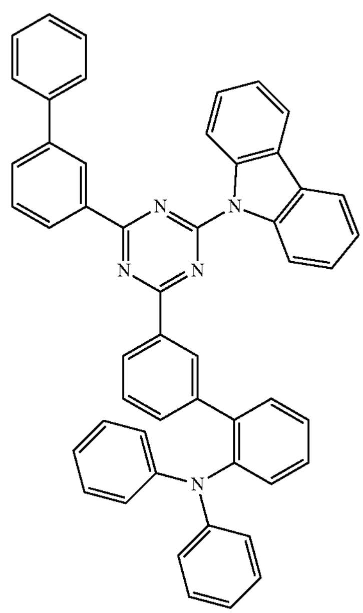

-continued
[37]
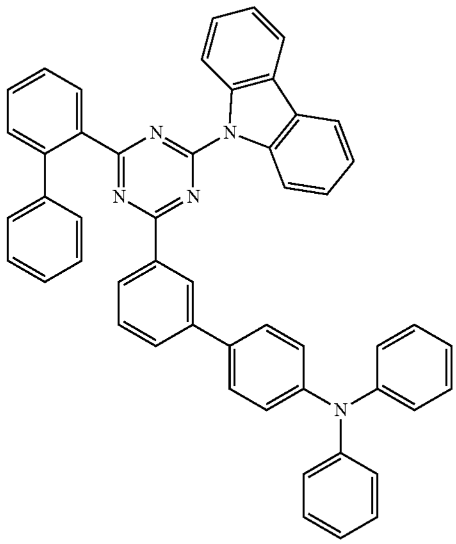
[38]
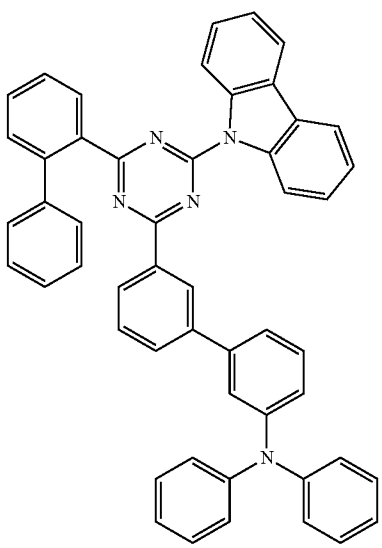
[39]
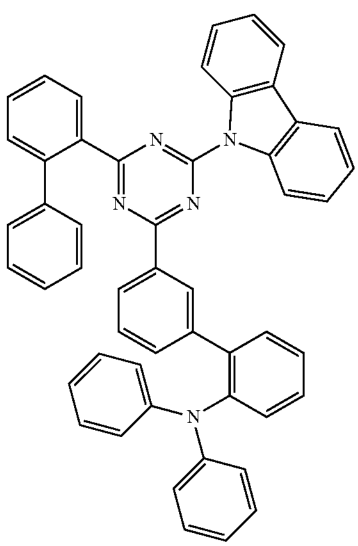
-continued
[40]
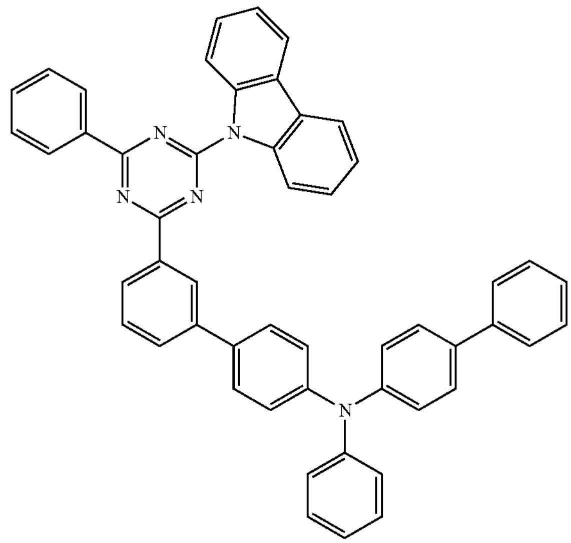
[41]
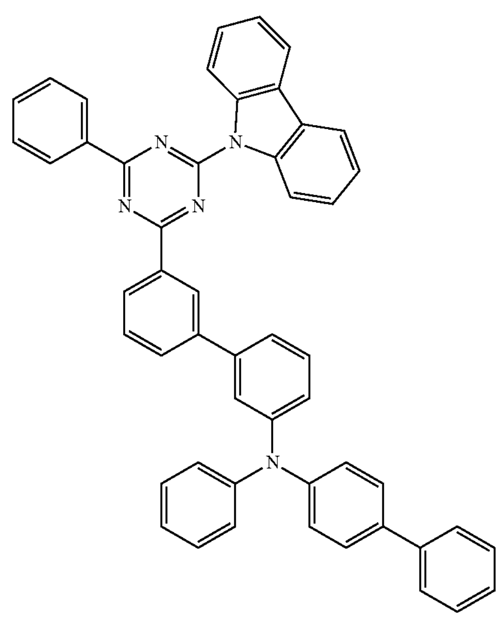

-continued
[42]
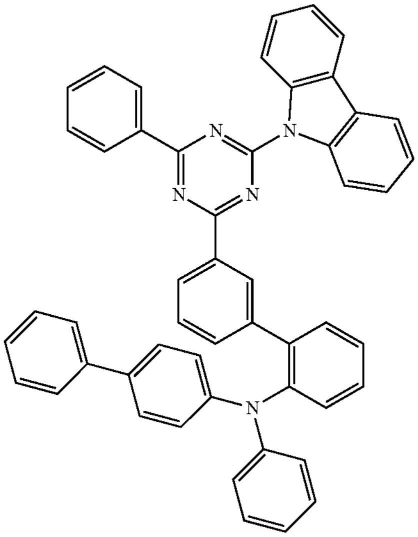
[43]
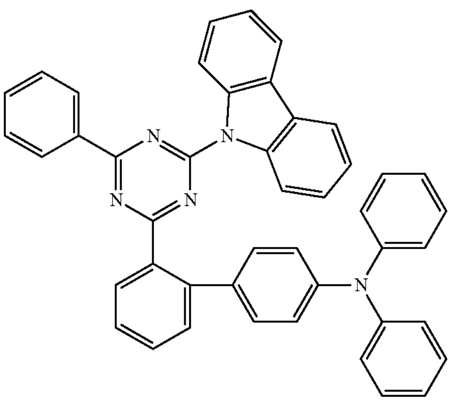
[44]
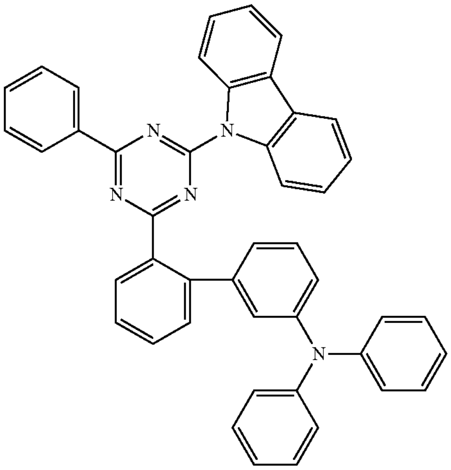
-continued
[45]
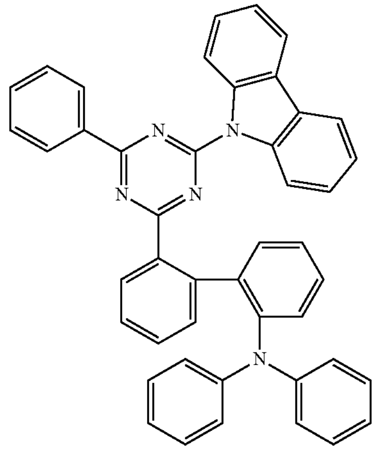
[46]
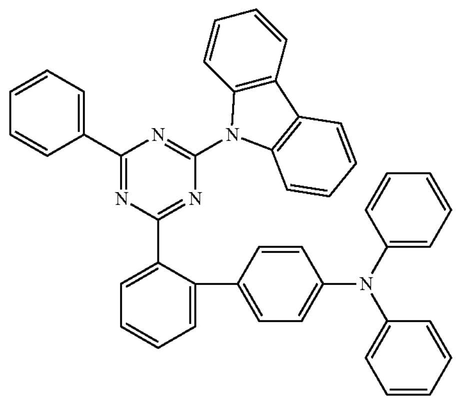
[47]
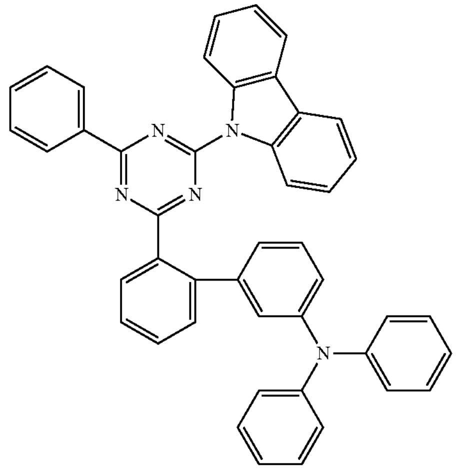

-continued
[48]
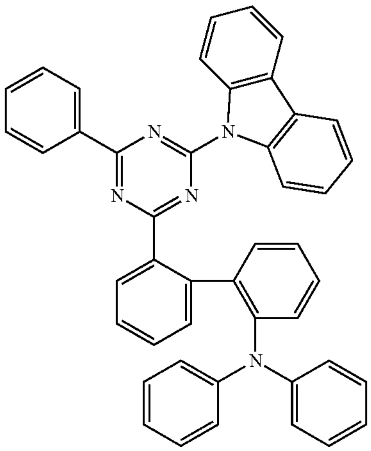
[49]
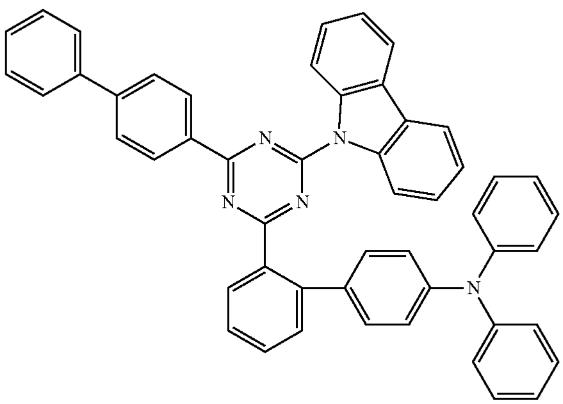
[50]
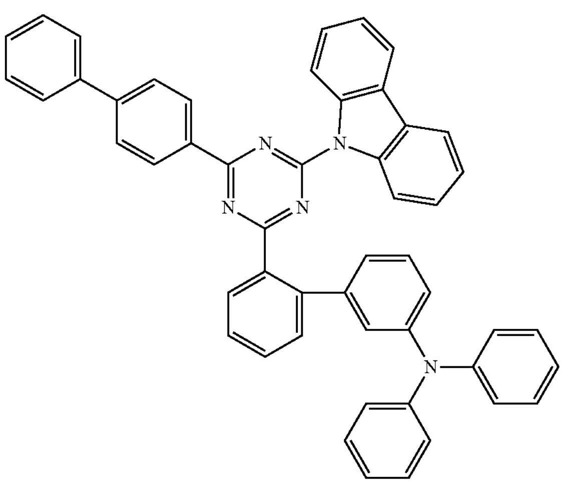
-continued
[51]
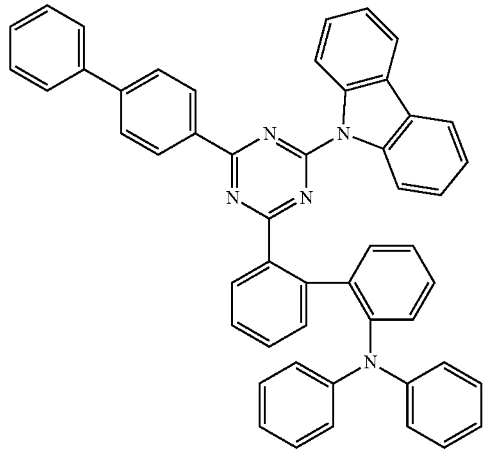
[52]
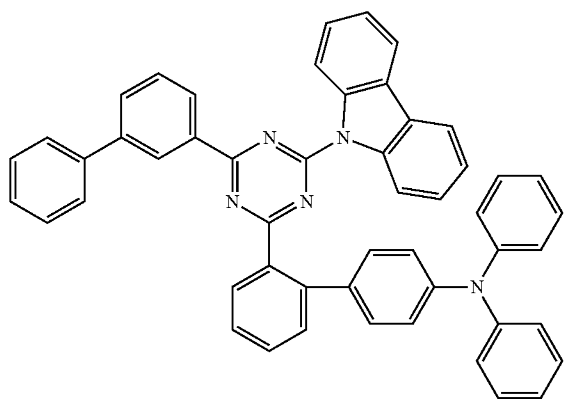
[53]
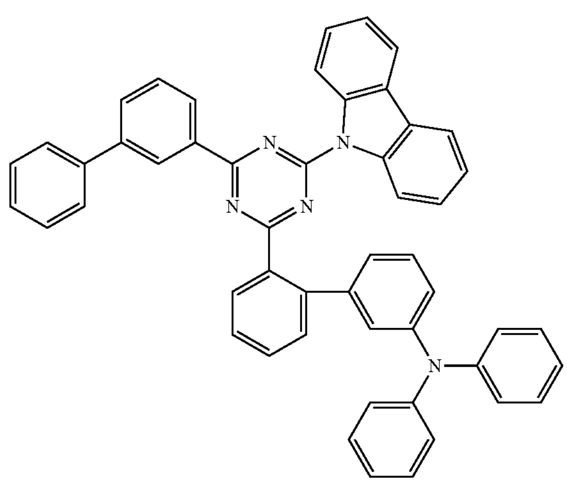

[54]
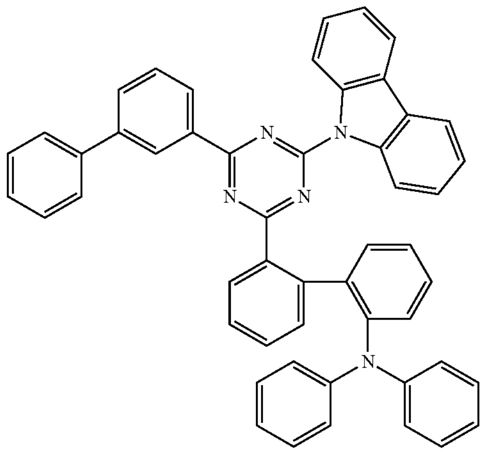
[55]
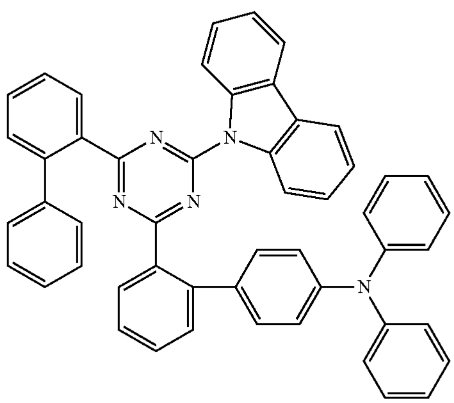
[56]
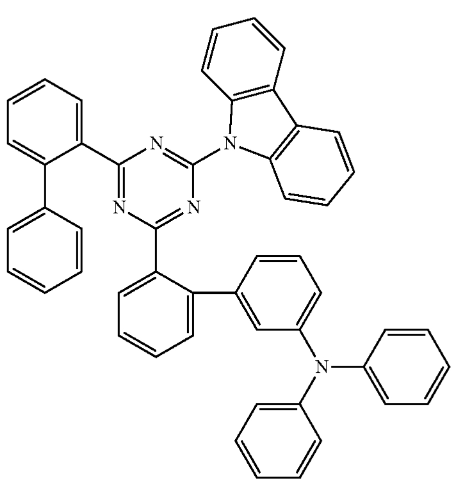
[57]
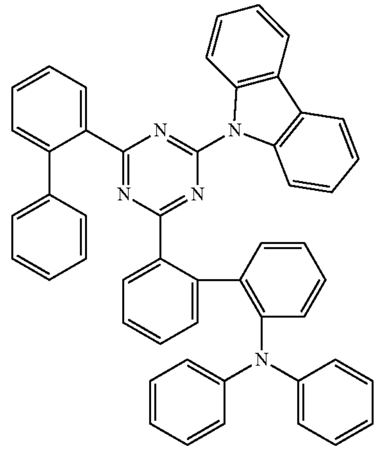
[58]
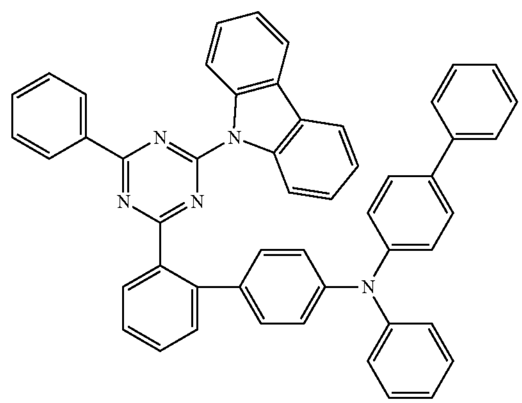
[59]
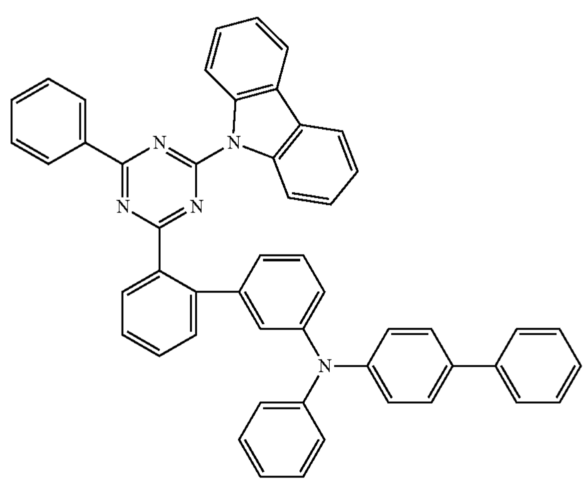

-continued
[60]
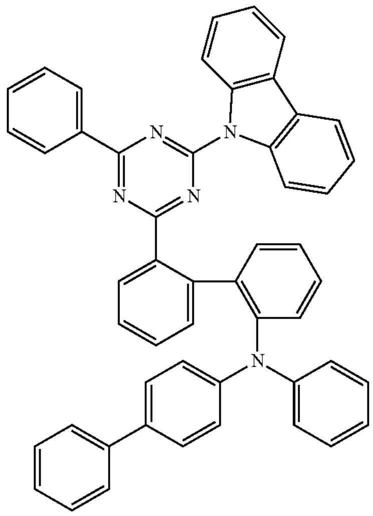
[61]
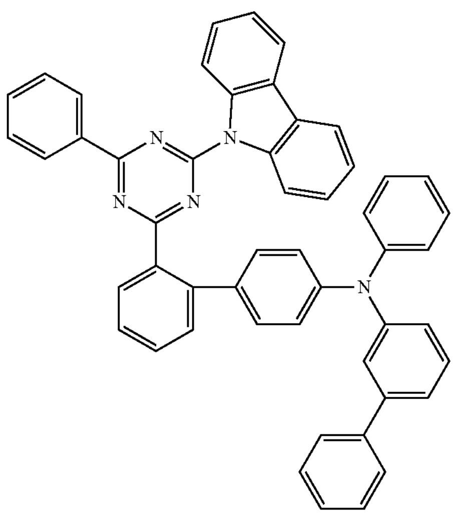
[62]
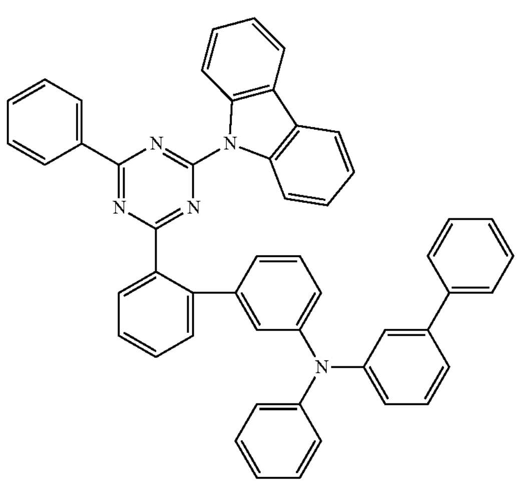
-continued
[63]
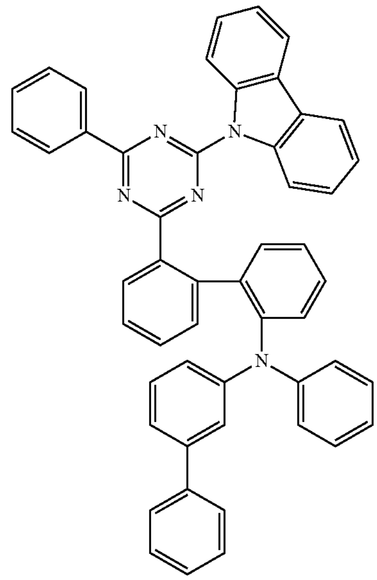
[64]
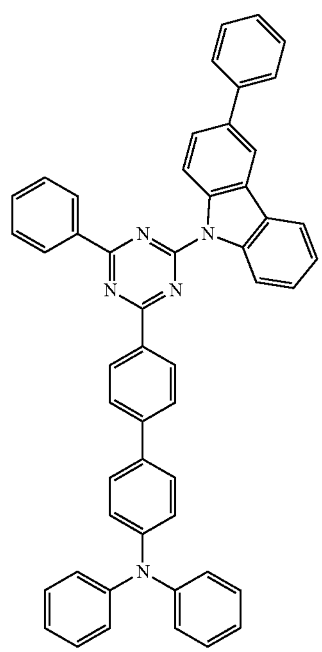

-continued
[65]
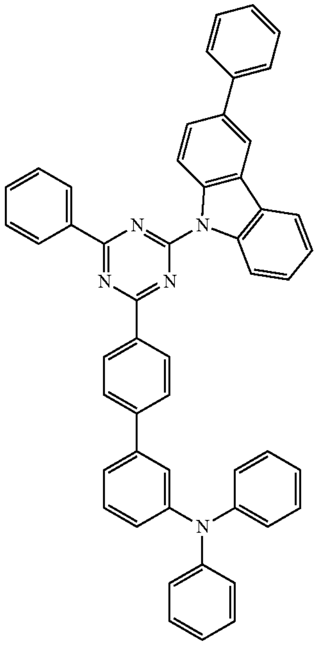
[66]
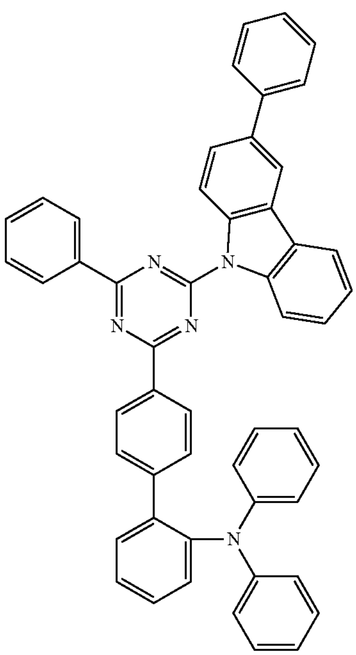
-continued
[67]
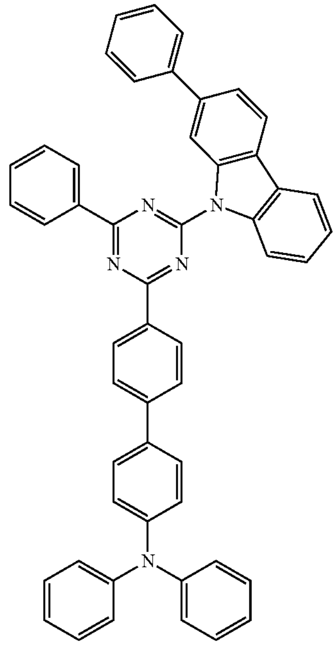
[68]
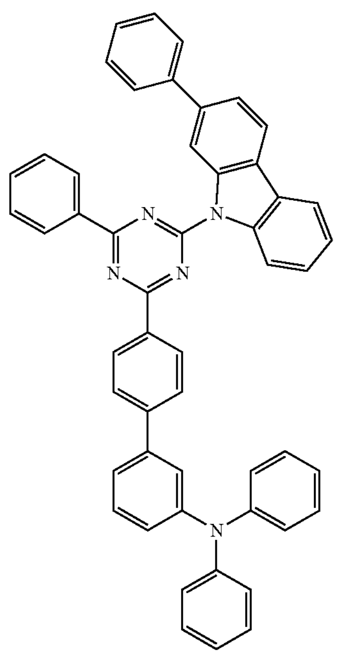

-continued
[69]
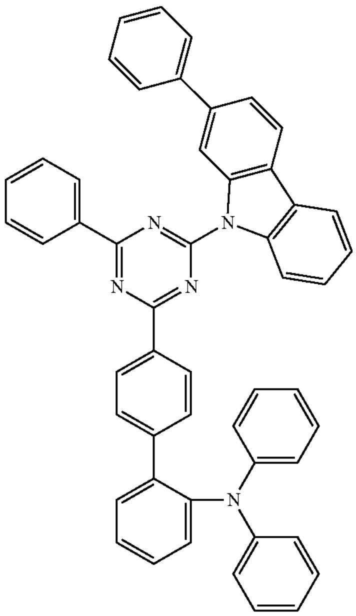
[70]
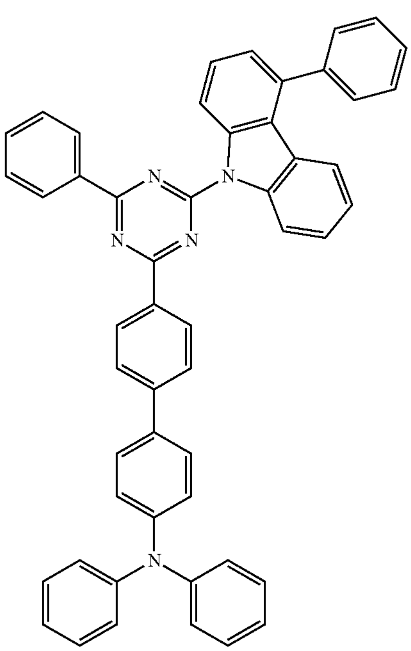
-continued
[71]
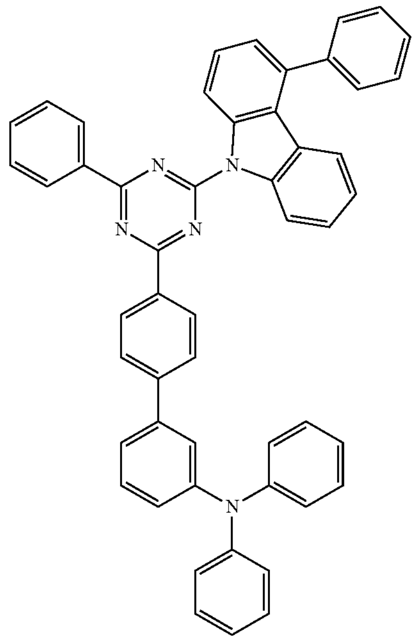
[72]
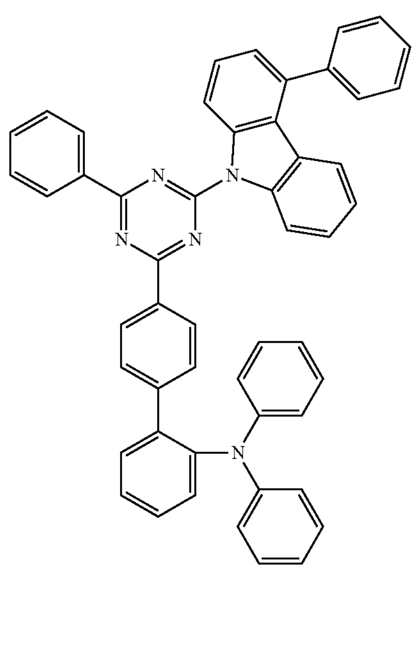

-continued
[73]
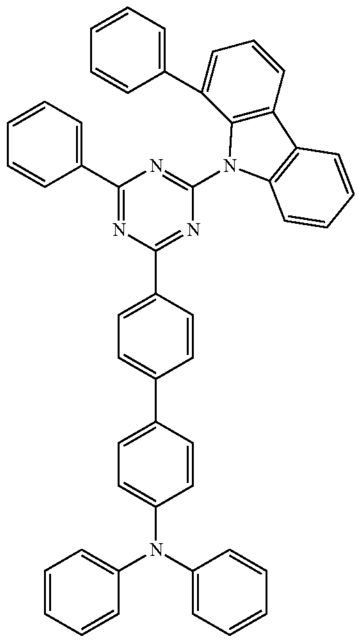
[74]
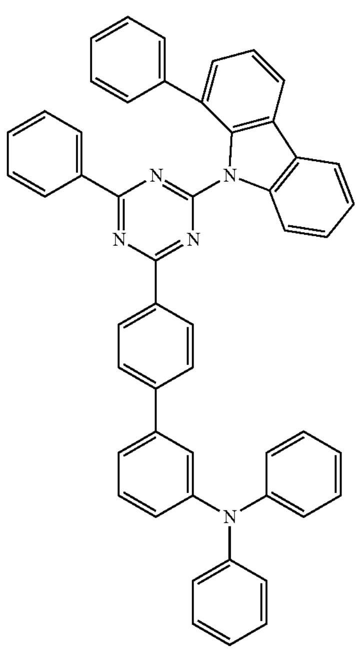
-continued
[75]
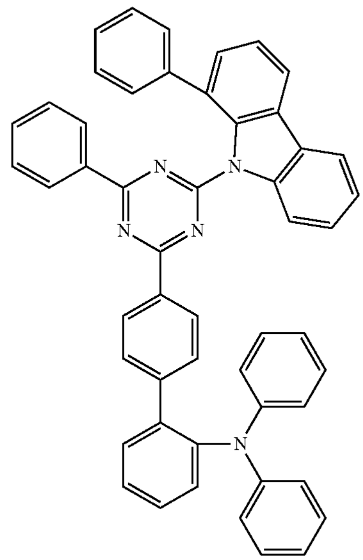
[76]
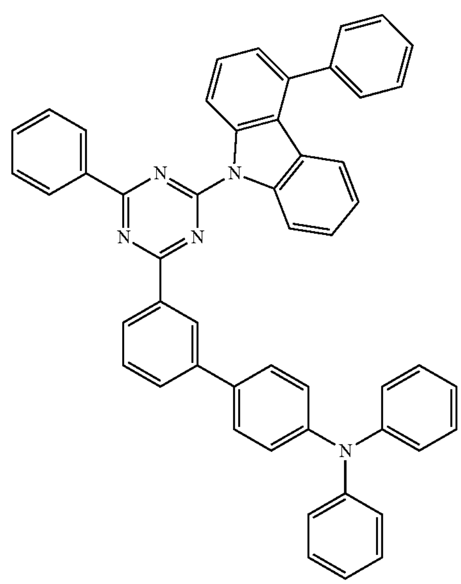

[77]
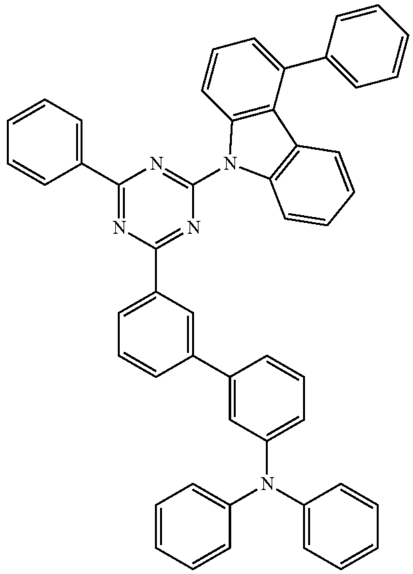
[78]
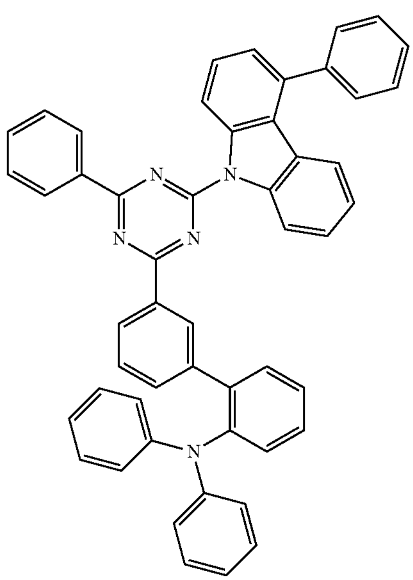
[79]
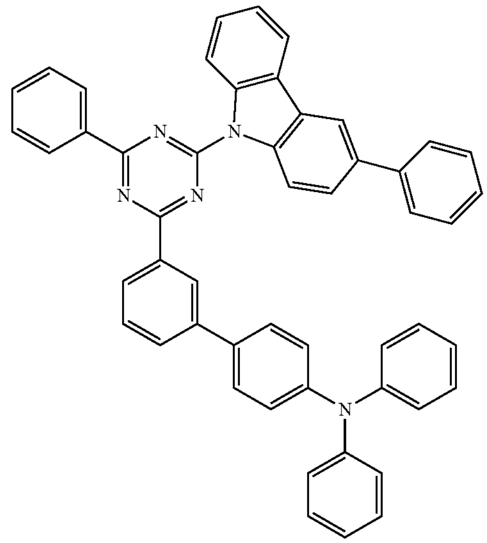
[80]
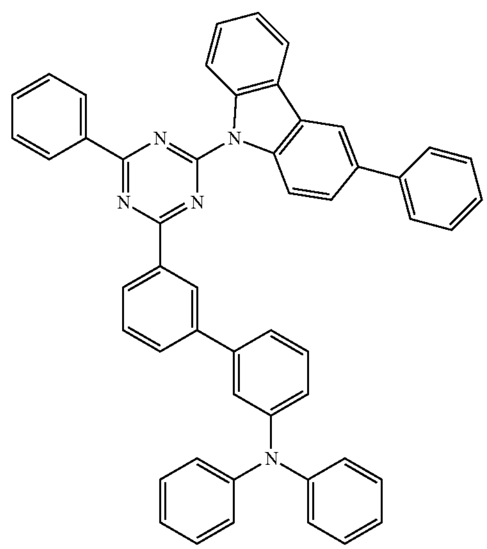
[81]
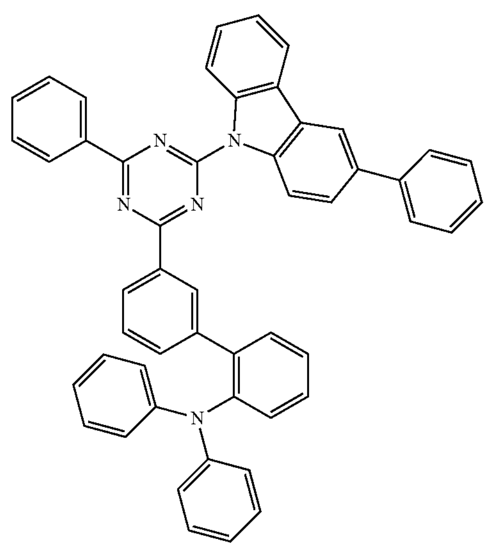

[82]
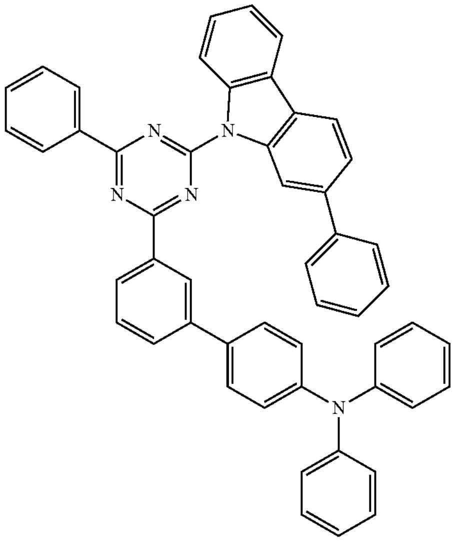
[83]
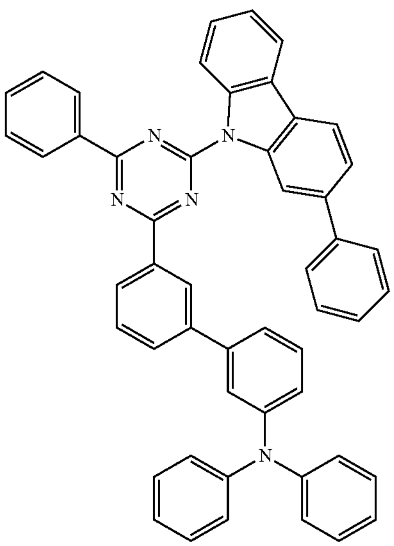
[84]
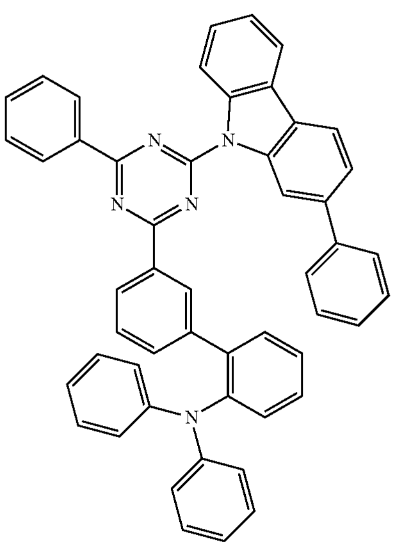
[85]
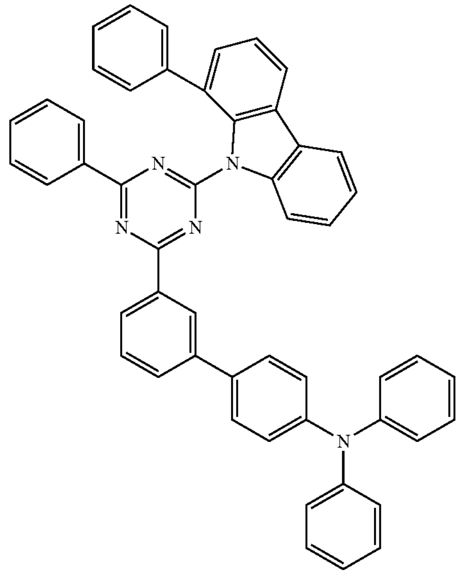
[86]
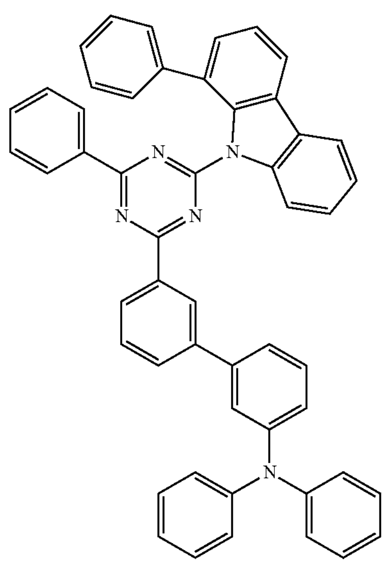

[87]
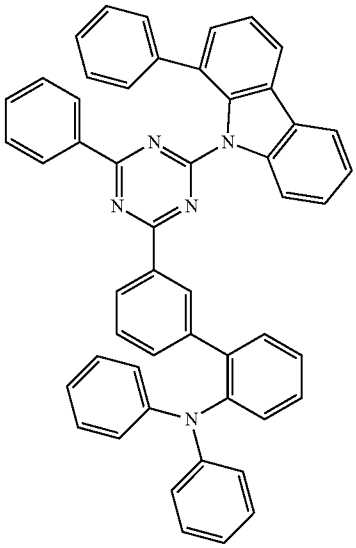
[88]
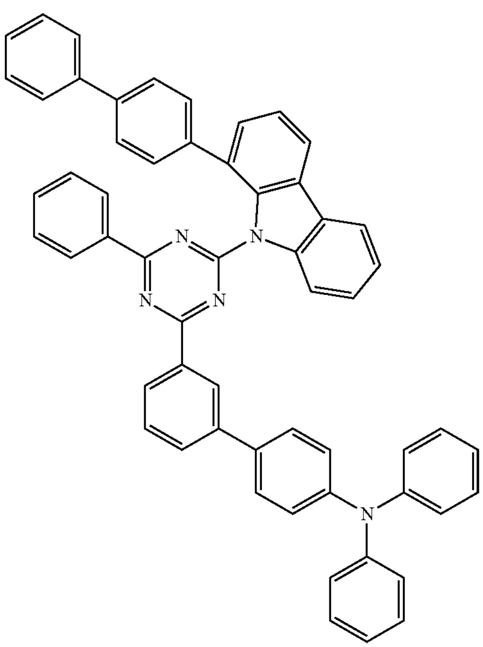
[89]
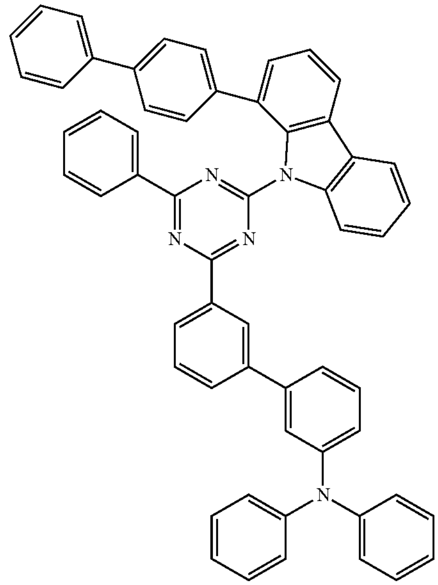
[90]
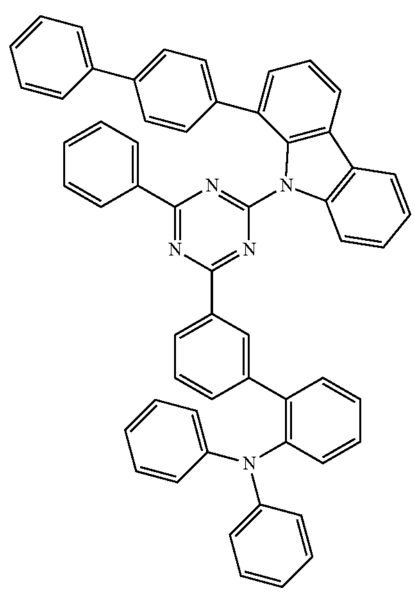

-continued
[91]
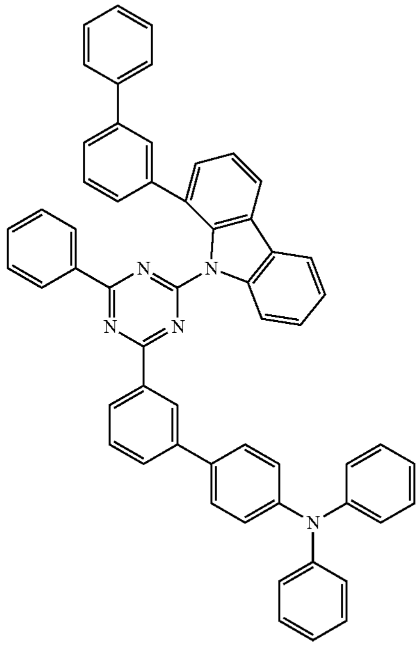
[92]
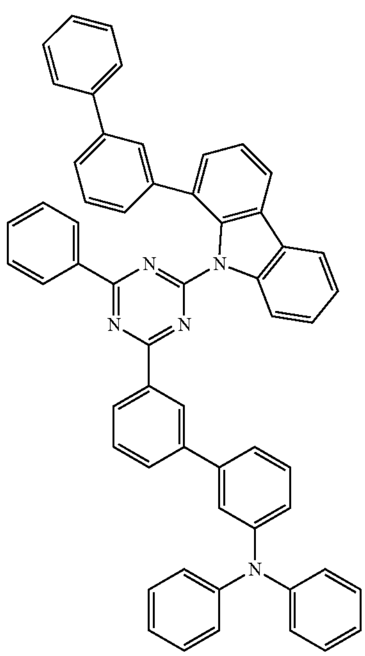
-continued
[93]
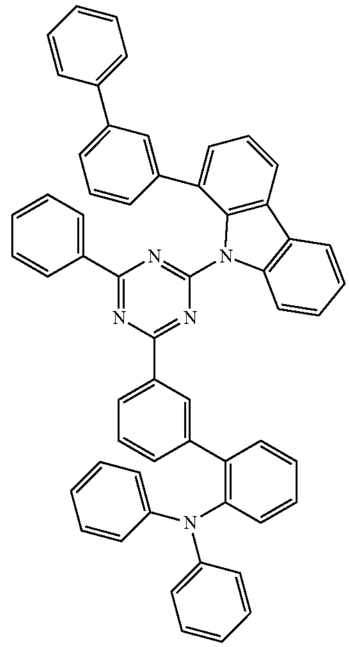
[94]
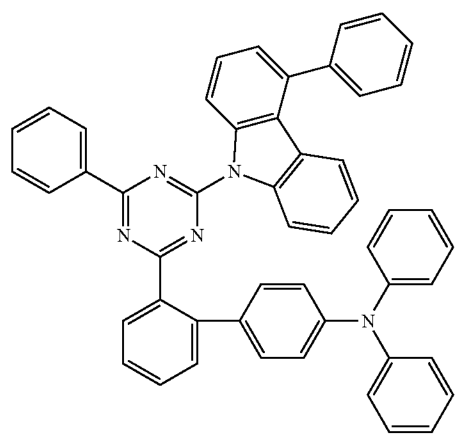
[95]
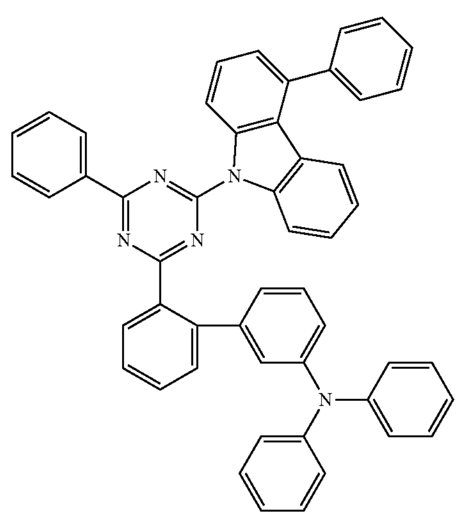

-continued
[96]
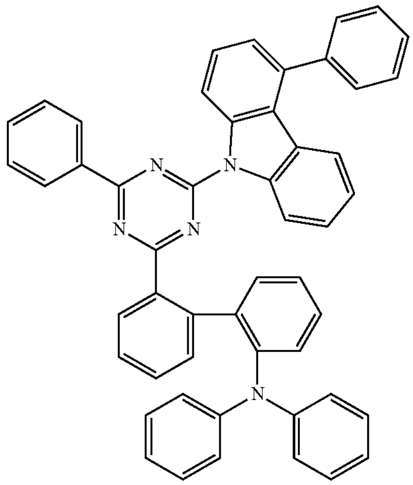
[97]
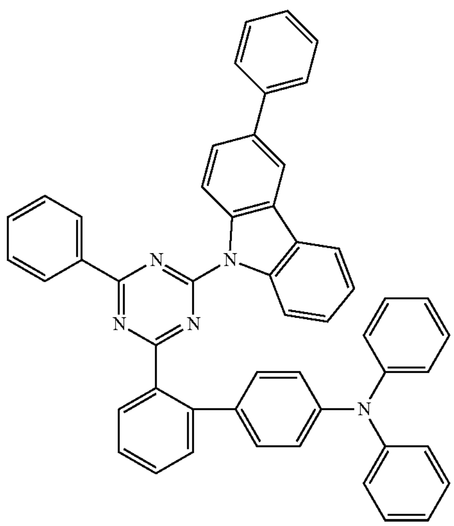
[98]
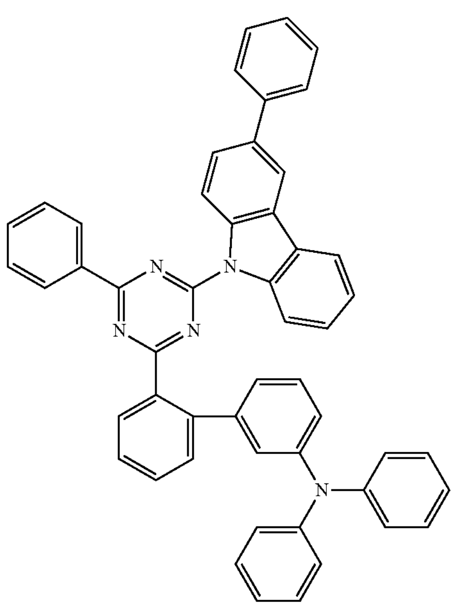
-continued
[99]
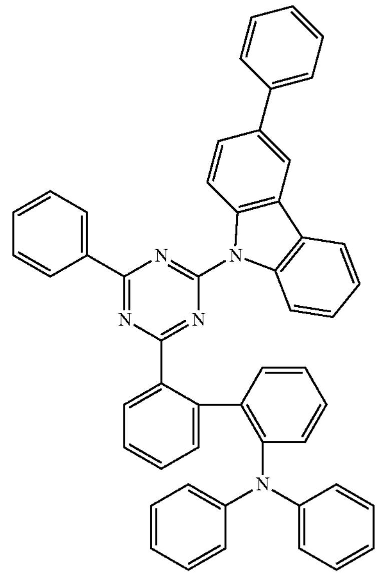
[100]
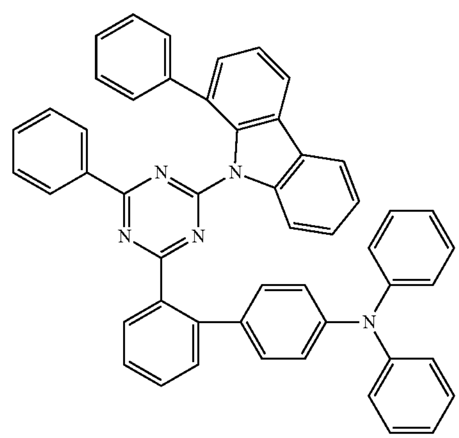
[101]
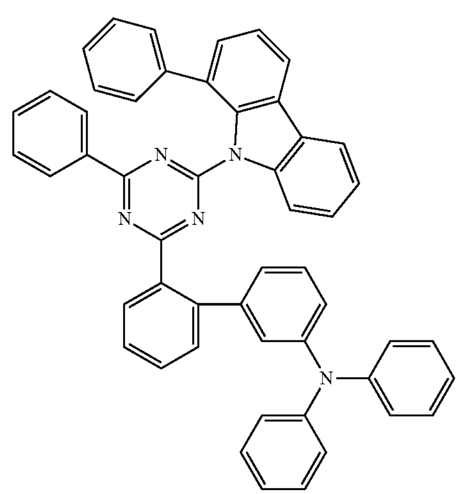

-continued
[102]
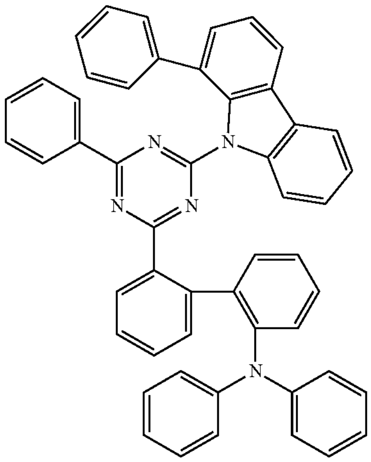
[103]
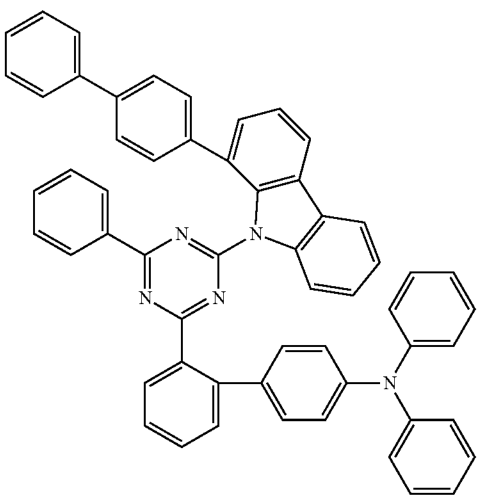
[104]
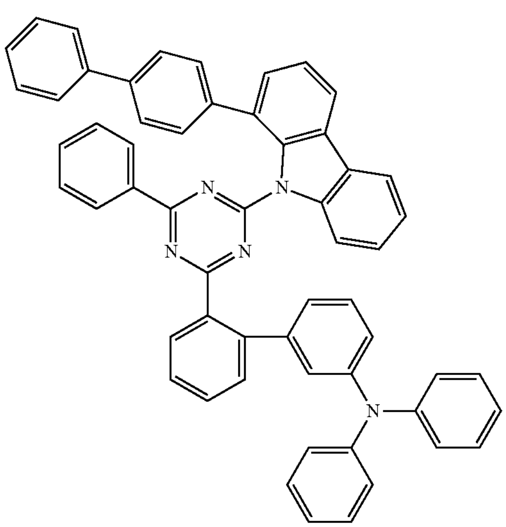
-continued
[105]
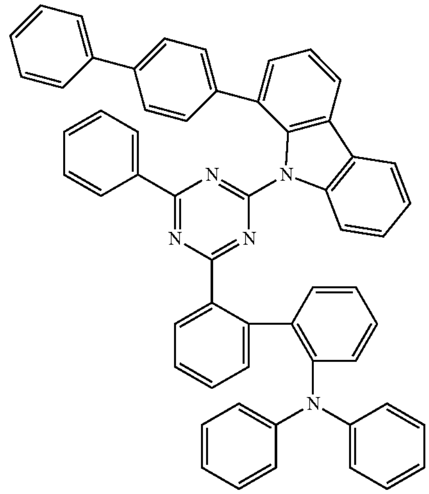
[106]
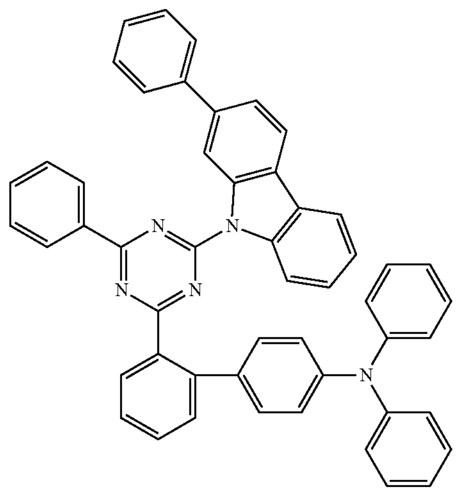
[107]
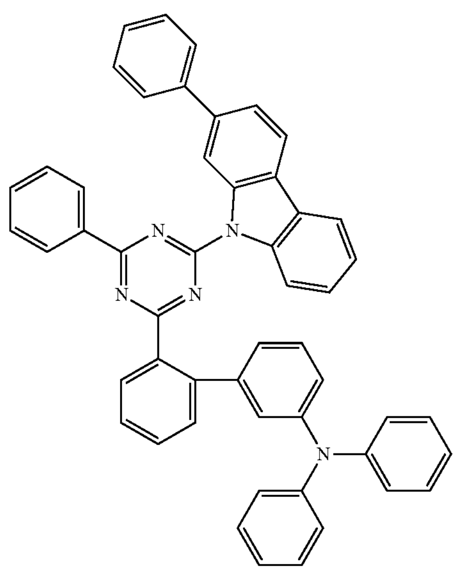

[108]
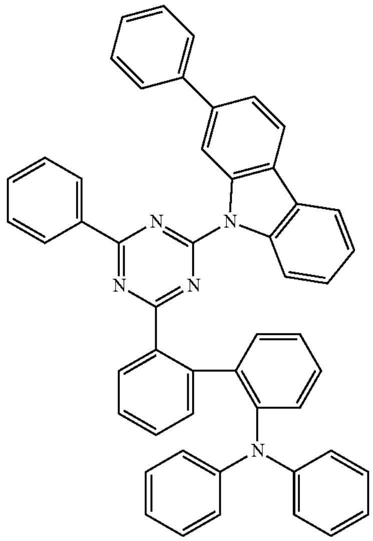
[109]
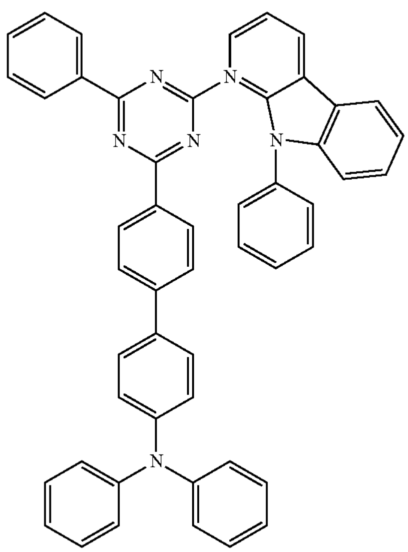
[110]
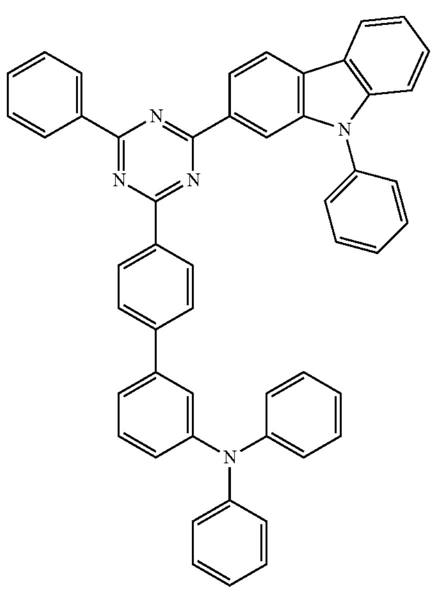
[111]
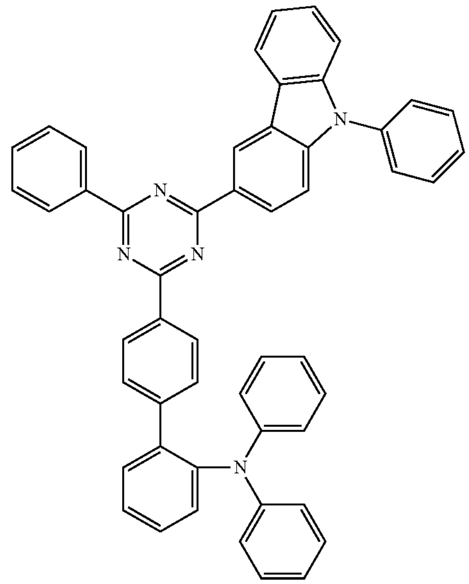
[112]
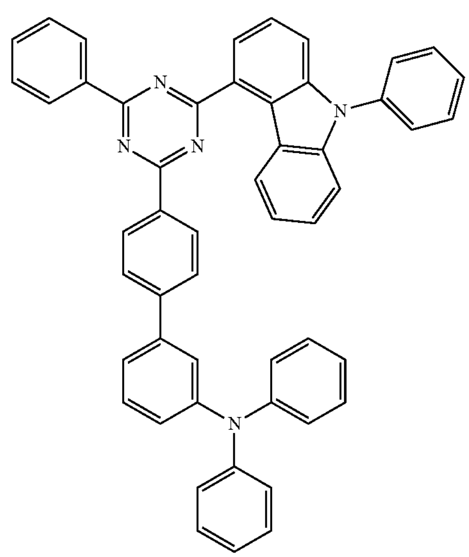

-continued
[113]
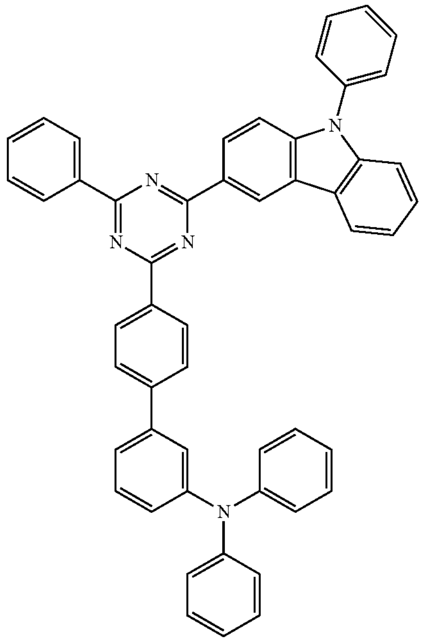
[114]
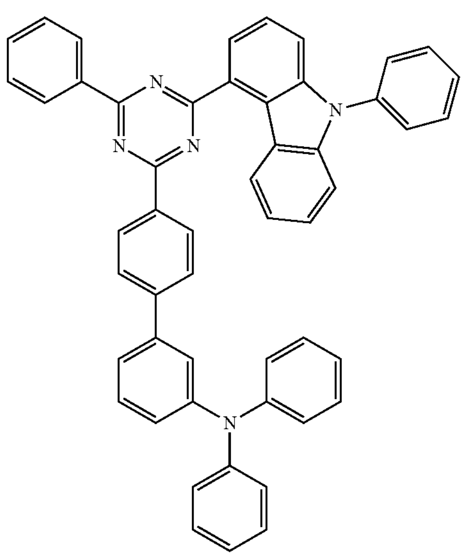
-continued
[115]
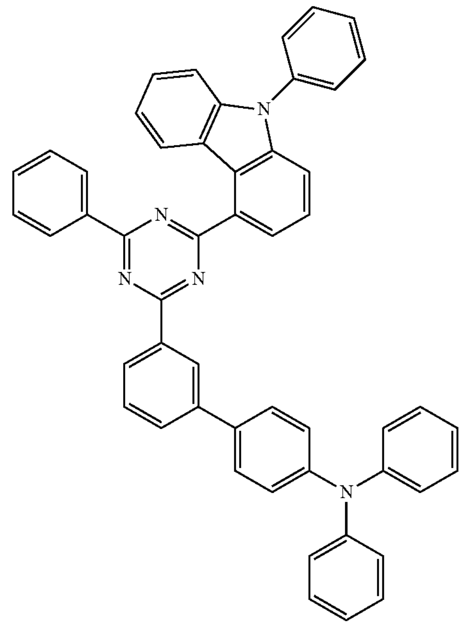
[116]
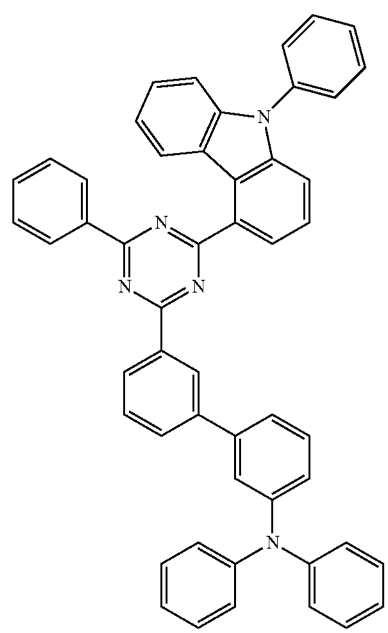

-continued
[117]
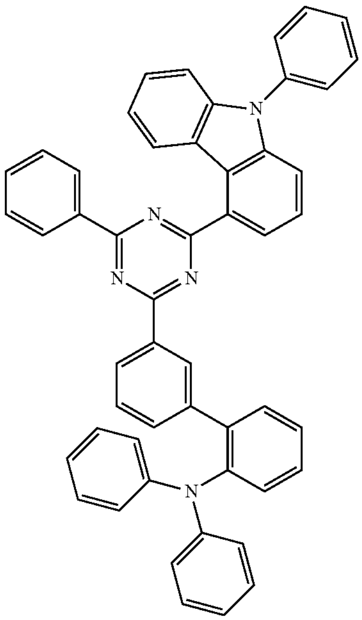
[118]
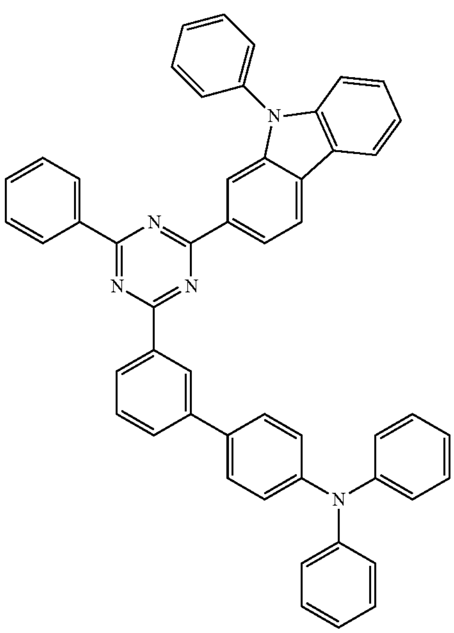
[119]
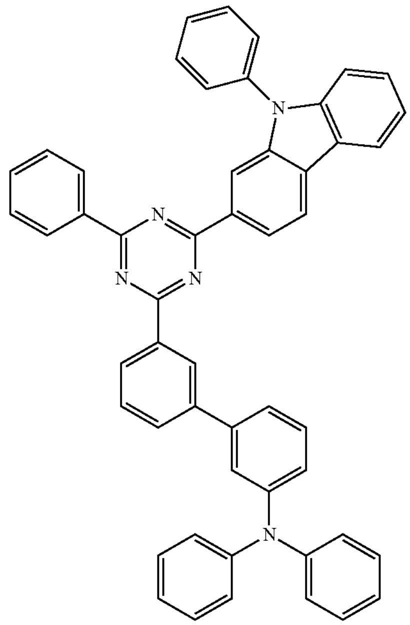
[120]
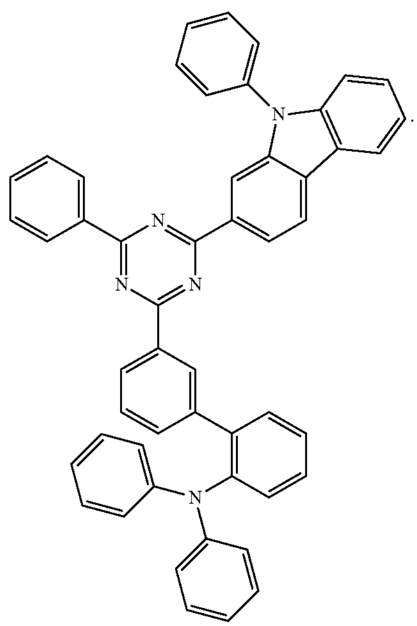
7. A composition for an organic optoelectronic device, the composition comprising a first compound and a second compound,
wherein:
the first compound is the compound for an organic optoelectronic device as claimed in claim 1, and
the second compound is represented by:
Chemical Formula 2; or
a combination of Chemical Formula 3 and Chemical Formula 4,

[Chemical Formula 2]

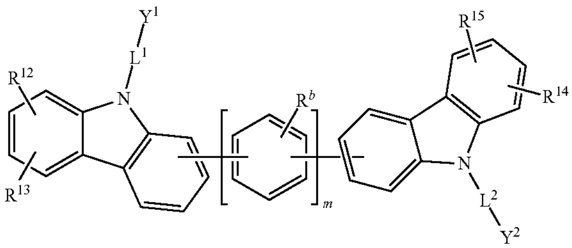

in Chemical Formula 2, $Y^1$ and $Y^2$ are independently a substituted or unsubstituted C6 to C20 aryl group or a substituted or unsubstituted C2 to C30 heterocyclic group, $L^1$ and $L^2$ are independently a single bond or a substituted or unsubstituted C6 to C20 arylene group, $R^b$ and $R^{12}$ to $R^{15}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and m is an integer of 0 to 2;

[Chemical Formula 3]

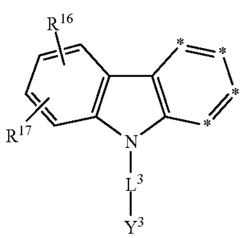

[Chemical Formula 4]

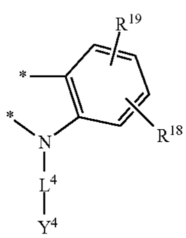

in Chemical Formulas 3 and 4, $Y^3$ and $Y^4$ are independently a substituted or unsubstituted C6 to C20 aryl group or a substituted or unsubstituted C2 to C30 heterocyclic group, adjacent two *s of Chemical Formula 3 are linked to Chemical Formula 4,

*s of Chemical Formula 3 not linked to Chemical Formula 4 are independently C-$L^a$-$R^c$, $L^a$, $L^3$ and $L^4$ are independently a single bond or a substituted or unsubstituted C6 to C20 arylene group, and $R^c$ and $R^{16}$ to $R^{19}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

8. The composition as claimed in claim 7, wherein:

the second compound is represented by Chemical Formula 2, the compound represented by Chemical Formula 2 is represented by Chemical Formula 2-8:

[Chemical Formula 2-8]

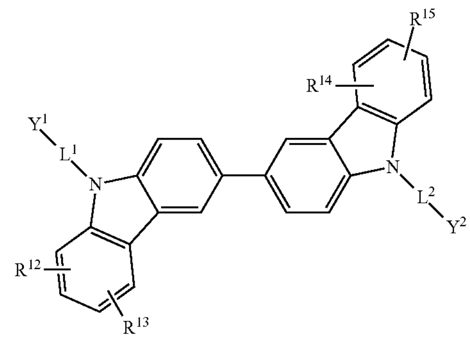

in Chemical Formula 2-8, $R^{12}$ to $R^{15}$ are independently hydrogen or a substituted or unsubstituted C6 to C12 aryl group, and

*-$L^1$-$Y^1$ and *-$L^2$-$Y^2$ are independently a moiety of Group I,

[Group I]

C-1

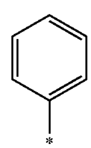

C-2

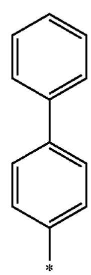

C-3

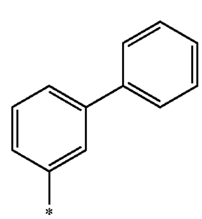

C-4

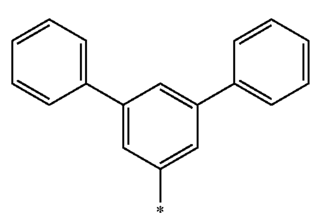

C-5
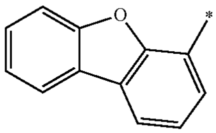
C-6
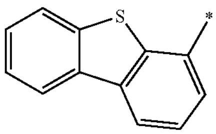
C-7
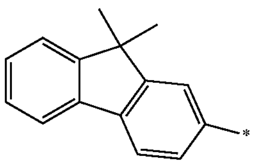
C-8
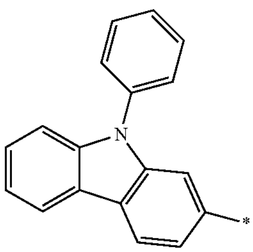
C-9
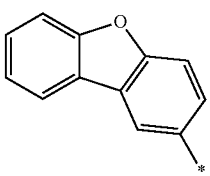
C-10
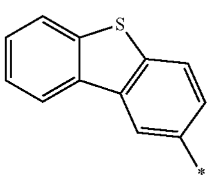
C-11
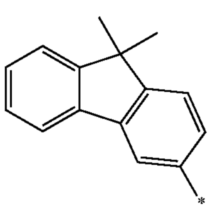
C-12
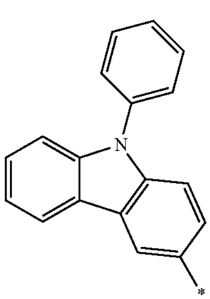
C-13
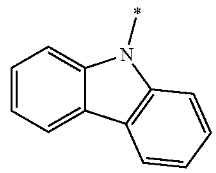
C-14
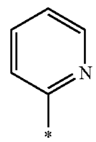
C-15
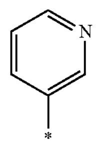
C-16
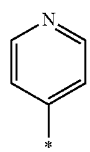
C-17
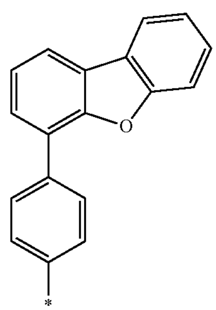
C-18
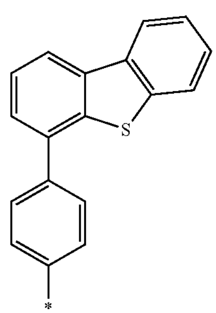
C-19
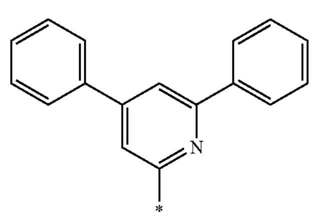

-continued
C-20
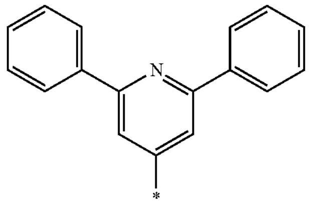
C-21
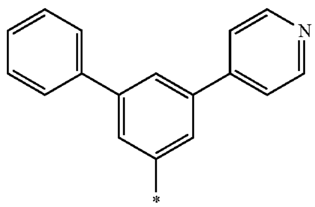
C-22
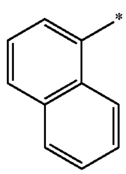
C-23
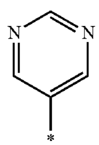
C-24
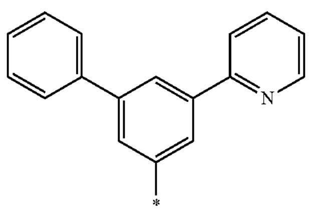
C-25
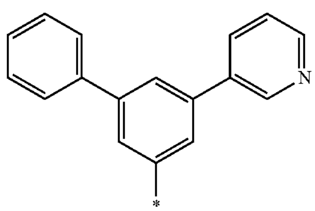
C-26
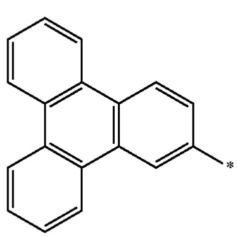
-continued
C-27
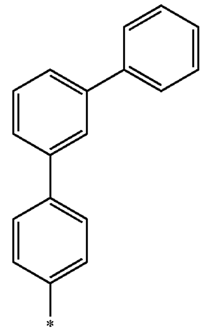
C-28
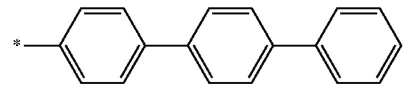
C-29
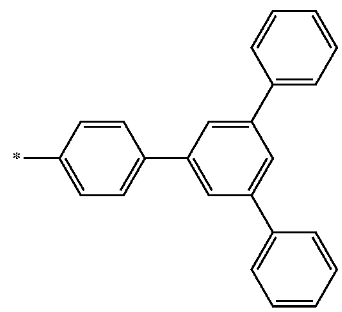
C-30
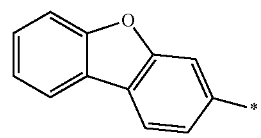
C-31
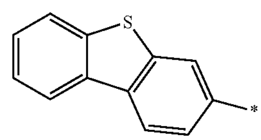
C-32
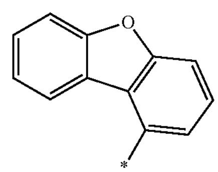
C-33
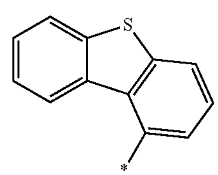
in Group I, * is a linking point.
9. The composition as claimed in claim 8, wherein *-$L^1$-$Y^1$ and *-$L^2$-$Y^2$ of Chemical Formula 2-8 are independently one of moieties C-1, C-2, C-3, C-19, and C-26 of Group I.
10. An organic optoelectronic device, comprising:
an anode and a cathode facing each other,
at least one organic layer between the anode and the cathode, wherein the at least one organic layer includes the compound for an organic optoelectronic device as claimed in claim 1.

11. The organic optoelectronic device as claimed in claim 10, wherein the at least one organic layer includes a light emitting layer, and the light emitting layer includes the compound for an organic optoelectronic device.

12. A display device comprising the organic optoelectronic device as claimed in claim 10.

13. An organic optoelectronic device, comprising:

an anode and a cathode facing each other, at least one organic layer between the anode and the cathode, wherein at least one the organic layer includes the composition for an organic optoelectronic device as claimed in claim 7.

14. The organic optoelectronic device as claimed in claim 13, wherein:

the at least one organic layer includes a light emitting layer, and the light emitting layer includes the composition for an organic optoelectronic device.

15. A display device comprising the organic optoelectronic device as claimed in claim 13.

* * * * *